(12) United States Patent
Chang

(10) Patent No.: US 10,187,076 B2
(45) Date of Patent: *Jan. 22, 2019

(54) BROADBAND DIGITAL BEAM FORMING SYSTEM INCLUDING WAVEFRONT MULTIPLEXERS AND NARROWBAND DIGITAL BEAM FORMING MODULES

(71) Applicant: SPATIAL DIGITAL SYSTEMS, INC., Agoura Hills, CA (US)

(72) Inventor: Donald C. D. Chang, Thousand Oaks, CA (US)

(73) Assignee: SPATIAL DIGITAL SYSTEMS, INC., Agoura Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/943,666

(22) Filed: Apr. 2, 2018

(65) Prior Publication Data
US 2018/0226982 A1 Aug. 9, 2018

Related U.S. Application Data

(63) Continuation of application No. 15/350,103, filed on Nov. 13, 2016, now Pat. No. 9,935,647, which is a
(Continued)

(51) Int. Cl.
*H03M 1/12* (2006.01)
*H04J 14/02* (2006.01)
(Continued)

(52) U.S. Cl.
CPC .......... *H03M 1/122* (2013.01); *H03F 1/0277* (2013.01); *H03F 1/3247* (2013.01); *H03F 1/3258* (2013.01); *H03F 3/211* (2013.01);
*H03F 3/24* (2013.01); *H03F 3/68* (2013.01); *H03F 3/72* (2013.01); *H04B 7/18515* (2013.01); *H04J 14/0223* (2013.01); *H04J 14/0227* (2013.01);
(Continued)

(58) Field of Classification Search
CPC .... H03M 1/122; H03F 1/0277; H03F 1/3247; H03F 1/3258; H03F 1/211; H03F 1/24; H03F 1/72; H04B 7/18515; H04J 14/0223; H04J 14/0227
See application file for complete search history.

(56) References Cited

U.S. PATENT DOCUMENTS

| | | | | |
|---|---|---|---|---|
| 5,671,168 A | * | 9/1997 | Liu | ......................... G06F 17/10 708/321 |
| 9,935,647 B2 | * | 4/2018 | Chang | ................... H03M 1/122 |
| 2010/0231442 A1 | * | 9/2010 | Craig | ................... H04B 7/0851 342/354 |

* cited by examiner

*Primary Examiner* — Leon Flores
(74) *Attorney, Agent, or Firm* — Phuong-Quan Hoang

(57) ABSTRACT

A broadband linear processing system includes a pre-processing module and a set of M linear processors coupled to the pre-processing module, M being an integer greater than 1. The pre-processing module includes a wavefront multiplexer having M input ports and M output ports. The wavefront multiplexer receives M input signals at the M input ports, performs a wavefront multiplexing transform on the M input signals and outputs M narrowband signal streams at the M output ports. The wavefront multiplexing transform has an inverse. Each of the M linear processors receives and processes a corresponding one of the M narrowband signal streams, and outputs a corresponding one of M processed narrowband signal streams.

20 Claims, 35 Drawing Sheets

Related U.S. Application Data continuation of application No. 14/580,248, filed on Dec. 23, 2014, now Pat. No. 9,496,886, which is a continuation of application No. 13/525,315, filed on Jun. 17, 2012, now Pat. No. 8,953,728.

(60) Provisional application No. 61/497,852, filed on Jun. 16, 2011.

(51) Int. Cl.
*H03F 1/02* (2006.01)
*H03F 1/32* (2006.01)
*H03F 3/21* (2006.01)
*H03F 3/24* (2006.01)
*H03F 3/68* (2006.01)
*H03F 3/72* (2006.01)
*H04B 7/185* (2006.01)
*H04B 10/118* (2013.01)

(52) U.S. Cl.
CPC ............... *H03F 2201/3212* (2013.01); *H03F 2203/21106* (2013.01); *H03F 2203/21109* (2013.01); *H03F 2203/21136* (2013.01); *H03F 2203/21145* (2013.01); *H03F 2203/21175* (2013.01); *H03F 2203/7215* (2013.01); *H03F 2203/7224* (2013.01); *H03F 2203/7236* (2013.01); *H04B 10/118* (2013.01)

BROADBAND DIGITAL BEAM FORMING SYSTEM INCLUDING WAVEFRONT MULTIPLEXERS AND NARROWBAND DIGITAL BEAM FORMING MODULES

CROSS-REFERENCE TO RELATED APPLICATIONS

This application is a continuation of application Ser. No. 15/350,103 filed on Nov. 13, 2016, which is a continuation of application Ser. No. 14/580,248 filed on Dec. 23, 2014, issued as U.S. Pat. No. 9,496,886, which is a continuation of application Ser. No. 13/525,315, filed on Jun. 17, 2012, issued as U.S. Pat. No. 8,953,728, which claims the benefit of U.S. Provisional Application Ser. No. 61/497,852, filed on Jun. 16, 2011, all of which are herein incorporated by reference in their entireties.

BACKGROUND OF THE DISCLOSURE

Field of the Disclosure

The disclosure relates to a signal or data stream processing system, and more particularly, to a signal or data stream processing system that includes a wave-front multiplexer and a wave-front demultiplexer that is complementary transformation to the wave-front multiplexer.

Brief Description of the Related Art

Signal processing is a mathematical manipulation of a signal to transform, modify or improve it in some way. For example, signals can be constantly converted from analog to digital, manipulated digitally, and then converted back to analog form. Signal processing algorithms requires a large number of mathematical operations to be performed quickly and repeatedly on a signal.

SUMMARY OF THE DISCLOSURE

The present invention provides exemplary approaches of coherent combining parallel processing that are proposed addressing various application enhancements. Proposed algorithms may include pre-processing of signals in a multichannel structure for diagnostics of multiple unequalized propagation/processing delay paths at the input end, and associated adaptive post processing at an output end. The preprocessors generate orthogonality among various wavefronts and attach various inputs to different wavefronts. The post processing iteratively equalizes phases/amplitudes and/or time delays among the multiple paths via different processors, or propagation sub-channels based only on the diagnostic information gained by unique structure Rx signals. As a result of successful compensations, the orthogonality among wavefronts are restored. Therefore the individual outputs associated with various inputs can then be reconstituted. The organized structure for the multiple processing subchannels is the wave-front multiplexing/de-multiplexing (WF Muxing/De-muxing) processing. There requires no feedback paths between transmit (Tx) and receiving (Rx) ends. Therefore, no back channel exchange is required for the calibrations and equalizations among various processing or propagation paths, or sub-channels, and thus minimizing potential complexity in control algorithms.

There may be needs for fragmenting high bandwidth signals into multiple sub-channels due to shortage of continuous spectrum or speed of available processors. It is desirable to decompose a wideband signal stream, from a transmit end, into multiple subband signals, and then having them frequency converted individually to various sub-channels at different frequency slots before transmission. At Rx end of the link, captured sub-channel signals are frequency converted back to those of individual subbands. The wideband signal stream is then reconstituted through proper processing on these Rx subband signals.

There may be also needs for fragmenting high bandwidth signals into multiple sub-channels due to processing speed of available processors. It is desirable to decompose a wideband signal stream, from an input, into multiple subband signals, and then having them processed by different processors at lower speed concurrently. At output end of the processing, captured sub-channel signals are re-constituted back to the wideband signal stream through proper processing on these Rx subband signals.

There may be also needs for combining multiple devices in parallel to gain better performance in power outputs, enhanced dynamic range, higher proceeding bandwidth/speed, better transmissions or processing securities, and/or combinations of above.

An exemplary embodiment of the present disclosure provides a system for processing data streams or signals including a wave-front multiplexer configured to process first and second input signals into first and second output signals each carrying information associated with the first and second input signals, a first processing unit or device configured to process a third input signal carrying information associated with the first output signal into a third output signal, a second processing unit or device configured to process a fourth input signal carrying information associated with the second output signal into a fourth output signal, and a wave-front demultiplexer configured to process fifth and sixth input signals into fifth and sixth output signals each carrying information associated with the fifth and sixth input signals. The fifth input signal carries information associated with the third output signal, and the sixth input signal carries information associated with the fourth output signal.

Another exemplary embodiment of the present disclosure provides a system for transmitting data streams or signals including a wave-front multiplexer configured to process first and second input signals into first and second output signals each carrying information associated with the first and second input signals, a communication medium configured to transmit a first transmitting signal carrying information associated with the first output signal and transmit a second transmitting signal carrying information associated with the second output signal, and a wave-front demultiplexer configured to process third and fourth input signals into third and fourth output signals each carrying information associated with the third and fourth input signals. The third input signal carries information associated with the first transmitting signal, and the fourth input signal carries information associated with the second transmitting signal. The third output signal is substantially equal to the first input signal, and the fourth output signal is substantially equal to the second input signal. Alternative, the third output signal is equal to the first input signal multiplied by a first scalar, and the fourth output signal is equal to the second input signal by a second scalar, wherein the first scalar is substantially equal to the second scalar.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1A:
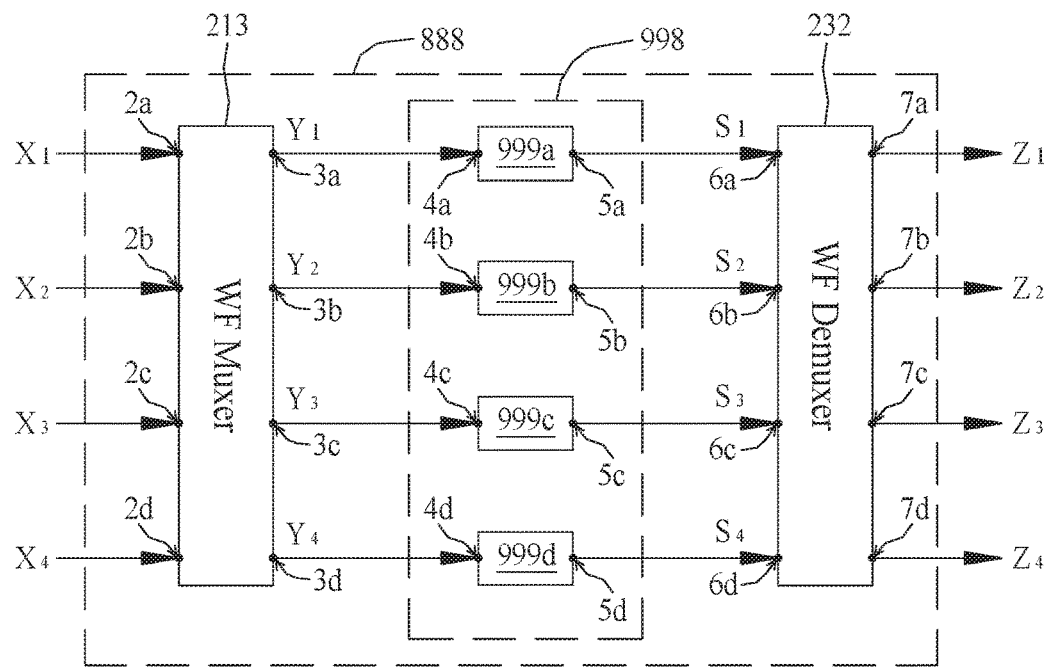
FIG. 1A shows a system including a wave-front multiplexer, a wave-front demultiplexer and multiple signal processing units or devices according to an embodiment of the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Before describing embodiments of the present invention, a definition has been included for these various terms. These definitions are provided to assist in teaching a general understanding of the present invention.

Wave-Front Multiplexer (WF Muxer):

The term "wave-front multiplexer" is used herein to denote a specialized signal processing transform from a spatial-domain representation of signals to a wavefront-domain representation of the signals. A wave-front multiplexer performs an orthogonal functional transformation to multiply an orthogonal matrix, such as Fourier matrix, Butler matrix or Hadamard matrix, by an input matrix representing multiple input signals so as to obtain an output matrix representing multiple output signals. The orthogonal functional transformation can be, but not limited to, Fourier transformation, discrete Fourier transformation (DFT), fast Fourier transformation (FFT), Hartley transformation, Hadamard transformation, or any other Fourier-related transformation. Each output signal output from the wave-front multiplexer is a linear combination, i.e. weighted sum, of all input signals input into the wave-front multiplexer. As a result, each input signal into the wave-front multiplexer appears in all output signals. The weightings of one input signal among all the output signals feature a unique distribution which is defined as a wavefront multiplexing vector (WFMV). When the wave-front multiplexer features H inputs receiving H input signals and H outputs outputting H output signals, there are H wavefront multiplexing vectors (WFMVs) associated with the H inputs of the H-to-H wave-front multiplexer, and each of the H wavefront multiplexing vectors is an H-dimensional vector, where H is an integer equal to or greater than two, four, eight, sixteen, thirty-two, sixty-four or two-hundred-and-fifty-six. The H wavefront multiplexing vectors are mutually orthogonal to one another. Each of the H output signals carries a linear combination of all the H input signals, and the H input signals appearing in each of the H output signals can be completely independent from one another. The above-mentioned transform performed by the wave-front multiplexer is called herein a wave-front multiplexing transform or transformation, which can be applied to the following embodiments.

The wave-front multiplexing transform may be, but not limited to, implemented at base band in a digital format or by analog devices, wherein the devices may be selected from a group consisting of a Butler Matrix, a Fourier transform, and a Hartley transform.

The wave-front multiplexer can be, but not limited to, embedded in a processor. The wave-front multiplexer can be implemented by hardware which performing the above wave-front multiplexing transformation, such as FFT chip, Butler matrix, or a device performing a specified transformation of an orthogonal matrix such as Fourier matrix or Hadamard matrix. Alternatively, the function of the wave-front multiplexer can be realized by software installed in and performed by the processor, wherein the software can perform the above wave-front multiplexing transform. Alternatively, the wave-front multiplexer can be or include, but not limited to, a field programmable gate array (FPGA) or a digital signal processor (DSP).

The wave-front multiplexer can be layout with circuits for cells of basic functions recorded in a cell library such that any company of interest can implement the circuit layout in an integrated-circuit chip, a system-on chip (SOC) or an integrated-circuit chip package.

The wave-front multiplexer (WF muxer) features multiple-input and multiple-output (MIMO) processing that receives multiple input signals passing in parallel through multiple parallel input ports of the WF muxer and outputs multiple output signals passing in parallel through multiple parallel output ports of the WF muxer. The total number of the parallel input ports of the WF muxer may be equal to the total number of the parallel output ports of the WF muxer, may be equal to the number of rows or columns of an orthogonal matrix characterizing the WF muxer, and may be any number equal to or more than two, four, eight, sixteen, thirty-two or two-hundred-and-fifty-six. The total number of the input signals into the WF muxer may be equal to or less than the total number of the parallel input ports of the WF muxer, may be equal to or less than the number of rows or columns of the orthogonal matrix characterizing the WF muxer, and may be any number equal to or more than two, four, eight, sixteen, thirty-two or two-hundred-and-fifty-six. The total number of the output signals output form the WF muxer may be equal to the total number of the parallel output ports of the WF muxer, may be equal to the number of rows or columns of the orthogonal matrix characterizing the WF muxer, and may be any number equal to or more than two, four, eight, sixteen, thirty-two or two-hundred-and-fifty-six.

Wave-Front Demultiplexer (WF Demuxer):

The term "Wave-front demultiplexer" is used herein to denote a specialized signal processing transform from a wavefront-domain representation of signals to a spatial-domain representation of the signals. A wave-front demultiplexer performs a complementary transformation to a wave-front multiplexer and extracts multiple signals each corresponding to one of the original signals input to the wave-front multiplexer.

The wave-front demultiplexer performs an inverse orthogonal functional transformation to multiply an inverse orthogonal matrix, such as inverse Fourier matrix, Butler matrix or Hadamard matrix, by an input matrix representing multiple input signals so as to obtain an output matrix representing multiple output signals. The inverse transformation performed by the wave-front demultiplexer is the inverse of the transformation performed by a corresponding or complementary wave-front multiplexer. Many orthogonal matrixes, such as Hadamard matrix, have inverses which equal to the orthogonal matrixes themselves. The inverse orthogonal functional transformation can be, but not limited to, inverse Fourier transformation, inverse discrete Fourier transformation, inverse fast Fourier transformation (IFFT), Hadamard transformation, inverse Hartley transformation, any other inverse Fourier-related transformation, or any transformation of an orthogonal matrix (such as inverse Fourier matrix, Butler matrix, or Hadamard matrix).

Hadamard transforms featuring the inverse transforms equal to themselves may be used for the wave-front multiplexing and demultiplexing transforms. In the present disclosure, the wave-front multiplexing and demultiplexing transforms can be, but not limited to, characterized by same matrixes.

Alternatively, the wave-front multiplexing transform may have an inverse not equal to itself. The wave-front multiplexing transform is not equal to the corresponding or complementary wave-front demultiplexing transform. For example, the wave-front multiplexing and demultiplexing transforms can be, but not limited to, a fast Fourier transform (FFT) and its corresponding or complementary inverse fast Fourier transforms (IFFT).

Each output signal output from the wave-front demultiplexer is a linear combination, i.e. weighted sum, of all input signals input into the wave-front demultiplexer. As a result, each input signal into the wave-front demultiplexer appears in all output signals. The weightings of one input signal among all the output signals feature a unique distribution which is defined as a wavefront demultiplexing vector (WFDV). When the wave-front demultiplexer features I inputs receiving I input signals and I outputs outputting I output signals, there are I wavefront demultiplexing vectors (WFDVs) associated with the I inputs of the I-to-I wave-front demultiplexer, and each of the I wavefront demultiplexing vectors is an I-dimensional vector, where I is an integer equal to or greater than two, four, eight, sixteen, thirty-two, sixty-four or two-hundred-and-fifty-six. The I wavefront demultiplexing vectors are mutually orthogonal to one another. Each of the I output signals carries a linear combination of all the I input signals, and the I input signals appearing in each of the I output signals can be completely independent from one another.

Therefore, the wave-front demultiplexer extracts coherently combined signals from input signals input to the wave-front demultiplexer and outputs the coherently combined signals, such that each of the coherently combined signals output from the wave-front demultiplexer can be correspondent to or associated with one of the input signals input into the wave-front multiplexer. The above-mentioned transform performed by the wave-front demultiplexer is called herein a wave-front demultiplexing transform or transformation, which can be applied to the following embodiments.

The wave-front demultiplexer can be, but not limited to, embedded in a processor. The wave-front demultiplexer can be implemented by hardware which performing the above wave-front demultiplexing transformation, such as IFFT chip, Butler matrix, or a device performing a specified transformation of an inverse orthogonal matrix. Alternatively, the function of the wave-front demultiplexer can be realized by software installed in and performed by the processor, wherein the software can perform the above wave-front demultiplexing transform. Alternatively, the wave-front demultiplexer can be or include, but not limited to, a field programmable gate array (FPGA) or a digital signal processor (DSP). When the wave-front multiplexing and demultiplexing transformations are implemented by hardware, the wave-front multiplexer and the wave-front demultiplexer can be, but not limited to, a pair of Butler Matrixes, a Fourier transform pair, or a Hartley transform pair.

The wave-front demultiplexer can be layout with circuits for cells of basic functions recorded in a cell library such that any company of interest can implement the circuit layout in an integrated-circuit chip, a system-on chip (SOC) or an integrated-circuit chip package.

The wave-front demultiplexer (WF demuxer) features multiple-input and multiple-output (MIMO) processing that receives multiple input signals passing in parallel through multiple parallel input ports of the WF demuxer and outputs multiple output signals passing in parallel through multiple parallel output ports of the WF demuxer. The total number of the parallel input ports of the WF demuxer may be equal to the total number of the parallel output ports of the WF demuxer, may be equal to the total number of parallel input ports of a corresponding or complementary WF muxer, may be equal to the total number of parallel output ports of the corresponding or complementary WF muxer, may be equal to the number of rows or columns of an orthogonal matrix characterizing the corresponding or complementary WF muxer, may be equal to the number of rows or columns of an inverse orthogonal matrix characterizing the WF demuxer, and may be any number equal to or more than two, four, eight, sixteen, thirty-two or two-hundred-and-fifty-six. The total number of the input signals input in parallel to the WF demuxer may be equal to the total number of output signals output in parallel from the corresponding or complementary WF muxer, may be equal to the total number of the parallel inputs of the WF demuxer, and may be any number equal to or more than two, four, eight, sixteen, thirty-two or two-hundred-and-fifty-six. The total number of the output signals output in parallel form the WF demuxer may be equal to the total number of input signals input in parallel to the corresponding or complementary WF muxer, may be equal to or less than the total number of the input signals input in parallel to the WF demuxer, may be equal to or less than the total number of the output signals output in parallel from the corresponding or complementary WF muxer, may be equal to or less than the total number of the parallel output ports of the WF demuxer, and may be any number equal to or more than two, four, eight, sixteen, thirty-two or two-hundred-and-fifty-six.

Mathematically, the wave-front demultiplexing transformation can be expressed by a linear equation as Z=WFDM*S, where S denotes input vectors such as four components $S_1$-$S_4$ in the following matrix D as illustrated in FIG. 1A, Z denotes output vectors such as four components in the following matrix F as illustrated in FIG. 1A, and WFDM denotes an inverse orthogonal matrix, such as the following matrix E as illustrated in FIG. 1A, of the wave-front demultiplexer. The wave-front multiplexing transformation can be expressed by a linear equation as Y=WFM*X, where X denotes input vectors such as four components $X_1$-$X_4$ in the following matrix A as illustrated in FIG. 1A, Y denotes output vectors such as four components in the following matrix C as illustrated in FIG. 1A, and WFM denotes an orthogonal matrix, such as the following matrix B as illustrated in FIG. 1A, of the wave-front multiplexer. The wave-front demultiplexing transformation features the characteristic that WFM*WFDM=I, where I is a unit matrix. Basically, WFM and WFDM are square matrices, and the order of WFM has the same rows and columns as the order of WFDM. For example, in case the orders of WFM and WFDM each having N rows and N columns are N×N, each of the wave-front multiplexing and demultiplexing transformations is available to processing N input vectors, i.e. input signals, and transforming the N input vectors into N output vectors, i.e. output signals, where N is an integer equal to or greater than two, four, eight, sixteen, thirty-two or two-hundred-and-fifty-six.

The wave-front demultiplexer, for example, can be used at a receiving side of a system with a complementary wave-front multiplexer at a transmitting side of the system, and multiple signal paths, such as physical or wireless channels, can be set between an antenna array of the transmitting side and an antenna array of the receiving side. Satellite transponders can be arranged in the signal paths between the antenna array of the transmitting side and the antenna array of the receiving side. Alternatively, both of the wave-front demultiplexer and complementary wave-front multiplexer can be arranged at the receiving side of the system. Alternatively, both of the wave-front demultiplexer and complementary wave-front multiplexer can be arranged at the transmitting side of the system.

The above-mentioned descriptions of the wave-front multiplexer and the wave-front demultiplexer can be applied to the following embodiments.

FIG. 1A shows an example illustrating how a four-input and four-output wave-front multiplexer along with a four-input and four-output wave-front demultiplexer works.

Referring to FIG. 1A, a system 888 includes a wave-front multiplexer 213, a wave-front demultiplexer 232, and multiple signal processing units or devices such as four units or devices 999a, 999b, 999c and 999d. Each of the wave-front multiplexer 213 and the wave-front multiplexer 232 can be, but not limited to, a four-input and four-output unit. That is, the wave-front multiplexer 213 may have four inputs 2a, 2b, 2c and 2d and four outputs 3a, 3b, 3c and 3d, and the wave-front demultiplexer 232 may have four inputs 6a, 6b, 6c and 6d and four outputs 7a, 7b, 7c and 7d.

The signal processing units or devices 999a, 999b, 999c and 999d, for example, can be embedded in a processor 998 or can be respectively embedded in four processors such as four mobile or wireless communication base stations, four satellites, four mobile phones, four computers, or four servers. The processor 998 can be, but not limited to, a mobile or wireless communication base station, a satellite, a mobile phone, a computer, or a server. The signal processing unit or device 999a is in a first signal path between the output 3a of the wave-front multiplexer 213 and the input 6a of the wave-front demultiplexer 232, being used to process an input signal, such as signal $Y_1$ output from the output 3a, so as to output another signal, such as signal $S_1$. The signal processing unit or device 999b is in a second signal path between the output 3b of the wave-front multiplexer 213 and the input 6b of the wave-front demultiplexer 232, being used to process an input signal, such as signal $Y_2$ output from the output 3b, so as to output another signal, such as signal $S_2$. The signal processing unit or device 999c is in a third signal path between the output 3c of the wave-front multiplexer 213 and the input 6c of the wave-front demultiplexer 232, being used to process an input signal, such as signal $Y_3$ output from the output 3c, so as to output another signal, such as signal $S_3$. The signal processing unit or device 999d is in a fourth signal path between the output 3d of the wave-front multiplexer 213 and the input 6d of the wave-front demultiplexer 232, being used to process an input signal, such as signal $Y_4$ output from the output 3d, so as to output another signal, such as signal $S_4$. The first, second, third and fourth signal paths are arranged in parallel.

There are four input signals $X_1$, $X_2$, $X_3$ and $X_4$ input in parallel to the four inputs 2a, 2b, 2c and 2d of the wave-front multiplexer 213. The signals $X_1$, $X_2$, $X_3$ and $X_4$ can be, but not limited to, digital signals, analog signals, mixed analog and digital signals, or digital signal streams. Next, the wave-front multiplexer 213 performs the wave-front multiplexing transform to multiply the four input signals $X_1$, $X_2$, $X_3$ and $X_4$, represented by a 4×1 input matrix A, by an orthogonal matrix B so as to obtain four output signals $Y_1$, $Y_2$, $Y_3$ and $Y_4$ represented by a 4×1 output matrix C and then outputs the four output signals $Y_1$, $Y_2$, $Y_3$ and $Y_4$ from its four outputs 3a, 3b, 3c and 3d. The matrix B is a square matrix, and the transpose of the matrix B is equal to the inverse of the matrix B. The below formula (1) illustrates the input matrix A multiplied by the orthogonal matrix B, performed on the wave-front multiplexer 213.

$$\text{matrix } A = \begin{bmatrix} X_1 \\ X_2 \\ X_3 \\ X_4 \end{bmatrix} \quad (1)$$

$$\text{matrix } B = \begin{bmatrix} C_{11} & C_{12} & C_{13} & C_{14} \\ C_{21} & C_{22} & C_{23} & C_{24} \\ C_{31} & C_{32} & C_{33} & C_{34} \\ C_{41} & C_{42} & C_{43} & C_{44} \end{bmatrix}$$

matrix $$C = \begin{bmatrix} C_{11}X_1 + C_{12}X_2 + C_{13}X_3 + C_{14}X_4 \\ C_{21}X_1 + C_{22}X_2 + C_{23}X_3 + C_{24}X_4 \\ C_{31}X_1 + C_{32}X_2 + C_{33}X_3 + C_{34}X_4 \\ C_{41}X_1 + C_{42}X_2 + C_{43}X_3 + C_{44}X_4 \end{bmatrix} \begin{bmatrix} C_{11} & C_{12} & C_{13} & C_{14} \\ C_{21} & C_{22} & C_{23} & C_{24} \\ C_{31} & C_{32} & C_{33} & C_{34} \\ C_{41} & C_{42} & C_{43} & C_{44} \end{bmatrix}$$

$$\begin{bmatrix} X_1 \\ X_2 \\ X_3 \\ X_4 \end{bmatrix} = \begin{bmatrix} C_{11}X_1 + C_{12}X_2 + C_{13}X_3 + C_{14}X_4 \\ C_{21}X_1 + C_{22}X_2 + C_{23}X_3 + C_{24}X_4 \\ C_{31}X_1 + C_{32}X_2 + C_{33}X_3 + C_{34}X_4 \\ C_{41}X_1 + C_{42}X_2 + C_{43}X_3 + C_{44}X_4 \end{bmatrix} = \begin{bmatrix} Y_1 \\ Y_2 \\ Y_3 \\ Y_4 \end{bmatrix}$$

The components associated with the input $X_1$ in the four outputs are in the forms of $C_{11}X_1$, $C_{21}X_1$, $C_{31}X_1$ and $C_{41}X_1$. The weighting distribution of the components associated with the input $X_1$ in the four outputs is characterized by a first column vector, i.e. first wave-front multiplexing vector (WFMV1), where $$WFMV1 = \begin{bmatrix} C_{11} \\ C_{21} \\ C_{31} \\ C_{41} \end{bmatrix}$$

Similarly, the components associated with the input $X_2$ in the four outputs are in the forms of $C_{12}X_2$, $C_{22}X_2$, $C_{32}X_2$ and $C_{42}X_2$. The weighting distribution of the components associated with the input $X_2$ in the four outputs is characterized by a second column vector, i.e. second wave-front multiplexing vector (WFMV2), where $$WFMV2 = \begin{bmatrix} C_{12} \\ C_{22} \\ C_{32} \\ C_{42} \end{bmatrix}$$

The components associated with the input $X_3$ in the four outputs are in the forms of $C_{13}X_3$, $C_{23}X_3$, $C_{33}X_3$ and $C_{43}X_3$. The weighting distribution of the components associated with the input $X_3$ in the four outputs is characterized by a third column vector, i.e. third wave-front multiplexing vector (WFMV3), where $$WFMV3 = \begin{bmatrix} C_{13} \\ C_{23} \\ C_{33} \\ C_{43} \end{bmatrix}$$

The components associated with the input $X_4$ in the four outputs are in the forms of $C_{14}X_4$, $C_{24}X_4$, $C_{34}X_4$ and $C_{44}X_4$. The weighting distribution of the components associated with the input $X_4$ in the four outputs is characterized by a fourth column vector, i.e. fourth wave-front multiplexing vector (WFMV4), where $$WFMV4 = \begin{bmatrix} C_{14} \\ C_{24} \\ C_{34} \\ C_{44} \end{bmatrix}$$

The first and second wave-front multiplexing vectors are mutually orthogonal to each other. The first and third wave-front multiplexing vectors are mutually orthogonal to each other. The first and fourth wave-front multiplexing vectors are mutually orthogonal to each other. The second and third wave-front multiplexing vectors are mutually orthogonal to each other. The second and fourth wave-front multiplexing vectors are mutually orthogonal to each other. The third and fourth multiplexing wave-front vectors are mutually orthogonal to each other.

The output signal $Y_1$ is a linear combination, i.e. weighted sum, of all input signals $X_1$, $X_2$, $X_3$ and $X_4$ multiplied by the weightings $C_{11}$, $C_{12}$, $C_{13}$, and $C_{14}$, respectively. That is, the output signal $Y_1$ can be represented by a linear combination of $C_{11}X_1$ plus $C_{12}X_2$ plus $C_{13}X_3$ plus $C_{14}X_4$. The four input signals $X_1$, $X_2$, $X_3$ and $X_4$ can be completely independent. The output signal $Y_2$ is a linear combination, i.e. weighted sum, of all input signals $X_1$, $X_2$, $X_3$ and $X_4$ multiplied by the weightings $C_{21}$, $C_{22}$, $C_{23}$, and $C_{24}$, respectively. That is, the output signal $Y_2$ can be represented by a linear combination of $C_{21}X_1$ plus $C_{22}X_2$ plus $C_{23}X_3$ plus $C_{24}X_4$. The output signal $Y_3$ is a linear combination, i.e. weighted sum, of all input signals $X_1$, $X_2$, $X_3$ and $X_4$ multiplied by the weightings $C_{31}$, $C_{32}$, $C_{33}$, and $C_{34}$, respectively. That is, the output signal $Y_3$ can be represented by a linear combination of $C_{31}X_1$ plus $C_{32}X_2$ plus $C_{33}X_3$ plus $C_{34}X_4$. The output signal $Y_4$ is a linear combination, i.e. weighted sum, of all input signals $X_1$, $X_2$, $X_3$ and $X_4$ multiplied by the weightings $C_{41}$, $C_{42}$, $C_{43}$, and $C_{44}$, respectively. That is, the output signal $Y_4$ can be represented by a linear combination of $C_{41}X_1$ plus $C_{42}X_2$ plus $C_{43}X_3$ plus $C_{44}X_4$.

Therefore, each of the output signals $Y_1$, $Y_2$, $Y_3$ and $Y_4$ output from the wave-front multiplexer 213 is a linear combination, i.e. weighted sum, of all input signals $X_1$, $X_2$, $X_3$ and $X_4$ multiplied by respective weightings, and distributions of the weightings of any two input components in the four output signals $Y_1$, $Y_2$, $Y_3$ and $Y_4$ are orthogonal. The weightings include $C_{11}$, $C_{12}$, $C_{13}$ and $C_{14}$ for the input signals $X_1$, $X_2$, $X_3$ and $X_4$, respectively, in the output signal $Y_1$, include $C_{21}$, $C_{22}$, $C_{23}$ and $C_{24}$ for the input signals $X_1$, $X_2$, $X_3$ and $X_4$, respectively, in the output signal $Y_2$, include $C_{31}$, $C_{32}$, $C_{33}$ and $C_{34}$ for the input signals $X_1$, $X_2$, $X_3$ and $X_4$, respectively, in the output signal $Y_3$, and include $C_{41}$, $C_{42}$, $C_{43}$ and $C_{44}$ for the input signals $X_1$, $X_2$, $X_3$ and $X_4$, respectively, in the output signal $Y_4$.

In other words, each of the output signals $Y_1$, $Y_2$, $Y_3$ and $Y_4$ is processed by multiple factors including the input signals $X_1$, $X_2$, $X_3$ and $X_4$ and the corresponding weightings. For the output signal $Y_1$, the factors include the input signals $X_1$, $X_2$, $X_3$ and $X_4$ and their weightings $C_{11}$, $C_{12}$, $C_{13}$ and $C_{14}$. For the output signal $Y_2$, the factors include the input signals $X_1$, $X_2$, $X_3$ and $X_4$ and their weightings $C_{21}$, $C_{22}$, $C_{23}$ and $C_{24}$. For the output signal $Y_3$, the factors include the input signals $X_1$, $X_2$, $X_3$ and $X_4$ and their weightings $C_{31}$, $C_{32}$, $C_{33}$ and $C_{34}$. For the output signal $Y_4$, the factors include the input signals $X_1$, $X_2$, $X_3$ and $X_4$ and their weightings $C_{41}$, $C_{42}$, $C_{43}$ and $C_{44}$.

Figure 1B:
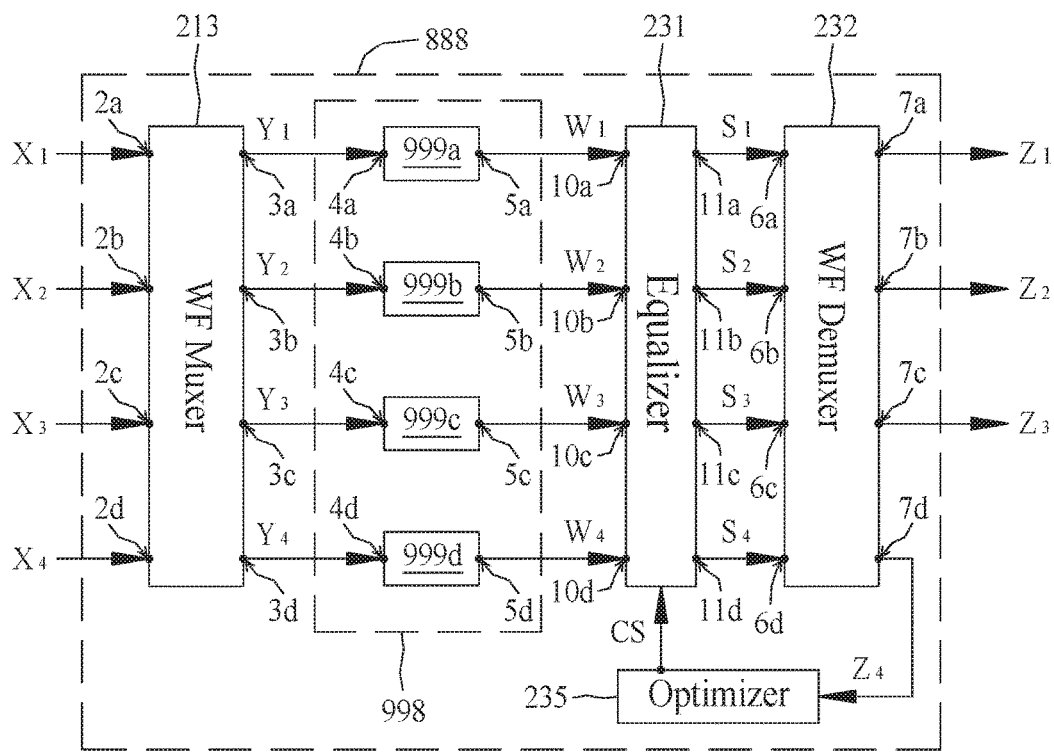
FIG. 1B shows a system including a wave-front multiplexer, a wave-front demultiplexer, multiple signal processing units or devices, an equalizer, and an optimizer according to an embodiment of the present disclosure.
Figure 1C:
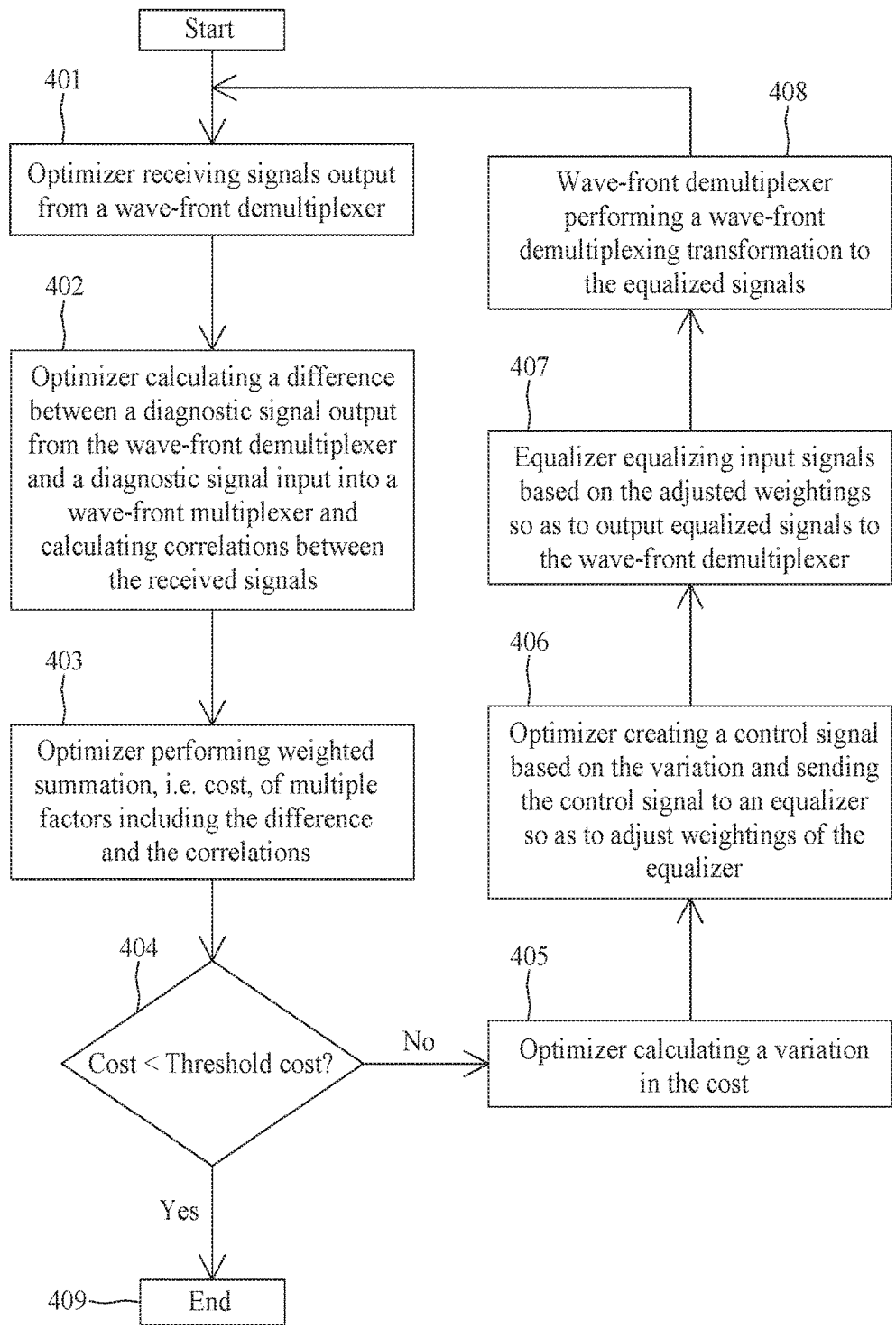
FIG. 1C shows a flow chart of an optimizing and equalizing process according to an embodiment of the present disclosure.
Figure 1D:
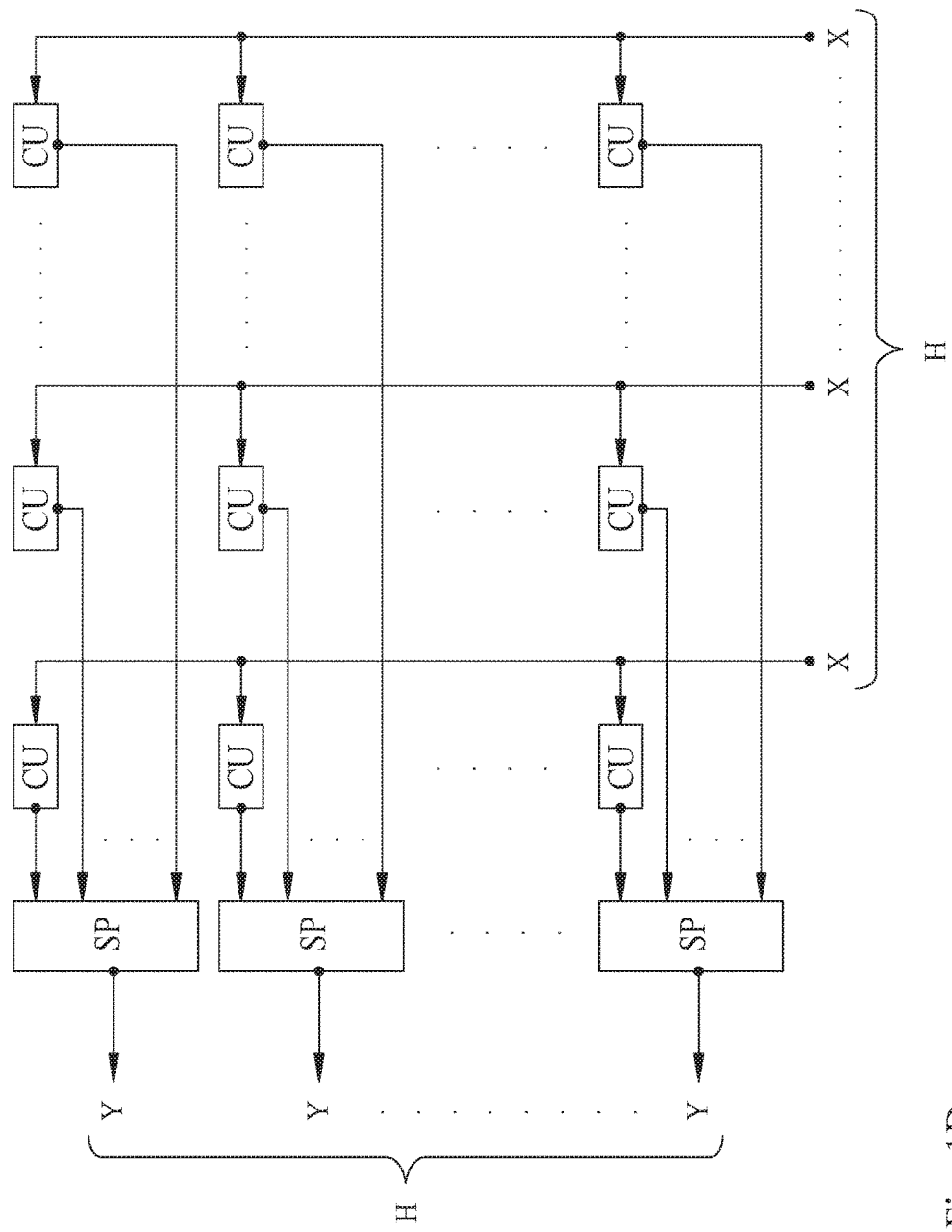
FIG. 1D shows architecture of a wave-front multiplexer according to an embodiment of the present disclosure.

Referring to FIG. 1D showing architecture of a wave-front multiplexer in accordance with the present invention. For more elaboration, the wave-front multiplexer can be adapted to receive the number H of input signals X, process the number H of the input signals X to be multiplied by the above-mentioned WFM matrix, such as H-by-H square orthogonal matrix, and output the number H of output signals Y, wherein H could be any number greater than or equal to 2, 4, 8, 16, 32, 64, 126 or 256. The input signals X can be, but not limited to, analog or digital signals. The output signals Y can be, but not limited to, analog or digital signals. The wave-front multiplexer may include the number H*H of computing units (CUs) and the number H of summing processors (SPs). The computing units form an H-by-H processor array with the number H of columns and the number H of rows. The computing units in each column in the processor array receive a corresponding input signal X, and thus the number H of the input signals X can be received by the computing units in the number H of the respective columns in the processor array. Upon receiving the input signals X, each of the computing units independently weights its received signal, multiplied by a weighting value, to generate a weighted signal. Each of the summing processors provides a means for summing weighted signals generated by the corresponding computing units in same row in the processor array to produce a corresponding output signal Y Accordingly, the number H of the summing processors can output the number H of the output signals Y each combined with the weighted signals output from the computing units in a corresponding one of the number H of the rows in the processor array. The above-mentioned description of the wave-front multiplexer can be applied to the following embodiments.

In the case illustrated in FIG. 1A, the number of H is equal to 4. The wave-front multiplexer 213 illustrated in FIG. 1A may include 4*4 computing units and four summing processors. The computing units form a processor array with four rows and four columns. The input signals $X_1$-$X_4$ illustrated in FIG. 1A can be received by the computing units in the respective four columns in the processor array. Upon receiving the input signals $X_1$-$X_4$, each of the computing units independently weights its received signal, multiplied by a weighting value, to generate a weighted signal. The four summing processors can output the four signals $Y_1$-$Y_4$ each combined with the weighted signals output from the computing units in a corresponding one of the four rows in the processor array.

Referring to FIG. 1A, after the wave-front multiplexer 213 outputs the signals $Y_1$, $Y_2$, $Y_3$ and $Y_4$, the signals $Y_1$, $Y_2$, $Y_3$ and $Y_4$ are transmitted in parallel into four inputs 4a, 4b, 4c and 4d of the four signal processing units or devices 999a, 999b, 999c and 999d and are processed by the signal processing units or devices 999a, 999b, 999c and 999d. The four signal processing units or devices 999a, 999b, 999c and 999d can be, but not limited to, four linear processors, four analog-to-digital (A/D) converters, four digital-to-analog (D/A) converters, four power amplifiers (PAs), four digital signal processors (DSPs), four chip packages, four integrated circuit (IC) chips, four system-on chips, four central processing units (CPUs), or four satellite transponders. Next, the four signal processing units or devices 999a, 999b, 999c and 999d output the processed signals, represented by four signals $S_1$, $S_2$, $S_3$ and $S_4$, in parallel from their outputs 5a, 5b, 5c and 5d. Next, the four signals $S_1$, $S_2$, $S_3$ and $S_4$ are transmitted in parallel to the four inputs 6a, 6b, 6c and 6d of the wave-front demultiplexer 232. The signal $S_1$ output from the output 5a of the unit or device 999a is correspondent to and processed based on the signal $Y_1$ output from the output 3a of the wave-front multiplexer 213. The signal $S_2$ output from the output 5b of the unit or device 999b is correspondent to and processed based on the signal $Y_2$ output from the output 3b of the wave-front multiplexer 213. The signal $S_3$ output from the output 5c of the unit or device 999c is correspondent to and processed based on the signal $Y_3$ output from the output 3c of the wave-front multiplexer 213. The signal $S_4$ output from the output 5d of the unit or device 999d is correspondent to and processed based on the signal $Y_4$ output from the output 3d of the wave-front multiplexer 213.

After the four signals $S_1$, $S_2$, $S_3$ and $S_4$ input in parallel to the four inputs 6a, 6b, 6c and 6d of the wave-front demultiplexer 232, the wave-front demultiplexer 232 performs the wave-front demultiplexing transform to multiply the four input signals $S_1$, $S_2$, $S_3$ and $S_4$, represented by a 4×1 input matrix D, by an orthogonal 4×4 matrix E so as to obtain four output signals $Z_1$, $Z_2$, $Z_3$ and $Z_4$ represented by a 4×1 output matrix F and then outputs the four output signals $Z_1$, $Z_2$, $Z_3$ and $Z_4$ from its outputs 7a, 7b, 7c and 7d. The matrix E is a square matrix, and the transpose of the matrix E is equal to the inverse of the matrix E. The below formula (2) illustrates the input matrix D multiplied by the orthogonal matrix E, performed on the wave-front demultiplexer 232.

$$\text{matrix } D = \begin{bmatrix} S_1 \\ S_2 \\ S_3 \\ S_4 \end{bmatrix} \quad (2)$$

$$\text{matrix } E = \begin{bmatrix} D_{11} & D_{12} & D_{13} & D_{14} \\ D_{21} & D_{22} & D_{23} & D_{24} \\ D_{31} & D_{32} & D_{33} & D_{34} \\ D_{41} & D_{42} & D_{43} & D_{44} \end{bmatrix}$$

matrix
$$F = \begin{bmatrix} D_{11}S_1 + D_{12}S_2 + D_{13}S_3 + D_{14}S_4 \\ D_{21}S_1 + D_{22}S_2 + D_{23}S_3 + D_{24}S_4 \\ D_{31}S_1 + D_{32}S_2 + D_{33}S_3 + D_{34}S_4 \\ D_{41}S_1 + D_{42}S_2 + D_{43}S_3 + D_{44}S_4 \end{bmatrix} \begin{bmatrix} D_{11} & D_{12} & D_{13} & D_{14} \\ D_{21} & D_{22} & D_{23} & D_{24} \\ D_{31} & D_{32} & D_{33} & D_{34} \\ D_{41} & D_{42} & D_{43} & D_{44} \end{bmatrix}$$

$$\begin{bmatrix} S_1 \\ S_2 \\ S_3 \\ S_4 \end{bmatrix} = \begin{bmatrix} D_{11}S_1 + D_{12}S_2 + D_{13}S_3 + D_{14}S_4 \\ D_{21}S_1 + D_{22}S_2 + D_{23}S_3 + D_{24}S_4 \\ D_{31}S_1 + D_{32}S_2 + D_{33}S_3 + D_{34}S_4 \\ D_{41}S_1 + D_{42}S_2 + D_{43}S_3 + D_{44}S_4 \end{bmatrix} = \begin{bmatrix} Z_1 \\ Z_2 \\ Z_3 \\ Z_4 \end{bmatrix}$$

The components associated with the input $S_1$ in the four outputs are in the forms of $D_{11}S_1$, $D_{21}S_1$, $D_{31}S_1$ and $D_{41}S_1$. The weighting distribution of the components associated with the input $S_1$ in the four outputs is characterized by a first column vector, i.e. first wave-front demultiplexing vector (WFDV1), where $$WFDV1 = \begin{bmatrix} D_{11} \\ D_{21} \\ D_{31} \\ D_{41} \end{bmatrix}$$

Similarly, the components associated with the input $S_2$ in the four outputs are in the forms of $D_{12}S_2$, $D_{22}S_2$, $D_{32}S_2$ and $D_{42}S_2$. The weighting distribution of the components associated with the input $S_2$ in the four outputs is characterized by a second column vector, i.e. second wave-front demultiplexing vector (WFDV2), where $$WFDV2 = \begin{bmatrix} D_{12} \\ D_{22} \\ D_{32} \\ D_{42} \end{bmatrix}$$

The components associated with the input $S_3$ in the four outputs are in the forms of $D_{13}S_3$, $D_{23}S_3$, $D_{33}S_3$ and $D_{43}S_3$. The weighting distribution of the components associated with the input $S_3$ in the four outputs is characterized by a third column vector, i.e. third wave-front demultiplexing vector (WFDV3), where $$WFDV3 = \begin{bmatrix} D_{13} \\ D_{23} \\ D_{33} \\ D_{43} \end{bmatrix}$$

The components associated with the input $S_4$ in the four outputs are in the forms of $D_{14}S_4$, $D_{24}S_4$, $D_{34}S_4$ and $D_{44}S_4$. The weighting distribution of the components associated with the input $S_4$ in the four outputs is characterized by a fourth column vector, i.e. fourth wave-front demultiplexing vector (WFDV4), where $$WFDV4 = \begin{bmatrix} D_{14} \\ D_{24} \\ D_{34} \\ D_{44} \end{bmatrix}$$

The first and second wave-front demultiplexing vectors are mutually orthogonal to each other. The first and third wave-front demultiplexing vectors are mutually orthogonal to each other. The first and fourth wave-front demultiplexing vectors are mutually orthogonal to each other. The second and third wave-front demultiplexing vectors are mutually orthogonal to each other. The second and fourth wave-front demultiplexing vectors are mutually orthogonal to each other. The third and fourth wave-front demultiplexing vectors are mutually orthogonal to each other.

The output signal $Z_1$ is a linear combination, i.e. weighted sum, of all input signals $S_1$, $S_2$, $S_3$ and $S_4$ multiplied by the weightings $D_{11}$, $D_{12}$, $D_{13}$, and $D_{14}$, respectively. That is, the output signal $Z_1$ can be represented by a linear combination of $D_{11}S_1$ plus $D_{12}S_2$ plus $D_{13}S_3$ plus $D_{14}S_4$. The output signal $Z_2$ is a linear combination, i.e. weighted sum, of all input signals $S_1$, $S_2$, $S_3$ and $S_4$ multiplied by the weightings $D_{21}$, $D_{22}$, $D_{23}$, and $D_{24}$, respectively. That is, the output signal $Z_2$ can be represented by a linear combination of $D_{21}S_1$ plus $D_{22}S_2$ plus $D_{23}S_3$ plus $D_{24}S_4$. The output signal $Z_3$ is a linear combination, i.e. weighted sum, of all input signals $S_1$, $S_2$, $S_3$ and $S_4$ multiplied by the weightings $D_{31}$, $D_{32}$, $D_{33}$, and $D_{34}$, respectively. That is, the output signal $Z_3$ can be represented by a linear combination of $D_{31}S_1$ plus $D_{32}S_2$ plus $D_{33}S_3$ plus $D_{34}S_4$. The output signal $Z_4$ is a linear combination, i.e. weighted sum, of all input signals $S_1$, $S_2$, $S_3$ and $S_4$ multiplied by the weightings $D_{41}$, $D_{42}$, $D_{43}$, and $D_{44}$, respectively. That is, the output signal $Z_4$ can be represented by a linear combination of $D_{41}S_1$ plus $D_{42}S_2$ plus $D_{43}S_3$ plus $D_{44}S_4$.

Therefore, each of the output signals $Z_1$, $Z_2$, $Z_3$ and $Z_4$ output from the wave-front demultiplexer 232 is a linear combination, i.e. weighted sum, of all input signals $S_1$, $S_2$, $S_3$ and $S_4$ multiplied by respective weightings, and distributions of the weightings of any two input components in the four output signals are orthogonal. The weightings include $D_{11}$, $D_{12}$, $D_{13}$ and $D_{14}$ for the input signals $S_1$, $S_2$, $S_3$ and $S_4$, respectively, in the output signal $Z_1$, include $D_{21}$, $D_{22}$, $D_{23}$ and $D_{24}$ for the input signals $S_1$, $S_2$, $S_3$ and $S_4$, respectively, in the output signal $Z_2$, include $D_{31}$, $D_{32}$, $D_{33}$ and $D_{34}$ for the input signals $S_1$, $S_2$, $S_3$ and $S_4$, respectively, in the output signal $Z_3$, and include $D_{41}$, $D_{42}$, $D_{43}$ and $D_{44}$ for the input signals $S_1$, $S_2$, $S_3$ and $S_4$, respectively, in the output signal $Z_4$.

In other words, each of the output signals $Z_1$, $Z_2$, $Z_3$ and $Z_4$ is processed by multiple factors including the input signals $S_1$, $S_2$, $S_3$ and $S_4$ and the corresponding weightings. For the output signal $Z_1$, the factors include the input signals $S_1$, $S_2$, $S_3$ and $S_4$ and the weightings $D_{11}$, $D_{12}$, $D_{13}$ and $D_{14}$. For the output signal $Z_2$, the factors include the input signals $S_1$, $S_2$, $S_3$ and $S_4$ and the weightings $D_{21}$, $D_{22}$, $D_{23}$ and $D_{24}$. For the output signal $Z_3$, the factors include the input signals $S_1$, $S_2$, $S_3$ and $S_4$ and the weightings $D_{31}$, $D_{32}$, $D_{33}$ and $D_{34}$. For the output signal $Z_4$, the factors include the input signals $S_1$, $S_2$, $S_3$ and $S_4$ and the weightings $D_{41}$, $D_{42}$, $D_{43}$ and $D_{44}$.

Therefore, each of the signals $Z_1$, $Z_2$, $Z_3$ and $Z_4$ output from the wave-front multiplexer 232 is correspondent to or carries information associated with one of the signal $X_1$, $X_2$, $X_3$ and $X_4$ input to the wave-front multiplexer 213.

The matrix B and the matrix E, for example, can be equal. That is, the weightings at the same column and row in the matrix B and the matrix E have the same values, and the matrix B has the same number of rows and columns as the matrix E. In other words, the matrix B and the matrix E have the same dimensions and have the same values at the same positions. For instance, the weighting $C_{11}$ of the matrix B may have a value equal to the value of the weighting $D_{11}$ of the matrix E. The weighting $C_{12}$ of the matrix B may have a value equal to the value of the weighting $D_{12}$ of the matrix E. The weighting $C_{13}$ of the matrix B may have a value equal to the value of the weighting $D_{13}$ of the matrix E. The weighting $C_{14}$ of the matrix B may have a value equal to the value of the weighting $D_{14}$ of the matrix E. The weighting $C_{21}$ of the matrix B may have a value equal to the value of the weighting $D_{21}$ of the matrix E. The weighting $C_{22}$ of the matrix B may have a value equal to the value of the weighting $D_{22}$ of the matrix E. The weighting $C_{23}$ of the matrix B may have a value equal to the value of the weighting $D_{23}$ of the matrix E. The weighting $C_{24}$ of the matrix B may have a value equal to the value of the weighting $D_{24}$ of the matrix E. The weighting $C_{31}$ of the matrix B may have a value equal to the value of the weighting $D_{31}$ of the matrix E. The weighting $C_{32}$ of the matrix B may have a value equal to the value of the weighting $D_{32}$ of the matrix E. The weighting $C_{33}$ of the matrix B may have a value equal to the value of the weighting $D_{33}$ of the matrix E. The weighting $C_{34}$ of the matrix B may have a value equal to the value of the weighting $D_{34}$ of the matrix E. The weighting $C_{41}$ of the matrix B may have a value equal to the value of the weighting $D_{41}$ of the matrix E. The weighting $C_{42}$ of the matrix B may have a value equal to the value of the weighting $D_{42}$ of the matrix E. The weighting $C_{43}$ of the matrix B may have a value equal to the value of the weighting $D_{43}$ of the matrix E. The weighting $C_{44}$ of the matrix B may have a value equal to the value of the weighting $D_{44}$ of the matrix E.

Alternatively, the matrix E can be constructed to be equal to the matrix B multiplied by a scalar, and the matrix B and the matrix E have the same dimensions. That is, each of the weightings $D_{11}$, $D_{12}$, $D_{13}$, $D_{14}$, $D_{21}$, $D_{22}$, $D_{23}$, $D_{24}$, $D_{31}$, $D_{32}$, $D_{33}$, $D_{34}$, $D_{41}$, $D_{42}$, $D_{43}$ and $D_{44}$ in the matrix E may have a value equal to the value of the corresponding one of the weightings $C_{11}$, $C_{12}$, $C_{13}$, $C_{14}$, $C_{21}$, $C_{22}$, $C_{23}$, $C_{24}$, $C_{31}$, $C_{32}$, $C_{33}$, $C_{34}$, $C_{41}$, $C_{42}$, $C_{43}$ and $C_{44}$ in the matrix B, at the same column and row as the each of the weightings $D_{11}$, $D_{12}$, $D_{13}$, $D_{14}$, $D_{21}$, $D_{22}$, $D_{23}$, $D_{24}$, $D_{31}$, $D_{32}$, $D_{33}$, $D_{34}$, $D_{41}$, $D_{42}$, $D_{43}$ and $D_{44}$ in the matrix E, multiplied by the same scalar, and the matrix B has the same numbers of rows and columns as the matrix E. The weightings $D_{11}$, $D_{12}$, $D_{13}$, $D_{14}$, $D_{21}$, $D_{22}$, $D_{23}$, $D_{24}$, $D_{31}$, $D_{32}$, $D_{33}$, $D_{34}$, $D_{41}$, $D_{42}$, $D_{43}$ and $D_{44}$ in the matrix E may have values equal respectively to the values of the corresponding weightings $C_{11}$, $C_{12}$, $C_{13}$, $C_{14}$, $C_{21}$, $C_{22}$, $C_{23}$, $C_{24}$, $C_{31}$, $C_{32}$, $C_{33}$, $C_{34}$, $C_{41}$, $C_{42}$, $C_{43}$ and $C_{44}$ in the matrix B multiplied by the same scalar.

Alternatively, each weighting in the matrix E may have a value taking the complex conjugate of the value of the corresponding weighting in the matrix B, at the same column and row as the each weighting in the matrix E. For instance, the weighting $C_{11}$ of the matrix B has a value equal to the conjugate of the value of the weighting $D_{11}$. The weighting $C_{12}$ of the matrix B has a value equal to the conjugate of the value of the weighting $D_{12}$. The weighting $C_{13}$ of the matrix B has a value equal to the conjugate of the value of the weighting $D_{13}$. The weighting $C_{14}$ of the matrix B has a value equal to the conjugate of the value of the weighting $D_{14}$. The weighting $C_{21}$ of the matrix B has a value equal to the conjugate of the value of the weighting $D_{21}$. The weighting $C_{22}$ of the matrix B has a value equal to the conjugate of the value of the weighting $D_{22}$. The weighting $C_{23}$ of the matrix B has a value equal to the conjugate of the value of the weighting $D_{23}$. The weighting $C_{24}$ of the matrix B has a value equal to the conjugate of the value of the weighting $D_{24}$. The weighting $C_{31}$ of the matrix B has a value equal to the conjugate of the value of the weighting $D_{31}$. The weighting $C_{32}$ of the matrix B has a value equal to the conjugate of the value of the weighting $D_{32}$. The weighting $C_{33}$ of the matrix B has a value equal to the value of the conjugate of the weighting $D_{33}$. The weighting $C_{34}$ of the matrix B has a value equal to the conjugate of the value of the weighting $D_{34}$. The weighting $C_{41}$ of the matrix B has a value equal to the conjugate of the value of the weighting $D_{41}$. The weighting $C_{42}$ of the matrix B has a value equal to the conjugate of the value of the weighting $D_{42}$. The weighting $C_{43}$ of the matrix B has a value equal to the conjugate of the value of the weighting $D_{43}$. The weighting $C_{44}$ of the matrix B has a value equal to the conjugate of the value of the weighting $D_{44}$.

Alternatively, each of the weightings $D_{11}$, $D_{12}$, $D_{13}$, $D_{14}$, $D_{21}$, $D_{22}$, $D_{23}$, $D_{24}$, $D_{31}$, $D_{32}$, $D_{33}$, $D_{34}$, $D_{41}$, $D_{42}$, $D_{43}$ and $D_{44}$ in the matrix E may have a value taking the complex conjugate of the value of the corresponding one of the weightings $C_{11}$, $C_{12}$, $C_{13}$, $C_{14}$, $C_{21}$, $C_{22}$, $C_{23}$, $C_{24}$, $C_{31}$, $C_{32}$, $C_{33}$, $C_{34}$, $C_{41}$, $C_{42}$, $C_{43}$ and $C_{44}$ in the matrix B, at the same column and row as the each of the weightings $D_{11}$, $D_{12}$, $D_{13}$, $D_{14}$, $D_{21}$, $D_{22}$, $D_{23}$, $D_{24}$, $D_{31}$, $D_{32}$, $D_{33}$, $D_{34}$, $D_{41}$, $D_{42}$, $D_{43}$ and $D_{44}$ in the matrix E, multiplied by the same scalar, and the matrix B has the same numbers of rows and columns as the matrix E. The weightings $D_{11}$, $D_{12}$, $D_{13}$, $D_{14}$, $D_{21}$, $D_{22}$, $D_{23}$, $D_{24}$, $D_{31}$, $D_{32}$, $D_{33}$, $D_{34}$, $D_{41}$, $D_{42}$, $D_{43}$ and $D_{44}$ in the matrix E may have values equal respectively to the conjugates of the values of the weightings $C_{11}$, $C_{12}$, $C_{13}$, $C_{14}$, $C_{21}$, $C_{22}$, $C_{23}$, $C_{24}$, $C_{31}$, $C_{32}$, $C_{33}$, $C_{34}$, $C_{41}$, $C_{42}$, $C_{43}$ and $C_{44}$ in the matrix B multiplied by the same scalar.

Figure 1E:
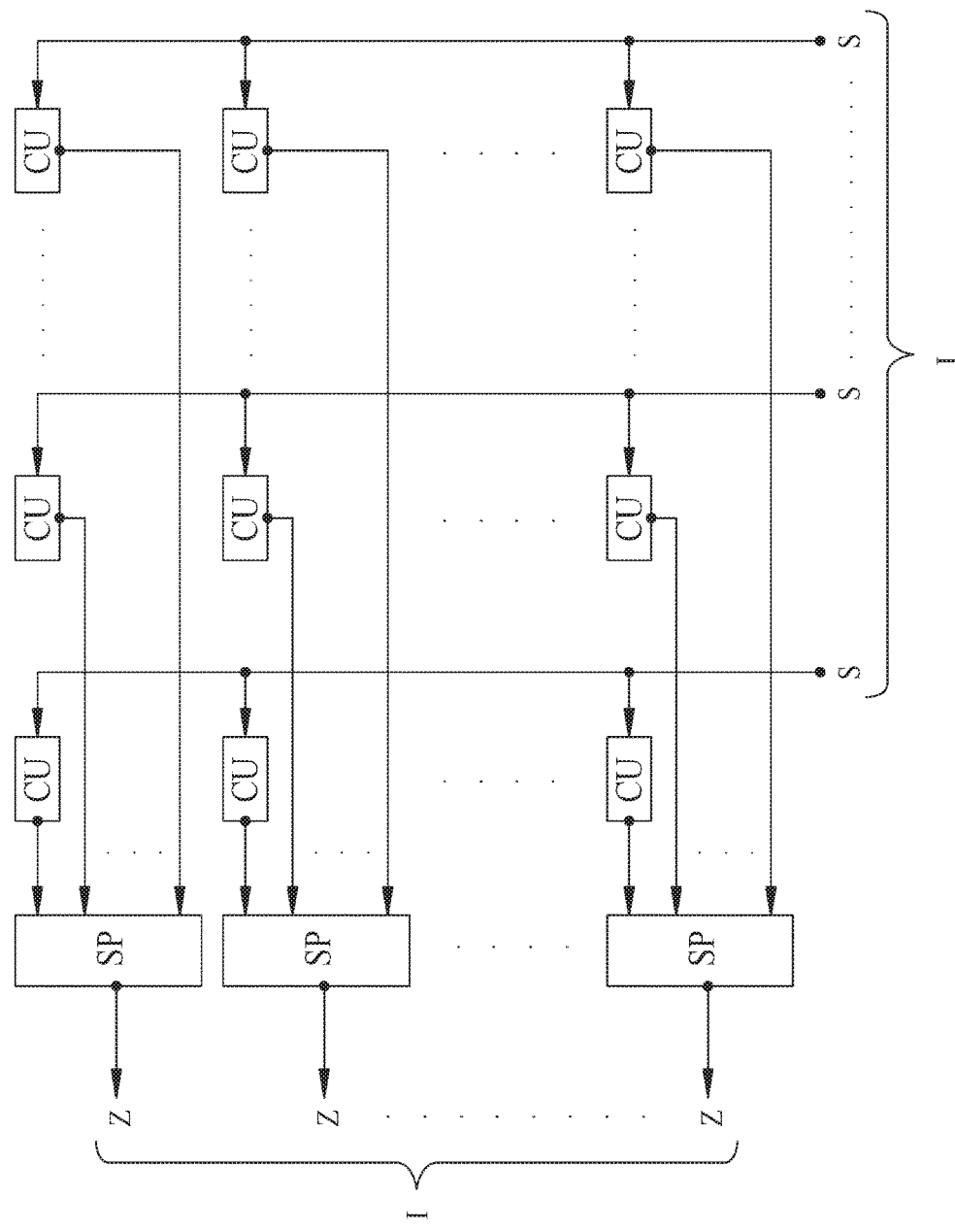
FIG. 1E shows architecture of a wave-front demultiplexer according to an embodiment of the present disclosure.

Referring to FIG. 1E showing architecture of a wave-front demultiplexer in accordance with the present invention. For more elaboration, the wave-front demultiplexer can be adapted to receive the number I of input signals S, process the number I of the input signals S to be multiplied by the above-mentioned WFDM matrix, such as I-by-I square orthogonal matrix, and output the number I of output signals Z, wherein I could be any number greater than or equal to 2, 4, 8, 16, 32, 64, 126 or 256. The input signals S can be, but not limited to, analog or digital signals. The output signals Z can be, but not limited to, analog or digital signals. The wave-front demultiplexer may include the number I*I of computing units and the number I of summing processors. The computing units form an I-by-I processor array with the number I of columns and the number I of rows. The computing units in each column in the processor array receive a corresponding input signal S, and thus the number I of the input signals S can be received by the computing units in the number I of the respective columns in the processor array. Upon receiving the input signals S, each of the computing units independently weights its received signal, multiplied by a weighting value, to generate a weighted signal. Each of the summing processors provides a means for summing weighted signals generated by the corresponding computing units in same row in the processor array to produce a corresponding output signal Z. Accordingly, the number I of the summing processors can output the number I of the output signals Z each combined with the weighted signals output from the computing units in a corresponding one of the number I of the rows in the processor array. The above-mentioned description of the wave-front demultiplexer can be applied to the following embodiments.

In the case illustrated in FIG. 1A, the number of I is equal to 4. The wave-front demultiplexer 232 illustrated in FIG. 1A may include 4*4 computing units and four summing processors. The computing units form a processor array with four rows and four columns. The four input signals $S_1$-$S_4$ illustrated in FIG. 1A can be received by the computing units in the respective four columns in the processor array. Upon receiving the four input signals $S_1$-$S_4$, each of the computing units independently weights its received signal, multiplied by a weighting value, to generate a weighted signal. The four summing processors can output the four signals $Z_1$-$Z_4$ each combined with the weighted signals output from the computing units in a corresponding one of the four rows in the processor array.

Referring to FIGS. 1A, 1D and 1E, when the above-mentioned wave-front demultiplexing transformation performed by the wave-front demultiplexer 232 having the architecture illustrated in FIG. 1E inverts or transforms signals previously transformed by the wave-front multiplexing transformation performed by its complementary wave-front multiplexer 213 having the architecture illustrated in FIG. 1D, the number of H is equal to the number of I. Each weighting for multiplying a corresponding one of the input signals X, performed by a corresponding one of the computing units of the wave-front multiplexer 213, may have the same value as the corresponding weighting for multiplying a corresponding one of the input signals S, performed by a corresponding one of the computing units of the wave-front demultiplexer 232 at the same row and column as the corresponding computing unit of the wave-front multiplexer 213. Alternatively, each weighting for multiplying a corresponding one of the input signals X, performed by a corresponding one of the computing units of the wave-front multiplexer 213, may have a value equal to that of the corresponding weighting for multiplying a corresponding one of the input signals S, performed by a corresponding one of the computing units of the wave-front demultiplexer 232 at the same row and column as the corresponding computing unit of the wave-front multiplexer 213, multiplied by the same scalar. Alternatively, each weighting for multiplying a corresponding one of the input signals X, performed by a corresponding one of the computing units of the wave-front multiplexer 213, may have a value equal to the conjugate of the value of the corresponding weighting for multiplying a corresponding one of the input signals S, performed by a corresponding one of the computing units of the wave-front demultiplexer 232 at the same row and column as the corresponding computing unit of the wave-front multiplexer 213. Alternatively, each weighting for multiplying a corresponding one of the input signals X, performed by a corresponding one of the computing units of the wave-front multiplexer 213, may have a value equal to the conjugate of the value of the corresponding weighting for multiplying a corresponding one of the input signals S, performed by a corresponding one of the computing units of the wave-front demultiplexer 232 at the same row and column as the corresponding computing unit of the wave-front multiplexer 213, multiplied by the same scalar.

Alternatively, referring to FIG. 1B, the system 888 may further include an equalizer or equalization processor 231 and an optimizer or optimization processor 235 for performing signal compensations. The system 200 shown in FIG. 1B is similar to the system 200 illustrated in FIG. 1A except that the system 200 illustrated in FIG. 1B further includes the equalizer 231 and the optimizer 235 and that the signal $X_4$ illustrated in FIG. 1A is replaced with a pilot or diagnostic signal $X_4$ shown in FIG. 1B. The pilot or diagnostic signal $X_4$ may have a single frequency and fixed amplitude. Alternatively, the pilot or diagnostic signal $X_4$ could change based on time or could be any signal known by the system 888. In contrast, the extraneous signals $X_1$, $X_2$ and $X_3$ are unknown by the system 888 and input into the system 888 from an extraneous system.

Besides, compared with the signals $S_1$, $S_2$, $S_3$ and $S_4$, in FIG. 1A, input into the wave-front demultiplexer 232, the signals $S_1$, $S_2$, $S_3$ and $S_4$, in FIG. 1B, are equalized by the equalizer 231. In this embodiment, four signals $W_1$, $W_2$, $W_3$ and $W_4$ are defined as ones output from outputs 5a, 5b, 5c and 5d of the four signal processing units or device 999a, 999b, 999c and 999d and have not been equalized by the equalizer 231.

The signal processing unit or device 999a is in a first signal path between the output 3a of the wave-front multiplexer 213 and an input 10a of the equalizer 231, being used to process an input signal, such as the signal $Y_1$ output from the output 3a, so as to output another signal, such as the signal $W_1$. The signal processing unit or device 999b is in a second signal path between the output 3b of the wave-front multiplexer 213 and an input 10b of the equalizer 231, being used to process an input signal, such as the signal $Y_2$ output from the output 3b, so as to output another signal, such as the signal $W_2$. The signal processing unit or device 999c is in a third signal path between the output 3c of the wave-front multiplexer 213 and an input 10c of the equalizer 231, being used to process an input signal, such as the signal $Y_3$ output from the output 3c, so as to output another signal, such as the signal $W_3$. The signal processing unit or device 999d is in a fourth signal path between the output 3d of the wave-front multiplexer 213 and an input 10d of the equalizer 231, being used to process an input signal, such as the signal $Y_4$ output from the output 3d, so as to output another signal, such as the signal $W_4$. The first, second, third and fourth signal paths are arranged in parallel.

The equalizer 231 is in four signal paths between the four outputs 5a, 5b, 5c and 5d of the four signal processing units or devices 999a, 999b, 999c and 999d and the input ports 6a, 6b, 6c and 6d of the wave-front demultiplexer 232. The optimizer 235 is in a signal path between the equalizer 231 and the outputs 7a, 7b, 7c and 7d of the wave-front demultiplexer 232. In this embodiment, the input signal $X_4$ input to the input 2d of the wave-front multiplexer 213 is a pilot or diagnostic signal. The output signal $Z_4$ output from the output 7d of the wave-front demultiplexer 232 is also a pilot or diagnostic signal correspondent to or carries information associated with the input signal $X_4$. The equalizer 231 can perform amplitude, phase, and time-delay compensation to adjust the amplitudes, phases, and/or time-delays of the signals $W_1$, $W_2$, $W_3$ and $W_4$. The wave-front multiplexing transform performed by the wave-front multiplexer 213 shown in FIG. 1B can be referred to as the wave-front multiplexing transform performed by the wave-front multiplexer 213 as illustrated in FIG. 1A. The wave-front demultiplexing transform performed by the wave-front demultiplexer 232 shown in FIG. 1B can be referred to as the wave-front demultiplexing transform performed by the wave-front demultiplexer 232 as illustrated in FIG. 1A.

To avoid propagation effects and/or the difference of unbalanced amplitudes, unbalanced phases and/or unbalanced time-delays among the signals $W_1$, $W_2$, $W_3$ and $W_4$ output from the units or devices 999a, 999b, 999c and 999d, the system 888 performs an optimizing and equalizing process to the signals $W_1$, $W_2$, $W_3$ and $W_4$ by the equalizer 231 and the optimization processor 235. After inputting the signals $W_1$, $W_2$, $W_3$ and $W_4$ to the inputs 10a, 10b, 10c and 10d of the equalizer 231, the equalizer 231 generates the corresponding equalized signals $S_1$, $S_2$, $S_3$ and $S_4$ according to a control signal CS output from the optimization processor 235, wherein the corresponding equalized signals $S_1$, $S_2$, $S_3$ and $S_4$ are output from its outputs 11a, 11b, 11c and 11d, respectively.

During the optimizing and equalizing process, a cost function may be used to measure the difference between the diagnostic input 2d of the wave-front multiplexer 213 and the diagnostic output 7d of the wave-front demultiplexer 232. Then, the system 888 uses the optimization processor 235 to generate the control signal CS which can be used to adjust the equalizer 231 in order to minimize the cost function. Then, an adaptive equalization is reached when the cost function is minimal and the cost function can no longer be reduced any further. The processors 231 and 235 can perform an amplitude, phase, and/or time-delay compensation.

FIG. 1C shows a flow chart of an optimizing and equalizing process performed by a system, which can be applied to all of the embodiments of the present disclosure. Referring to FIG. 1C, in step 401, an optimizer, such as the optimizer 235, e.g., illustrated in FIG. 1B, can be configured to receive one or some of output diagnostic signals from one or some of output ports of a wave-front demultiplexer such as the wave-front demultiplexer 232, e.g., illustrated in FIG. 1B. For example, the optimizer 235, e.g., illustrated in FIG. 1B can be configured to receive the signal $Z_4$ from the output port 7d of the wave-front demultiplexer 232. Alternatively, the optimizer may be configured to receive the signals from all of the output ports of the wave-front demultiplexer. For example, the optimizer 235, e.g., illustrated in FIG. 1B may be configured to receive the signals $Z_1$, $Z_2$, $Z_3$ and $Z_4$ from the output ports 7a, 7b, 7c and 7d of the wave-front demultiplexer 232.

Next, in step 402, the optimizer is configured to calculate one or some differences between values represented by the output diagnostic signals, such as the signal $Z_4$, e.g., illustrated in FIG. 1B, and corresponding predetermined values known by the system such as the system 888 illustrated in FIG. 1B, wherein one or some input diagnostic signals, such as the signal $X_4$, e.g., illustrated in FIG. 1B, input into a corresponding or complementary wave-front multiplexer, such as the wave-front multiplexer 213, e.g., illustrated in FIG. 1B, at the same sequences as the corresponding output diagnostic signals, such as the signal $Z_4$, e.g., illustrated in FIG. 1B, represent the predetermined values. Alternatively, the optimizer may be configured further to calculate a correlation between each two of the signals from all of the output ports of the wave-front demultiplexer in case that all of the signals from the output ports of the wave-front demultiplexer are received by the optimizer. For example, the optimizer 235, e.g., illustrated in FIG. 1B may be configured further to calculate correlations between the signals $Z_1$ and $Z_2$, between the signals $Z_1$ and $Z_3$, between the signals $Z_1$ and $Z_4$, between the signals $Z_2$ and $Z_3$, between the signals $Z_2$ and $Z_4$, and the signals $Z_3$ and $Z_4$ in case that all of the signals $Z_1$, $Z_2$, $Z_3$ and $Z_4$ output from the output ports 7a, 7b, 7c and 7d of the wave-front demultiplexer 232 are received by the optimizer 235.

Next, in step 403, the optimizer is configured to calculate a sum value, i.e. cost, by performing weighted summation of multiple factors including the differences. Alternatively, the factors may further include the correlations in case that the correlations are obtained.

Next, in step 404, the optimizer is configured to compare the calculated sum value or cost with a threshold sum value, i.e. threshold cost.

In step 405, the optimizer is configured to calculate a variation in the calculated sum value or cost in response to finding the calculated sum value or cost is greater than the threshold sum value or threshold cost.

After calculating the variation in step 405, step 406 is performed with the optimizer creating one or more control signals, such as the control signal CS, e.g., shown in FIG. 1B, based on the variation and sending the control signals to an equalizer, such as the equalizer 231, e.g., illustrated in FIG. 1B, so as to adjust the values of weightings of the equalizer.

In step 407, after the weightings are adjusted based on the control signals, the equalizer can equalize the received signals, such as the signals $W_1$, $W_2$, $W_3$ and $W_4$, e.g., illustrated in FIG. 1B, based on the adjusted weightings so as to output the equalized signals, such as the equalized signals $S_1$, $S_2$, $S_3$ and $S_4$, e.g., illustrated in FIG. 1B, into the wave-front demultiplexer. For example, the equalized signal $S_1$, e.g., illustrated in FIG. 1B is created by the equalizer 231 multiplying the signal $W_1$ by a weighting of the equalizer 231. The equalized signal $S_2$, e.g., illustrated in FIG. 1B is created by the equalizer 231 multiplying the signal $W_2$ by another weighting of the equalizer 231. The equalized signal $S_3$, e.g., illustrated in FIG. 1B is created by the equalizer 231 multiplying the signal $W_3$ by another weighting of the equalizer 231. The equalized signal $S_4$, e.g., illustrated in FIG. 1B is created by the equalizer 231 multiplying the signal $W_4$ by the other weighting of the equalizer 231.

Each of the weightings of the equalizer can be, but not limited to, a complex value such that the equalized signals, such as the equalized signals $S_1$, $S_2$, $S_3$ and $S_4$, e.g., illustrated in FIG. 1B, can be rotated precisely to become in phase. In case that the equalizer is performed by a narrow band equalizer, such as amplitude-and-phase filter, the narrow band equalizer can alter each of the received signals, such as the signals $W_1$, $W_2$, $W_3$ and $W_4$, e.g., illustrated in FIG. 1B, of the equalizer by amplitude and phase amounts fixed across a narrow frequency band. The narrow band equalizer can provide phase and amplitude modifications to each of the received signals, such as the signals $W_1$, $W_2$, $W_3$ and $W_4$, e.g., illustrated in FIG. 1B, of the equalizer featuring a constant phase shift and a constant amplitude attenuation across the narrow frequency band. Alternatively, in case that the equalizer is performed by a broadband equalizer, such as finite impulse filter (FIR), the broadband equalizer can alter each of the received signals, such as the signals $W_1$, $W_2$, $W_3$ and $W_4$, e.g., illustrated in FIG. 1B, of the equalizer by amplitude and phase amounts depending on an amplitude and phase profile, changing with frequencies, across a broad frequency band. The broad band equalizer can provide phase and amplitude modifications to each of the received signals, such as the signals $W_1$, $W_2$, $W_3$ and $W_4$, e.g., illustrated in FIG. 1B, of the equalizer featuring a constant phase shift and a constant amplitude attenuation in each sub-band across the broad frequency band, but the phase shift and amplitude attenuation in one sub-band across the broad frequency band is different from those in the other sub-bands across the broad frequency band.

Next, in step 408, the equalized signals, such as the equalized signals $S_1$, $S_2$, $S_3$ and $S_4$, e.g., illustrated in FIG. 1B, are transformed into multiple linear combinations by the wave-front demultiplexer performing the above-mentioned wave-front demultiplexing transformation, wherein each linear combination is combined with the equalized signals, such as the equalized signals $S_1$, $S_2$, $S_3$ and $S_4$, e.g., illustrated in FIG. 1B, multiplied by respective weightings of the wave-front demultiplexer, represented by the signals, such as the signals $Z_1$, $Z_2$, $Z_3$ and $Z_4$, e.g., illustrated in FIG. 1B, output in parallel from the output ports of the wave-front demultiplexer.

Next, step 401 is performed again so as to form the above loop of steps 401-408, as seen in FIG. 1C. In step 409, the optimizer is configured to stop the above loop in response to finding the calculated sum value or cost is less than the threshold sum value or threshold cost.

Therefore, the equalizer coupled to the optimizer can dynamically provide a compensation function to compensate the received signals, such as the signals $W_1$, $W_2$, $W_3$ and $W_4$, e.g., illustrated in FIG. 1B, of the equalizer for propagation effects and/or difference of unbalanced amplitudes, unbalanced phases, and/or unbalanced time-delays so as to improve the signals, such as the signals $Z_1$, $Z_2$, $Z_3$ and $Z_4$, e.g., illustrated in FIG. 1B, output from the wave-front demultiplexer.

In all of the embodiments of the present disclosure, the equalizer, the wave-front demultiplexer and the optimizer can be, but not limited to, embedded in a processor, such as single integrated circuit chip, single system-on chip or single chip package. The equalizer can be hardware or can be realized by software installed in and performed by the processor. The optimizer can be hardware or can be realized by software installed in and performed by the processor.

The above-mentioned descriptions of the wave-front multiplexer, the wave-front demultiplexer, the equalizer, and the optimizer can be applied to the following embodiments.

First Embodiment: Application to Analog-to-Digital Converter

Figure 2A:
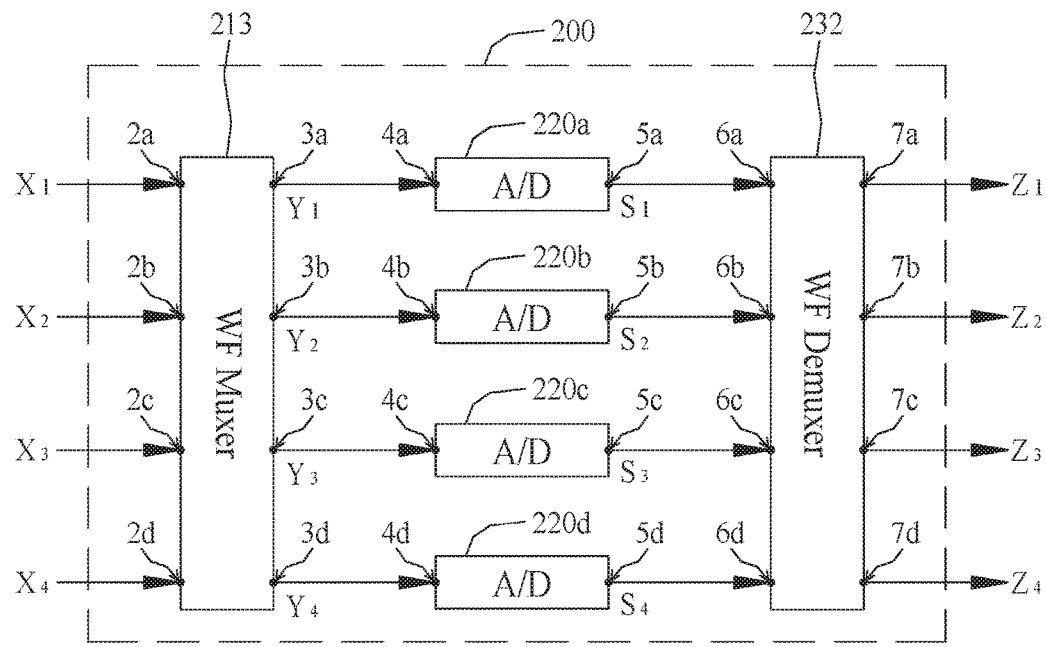
FIG. 2A shows an A/D conversion system including a wave-front multiplexer, four A/D converters and a wave-front demultiplexer according to an embodiment of the present disclosure.

FIG. 2A shows a system for converting analog signals into digital signals constructed with digital representation of the analog signals using a wave-front multiplexer, multiple analog-to-digital converters and a wave-front demultiplexer according to an exemplary embodiment of the present disclosure.

Referring to FIG. 2A, an analog-to-digital (A/D) conversion system 200 may include a wave-front multiplexer 213, four individual analog-to-digital converters (or called ADCs or A/D converters) 220a, 220b, 220c and 220d, and a wave-front demultiplexer 232. In this embodiment, the four processing units or devices 999a, 999b, 999c and 999d as illustrated in FIG. 1A can be replaced with the four analog-to-digital converters 220a, 220b, 220c and 220d illustrated in FIG. 2A.

The wave-front multiplexer 213 can receive, in parallel, four individual and independent analog signals $X_1$, $X_2$, $X_3$ and $X_4$, processes all the analog signals $X_1$, $X_2$, $X_3$ and $X_4$ into four analog signals $Y_1$, $Y_2$, $Y_3$ and $Y_4$ by the above-mentioned wave-front multiplexing transform, and outputs the analog signals $Y_1$, $Y_2$, $Y_3$ and $Y_4$ in parallel, which can be referred to as the description illustrated in FIG. 1A. Each of the analog signals $Y_1$, $Y_2$, $Y_3$ and $Y_4$ is a linear combination, i.e. weighted sum, of all the analog signals $X_1$, $X_2$, $X_3$ and $X_4$ multiplied by respective weightings, and distributions of the weightings of any two input components in all analog signals $Y_1$, $Y_2$, $Y_3$ and $Y_4$ are orthogonal, which can be referred to as the description illustrated in FIGS. 1A and 1D. In this case, the number of H is equal to 4. The wave-front multiplexer 213 may include 4*4 computing units and four summing processors. The computing units form a processor array with four rows and four columns. The input signals $X_1$-$X_4$ can be received by the computing units in the respective four columns in the processor array. Upon receiving the input signals $X_1$-$X_4$, each of the computing units independently weights its received signal, multiplied by a weighting value, to generate a weighted signal. The four summing processors can output the four signals $Y_1$-$Y_4$ each combined with the weighted signals output from the computing units in a corresponding one of the four rows in the processor array.

The wave-front multiplexer 213 can be, but not limited to, embedded in a processor. The wave-front multiplexer 213 can be, but not limited to, hardware, such as four-by-four Butler matrix or a device performing any transformation of a four-by-four orthogonal matrix.

The wave-front multiplexer 213 can be a multiple-input and multiple-output (MIMO) one that has at least as many output signal paths as there exist input signal paths connected to the wave-front multiplexer 213. For example, the wave-front multiplexer 213 may have four input ports (i.e. inputs) 2a, 2b, 2c and 2d that are arranged in parallel and available to receiving the analog signals $X_1$, $X_2$, $X_3$ and $X_4$ passing in parallel through four parallel input channels, and four output ports (i.e. outputs) 3a, 3b, 3c and 3d that are arranged in parallel and available to outputting the analog signals $Y_1$, $Y_2$, $Y_3$ and $Y_4$ passing in parallel through four parallel output channels.

Alternatively, the wave-front multiplexer 213 can be applied for processing or calculating for multiple linear combinations to multiple analog input signals, passing in parallel through multiple input channels, received by multiple parallel input ports of the wave-front multiplexer 213 so as to output multiple analog output signals in parallel from multiple parallel output ports of the wave-front multiplexer 213, and then the analog output signals pass in parallel through parallel output channels coupled to the parallel output ports of the wave-front multiplexer 213 and to multiple parallel input ports of multiple analog-to-digital converters. The total number of the parallel input ports of the wave-front multiplexer 213 may be equal to the total number of the parallel output ports of the wave-front multiplexer 213 and can be any number equal to or more than two, four, eight, sixteen or thirty-two. The total number of the parallel input channels is equal to the total number of the parallel output channels and can be any number equal to or more than two, four, eight, sixteen or thirty-two. The total number of the analog input signals to be processed or calculated in parallel by the wave-front multiplexer 213 for the above linear combinations can be equal to or less than the total number of the parallel input ports of the wave-front multiplexer 213 and can be any number equal to or more than two, four, eight, sixteen or thirty-two. The total number of the analog output signals, passing in parallel, processed or calculated by the wave-front multiplexer 213 for the above linear combinations can be equal to the total number of the parallel output ports and can be any number equal to or more than two, four, eight, sixteen or thirty-two. The total number of the analog-to-digital converters can be equal to or less than the total number of the analog output signals and can be any number equal to or more than two, four, eight, sixteen or thirty-two.

The wave-front demultiplexer 232 can receive, in parallel, multiple individual digital signals $S_1$, $S_2$, $S_3$ and $S_4$ output in parallel from the analog-to-digital converters 220a, 220b, 220c and 220d, extracts multiple coherently combined digital signals $Z_1$, $Z_2$, $Z_3$ and $Z_4$, which are digital representations of the analog signals $X_1$, $X_2$, $X_3$ and $X_4$, from the digital signals $S_1$, $S_2$, $S_3$ and $S_4$ by the above-mentioned wave-front demultiplexing transform, and outputs the digital signals $Z_1$, $Z_2$, $Z_3$ and $Z_4$ in parallel, which can be referred to as the description illustrated in FIG. 1A. Each of the digital signals $Z_1$, $Z_2$, $Z_3$ and $Z_4$ is a linear combination, i.e. weighted sum, of all the digital signals $S_1$, $S_2$, $S_3$ and $S_4$ multiplied by respective weightings, and distributions of the weightings of any two input components in all digital signals $Z_1$, $Z_2$, $Z_3$ and $Z_4$ are orthogonal, which can be referred to as the description illustrated in FIGS. 1A and 1E. In this case, the number of I is equal to 4. The wave-front demultiplexer 232 may include 4*4 computing units and four summing processors. The computing units form a processor array with four rows and four columns. The input signals $S_1$-$S_4$ can be received by the computing units in the respective four columns in the processor array. Upon receiving the input signals $S_1$-$S_4$, each of the computing units independently weights its received signal, multiplied by a weighting value, to generate a weighted signal. The four summing processors can output the four signals $Z_1$-$Z_4$ each combined with the weighted signals output from the computing units in a corresponding one of the four rows in the processor array. Each of the digital signals $Z_1$, $Z_2$, $Z_3$ and $Z_4$ can be, but not limited to, an intermediate-frequency (IF) digital signal or a radio-frequency (RF) digital signal.

The wave-front demultiplexer 232 can be, but not limited to, embedded in a processor. The wave-front demultiplexer 232 can be hardware achieving the wave-front demultiplexing transform, such as IFFT chip, four-by-four Butler matrix, or a device performing inverse Fourier transformation, inverse discrete Fourier transformation, inverse Hartley transformation, Hadamard transformation, any other inverse Fourier-related transformation, or any transformation of a four-by-four orthogonal matrix. Alternatively, the function of the wave-front demultiplexer 232 can be realized by software installed in and performed by the processor, wherein the software can perform the above wave-front demultiplexing transform.

The wave-front demultiplexer 232 can be a multiple-input and multiple-output (MIMO) one that has at least as many parallel output channels as there exist parallel input channels connected to the wave-front demultiplexer 232. For example, the wave-front demultiplexer 232 may have four input ports (i.e. inputs) 6a, 6b, 6c and 6d that are arranged in parallel and available to receiving the digital signals $S_1$, $S_2$, $S_3$ and $S_4$ passing in parallel through four parallel input channels, and four output ports (i.e. outputs) 7a, 7b, 7c and 7d that are arranged in parallel and available to outputting the digital signals $Z_1$, $Z_2$, $Z_3$ and $Z_4$ passing in parallel through four parallel output channels.

Alternatively, the wave-front demultiplexer 232 can be applied for processing or calculating for multiple linear combinations to multiple digital input signals, output from multiple analog-to-digital converters, passing in parallel through parallel input channels, received by multiple parallel input ports of the wave-front demultiplexer 232 so as to output multiple digital output signals in parallel from multiple parallel output ports of the wave-front demultiplexer 232, and then the digital output signals pass in parallel through parallel output channels coupled to the output ports of the wave-front demultiplexer 232. The total number of the parallel input ports of the wave-front demultiplexer 232 may be equal to the total number of the parallel output ports of the wave-front demultiplexer 232 and can be any number equal to or more than two, four, eight, sixteen or thirty-two. The total number of the parallel input channels may be equal to the total number of the parallel output channels and can be any number equal to or more than two, four, eight, sixteen or thirty-two. The total number of the digital input signals to be processed or calculated in parallel by the wave-front demultiplexer 232 for the linear combinations can be equal to the total number of the parallel input ports of the wave-front demultiplexer 232 and can be any number equal to or more than two, four, eight, sixteen or thirty-two. The total number of the digital output signals, passing in parallel, processed or calculated by the wave-front demultiplexer 232 for the linear combinations can be equal to or less than the total number of the parallel output ports of the wave-front demultiplexer 232 and can be any number equal to or more than two, four, eight, sixteen or thirty-two. The total number of the analog-to-digital converters can be equal to or less than the total number of the digital input signals and can be any number equal to or more than two, four, eight, sixteen or thirty-two. The total number of the analog input signals input in parallel into the wave-front multiplexer 213 may be equal to the total number of the digital output signals output in parallel from the wave-front demultiplexer 232, and the digital output signals output in parallel from the wave-front demultiplexer 232 are digital representations of the analog input signals input in parallel into the wave-front multiplexer 213, respectively.

The four analog-to-digital converters 220a, 220b, 220c and 220d are arranged in four parallel signal paths between the wave-front multiplexer 213 and the wave-front demultiplexer 232 of the system 200. In other words, the analog-to-digital converter 220a is arranged in a first signal path between the output port 3a of the wave-front multiplexer 213 and the input port 6a of the wave-front demultiplexer 232 of the system 200, and the first signal path includes the A/D converter 220a, a signal path between the output port 3a of the wave-front multiplexer 213 and the input port 4a of the A/D converter 220a, and a signal path between the output port 5a of the A/D converter 220a and the input port 6a of the wave-front demultiplexer 232. The analog-to-digital converter 220b is arranged in a second signal path between the output port 3b of the wave-front multiplexer 213 and the input port 6b of the wave-front demultiplexer 232 of the system 200, and the second signal path includes the A/D converter 220b, a signal path between the output port 3b of the wave-front multiplexer 213 and the input port 4b of the A/D converter 220b, and a signal path between the output port 5b of the A/D converter 220b and the input port 6b of the wave-front demultiplexer 232. The analog-to-digital converter 220c is arranged in a third signal path between the output port 3c of the wave-front multiplexer 213 and the input port 6c of the wave-front demultiplexer 232 of the system 200, and the third signal path includes the A/D converter 220c, a signal path between the output port 3c of the wave-front multiplexer 213 and the input port 4c of the A/D converter 220c, and a signal path between the output port 5c of the A/D converter 220c and the input port 6c of the wave-front demultiplexer 232. The analog-to-digital converter 220d is arranged in a fourth signal path between the output port 3d of the wave-front multiplexer 213 and the input port 6d of the wave-front demultiplexer 232 of the system 200, and the fourth signal path includes the A/D converter 220d, a signal path between the output port 3d of the wave-front multiplexer 213 and the input port 4d of the A/D converter 220d, and a signal path between the output port 5d of the A/D converter 220d and the input port 6d of the wave-front demultiplexer 232.

Each of the analog-to-digital converters 220a, 220b, 220c and 220d can convert an analog signal into a digital representation of the analog signal. Each of the analog-to-digital converters 220a, 220b, 220c and 220d can be, but not limited to, a parallel-output analog-to-digital converter or a serial-output analog-to-digital converter. For instance, each of the analog-to-digital converters 220a, 220b, 220c and 220d can be a parallel-output one having an output port, such as output port 5a, 5b, 5c or 5d, with multiple parallel output nodes for outputting a digital representation of an analog signal, represented by the digital signal $S_1$, $S_2$, $S_3$ or $S_4$. The digital signals $S_1$, $S_2$, $S_3$ and $S_4$ passing in parallel can be transmitted to parallel input ports of a device or processor, such as the parallel input ports 6a, 6b, 6c or 6d of the wave-front demultiplexer 232, through parallel channels (such as wireless channels or physical channels) coupled to the parallel output ports 5a, 5b, 5c and 5d, respectively, and to the parallel input ports of the device or processor, respectively.

Each of the analog-to-digital converters 220a, 220b, 220c and 220d, for example, may have the same sampling rate or sampling frequency, based on which analog-to-digital conversions are performed by the analog-to-digital converters 220a, 220b, 220c and 220d. Alternatively, each of the analog-to-digital converters 220a, 220b, 220c and 220d may have different sampling rates or sampling frequencies, based on which analog-to-digital conversions are performed by the analog-to-digital converters 220a, 220b, 220c and 220d.

Each of the analog-to-digital converters 220a, 220b, 220c and 220d, for example, may have the same analog-to-digital conversion resolution, based on which analog-to-digital conversions are performed by the analog-to-digital converters 220a, 220b, 220c and 220d. Alternatively, each of the analog-to-digital converters 220a, 220b, 220c and 220d may have different analog-to-digital conversion resolutions, based on which analog-to-digital conversions are performed by the analog-to-digital converters 220a, 220b, 220c and 220d.

Alternatively, multiple analog-to-digital converters arranged in parallel can be arranged in multiple parallel signal paths between the wave-front multiplexer 213 and the wave-front demultiplexer 232 of the system 200 and can perform analog-to-digital conversions to multiple analog signals, passing in parallel through multiple parallel channels and output from parallel output ports of the wave-front multiplexer 213, so as to convert the analog signals into multiple digital signals, respectively, which are digital representations of the analog signals. The total number of the analog-to-digital convertors processing the analog signals output in parallel from the wave-front multiplexer 213 may be equal to or less than the total number of the parallel output ports of the wave-front multiplexer 213, may be equal to or less than the total number of the parallel input ports of the wave-front de-multiplexer 232, and can be any number equal to or more than two, four, eight, sixteen or thirty-two.

The system 200 may further include four low pass filters, respectively, in four signal paths before the input ports 2a, 2b, 2c and 2d of the wave-front multiplexer 213. In other words, the four extraneous analog signals $X_1$, $X_2$, $X_3$ and $X_4$ may be output in parallel from the four low pass filters, respectively, such that each of the analog signals $X_1$, $X_2$, $X_3$ and $X_4$ has attenuated parts with frequencies higher than a cutoff frequency, and then the analog signals $X_1$, $X_2$, $X_3$ and $X_4$ are transmitted into the parallel input ports 2a, 2b, 2c and 2d of the wave-front multiplexer 213, respectively, through, e.g., four parallel channels, such as wireless channels or physical channels.

A method for processing signals or data streams by using the system 200 is described below. The individual analog signals $X_1$, $X_2$, $X_3$ and $X_4$ from, e.g., one or more wireless base stations or array elements such as antenna array elements are input in parallel to the input ports 2a, 2b, 2c and 2d of the wave-front multiplexer 213 through, e.g., four parallel signal paths, four parallel wireless channels or four parallel physical channels. Each of the wireless base stations can be, but not limited to, a mobile base station or a Wi-Fi base station. Alternatively, the analog signals $X_1$, $X_2$, $X_3$ and $X_4$ can come from, but not limited to, one or more microphone devices, one or more image sensors, one or more micro-electro-mechanical-system (MEMS) microphone chips, or one or more antennas of a mobile phone. After the analog signals $X_1$, $X_2$, $X_3$ and $X_4$ are input in parallel to the wave-front multiplexer 213, the wave-front multiplexer 213 performs the above-mentioned wave-front multiplexing transformation to process the individual analog signals $X_1$, $X_2$, $X_3$ and $X_4$ into four linear combinations, each combined with the analog signals $X_1$, $X_2$, $X_3$ and $X_4$ multiplied by respective weightings, represented by the analog signals $Y_1$, $Y_2$, $Y_3$ and $Y_4$. Next, the wave-front multiplexer 213 outputs the four analog signals $Y_1$, $Y_2$, $Y_3$ and $Y_4$ from the four output ports 3a, 3b, 3c and 3d, and the four analog signals $Y_1$, $Y_2$, $Y_3$ and $Y_4$ are transmitted into the four input ports 4a, 4b, 4c and 4d of the four analog-to-digital converters 220a, 220b, 220c and 220d, respectively, through, e.g., four parallel channels, such as wireless channels or physical channels.

After the analog signals $Y_1$, $Y_2$, $Y_3$ and $Y_4$ are transmitted in parallel into the analog-to-digital converters 220a, 220b, 220c and 220d arranged in parallel, the analog-to-digital converters 220a, 220b, 220c and 220d transform the analog signals $Y_1$, $Y_2$, $Y_3$ and $Y_4$ into digital representations of the analog signals $Y_1$, $Y_2$, $Y_3$ and $Y_4$, represented by the digital signals $S_1$, $S_2$, $S_3$ and $S_4$ respectively, and output the four digital signals $S_1$, $S_2$, $S_3$ and $S_4$ in parallel from the four output ports 5a, 5b, 5c and 5d of the analog-to-digital converters 220a, 220b, 220c and 220d. The analog signals $Y_1$, $Y_2$, $Y_3$ and $Y_4$ may be sampled at the same sampling frequency or at different sampling frequencies by the analog-to-digital converters 220a, 220b, 220c and 220d. The analog-to-digital converters 220a, 220b, 220c and 220d, for example, could be realized by four integrated circuit chips embedded in a single chip package, by four integrated circuit chips embedded in four individual chip packages, or by a single integrated circuit chip. Alternatively, the function of the analog-to-digital converters 220a, 220b, 220c and 220d can be realized by software installed in the system 200.

Next, the digital signals $S_1$, $S_2$, $S_3$ and $S_4$ are transmitted in parallel into the four input ports 6a, 6b, 6c and 6d of the wave-front demultiplexer 232 through, e.g., four parallel channels, such as wireless channels or physical channels. The input ports 6a, 6b, 6c and 6d are arranged in parallel. Next, the wave-front demultiplexer 232 performs the above-mentioned wave-front demultiplexing transformation to process the digital signals $S_1$, $S_2$, $S_3$ and $S_4$ into multiple linear combinations, each combined with the digital signals $S_1$, $S_2$, $S_3$ and $S_4$ multiplied by respective weightings, represented by the digital signals $Z_1$, $Z_2$, $Z_3$ and $Z_4$ output in parallel from the four parallel output ports 7a, 7b, 7c and 7d of the wave-front demultiplexer 232. The digital signals $Z_1$, $Z_2$, $Z_3$ and $Z_4$ are digital representations of the analog signals $X_1$, $X_2$, $X_3$ and $X_4$, respectively. The four output ports 7a, 7b, 7c and 7d are arranged in parallel.

According to another exemplary embodiment of the present disclosure, three of the four analog signals $X_1$, $X_2$, $X_3$ and $X_4$ illustrated in FIG. 2A can be replaced with three analog pilot or diagnostic signals. That is, the system 200 illustrated in FIG. 2A can receive one extraneous analog signal $X_1$ and three analog pilot or diagnostic signals $X_2$, $X_3$ and $X_4$ and sends the four signals $X_1$, $X_2$, $X_3$ and $X_4$ to the input ports 2a, 2b, 2c and 2d of the wave-front multiplexer 213. Each of the analog pilot or diagnostic signals $X_2$, $X_3$ and $X_4$ may have a single frequency and fixed amplitude. Next, the signals $X_1$, $X_2$, $X_3$ and $X_4$ are processed by the wave-front multiplexer 213, the analog-to-digital converters 220a, 220b, 220c and 220d, and the wave-front demultiplexer 232, as mentioned above. Next, the wave-front demultiplexer 232 outputs a digital representation of the extraneous analog signal $X_1$, represented by the digital signal $Z_1$, and outputs digital representations of the analog pilot or diagnostic signals $X_2$, $X_3$ and $X_4$, represented by the digital signals $Z_2$, $Z_3$ and $Z_4$. Alternatively, each of the analog pilot or diagnostic signals $X_2$, $X_3$ and $X_4$ could change based on time or could be any signal known by the system 200. The extraneous analog signal $X_1$ is unknown by the system 200 and input into the system 200 from an extraneous system.

According to another exemplary embodiment of the present disclosure, one of the four analog signals $X_1$, $X_2$, $X_3$ and $X_4$ illustrated in FIG. 2A can be replaced with an analog ground signal. For example, three extraneous analog signals $X_1$, $X_2$ and $X_3$ that could be independent to one another and one analog ground signal $X_4$ are input to the input ports 2a, 2b, 2c and 2d of the wave-front multiplexer 213 illustrated in FIG. 2A. Next, the signals $X_1$, $X_2$, $X_3$ and $X_4$ are processed by the wave-front multiplexer 213, the analog-to-digital converters 220a, 220b, 220c and 220d, and the wave-front demultiplexer 232, as mentioned above. Next, the wave-front demultiplexer 232 outputs three digital representations of the three extraneous analog signals $X_1$, $X_2$ and $X_3$, represented by the three digital signals $Z_1$, $Z_2$ and $Z_3$, and outputs a digital representation of the analog ground signal $X_4$, represented by the digital signal $Z_4$.

Figure 2B:
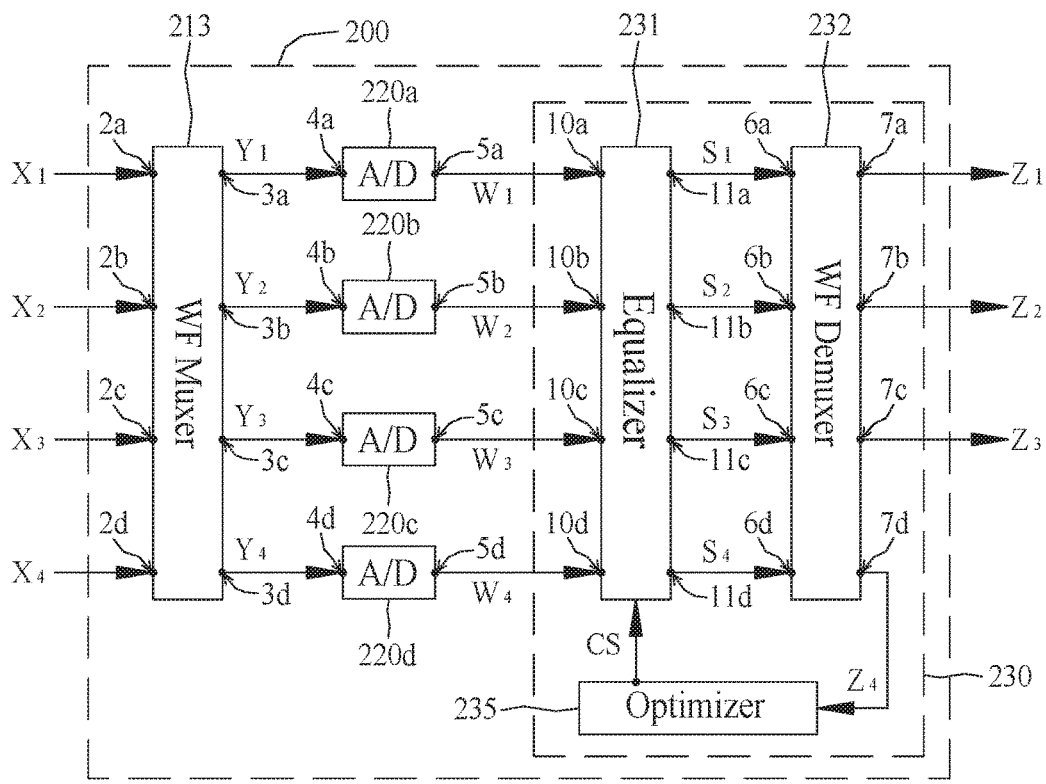
FIG. 2B shows an A/D conversion system including a wave-front multiplexer, four A/D converters, a wave-front demultiplexer, an equalizer and an optimizer according to an embodiment of the present disclosure.

According to another exemplary embodiment of the present disclosure, the system 200 may further include an equalizer and an optimizer to dynamically adjust digital signals output from analog-to-digital converters before the digital signals are transmitted into the wave-front demultiplexer 232. FIG. 2B shows an example illustrating how the system 200 optimizes, compensates and/or equalizes four digital signals $W_1$, $W_2$, $W_3$ and $W_4$, output from the analog-to-digital converters 200a, 200b, 200c and 200d, based on factors including a variation in a pilot or diagnostic signal $Z_4$ output from the wavefront demultiplexer 232 and the correlations between each two of the digital signals $Z_1$, $Z_2$, $Z_3$ and $Z_4$.

Referring to FIG. 2B, an analog-to-digital conversion system 200 may include a wave-front multiplexer 213, four individual analog-to-digital converters 220a, 220b, 220c and 220d, an equalizer or equalization processor 231, a wave-front demultiplexer 232, and an optimizer or optimization processor 235. The system 200 illustrated in FIG. 2B is similar to the system 200 illustrated in FIG. 2A except that the system 200 illustrated in FIG. 2B further includes the equalizer 231 and the optimizer 235 and that the extraneous analog signal $X_4$ illustrated in FIG. 2A is replaced with an analog pilot or diagnostic signal $X_4$ shown in FIG. 2B. In this embodiment, the four processing units or devices 999a, 999b, 999c and 999d as illustrated in FIG. 1B can be replaced with the four analog-to-digital converters 220a, 220b, 220c and 220d illustrated in FIG. 2B.

A method for processing signals or data streams by using the system 200 shown in FIG. 2B is described below. Three extraneous analog signals $X_1$, $X_2$ and $X_3$ from, e.g., one or more wireless base stations or array elements such as antenna array elements and the pilot or diagnostic signal $X_4$ are input in parallel to input ports 2a, 2b, 2c and 2d of the wave-front multiplexer 213 through, e.g., four parallel signal paths, four parallel wireless channels or four parallel physical channels. Each of the wireless base stations can be, but not limited to, a mobile base station or a Wi-Fi base station. Alternatively, the analog signals $X_1$, $X_2$ and $X_3$ can come from, but not limited to, one or more microphone devices, one or more image sensors, one or more MEMS microphone chips, or one or more antennas of a mobile phone.

The extraneous analog signals $X_1$, $X_2$ and $X_3$ could be independent from one another. The pilot or diagnostic signal $X_4$ may have a single frequency and fixed amplitude. Alternatively, the analog pilot or diagnostic signal $X_4$ could change based on time or could be any signal known by the system 200. The extraneous analog signals $X_1$, $X_2$ and $X_3$ are unknown by the system 200 and input into the system 200 from an extraneous system.

Next, the wave-front multiplexer 213 performs the above wave-front multiplexing transformation to process the signals $X_1$, $X_2$, $X_3$ and $X_4$ into multiple linear combinations, each combined with the signals $X_1$, $X_2$, $X_3$ and $X_4$ multiplied by respective weightings, represented by four analog signals $Y_1$, $Y_2$, $Y_3$ and $Y_4$. Next, the wave-front multiplexer 213 outputs the analog signals $Y_1$, $Y_2$, $Y_3$ and $Y_4$ from its output ports 3a, 3b, 3c and 3d, and the analog signals $Y_1$, $Y_2$, $Y_3$ and $Y_4$ are respectively transmitted into four input ports 4a, 4b, 4c and 4d of the four analog-to-digital converters 220a, 220b, 220c and 220d through, e.g., four parallel channels, such as wireless channels or physical channels.

After the analog signals $Y_1$, $Y_2$, $Y_3$ and $Y_4$ are transmitted in parallel into the analog-to-digital converters 220a, 220b, 220c and 220d arranged in parallel, the analog-to-digital converters 220a, 220b, 220c and 220d convert the analog signals $Y_1$, $Y_2$, $Y_3$ and $Y_4$ into digital representations of the analog signals $Y_1$, $Y_2$, $Y_3$ and $Y_4$, respectively represented by the digital signals $W_1$, $W_2$, $W_3$ and $W_4$, and output the digital signals $W_1$, $W_2$, $W_3$ and $W_4$ in parallel from output ports 5a, 5b, 5c and 5d of the analog-to-digital converters 220a, 220b, 220c and 220d. The analog signals $Y_1$, $Y_2$, $Y_3$ and $Y_4$ may be sampled at the same sampling frequency or at different sampling frequencies by the analog-to-digital converters 220a, 220b, 220c and 220d.

Next, the digital signals $W_1$, $W_2$, $W_3$ and $W_4$ are transmitted in parallel to four input ports 10a, 10b, 10c and 10d of the equalizer 231 through, e.g., four parallel signal paths, four parallel wireless channels, or four parallel physical channels. The input ports 10a, 10b, 10c and 10d are arranged in parallel for receiving the digital signals $W_1$, $W_2$, $W_3$ and $W_4$, respectively. After the digital signals $W_1$, $W_2$, $W_3$ and $W_4$ are transmitted in parallel into the equalizer 231, an optimizing and equalizing process is performed such that the digital signals $W_1$, $W_2$, $W_3$ and $W_4$ can be compensated to be multiplied by four respective weightings by the equalizer 231, wherein the four respective weightings of the equalizer 231 can be adjusted based on a control signal CS output from the optimizer 235 and input into the equalizer 231. The optimizing and equalizing process can be referred to as the optimizing and equalizing process as illustrated in FIGS. 1B and 1C. After the optimizing and equalizing process, the equalizer 231 outputs four equalized digital signals $S_1$, $S_2$, $S_3$ and $S_4$, respectively, from its output ports 11a, 11b, 11c and 11d. The equalized digital signal $S_1$ is created by the equalizer 231 multiplying the digital signal $W_1$ by one of the weightings of the equalizer 231, the equalized digital signal $S_2$ is created by the equalizer 231 multiplying the digital signal $W_2$ by another one of the weightings of the equalizer 231, the equalized digital signal $S_3$ is created by the equalizer 231 multiplying the digital signal $W_3$ by another one of the weightings of the equalizer 231, and the equalized digital signal $S_4$ is created by the equalizer 231 multiplying the digital signal $W_4$ by the other one of the weightings of the equalizer 231. Next, the equalized digital signals $S_1$, $S_2$, $S_3$ and $S_4$ are transmitted in parallel into input ports 6a, 6b, 6c and 6d of the wave-front demultiplexer 232 through four parallel signal paths between the output ports 11a, 11b, 11c and 11d of the equalizer 231 and the input ports 6a, 6b, 6c and 6d of the wave-front demultiplexer 232. Each of the four respective weightings of the equalizer 231 can be, but not limited to, a complex value such that the equalized signals $S_1$, $S_2$, $S_3$ and $S_4$ can be rotated precisely to become in phase. In this case, the equalizer 231 can be performed by the narrow band equalizer, as illustrated in FIG. 1C. The narrow band equalizer 231 can provide phase and amplitude modifications to each of the signals $W_1$, $W_2$, $W_3$ and $W_4$ featuring a constant phase shift and a constant amplitude attenuation across a narrow frequency band. Alternatively, the equalizer 231 can be performed by the broadband equalizer, as illustrated in FIG. 1C. The broadband equalizer 231 can provide phase and amplitude modifications to each of the signals $W_1$, $W_2$, $W_3$ and $W_4$ featuring a constant phase shift and a constant amplitude attenuation in each sub-band across a broad frequency band, but the phase shift and amplitude attenuation in one sub-band across the broad frequency band is different from those in the other sub-bands across the broad frequency band.

After the equalized digital signals $S_1$, $S_2$, $S_3$ and $S_4$ are input in parallel to the wave-front demultiplexer 232, the wave-front demultiplexer 232 performs the above wavefront demultiplexing transformation to process the equalized digital signals $S_1$, $S_2$, $S_3$ and $S_4$ into multiple linear combinations, each combined with the equalized digital signals $S_1$, $S_2$, $S_3$ and $S_4$ multiplied by respective weightings, represented by the digital signals $Z_1$, $Z_2$, $Z_3$ and $Z_4$ output in parallel from the four parallel output ports 7a, 7b, 7c and 7d of the wave-front demultiplexer 232. The digital signals $Z_1$, $Z_2$, $Z_3$ and $Z_4$ are digital representations of the analog signals $X_1$, $X_2$, $X_3$ and $X_4$, respectively. The four output ports 7a, 7b, 7c and 7d are arranged in parallel. Each of the digital signals $Z_1$, $Z_2$ and $Z_3$ can be, but not limited to, a RF digital signal or an IF digital signal.

The optimizer 235 can be in a signal path between the output ports 7a, 7b, 7c and 7d and the equalizer 231 (only one signal path between the output port 7d and the equalizer 231 is shown in FIG. 2B). The flow chart of the optimizing and equalizing process shown in FIG. 1C can be applied to the embodiment illustrated in FIG. 2B.

The equalizer 231, the wave-front demultiplexer 232 and the optimizer 235 can be, but not limited to, embedded in a processor 230, such as single integrated circuit chip or single chip package. The equalizer 231 can be hardware or can be realized by software installed in and performed by the processor 230. The optimizer 235 can be hardware or can be realized by software installed in and performed by the processor 230.

Figure 2C:
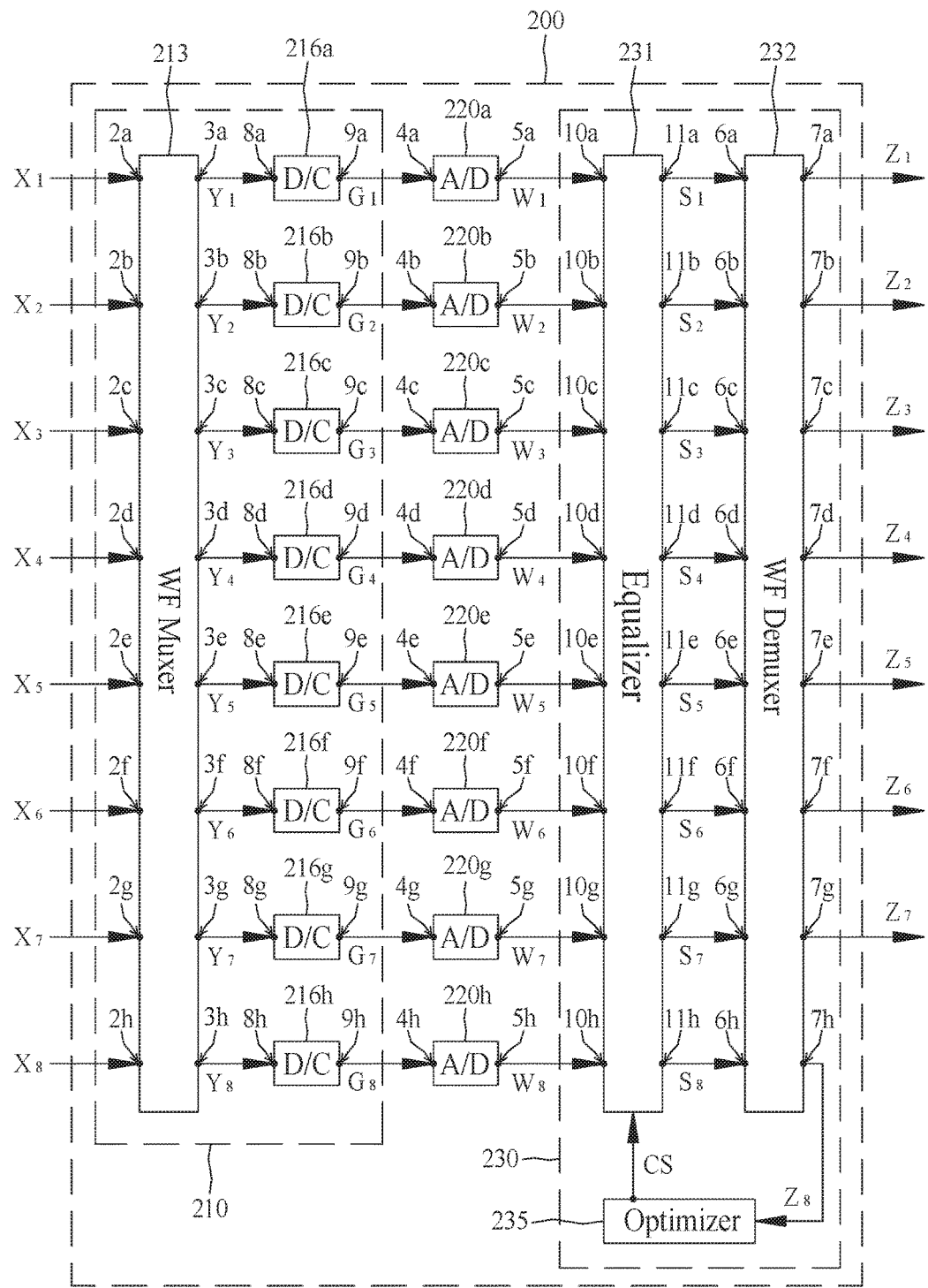
FIG. 2C shows an A/D conversion system including a wave-front multiplexer, eight frequency down-conversion components, eight A/D converters, a wave-front demultiplexer, an equalizer and an optimizer according to an embodiment of the present disclosure.

Alternatively, the system 200 can process more than four input signals, such as seven analog signals $X_1$-$X_7$ and one analog pilot or diagnostic signal $X_8$ as illustrated in FIG. 2C, and can output more than four output signals, such as seven digital signals $Z_1$-$Z_7$ and one digital pilot or diagnostic signal $Z_8$ as illustrated in FIG. 2C. Moreover, the system 200 can include more than four A/D converters, such as eight A/D converters 220a-220h illustrated in FIG. 2C, in more than four parallel signal paths or channels between the wave-front multiplexer 213 and the equalizer 231 and can further include more than four processing units, such as eight frequency down-conversion components 216a-216h illustrated in FIG. 2C, in more than four parallel signal paths or channels between more than four output ports of the wave-front multiplexer 213 and more than four input ports of the A/D converters, such as in eight parallel signal paths or channels between eight outputs 3a-3h of the wave-front multiplexer 213 and eight inputs 4a-4h of the A/D converters 220a-220h. All of the processing units (such as the components 216a-216h illustrated in FIG. 2C) and the wave-front multiplexer 213 can be, but not limited to, embedded in a processor 210, such as integrated circuit chip, system-on chip or chip package. Alternatively, the wave-front multiplexer 213 may be embedded in the processor 210, but the processing units (such as the components 216a-216h illustrated in FIG. 2C) may be embedded in another processor, such as integrated circuit chip, system-on chip or chip package, or in multiple processors, such as integrated circuit chips, system-on chips or chip packages, respectively.

A method for processing signals or data streams by using the system 200 shown in FIG. 2C is described below. Referring to FIG. 2C, the seven analog signals $X_1$-$X_7$ from, e.g., one or more wireless base stations or array elements such as antenna array elements and the analog pilot or diagnostic signal $X_8$ are input in parallel to eight input ports 2a-2h of the wave-front multiplexer 213 through, e.g., eight parallel signal paths, eight parallel wireless channels, or eight parallel physical channels. The seven analog signals $X_1$-$X_7$ could be, but not limited to, seven independent RF signals. Each of the wireless base stations can be, but not limited to, a mobile base station or a Wi-Fi base station. Alternatively, the analog signals $X_1$-$X_7$ can come from, but not limited to, one or more microphone devices, one or more image sensors, one or more MEMS microphone chips, or one or more antennas of a mobile phone.

The pilot or diagnostic signal $X_8$ may have a single frequency and fixed amplitude. Alternatively, the pilot or diagnostic signal $X_8$ could change based on time or could be any signal known by the system 200. In contrast, the extraneous signals $X_1$-$X_7$ are unknown by the system 200 and input into the system 200 from an extraneous system.

Next, referring to FIG. 2C, the wave-front multiplexer 213 performs the above-mentioned wave-front multiplexing transformation to process the eight signals $X_1$-$X_8$ into eight linear combinations, each combined with the signals $X_1$-$X_8$ multiplied by respective weightings, represented by eight analog signals $Y_1$-$Y_8$, which can be referred to as the description illustrated in FIG. 1D. In this case, the number of H is equal to 8. The wave-front multiplexer 213 may include 8*8 computing units and eight summing processors. The computing units form a processor array with eight rows and eight columns. The input signals $X_1$-$X_8$ can be received by the computing units in the respective eight columns in the processor array. Upon receiving the input signals $X_1$-$X_8$, each of the computing units independently weights its received signal, multiplied by a weighting value, to generate a weighted signal. The eight summing processors can output the eight signals $Y_1$-$Y_8$ each combined with the weighted signals output from the computing units in a corresponding one of the eight rows in the processor array. An 8×8 Butler matrix may be used as the wave-front multiplexer 213 illustrated in FIG. 2C.

Next, referring to FIG. 2C, the wave-front multiplexer 213 outputs the eight analog signals $Y_1$-$Y_8$ from its eight output ports 3a-3h arranged in parallel, and the eight analog signals $Y_1$-$Y_8$ are respectively transmitted to eight input ports 8a-8h of the eight frequency down-conversion components 216a-216h through, e.g., eight parallel signal paths, eight parallel wireless channels, or eight parallel physical channels. After the eight signals $Y_1$-$Y_8$ are respectively input into the eight frequency down-conversion components 216a-216h, the eight signals $Y_1$-$Y_8$ have frequency ranges down-converted into lower ones by the frequency down-conversion components 216a-216h, and the eight frequency down-conversion components 216a-216h output the eight frequency down-converted signals, represented by eight signals $G_1$-$G_8$, form their output ports 9a-9h, respectively. For example, the eight signals $Y_1$-$Y_8$ can be, but not limited to, eight Ka-band or Ku-band analog signals, and the eight frequency down-conversion components 216a-216h can respectively convert the eight Ka-band or Ku-band analog signals $Y_1$-$Y_8$ into eight intermediate-frequency (IF) or base-band analog signals $G_1$-$G_8$.

Next, referring to FIG. 2C, the eight signals $G_1$-$G_8$ are respectively transmitted to eight input ports 4a-4h of the eight A/D converters 220a-220h through, e.g., eight parallel signal paths, eight parallel wireless channels or eight parallel physical channels, and the eight A/D converters 220a-220h respectively convert the eight analog signals $G_1$-$G_8$ into their digital representations, represented by eight digital signals $W_1$-$W_8$, and respectively output the eight digital signals $W_1$-$W_8$ from their output ports 5a-5h. The eight analog signals $G_1$-$G_8$ may be sampled at the same sampling frequency or at different sampling frequencies by the eight A/D converters 220a-220h.

Next, referring to FIG. 2C, the eight digital signals $W_1$-$W_8$ are transmitted in parallel to eight input ports 10a-

10h of the equalizer 231 through, e.g., eight parallel signal paths, eight parallel wireless channels or eight parallel physical channels. The eight input ports 10a-10h are arranged in parallel for receiving the eight digital signals $W_1$-$W_8$, respectively. After the digital signals $W_1$-$W_8$ are transmitted in parallel into the equalizer 231, an optimizing and equalizing process is performed such that each of the digital signals $W_1$-$W_8$ can be compensated to be multiplied by one of eight respective weightings by the equalizer 231, wherein the eight respective weightings of the equalizer 231 can be adjusted based on a control signal CS, output from the optimizer 235 and input into the equalizer 231. The optimizing and equalizing process can be referred to as the optimizing and equalizing process as illustrated in FIG. 1C.

Referring to FIG. 2C, after the optimizing and equalizing process, the equalizer 231 outputs eight equalized digital signals $S_1$-$S_8$, respectively, from its eight output ports 11a-11h. The equalized digital signal $S_1$ is created by the equalizer 231 multiplying the digital signal $W_1$ by one of the weightings of the equalizer 231. The equalized digital signal $S_2$ is created by the equalizer 231 multiplying the digital signal $W_2$ by another one of the weightings of the equalizer 231. The equalized digital signal $S_3$ is created by the equalizer 231 multiplying the digital signal $W_3$ by another one of the weightings of the equalizer 231. The equalized digital signal $S_4$ is created by the equalizer 231 multiplying the digital signal $W_4$ by another one of the weightings of the equalizer 231. The equalized digital signal $S_5$ is created by the equalizer 231 multiplying the digital signal $W_5$ by another one of the weightings of the equalizer 231. The equalized digital signal $S_6$ is created by the equalizer 231 multiplying the digital signal $W_6$ by another one of the weightings of the equalizer 231. The equalized digital signal $S_7$ is created by the equalizer 231 multiplying the digital signal $W_7$ by another one of the weightings of the equalizer 231. The equalized digital signal $S_8$ is created by the equalizer 231 multiplying the digital signal $W_8$ by the other one of the weightings of the equalizer 231. Each of the four respective weightings of the equalizer 231 can be, but not limited to, a complex value such that the equalized signals $S_1$-$S_8$ can be rotated precisely to become in phase. In this case, the equalizer 231 can be performed by the narrow band equalizer, as illustrated in FIG. 1C. The narrow band equalizer 231 can provide phase and amplitude modifications to each of the signals $W_1$-$W_8$ featuring a constant phase shift and a constant amplitude attenuation across a narrow frequency band. Alternatively, the equalizer 231 can be performed by the broadband equalizer, as illustrated in FIG. 1C. The broadband equalizer 231 can provide phase and amplitude modifications to each of the signals $W_1$-$W_8$ featuring a constant phase shift and a constant amplitude attenuation in each sub-band across a broad frequency band, but the phase shift and amplitude attenuation in one sub-band across the broad frequency band is different from those in the other sub-bands across the broad frequency band.

Next, referring to FIG. 2C, the equalized digital signals $S_1$-$S_8$ are transmitted in parallel into eight input ports 6a-6h of the wave-front demultiplexer 232 through eight parallel signal paths between the output ports 11a-11h of the equalizer 231 and the input ports 6a-6h of the wave-front demultiplexer 232.

Referring to FIG. 2C, after the eight equalized digital signals $S_1$-$S_8$ are input in parallel to the wave-front demultiplexer 232, the wave-front demultiplexer 232 performs the above-mentioned wave-front demultiplexing transformation to process the eight equalized digital signals $S_1$-$S_8$ into eight linear combinations, each combined with the equalized digital signals $S_1$-$S_8$ multiplied by respective weightings, represented by the eight digital signals $Z_1$-$Z_8$ output in parallel from its eight parallel output ports 7a-7h, which can be referred to as the description illustrated in FIG. 1E. In this case, the number of I is equal to 8. The wave-front demultiplexer 232 may include 8*8 computing units and eight summing processors. The computing units form a processor array with eight rows and eight columns. The input signals $S_1$-$S_8$ can be received by the computing units in the respective eight columns in the processor array. Upon receiving the input signals $S_1$-$S_8$, each of the computing units independently weights its received signal, multiplied by a weighting value, to generate a weighted signal. The eight summing processors can output the eight signals $Z_1$-$Z_8$ each combined with the weighted signals output from the computing units in a corresponding one of the eight rows in the processor array.

Referring to FIG. 2C, the eight digital signals $Z_1$-$Z_8$ are eight digital representations of the eight analog signals $X_1$-$X_8$, respectively. The eight output ports 7a-7h are arranged in parallel. Each of the seven digital signals $Z_1$-$Z_7$ can be, but not limited to, a RF digital signal or an IF digital signal.

Referring to FIG. 2C, the optimizer 235 can be in a signal path between the output ports 7a-7h and the equalizer 231. Only one signal path between the output port 7h and the equalizer 231 is shown in FIG. 2C. The optimizer 235 can output the control signal CS to the equalizer 231 so as to adjust the eight respective weightings of the equalizer 231 when the optimizing and equalizing process, as illustrated in FIG. 1C, is performed. In FIG. 2C, the equalizer 231, the wave-front demultiplexer 232 and the optimizer 235 can be, but not limited to, embedded in a processor 230, such as single integrated circuit chip or single chip package.

Alternatively, the analog-to-digital conversion system 200 can include an M-to-1 time-division multiplexer with M input ports receiving M parallel input signals and one output port outputting an output signal, where M is an integer. The integer M can be, but not equal to, equal to the total number of input ports of the wave-front multiplexer 213, equal to the total number of output ports of the wave-front multiplexer 213, equal to the total number of input ports of the wave-front demultiplexer 232, equal to the total number of output ports of the wave-front demultiplexer 232, equal to the total number of A/D converters of the system 200, equal to the total number of frequency down-conversion components of the system 200, equal to the total number of signals input into the wave-front multiplexer 213, and/or equal to the total number of signals output from the wave-front demultiplexer 232. The M-to-1 time-division multiplexer is defined herein to arrange or align the number M of parallel input signals sequentially in time as an output signal output from the output port of the M-to-1 time-division multiplexer. The output signal at the output port of the M-to-1 time-division multiplexer features M times the sampling rate as each of signals at output ports of the A/D converters features. The output signal at the output port of the M-to-1 time-division multiplexer features the same dynamic range as each of signals at output ports of the A/D converters features. In this case, one of the input ports of the wave-front multiplexer 213 receives an extraneous analog signal, and the others receive ground signals, wherein one or more of the ground signals can be used as pilot or diagnostic signals, or are connected to a ground reference.

The M-to-1 time-division multiplexer, for example, can be applied to the system 200 illustrated in FIG. 2C. That is, the system 200 illustrated in FIG. 2C further includes the M-to-1 time-division multiplexer. In this case, the M-to-1 time-division multiplexer is an 8-to-1 time-division multiplexer with eight input ports receiving the eight equalized digital signals $S_1$-$S_8$ illustrated in FIG. 2C and an output port outputting an output signal arranged or aligned as the eight equalized digital signals $S_1$-$S_8$ sequentially in time. Moreover, the input port 2a of the wave-front multiplexer 213 illustrated in FIG. 2C receives an extraneous analog signal $X_1$ from, e.g., a wireless base station, an antenna array, a microphone device, an image sensor, a MEMS microphone chip or an antenna of a mobile phone, and the other input ports 2b-2h of the wave-front multiplexer 213 illustrated in FIG. 2C receive seven ground signals $X_2$-$X_8$ or are connected to a ground reference. The ground signal $X_8$ is used as a pilot or diagnostic signal. Thereby, the output signal at the output port of the 8-to-1 time-division multiplexer features eight times the sampling rate as each of the eight signals $W_1$-$W_8$ at the eight output ports 5a-5h of the eight A/D converters 220a-220h features. The output signal at the output port of the 8-to-1 time-division multiplexer features the same dynamic range as each of the eight signals $W_1$-$W_8$ at the eight output ports 5a-5h of the eight A/D converters 220a-220h features.

Figure 2D:
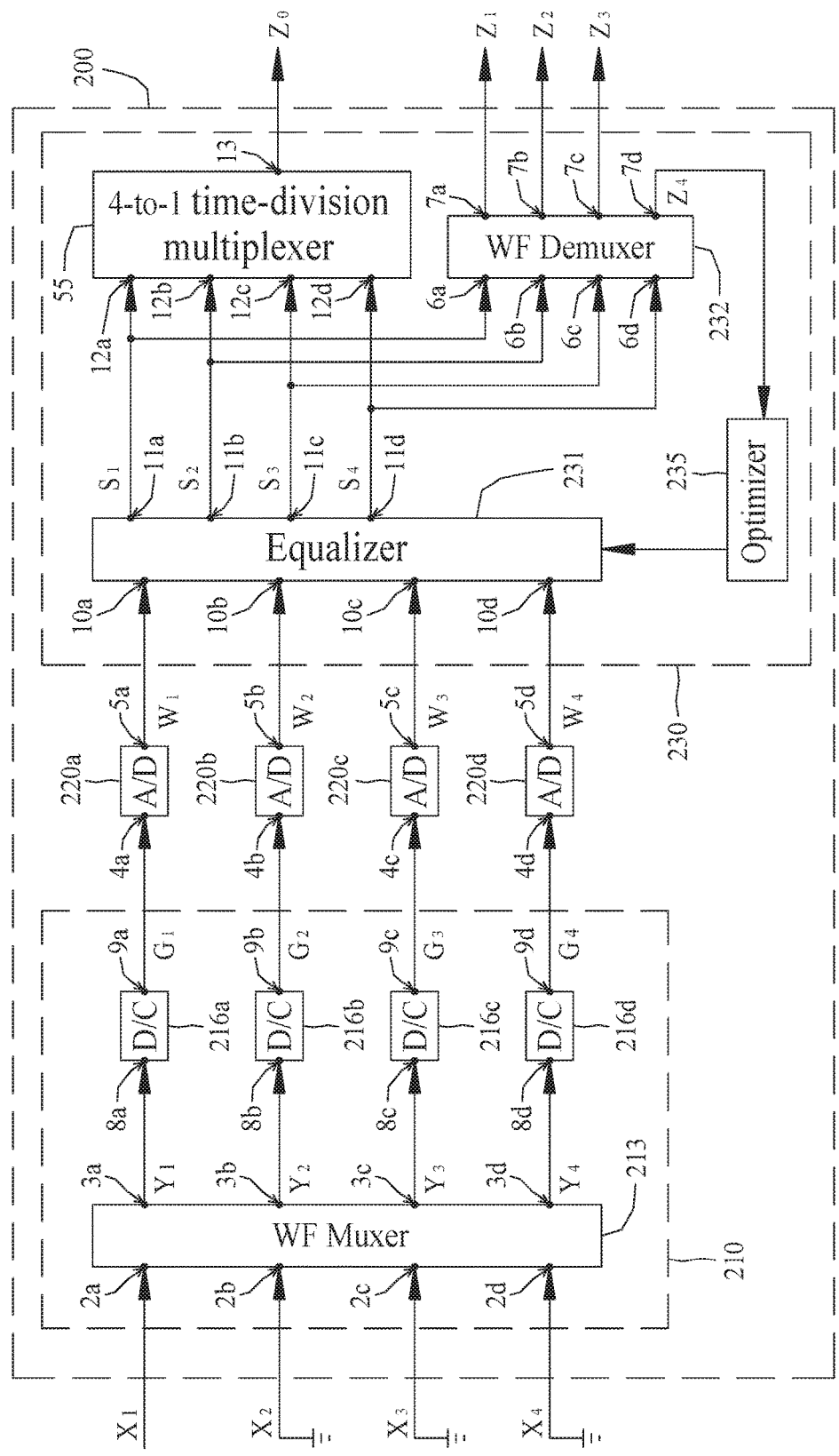
FIG. 2D shows an A/D conversion system including a wave-front multiplexer, four frequency down-conversion components, four A/D converters, a wave-front demultiplexer, an equalizer, an optimizer and a 4-to-1 time-division multiplexer according to an embodiment of the present disclosure.

Alternatively, the M-to-1 time-division multiplexer can be applied to an analog-to-digital conversion system 200 illustrated in FIG. 2D. In this case, the M-to-1 time-division multiplexer is a 4-to-1 time-division multiplexer 55, illustrated in FIG. 2D, with four input ports 12a-12d receiving four equalized digital signals $S_1$-$S_4$ and an output port 13 outputting an output signal $Z_0$ arranged or aligned as the four equalized digital signals $S_1$-$S_4$ sequentially in time.

Referring to FIG. 2D, the system 200 may include a wave-front multiplexer 213, four frequency down-conversion components 216a-216d, four individual A/D converters 220a-220d, an equalizer 231, a wave-front demultiplexer 232, an optimizer 235, and the 4-to-1 time-division multiplexer 55. The description of the wave-front multiplexer 213 illustrated in FIG. 2D can be referred to as the description of the wave-front multiplexer 213 as illustrated in FIG. 1B or 2B. The description of the wave-front demultiplexer 232 illustrated in FIG. 2D can be referred to as the description of the wave-front demultiplexer 232 as illustrated in FIG. 1B or 2B. The description of the equalizer 231 illustrated in FIG. 2D can be referred to as the description of the equalizer 231 as illustrated in FIG. 1B or 2B. The description of the optimizer 235 illustrated in FIG. 2D can be referred to as the description of the optimizer 235 as illustrated in FIG. 1B or 2B.

Referring to FIG. 2D, the wave-front multiplexer 213 and the four frequency down-conversion components 216a-216d can be, but not limited to, embedded in a processor 210, such as integrated circuit chip, system-on chip or chip package. Alternatively, the wave-front multiplexer 213 may be embedded in the processor 210, but the four frequency down-conversion components 216a-216d may be embedded in another processor, such as integrated circuit chip, system-on chip or chip package, or in four processors, such as four integrated circuit chips, four system-on chips or four chip packages, respectively. The wave-front multiplexer 213 can be, but not limited to, realized by hardware such as 4×4 Butler matrix, and each of the frequency down-conversion components 216a-216d can be, but not limited to, realized by hardware. The equalizer 231, the wave-front demultiplexer 232, the optimizer 235, and the 4-to-1 time-division multiplexer 55 can be, but not limited to, embedded in a processor 230, such as integrated circuit chip, system-on chip or chip package. Alternatively, the equalizer 231, the wave-front demultiplexer 232 and the optimizer 235 may be embedded in the processor 210, but the 4-to-1 time-division multiplexer 55 may be embedded in another processor, such as integrated circuit chip, system-on chip or chip package.

A method for processing one or more data streams or signals by using the system 200 shown in FIG. 2D is described below. Referring to FIG. 2D, an extraneous analog signal $X_1$ from, e.g., a wireless base station or an antenna array and three ground signals $X_2$, $X_3$ and $X_4$ are input in parallel to four input ports 2a-2d of the wave-front multiplexer 213 through, e.g., four parallel signal paths, four parallel wireless channels or four parallel physical channels. The wireless base station can be, but not limited to, a mobile base station or a Wi-Fi base station. Alternatively, the analog signal $X_1$ can come from, but not limited to, a microphone device, an image sensor, a MEMS microphone chip, or an antenna of a mobile phone. The ground signal $X_4$ is used as an input pilot or diagnostic signal. Alternatively, two or all of the three ground signals $X_2$, $X_3$ and $X_4$ can be used as input pilot or diagnostic signals.

Referring to FIG. 2D, after the four signals $X_1$, $X_2$, $X_3$ and $X_4$ are input into the wave-front multiplexer 213, the wave-front multiplexer 213 performs the above-mentioned wave-front multiplexing transformation to process the four signals $X_1$-$X_4$ into four linear combinations, each combined with the signals $X_1$-$X_4$ multiplied by respective weightings, represented by four analog signals $Y_1$-$Y_4$, which can be referred to as the description illustrated in FIG. 1D. In this case, the number of H is equal to 4. The wave-front multiplexer 213 may include 4*4 computing units and four summing processors. The computing units form a processor array with four rows and four columns. The input signals $X_1$-$X_4$ can be received by the computing units in the respective four columns in the processor array. Upon receiving the input signals $X_1$-$X_4$, each of the computing units independently weights its received signal, multiplied by a weighting value, to generate a weighted signal. The four summing processors can output four analog signals $Y_1$-$Y_4$ each combined with the weighted signals output from the computing units in a corresponding one of the four rows in the processor array.

Next, referring to FIG. 2D, the wave-front multiplexer 213 outputs the four analog signals $Y_1$-$Y_4$ from its four output ports 3a-3d arranged in parallel, and the four analog signals $Y_1$-$Y_4$ are respectively transmitted to four input ports 8a-8d of the four frequency down-conversion components 216a-216d through, e.g., four parallel signal paths, four parallel wireless channels or four parallel physical channels. After the four analog signals $Y_1$-$Y_4$ are input into the four frequency down-conversion components 216a-216d, the four analog signals $Y_1$-$Y_4$ have frequency ranges down-converted into lower ones by the frequency down-conversion components 216a-216d, and the four frequency down-conversion components 216a-216d output the four frequency down-converted signals, represented by four signals $G_1$-$G_4$, from their output ports 9a-9d, respectively. For example, the four analog signals $Y_1$-$Y_4$ can be, but not limited to, four Ka-band or Ku-band analog signals, and the four frequency down-conversion components 216a-216d can respectively convert the four Ka-band or Ku-band analog signals $Y_1$-$Y_4$ into four intermediate-frequency (IF) or baseband analog signals $G_1$-$G_4$.

Next, referring to FIG. 2D, the four signals $G_1$-$G_4$ are respectively transmitted to four input ports 4a-4d of the four A/D converters 220a-220d, and the four A/D converters 220a-220d respectively convert the four analog signals $G_1$-$G_4$ into their digital representations, represented by four digital signals $W_1$-$W_4$, and respectively output the four digital signals $W_1$-$W_4$ from their output ports 5a-5d. The four analog signals $G_1$-$G_4$ may be sampled at the same sampling frequency or at different sampling frequencies by the four A/D converters 220a-220d.

Next, referring to FIG. 2D, the four digital signals $W_1$-$W_4$ are transmitted in parallel to four input ports 10a-10d of the equalizer 231 through, e.g., four parallel signal paths, four parallel wireless channels or four parallel physical channels. The four input ports 10a-10d are arranged in parallel for receiving the four digital signals $W_1$-$W_4$, respectively. After the four digital signals $W_1$-$W_4$ are transmitted in parallel into the equalizer 231, an optimizing and equalizing process as illustrated in FIGS. 1B and 1C can be applied herein to compensating each of the four digital signals $W_1$-$W_4$ to be multiplied by a weighting of the equalizer 231, wherein the weighting of the equalizer 231 can be adjusted based on a control signal CS output from the optimizer 235 and input into the equalizer 231.

Referring to FIG. 2D, after the optimizing and equalizing process, the equalizer 231 outputs four equalized digital signals $S_1$-$S_4$, respectively, from its four output ports 11a-11d to four input ports 12a-12d of the 4-to-1 time-division multiplexer 55 and to four input ports 6a-6d of the wave-front demultiplexer 232. The equalized digital signal $S_1$ is created by the equalizer 231 multiplying the digital signal $W_1$ by a weighting of the equalizer 231. The equalized digital signal $S_2$ is created by the equalizer 231 multiplying the digital signal $W_2$ by another weighting of the equalizer 231. The equalized digital signal $S_3$ is created by the equalizer 231 multiplying the digital signal $W_3$ by another weighting of the equalizer 231. The equalized digital signal $S_4$ is created by the equalizer 231 multiplying the digital signal $W_4$ by the other weighting of the equalizer 231. Each of the weightings of the equalizer 231 can be, but not limited to, a complex value such that the equalized signals $S_1$-$S_4$ can be rotated precisely to become in phase. In this case, the equalizer 231 can be performed by the narrow band equalizer, as illustrated in FIG. 1C. Alternatively, the equalizer 231 can be performed by the broadband equalizer, as illustrated in FIG. 1C.

Referring to FIG. 2D, after the four equalized digital signals $S_1$-$S_4$ are input in parallel to the 4-to-1 time-division multiplexer 55, the 4-to-1 time-division multiplexer 55 arranges or aligns the four equalized digital signals $S_1$-$S_4$ sequentially in time as an output digital signal $Z_0$ output from its output port 13. With the multiplexing performed by the 4-to-1 time-division multiplexer 55, the four equalized digital signals $S_1$-$S_4$ output from the equalizer 231 are not coherently combined but are arranged sequentially in time as the output digital signal $Z_0$. The digital signal $Z_0$ is a digital representation of the analog signal $X_1$ and can be, but not limited to, a RF digital signal or an IF digital signal.

Referring to FIG. 2D, the output digital signal $Z_0$ at the output port 13 of the 4-to-1 time-division multiplexer 55 features four times the sampling rate as each of the four digital signals $W_1$-$W_4$ at the four output ports 5a-5d of the four A/D converters 220a-220d features. The output digital signal $Z_0$ at the output port 13 of the 4-to-1 time-division multiplexer 55 features the same dynamic range as each of the four digital signals $W_1$-$W_4$ at the four output ports 5a-5d of the four A/D converters 220a-220d features.

Referring to FIG. 2D, after the four equalized digital signals $S_1$-$S_4$ are input in parallel to the wave-front demultiplexer 232, the wave-front demultiplexer 232 performs the above-mentioned wave-front demultiplexing transformation to process the four equalized digital signals $S_1$-$S_4$ into four linear combinations, each combined with the equalized digital signals $S_1$-$S_4$ multiplied by respective weightings, represented by four digital signals $Z_1$-$Z_4$ output in parallel from its four parallel output ports 7a-7d, which can be referred to as the description illustrated in FIG. 1E. In this case, the number of I is equal to 4. The wave-front demultiplexer 232 may include 4*4 computing units and four summing processors. The computing units form a processor array with four rows and four columns. The input signals $S_1$-$S_4$ can be received by the computing units in the respective four columns in the processor array. Upon receiving the input signals $S_1$-$S_4$, each of the computing units independently weights its received signal, multiplied by a weighting value, to generate a weighted signal. The four summing processors can output the four signals $Z_1$-$Z_4$ each combined with the weighted signals output from the computing units in a corresponding one of the four rows in the processor array. The digital signal $Z_1$ is a digital representation of the analog signal $X_1$, and the three digital ground signals $Z_2$-$Z_4$ are three digital representations of the three ground signals $X_2$-$X_4$.

Referring to FIG. 2D, due to coherent combining of the wave-front demultiplexer 232, the digital signal $Z_1$ at the output port 7a of the wave-front demultiplexer 232 features the same sampling rate as each of the four digital signals $W_1$-$W_4$ at the four output ports 5a-5d of the four A/D converters 220a-220d features. The digital signal $Z_1$ at the output port 7a of the wave-front demultiplexer 232 features a dynamic range better than each of the four digital signals $W_1$-$W_4$ at the four output ports 5a-5d of the four A/D converters 220a-220d features and better than the output digital signal $Z_0$ at the output port 13 of the 4-to-1 time-division multiplexer 55 features. The output digital signal $Z_0$ at the output port 13 of the 4-to-1 time-division multiplexer 55 features four times the sampling rate as the digital signal $Z_1$ at the output port 7a of the wave-front demultiplexer 232 features.

Referring to FIG. 2D, the digital signal $Z_1$ can be, but not limited to, a RF digital signal or an IF digital signal. The signal $Z_4$ can be used as an output pilot or diagnostic signal featuring a value to be compared with that featured by the input pilot or diagnostic signal $X_4$ during the optimizing and equalizing process. The optimizer 235 can receive one or more of the signals $Z_1$-$Z_4$ (i.e. only the signal $Z_4$ is shown in FIG. 2D) output from the wave-front demultiplexer 232 and outputs the control signal CS to the equalizer 231 so as to adjust the four respective weightings of the equalizer 231 when the optimizing and equalizing process is performed.

Alternatively, the equalizer 231, the wave-front demultiplexer 232 and the optimizer 235 of the system 200 illustrated in FIG. 2D can be omitted, that is, the processor 230 illustrated in FIG. 2D may not include the equalizer 231, the wave-front demultiplexer 232 and the optimizer 235. In this case, the four digital signals $W_1$-$W_4$ output from the four A/D converters 220a-220d are transmitted to the 4-to-1 time-division multiplexer 55, and the 4-to-1 time-division multiplexer 55 arranges or aligns the four digital signals $W_1$-$W_4$ sequentially in time as an output digital signal $Z_0$ output from its output port 13. With the multiplexing performed by the 4-to-1 time-division multiplexer 55, the four digital signals $W_1$-$W_4$ output from the four A/D converters 220a-220d are not coherently combined but are arranged sequentially in time as the output digital signal $Z_0$. The digital signal $Z_0$ is a digital representation of the analog signal $X_1$ and can be, but not limited to, a RF digital signal or an IF digital signal. The output digital signal $Z_0$ at the output port 13 of the 4-to-1 time-division multiplexer 55 features four times the sampling rate as each of the four digital signals $W_1$-$W_4$ at the four output ports 5a-5d of the four A/D converters 220a-220d features. The output digital signal $Z_0$ at the output port 13 of the 4-to-1 time-division multiplexer 55 features the same dynamic range as each of the four digital signals $W_1$-$W_4$ at the four output ports 5a-5d of the four A/D converters 220a-220d features.

Alternatively, the signal $X_4$, input to the input port 2d of the wave-front multiplexer 213 illustrated in FIG. 2D, cannot be a ground signal but can be used as a pilot or diagnostic signal. In this case, the signal $X_4$, input to the input port 2d of the wave-front multiplexer 213 illustrated in FIG. 2D, may have a single frequency and fixed amplitude. Alternatively, the signal $X_4$, input to the input port 2d of the wave-front multiplexer 213 illustrated in FIG. 2D, could change based on time or could be any signal known by the system 200. In contrast, the extraneous signals $X_1$, input to the input port 2a of the wave-front multiplexer 213 illustrated in FIG. 2D, is unknown by the system 200 and input into the system 200 from an extraneous system. Moreover, in this case, the wave-front demultiplexer 232 can output a digital representation of the analog signal $X_1$ from its output port 7a.

Second Embodiment: Application to Digital Beam Forming Network (DBFN)

Figure 3A:
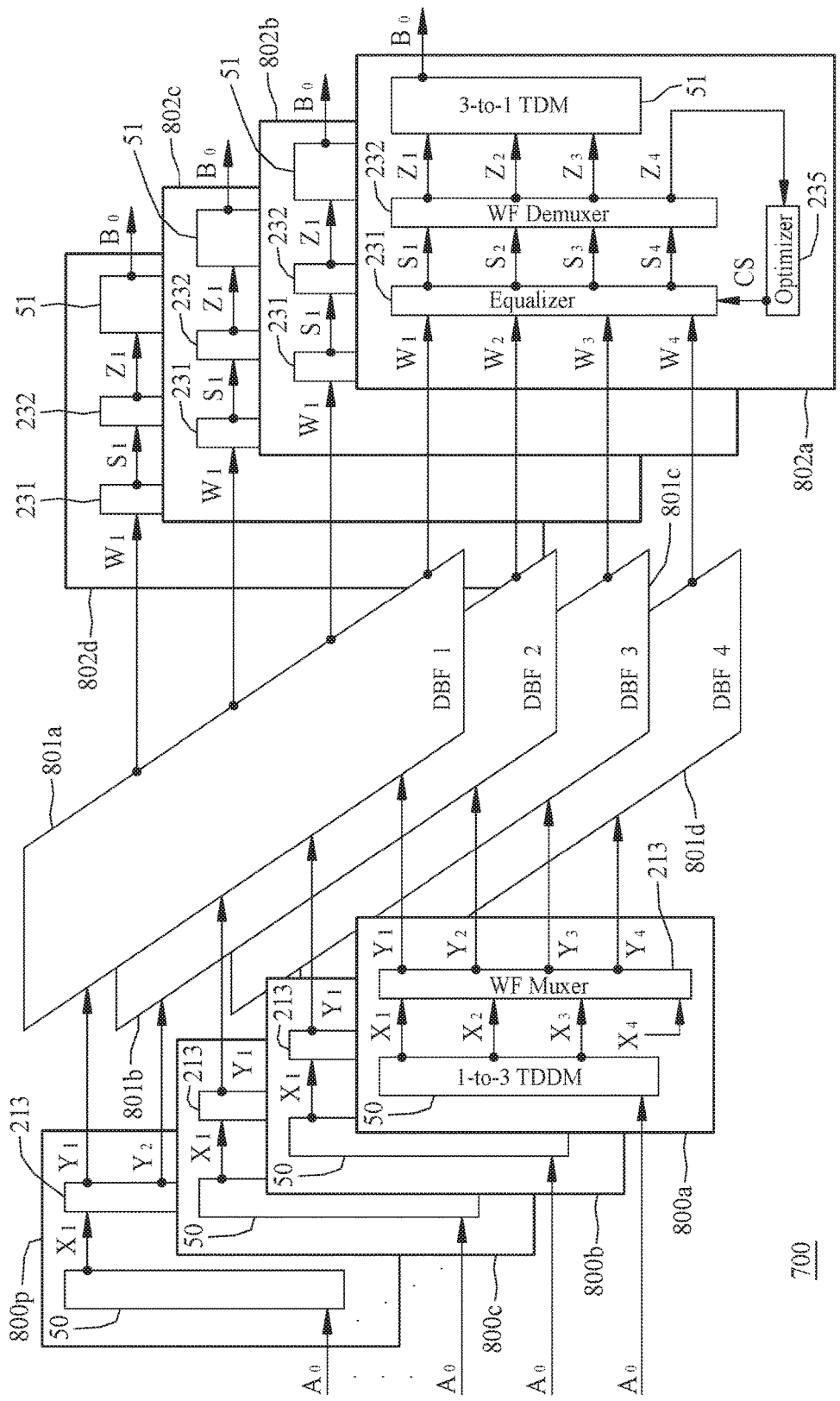
FIG. 3A shows a broadband DBFN system including sixteen preprocessor modules, four narrowband DBFN modules and four post-processor modules according to an embodiment of the present disclosure.

FIG. 3A shows a system for performing a broadband (BB) DBFN via four narrowband (NB) DBFN modules grouped with sixteen wave-front multiplexers and four wave-front demultiplexers according to an exemplary embodiment of the present disclosure. In FIG. 3A, the signals with the same reference number may not represent the signals carrying the same information.

Referring to FIG. 3A, a system 700 may include sixteen preprocessor modules 800a-800p having the same architecture as one another, four narrowband DBFN modules 801a-801d having the same architecture as one another, and four post-processor modules 802a-802d having the same architecture as one another. Each of the narrowband DBFN modules 801a-801d can perform one or more weighting summations to signals input into said each of the narrowband DBFN modules 801a-801d and outputs one or more linear combinations, each combined with the input signals multiplied by respective weightings, which can be realized by hardware, such as field programmable gate arrays (FPGA), fixed-function off-the-shelf digital components, and digital signal processors, or software installed in the system 700.

Referring to FIG. 3A, for brief description, only one of the sixteen preprocessor modules 800a-800p is illustrated as below. The preprocessor module 800a having the same architecture as each of the fifteen preprocessor modules 800b-800p may include a 1-to-3 time-domain demultiplexer (TDDM) 50 and a wave-front multiplexer 213. A time-domain demultiplexer is defined herein to divide an input signal having a high bandwidth sampled at a high sampling rate into multiple output signals each having a low bandwidth sampled at a low sampling rate. For example, in this embodiment, the 1-to-3 time-domain demultiplexer 50 can divide an input digital signal $A_0$ having a frequency bandwidth of J sampled at a sampling rate of K into three output digital signals $X_1$, $X_2$ and $X_3$, each having a frequency bandwidth of J/3 sampled at a sampling rate of K/3, passing through three parallel signal paths, such as physical or wireless channels, coupled to the wave-front multiplexer 213. A wave-front multiplexer is defined to perform the above wave-front multiplexing transform to process multiple input signals into multiple linear combinations, each combined with the input signals multiplied by respective weightings, which can be referred to as the description illustrated in FIGS. 1A and 1D. In this case, the number of H is equal to 4. The wavefront multiplexer 213 may include 4*4 computing units and four summing processors. The computing units form a processor array with four rows and four columns. The three input signals $X_1$-$X_3$ and an input diagnostic or pilot signal $X_4$ can be received by the computing units in the respective four columns in the processor array. Upon receiving the input signals $X_1$-$X_4$, each of the computing units independently weights its received signal, multiplied by a weighting value, to generate a weighted signal. The four summing processors can output four signals $Y_1$-$Y_4$ each combined with the weighted signals output from the computing units in a corresponding one of the four rows in the processor array. For example, in this embodiment, the wave-front multiplexer 213 can receive the digital signals $X_1$, $X_2$ and $X_3$ output from the 1-to-3 time-domain demultiplexer 50 and the digital diagnostic or pilot signal $X_4$, performing the above wave-front multiplexing transformation to process the input signals $X_1$, $X_2$, $X_3$ and $X_4$ into four linear combinations, each combined with the signals $X_1$, $X_2$, $X_3$ and $X_4$ multiplied by respective weightings, represented by the signals $Y_1$, $Y_2$, $Y_3$ and $Y_4$.

Referring to FIG. 3A, for brief description, only one of the four post-processor modules 802a-802d is illustrated as below. The post-processor module 802a having the same architecture as each of the three post-processor modules 802b, 802c and 802d may include a 3-to-1 time-domain multiplexer (TDM) 51, an equalizer 231, a wave-front demultiplexer 232, and an optimizer 235. A time-domain multiplexer is defined herein to combine or integrate multiple input signals each having a low bandwidth sampled at a low sampling rate into an output signal having a high bandwidth sampled at a high sampling rate. For example, in this embodiment, the 3-to-1 time-domain multiplexer 51 can combine or integrate multiple input signals $Z_1$, $Z_2$ and $Z_3$, each having a frequency bandwidth of J/3 sampled at a sampling rate of K/3, passing through three parallel signal paths, such as physical or wireless channels, coupled to the wave-front demultiplexer 232 into an output signal $B_0$ having a frequency bandwidth of J sampled at a sampling rate of K. An equalizer is defined to multiply each input signal by a weighting to compensate an amplitude, phase, and time-delay of said each input signal. For example, in this embodiment, the equalizer 231 illustrated in FIGS. 1B and 1C can be applied herein to adjusting amplitudes, phases, and/or time-delays of four signals $W_1$, $W_2$, $W_3$ and $W_4$ output in parallel from the four DBFN modules 801a, 801b, 801c and 801d according to a control signal CS generated by the optimizer 235 and generating four equalized signals $S_1$, $S_2$, $S_3$ and $S_4$ transmitted in parallel to the wave-front demultiplexer 232. The equalized digital signal $S_1$ is created by the equalizer 231 multiplying the digital signal $W_1$ by a weighting of the equalizer 231. The equalized digital signal $S_2$ is created by the equalizer 231 multiplying the digital signal $W_2$ by another weighting of the equalizer 231. The equalized digital signal $S_3$ is created by the equalizer 231 multiplying the digital signal $W_3$ by another weighting of the equalizer 231. The equalized digital signal $S_4$ is created by the equalizer 231 multiplying the digital signal $W_4$ by the other weighting of the equalizer 231. A wave-front demultiplexer is defined to perform the above wave-front demultiplexing transform to process multiple input signals into multiple linear combinations, each combined with the input signals multiplied by respective weightings. For example, in this embodiment, the wave-front demultiplexer 232 can receive the four equalized signals $S_1$, $S_2$, $S_3$ and $S_4$, performing the above wave-front multiplexing transform to process the four input signals $S_1$, $S_2$, $S_3$ and $S_4$ into four linear combinations, each combined with the signals $S_1$, $S_2$, $S_3$ and $S_4$ multiplied by respective weightings, represented by four signals $Z_1$, $Z_2$, $Z_3$ and $Z_4$, which can be referred to as the description illustrated in FIGS. 1A and 1E. In this case, the number of I is equal to 4. The wavefront demultiplexer 232 may include 4*4 computing units and four summing processors. The computing units form a processor array with four rows and four columns. The four input signals $S_1$-$S_4$ can be received by the computing units in the respective four columns in the processor array. Upon receiving the four input signals $S_1$-$S_4$, each of the computing units independently weights its received signal, multiplied by a weighting value, to generate a weighted signal. The four summing processors can output the four signals $Z_1$-$Z_4$ each combined with the weighted signals output from the computing units in a corresponding one of the four rows in the processor array.

For example, the wave-front multiplexer 213 illustrated in FIG. 3A can perform the wave-front multiplexing transform by using fast Fourier transform, and each wave-front demultiplexer 232 illustrated in FIG. 3A can perform the wave-front demultiplexing transform by using inverse fast Fourier transform to invert or transform signals previously transformed by the wave-front multiplexing transform performed by its complementary wave-front multiplexer 213. Thereby, each of the wave-front multiplexers 213 illustrated in FIG. 3A can be a FFT processor such as a FFT chip, and each of the wave-front demultiplexers 232 illustrated in FIG. 3A can be an IFFT processor such as an IFFT chip.

Figure 3B:
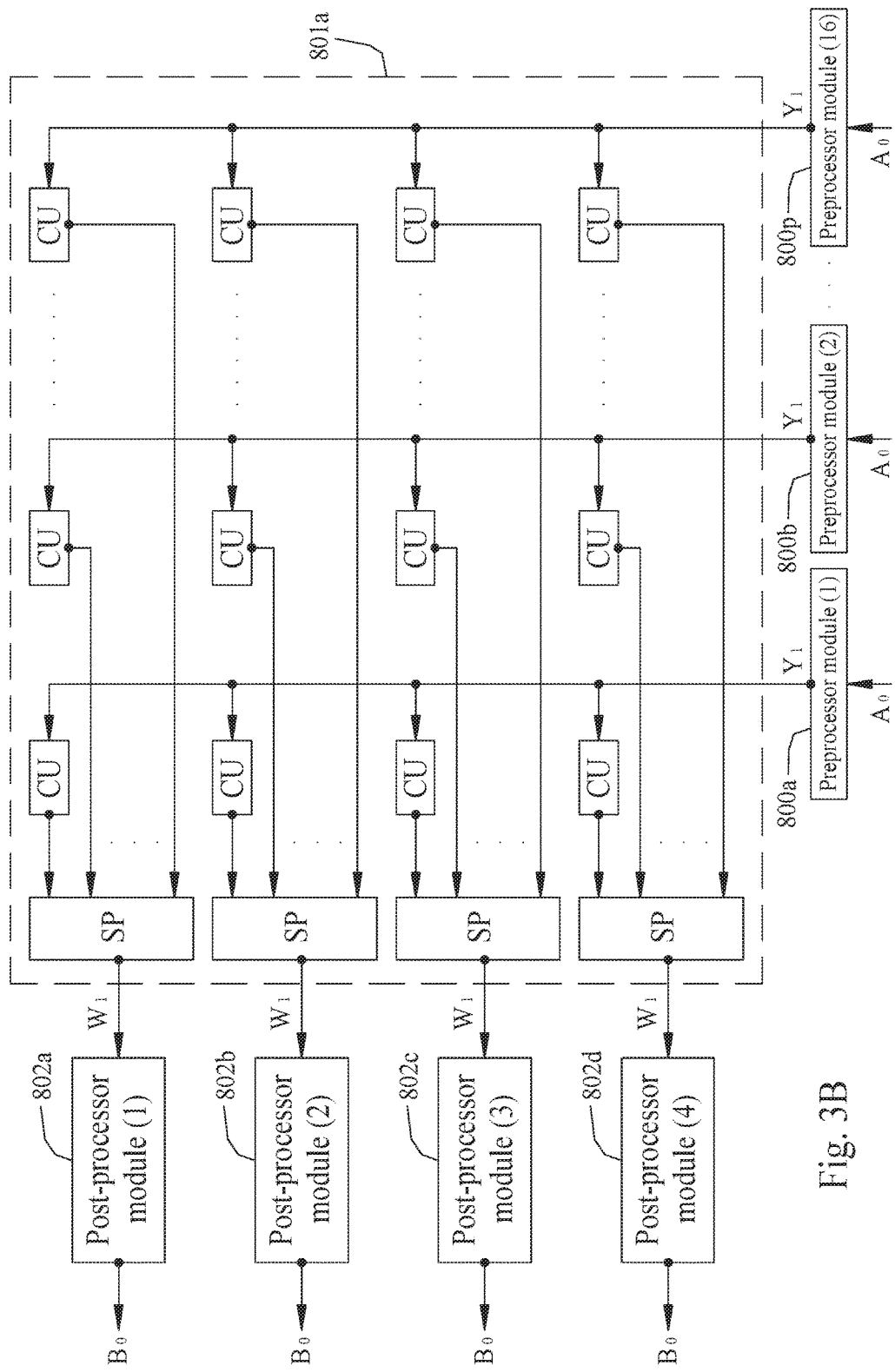
FIG. 3B shows a scheme of a narrowband DBFN module according to an embodiment of the present disclosure.

Besides using the fast Fourier transform, each of the wave-front multiplexers 213 illustrated in FIG. 3A can perform the wave-front multiplexing transform by using any Fourier-related transform, such as discrete Fourier transform, Hartley transform or Hadamard transform, to achieve an orthogonal functional transformation. Besides using the inverse fast Fourier transform, each of the wave-front demultiplexers 232 illustrated in FIG. 3A can perform the wave-front demultiplexing transform by using any inverse Fourier-related transform that can invert or transform signals previously transformed by the wave-front multiplexing transform performed by its complementary wave-front multiplexers 213. Referring to FIG. 3A, each of the DBFN modules 801a-801d may include a field programmable gate array (FPGA), a fixed-function off-the-shelf digital component and/or a digital signal processor (DSP) to process a set of signals received from the sixteen wave-front multiplexers 213 of the sixteen preprocessor modules 800a-800p. For brief description, only one of the DBFN modules 801a-801d is illustrated as below. A DBFN module is defined to output one or more linear combinations, each combined with its input signals multiplied by respective weightings. The DBFN module may include multiple computing units and one or more summing processors, wherein each computing unit independently weights an input signal to generate a weighted signal. Each of the summing processors provides a means for summing all or part of the weighted signals generated by the computing units. For example, referring to FIG. 3B showing a scheme of the DBFN module 801a, having the same architecture as each of the three DBFN modules 801b-801d, in accordance with the present invention, the DBFN module 801a may include sixty-four computing units (CUs) and four summing processors (SPs). The sixty-four computing units form a 4-by-16 processor array with sixteen columns and four rows, and each of the four summing processors processes the outputs of the corresponding computing units in the same row. The 4-by-16 processor array at each column has four of the sixty-four computing units, and the 4-by-16 processor array at each row has sixteen of the sixty-four computing units. FIG. 3B only shows twelve computing units at the first and second left and first right columns in the process array. The sixty-four computing units receive the sixteen input signals $Y_1$ output from the sixteen preprocessor modules 800a-800p. The preprocessor modules 800c-800o are not shown in FIG. 3B. The total number of the input signals $Y_1$ is sixteen equal to the total number of the preprocessor modules 800a-800p.

Referring to FIG. 3B, the four computing units in each column in the processor array receive a corresponding digital signal $Y_1$ output from a corresponding one of the sixteen preprocessor modules 800a-800p, and thus the sixteen digital signals $Y_1$ output from the sixteen preprocessor modules 800a-800p can be received by the sixty-four computing units in the respective sixteen columns in the processor array. Upon receiving the sixteen digital signals $Y_1$ output from the sixteen preprocessor modules 800a-800p, each of the sixty-four computing units independently weights its received digital signal $Y_1$ to generate a weighted signal. Each of the four summing processors provides a means for summing weighted signals generated by the corresponding sixteen computing units in same row in the processor array to produce a corresponding digital signal or beam $W_1$, i.e. beam weighting vector, output to the corresponding one of the four post-processor modules 802a-802d. Accordingly, the four summing processors can output the four digital signals or beams $W_1$, each combined with the weighted signals output from the computing units in a corresponding one of the four rows in the processor array. Thereby, the DBFN module 801a outputs four linear combinations, each combined with the sixteen input signals $Y_1$ multiplied by respective weightings, represented by the four digital signals $W_1$, wherein the total number of the linear combinations represented by the signals $W_1$ is four equal to the total number of the post-processor modules 802a-802d.

Referring to FIG. 3B, the DBFN module 801a can employ digital numerical techniques to create four beam weighting vectors that are four linear combinations, each combined with the sixteen input signals $Y_1$ in the same corresponding row in its 4-by-16 processor array multiplied by respective weightings, represented by the four signals or beams $W_1$. The DBFN module 801b can employ digital numerical techniques to create four beam weighting vectors that are four linear combinations, each combined with the sixteen input signals $Y_2$ in the same corresponding row in its 4-by-16 processor array multiplied by respective weightings, represented by the four signals or beams $W_2$. The DBFN module 801c can employ digital numerical techniques to create four beam weighting vectors that are four linear combinations, each combined with the sixteen input signals $Y_3$ in the same corresponding row in its 4-by-16 processor array multiplied by respective weightings, represented by the four signals or beams $W_3$. The DBFN module 801d can employ digital numerical techniques to create four beam weighting vectors that are four linear combinations, each combined with the sixteen input signals $Y_4$ in the same corresponding row in its 4-by-16 processor array multiplied by respective weightings, represented by the four signals or beams $W_4$.

Referring to FIG. 3A, a method for processing data streams or signals by using the system 700 is described below. The sixteen signals $A_0$ from, e.g., one or more wireless base stations (such as mobile base stations or Wi-Fi base stations) or array elements such as antenna array elements are respectively transmitted into the sixteen 1-to-3 time-domain demultiplexers 50 of the sixteen preprocessor modules 800a-800p through, e.g., sixteen parallel signal paths, sixteen parallel wireless channels or sixteen parallel physical channels. Alternatively, the sixteen signals $A_0$ can be or come from, but not limited to, sixteen digital signals including the four digital signals $Z_1, Z_2, Z_3$ and $Z_4$ illustrated in FIG. 2A, including the three digital signals $Z_1, Z_2$ and $Z_3$ illustrated in FIG. 2B, including the seven digital signals $Z_1$-$Z_7$ illustrated in FIG. 2C, or including the digital signal $Z_0$ or $Z_1$ illustrated in FIG. 2D. Each of the sixteen digital signals $A_0$ can be, but not limited to, a RF digital signal, an IF digital signal, or a real-time digital signal.

Next, referring to FIG. 3A, each of the sixteen 1-to-3 time-domain demultiplexers 50 of the sixteen preprocessor modules 800a-800p divides the received signal $A_0$ having a frequency bandwidth of J sampled at a sampling rate of K into a set of three digital signals $X_1, X_2$ and $X_3$, each having a frequency bandwidth of J/3 sampled at a sampling rate of K/3, output in parallel from its three outputs.

Next, referring to FIG. 3A, the sixteen sets of the digital signals $X_1, X_2$ and $X_3$ are respectively transmitted in parallel to the sixteen wave-front multiplexers 213 of the sixteen preprocessor modules 800a-800p, and at the same time, sixteen digital pilot or diagnostic signals $X_4$ are respectively transmitted in parallel to the sixteen wave-front multiplexers 213 of the sixteen preprocessor modules 800a-800p. Each of the sixteen pilot or diagnostic signals $X_4$ may have a single frequency and fixed amplitude. Alternatively, each of the sixteen pilot or diagnostic signals $X_4$ could change based on time or could be any signal known by the system 700. In contrast, the sixteen sets of the three digital signals $X_1, X_2$ and $X_3$ input into the sixteen wave-front multiplexers 213 of the sixteen preprocessor modules 800a-800p are unknown by the system 700. The sixteen extraneous signals $A_0$ input into the sixteen preprocessor modules 800a-800p are unknown by the system 700.

Referring to FIG. 3A, after sixteen sets of the four signals $X_1$-$X_4$ are input into the sixteen wave-front multiplexers 213 of the sixteen preprocessor modules 800a-800p, each wave-front multiplexer 213 of the sixteen preprocessor modules 800a-800p performs the above-mentioned wave-front multiplexing transformation to process a corresponding set of the four input signals $X_1, X_2, X_3$ and $X_4$ into a corresponding set of four linear combinations, each combined with the four input signals $X_1, X_2, X_3$ and $X_4$ in the corresponding set multiplied by respective weightings, represented by a corresponding set of the four output signals $Y_1, Y_2, Y_3$ and $Y_4$ each having a frequency bandwidth of J/3 sampled at a sampling rate of K/3. Next, the sixteen wave-front multiplexers 213 of the sixteen preprocessor modules 800a-800p output the sixteen sets of the four digital signals $Y_1, Y_2, Y_3$ and $Y_4$ to the four narrow DBFN modules 801a-801d through, e.g., multiple parallel signal paths, multiple parallel physical channels or multiple parallel wireless channels.

For example, the wave-front multiplexer 213 of the preprocessor module 800a outputs a set of the four digital signals $Y_1, Y_2, Y_3$ and $Y_4$ to the four narrow DBFN modules 801a-801d through, e.g., four parallel signal paths, four parallel physical channels or four parallel wireless channels. The wave-front multiplexer 213 of the preprocessor modules 800b outputs another set of the four digital signals $Y_1, Y_2, Y_3$ and $Y_4$ to the four narrow DBFN modules 801a-801d through, e.g., four parallel signal paths, four parallel physical channels or four parallel wireless channels. The wave-front multiplexer 213 of the preprocessor modules 800c outputs another set of the four digital signals $Y_1, Y_2, Y_3$ and $Y_4$ to the four narrow DBFN modules 801a-801d through, e.g., four parallel signal paths, four parallel physical channels or four parallel wireless channels. The wave-front multiplexer 213 of the preprocessor modules 800d outputs the other set of the four digital signals $Y_1, Y_2, Y_3$ and $Y_4$ to the four narrow DBFN modules 801a-801d through, e.g., four parallel signal paths, four parallel physical channels or four parallel wireless channels. Thereby, the sixteen digital signals $Y_1$ from the sixteen preprocessor modules 800a-800p are sent to the narrowband DBFN module 801a through, e.g., sixteen parallel signal paths, sixteen parallel physical channels or sixteen parallel wireless channels. The sixteen digital signals $Y_2$ from the sixteen preprocessor modules 800a-800p are sent to the narrowband DBFN module 801b through, e.g., sixteen parallel signal paths, sixteen parallel physical channels or sixteen parallel wireless channels. The sixteen digital signals $Y_3$ from the sixteen preprocessor modules 800a-800p are sent to the narrowband DBFN module 801c through, e.g., sixteen parallel signal paths, sixteen parallel physical channels or sixteen parallel wireless channels. The sixteen digital signals $Y_4$ from the sixteen preprocessor modules 800a-800p are sent to the narrowband DBFN module 801d through, e.g., sixteen parallel signal paths, sixteen parallel physical channels or sixteen parallel wireless channels.

Next, referring to FIG. 3A, the narrowband DBFN module 801a processes the sixteen input signals $Y_1$ from the sixteen preprocessor modules 800a-800p and generates the four digital signals or beams $W_1$ that are four individual linear combinations, each combined with the sixteen input signals $Y_1$, output from the sixteen wave-front multiplexers 213 of the sixteen preprocessor modules 800a-800p, multiplied by respective weightings and outputs the four digital signals or beams $W_1$, each having a frequency bandwidth of J/3 sampled at a sampling rate of K/3, to the four equalizers 231 of the four post-processor modules 802a-802d, respectively. The narrowband DBFN module 801b processes the sixteen input signals $Y_2$ from the sixteen preprocessor modules 800a-800p and generates the four digital signals or beams $W_2$ that are four individual linear combinations, each combined with the sixteen input signals $Y_2$, output from the sixteen wave-front multiplexers 213 of the sixteen preprocessor modules 800a-800p, multiplied by respective weightings and outputs the four digital signals or beams $W_2$, each having a frequency bandwidth of J/3 sampled at a sampling rate of K/3, to the four equalizers 231 of the four post-processor modules 802a-802d, respectively. The narrowband DBFN module 801c processes the sixteen input signals $Y_3$ from the sixteen preprocessor modules 800a-800p and generates the four digital signals or beams $W_3$ that are four individual linear combinations, each combined with the sixteen input signals $Y_3$, output from the sixteen wave-front multiplexers 213 of the sixteen preprocessor modules 800a-800p, multiplied by respective weightings and outputs the four digital signals or beams $W_3$, each having a frequency bandwidth of J/3 sampled at a sampling rate of K/3, to the four equalizers 231 of the four post-processor modules 802a-802d, respectively. The narrowband DBFN module 801d processes the sixteen input signals $Y_4$ from the sixteen preprocessor modules 800a-800p and generates the four digital signals or beams $W_4$ that are four individual linear combinations, each combined with the sixteen input signals $Y_4$, output from the sixteen wave-front multiplexers 213 of the sixteen preprocessor modules 800a-800p, multiplied by respective weightings and outputs the four digital signals or beams $W_4$, each having a frequency bandwidth of J/3 sampled at a sampling rate of K/3, to the four equalizers 231 of the four post-processor modules 802a-802d, respectively. Thereby, each equalizer 231 of the four post-processor modules 802a-802d receives a corresponding set of the four input signals $W_1$, $W_2$, $W_3$ and $W_4$ output from the four narrowband DBFN modules 801a-801d.

Next, referring to FIG. 3A, each of the four post-processor module 802a-802d may perform the above-mentioned optimizing and equalizing process, illustrated in FIG. 1C, by its equalizer 231 and its optimizer 235 to adjust the amplitudes, phases, and/or time-delays of a corresponding set of the four input signals $W_1$, $W_2$, $W_3$ and $W_4$ output from the four narrowband DBFN modules 801a-801d, and each of the four equalizers 231 of the four post-processor modules 802a-802d generates a corresponding set of the four equalized signals $S_1$, $S_2$, $S_3$ and $S_4$ each having a frequency bandwidth of J/3 sampled at a sampling rate of K/3 and outputs the corresponding set of the four equalized signals $S_1$, $S_2$, $S_3$ and $S_4$ to the corresponding wave-front demultiplexer 232. Each of the equalized digital signals $S_1$, $S_2$, $S_3$ and $S_4$ in the corresponding set is created by the corresponding equalizer 231 multiplying the corresponding one of the four digital signals $W_1$, $W_2$, $W_3$ and $W_4$ in the corresponding set by a weighting of the corresponding equalizer 231. For example, each of the four equalized digital signals $S_1$ is created by the corresponding equalizer 231 multiplying the corresponding digital signal $W_1$ by a weighting of the corresponding equalizer 231. Each of the four equalized digital signals $S_2$ is created by the corresponding equalizer 231 multiplying the corresponding digital signal $W_2$ by a weighting of the equalizer 231. Each of the four equalized digital signals $S_3$ is created by the corresponding equalizer 231 multiplying the corresponding digital signal $W_3$ by a weighting of the corresponding equalizer 231. Each of the four equalized digital signals $S_4$ is created by the corresponding equalizer 231 multiplying the corresponding digital signal $W_4$ by a weighting of the corresponding equalizer 231.

Next, referring to FIG. 3A, the four sets of the four equalized digital signals $S_1$, $S_2$, $S_3$ and $S_4$ in the four post-processor modules 802a-802d are respectively transmitted in parallel into the four wave-front demultiplexers 232 of the four post-processor modules 802a-802d through multiple parallel signal paths or multiple parallel wireless or physical channels between the four equalizers 231 of the four post-processor modules 802a-802d and the four wave-front demultiplexers 232 of the four post-processor modules 802a-802d.

Next, referring to FIG. 3A, each wave-front demultiplexer 232 of the four post-processor modules 802a-802d performs the above wave-front demultiplexing transform to process the corresponding set of the four equalized digital signals $S_1$, $S_2$, $S_3$ and $S_4$ into a corresponding set of four linear combinations, each combined with the four equalized digital signals $S_1$, $S_2$, $S_3$ and $S_4$ in the corresponding set multiplied by respective weightings, represented by a corresponding set of the four digital signals $Z_1$, $Z_2$, $Z_3$ and $Z_4$, each having a frequency bandwidth of J/3 sampled at a sampling rate of K/3, output in parallel from said each wave-front demultiplexer 232 of the four post-processor modules 802a-802d.

Each of the four wave-front demultiplexers 232 of the four post-processor modules 802a outputs the corresponding signal $Z_4$ to the corresponding optimizer 235, and each of the four optimizers 235 of the four post-processor modules 802a-802d generates the control signal CS and sends the control signal CS to the corresponding equalizer 231 to adjust the weightings of the corresponding equalizer 231, as illustrated in FIG. 1C.

At the same time, the four wave-front demultiplexers 232 of the four post-processor modules 802a-802d output in parallel four sets of the three digital signals $Z_1$, $Z_2$ and $Z_3$ to the four 3-to-1 time-domain multiplexers 51 of the four post-processor module 802a-802d, and each 3-to-1 time-domain multiplexer 51 of the four post-processor modules 802a-802d combines or integrates the corresponding set of the three parallel signals $Z_1$, $Z_2$ and $Z_3$ into a corresponding single signal or beam $B_0$ having a frequency bandwidth of J sampled at a sampling rate of K and outputs the signal $B_0$ from its output.

Thereby, referring to FIG. 3A, the sixteen input signals $A_0$ are respectively processed by the sixteen preprocessor modules 800a-800p, and each of the sixteen preprocessor modules 800a-800p outputs a set of the four digital signals $Y_1$, $Y_2$, $Y_3$ and $Y_4$ to the four narrowband DBFN modules 801a-801d. The sixteen sets of the four digital signals $Y_1$, $Y_2$, $Y_3$ and $Y_4$ are processed by the four narrowband DBFN modules 801a-801d, and the four narrowband DBFN modules 801a-801d output four sets of the four digital signals or beams $W_1$-$W_4$ to the four post-processor modules 802a-802d. The four sets of the four digital signals or beams $W_1$-$W_4$ are respectively processed by the four post-processor modules 802a-802d, and each of the four post-processor modules 802a-802d outputs the digital signal or beam $B_0$.

Referring to FIG. 3A, the broadband DBFN system 700 can process the sixteen input signals $A_0$ each having a bandwidth greater than that of each of the signals $Y_1$, $Y_2$, $Y_3$ and $Y_4$ output from the sixteen preprocessor modules 800a-800p, greater than that of each of the signals $W_1$, $W_2$, $W_3$ and $W_4$ input into the four post-processor modules 802a-802d, and substantially equal to each of the four signals $B_0$ output from the four postprocessor modules 802a-802d. The broadband DBFN system 700 can process the sixteen input signals $A_0$ each sampled at a greater sampling rate than each of the signals $Y_1$, $Y_2$, $Y_3$ and $Y_4$ output from the sixteen preprocessor modules 800a-800p is sampled and than each of the signals $W_1$, $W_2$, $W_3$ and $W_4$ input into the four post-processor modules 802a-802d is sampled. The broadband DBFN system 700 can process the sixteen input signals $A_0$ each sampled at the same sampling rate as each signal $B_0$ output from the four postprocessor modules 802a-802d is sampled.

Referring to FIG. 3A, each of the signals $A_0$, $X_1$-$X_4$, $Y_1$-$Y_4$, $W_1$-$W_4$, $S_1$-$S_4$, $Z_1$-$Z_4$ and $B_0$ can be, but not limited to, sampled at least twice or triple its (maximum) frequency or bandwidth. Each signal $A_0$ may have a frequency, such as maximum frequency, or bandwidth at least three times higher than that of each of the signals $X_1$-$X_4$, $Y_1$-$Y_4$, $W_1$-$W_4$, $S_1$-$S_4$ and $Z_1$-$Z_4$ and substantially equal to that of each signal $B_0$. Each of the four signals $B_0$ may have a frequency, such as maximum frequency, or bandwidth at least three times higher than that of each of the signals $X_1$-$X_4$, $Y_1$-$Y_4$, $W_1$-$W_4$, $S_1$-$S_4$ and $Z_1$-$Z_4$.

Referring to FIG. 3A, the signal $A_0$ input to the preprocessor module 800b may have a frequency, such as maximum frequency, equal to or lower than that of the signal $A_0$ input to the preprocessor module 800a. The signal $A_0$ input to the preprocessor module 800c may have a frequency, such as maximum frequency, equal to or lower than those of the signals $A_0$ input to the preprocessor module 800a and 800b, respectively. The signal $A_0$ input to the preprocessor module 800d may have a frequency, such as maximum frequency, equal to or lower than those of the signals $A_0$ input to the preprocessor module 800a, 800b and 800c, respectively. Thereby, all of the sixteen signals $A_O$ input to the sixteen preprocessor modules 800a-800p may have the same (maximum) frequency or bandwidth and all of the sixteen signals $A_O$ input to the sixteen preprocessor modules 800a-800p may be sampled at the same sampling rate. Alternatively, the sixteen signals $A_O$ input to the sixteen preprocessor modules 800a-800p may have different (maximum) frequencies or bandwidths from one another, and the sixteen signals $A_O$ input to the sixteen preprocessor modules 800a-800p may be sampled at different sampling rates from one another.

Alternatively, the system 700 may include more than sixteen preprocessor modules to receive and process more than sixteen input signals and may also include more than four post-processor modules to generate more than four output signals or beams. Moreover, each of the four narrowband DBFN modules 801a-801d of the system 700 can process more than sixteen individual digital signals from the more than sixteen preprocessor modules to create more than four digital coherent signals or beams.

Alternatively, the system 700 may include at least two preprocessor modules to receive and process at least two input signals and may also include at least one post-processor module to generate at least one output signal or beam. Moreover, each of the four narrowband DBFN modules 801a-801d of the system 700 can process at least two individual digital signals from the at least two preprocessor modules to create at least one digital signal or beam.

Figure 3C:
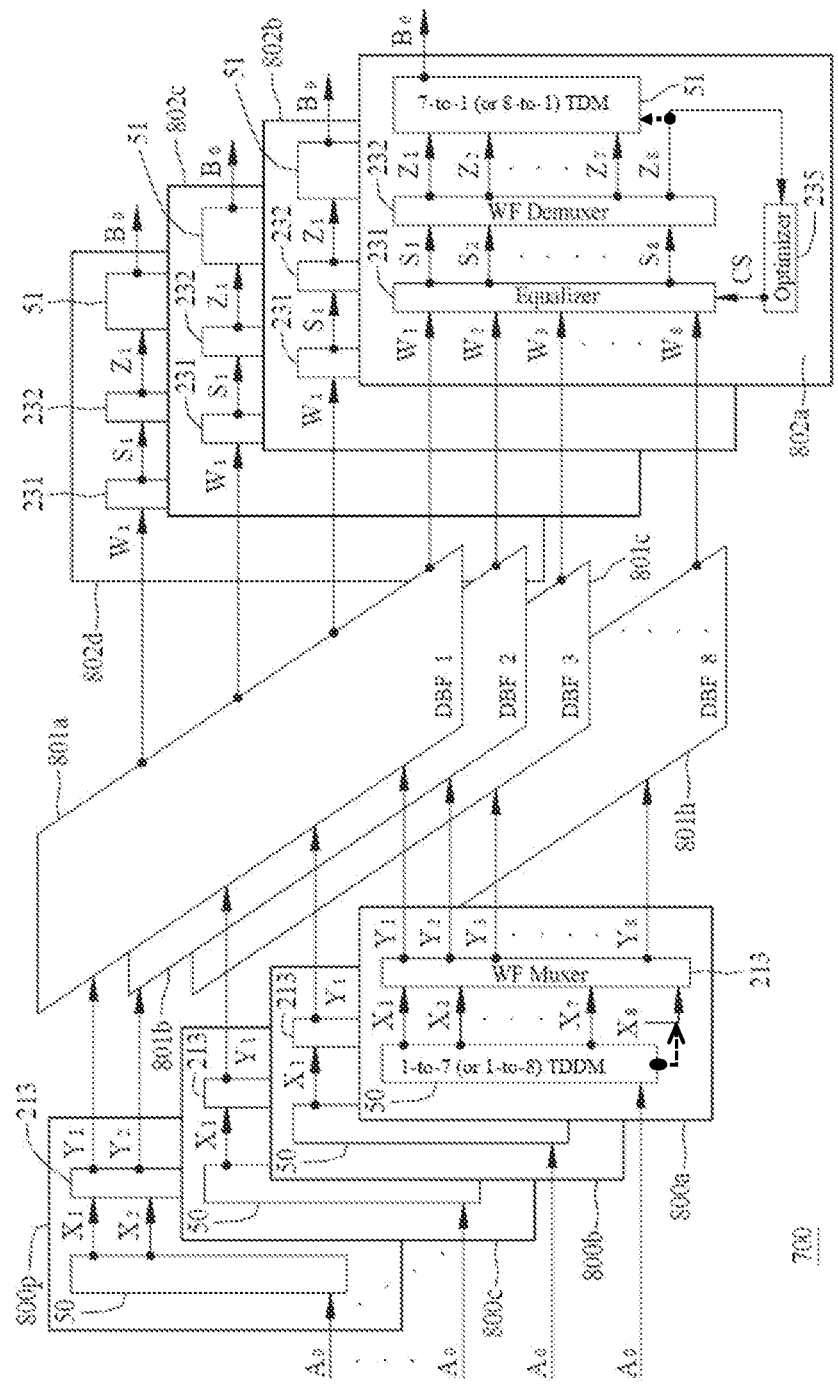
FIG. 3C shows a broadband DBFN system including sixteen preprocessor modules, eight narrowband DBFN modules and four post-processor modules according to an embodiment of the present disclosure.

Alternatively, the system 700 can include more than four narrowband DBFN modules, such as eight narrowband DBFN modules 801a-801h illustrated in FIG. 3C (the four narrowband DBFN modules 801d-801g are not shown in FIG. 3C). In this case, each of the preprocessor modules of the system 700 may include a 1-to-M time-domain demultiplexer and a H-input and H-output wave-front multiplexer, and each of the post-processor modules of the system 700 may include a M-to-1 time-domain multiplexer, an equalizer, a I-input and I-output wave-front demultiplexer, and an optimizer, where H is an integer equal to the total number of the narrowband DBFN modules of the system 700, I is an integer equal to the integer H, and M is an integer less than or equal to each of the integers H and I.

The 1-to-M time-domain demultiplexer denotes that it can divide an input signal, having a frequency bandwidth of J sampled at a sampling rate of K, into the number M of output signals, each having a frequency bandwidth of J/M sampled at a sampling rate of K/M. For example, the 1-to-M time-domain demultiplexer can be, but not limited to, a 1-to-7 time-domain demultiplexer 50 shown in FIG. 3C, and the 1-to-7 time-domain demultiplexer 50 denotes that it can divide an input signal, having a frequency bandwidth of J sampled at a sampling rate of K, into seven output signals, each having a frequency bandwidth of J/7 sampled at a sampling rate of K/7.

The M-to-1 time-domain multiplexer denotes that it can combine or integrate the number M of input signals, each having a frequency bandwidth of J/M sampled at a sampling rate of K/M, into an output signal having a frequency bandwidth of J sampled at a sampling rate of K. For example, the M-to-1 time-domain multiplexer can be, but not limited to, a 7-to-1 time-domain multiplexer 51 shown in FIG. 3C, and the 7-to-1 time-domain multiplexer 51 denotes that it can combine or integrate seven input signals, each having a frequency bandwidth of J/7 sampled at a sampling rate of K/7, into an output signal having a frequency bandwidth of J sampled at a sampling rate of K.

The H-input and H-output wave-front multiplexer denotes that it has the number H of inputs to receive the number H of input signals and the number H of outputs to output the number H of linear combinations, each combined with the number H of the input signals multiplied by respective weightings. For example, the H-input and H-output wave-front multiplexer can be, but not limited to, an eight-input and eight-output wave-front multiplexer 213 illustrated in FIG. 3C, and the eight-input and eight-output wave-front multiplexer 213 denotes that it has eight inputs to receive eight input signals $X_1$-$X_8$ and eight outputs to output eight linear combinations, each combined with the eight input signals $X_1$-$X_8$ multiplied by respective weightings, represented by eight output signals $Y_1$-$Y_8$, which can be referred to as the description illustrated in FIG. 1D. In this case, the number of H is equal to 8. The wavefront multiplexer 213 illustrated in FIG. 3C may include 8*8 computing units and eight summing processors, wherein the computing units form a processor array with eight rows and eight columns. The eight input signals $X_1$-$X_8$ can be received by the computing units in the respective eight columns in the processor array. Upon receiving the eight input signals $X_1$-$X_8$, each of the computing units independently weights its received signal, multiplied by a weighting value, to generate a weighted signal. The eight summing processors can output the eight signals $Y_1$-$Y_8$ each combined with the weighted signals output from the computing units in a corresponding one of the eight rows in the processor array.

The I-input and I-output wave-front demultiplexer denotes that it has the number I of inputs to receive the number I of input signals and the number I of outputs to output the number I of linear combinations, each combined with the number I of the input signals multiplied by respective weightings. For example, the I-input and I-output wave-front demultiplexer can be, but not limited to, an eight-input and eight-output wave-front demultiplexer 232 illustrated in FIG. 3C, and the eight-input and eight-output wave-front demultiplexer 232 denotes that it has eight inputs to receive eight input signals $S_1$-$S_8$ and eight outputs to output eight linear combinations, each combined with the eight input signals $S_1$-$S_8$ multiplied by respective weightings, represented by eight output signals $Z_1$-$Z_8$, which can be referred to as the description illustrated in FIG. 1E. In this case, the number of I is equal to 8. The wavefront demultiplexer 232 illustrated in FIG. 3C may include 8*8 computing units and eight summing processors, wherein the computing units form a processor array with eight rows and eight columns. The input signals $S_1$-$S_8$ can be received by the computing units in the respective eight columns in the processor array. Upon receiving the input signals $S_1$-$S_8$, each of the computing units independently weights its received signal, multiplied by a weighting value, to generate a weighted signal. The eight summing processors can output the eight signals $Z_1$-$Z_8$ each combined with the weighted signals output from the computing units in a corresponding one of the eight rows in the processor array.

Referring to FIG. 3C, the system 700 may include sixteen preprocessor modules 800a-800p having the same architecture as one another, the eight narrowband DBFN modules 801a-801h having the same architecture as one another, and four post-processor modules 802a-802d having the same architecture as one another. Each of the sixteen preprocessor modules 800a-800p of the system 700 includes the 1-to-7 time-domain demultiplexer 50 and the eight-input and eight-output wave-front multiplexer 213, and each of the four post-processor modules 802a-802d of the system 700 includes the 7-to-1 time-domain multiplexer 51, the equalizer 231, the eight-input and eight-output wave-front demultiplexer 232, and the optimizer 235. Each of the 1-to-7 time-domain demultiplexers 50 of the sixteen preprocessor modules 800a-800p includes an input and seven outputs and can divide an input signal having a frequency bandwidth of J sampled at a sampling rate of K, input to its input, into seven output signals each having a frequency bandwidth of J/7 sampled at a sampling rate of K/7, output from its seven outputs. Each of the 7-to-1 time-domain multiplexers 51 of the four post-processor modules 802a-802d includes seven inputs and an output and can combine or integrate seven input signals each having a frequency bandwidth of J/7 sampled at a sampling rate of K/7, input to its seven inputs, into an output signal having a frequency bandwidth of J sampled at a sampling rate of K, output from its output. The eight narrowband DBFN modules 801a-801h can process sixteen sets of the eight signals $Y_1$-$Y_8$, each having a frequency bandwidth of J/7 sampled at a sampling rate of K/7, output from the sixteen preprocessor modules 800a-800p so as to output four sets of the eight digital signals or beams $W_1$-$W_8$, each having a frequency bandwidth of J/7 sampled at a sampling rate of K/7, to the four post-processor modules 802a-802d. Each of the eight narrowband DBFN modules 801a-801h illustrated herein has the same architecture as the narrowband DBFN module 801a illustrated in FIG. 3A.

A method for processing data streams or signals by using the system 700 illustrated in FIG. 3C is described below. Sixteen different signals $A_0$ from, e.g., one or more wireless base stations (such as mobile base stations or Wi-Fi base stations) or array elements such as antenna array elements are respectively transmitted into the sixteen 1-to-7 time-domain demultiplexers 50 of the sixteen preprocessor modules 800a-800p through, e.g., sixteen parallel signal paths, sixteen parallel wireless channels or sixteen parallel physical channels. Alternatively, the sixteen signals $A_0$ can be or come from, but not limited to, sixteen digital signals including the four digital signals $Z_1$, $Z_2$, $Z_3$ and $Z_4$ illustrated in FIG. 2A, including the three digital signals $Z_1$, $Z_2$ and $Z_3$ illustrated in FIG. 2B, including the seven digital signals $Z_1$-$Z_7$ illustrated in FIG. 2C, or including the digital signal $Z_0$ or $Z_1$ illustrated in FIG. 2D. Each of the sixteen digital signals $A_0$ can be, but not limited to, a RF digital signal, an IF digital signal, or a real-time digital signal. In FIG. 3C, the signals with the same reference number may not represent the signals carrying the same information.

Next, referring to FIG. 3C, each of the sixteen 1-to-7 time-domain demultiplexers 50 of the sixteen preprocessor modules 800a-800p divides the received signal $A_0$ having a frequency bandwidth of J sampled at a sampling rate of K into a set of seven digital signals $X_1$-$X_7$ each having a frequency bandwidth of J/7 sampled at a sampling rate of K/7 and outputs the set of the seven digital signals $X_1$-$X_7$ from its seven outputs. The four signals $X_3$-$X_6$ are not shown in FIG. 3C. Next, the sixteen sets of the seven digital signals $X_1$-$X_7$, output from the sixteen 1-to-7 time-domain demultiplexers 50 of the sixteen preprocessor modules 800a-800p, are respectively transmitted in parallel to the sixteen wave-front multiplexers 213 of the sixteen preprocessor modules 800a-800p, and at the same time, sixteen digital pilot or diagnostic signals $X_8$ are respectively transmitted in parallel to the sixteen wave-front multiplexers 213 of the sixteen preprocessor modules 800a-800p. Each of the sixteen pilot or diagnostic signals $X_8$ may have a single frequency and fixed amplitude. Alternatively, each of the sixteen pilot or diagnostic signals $X_8$ could change based on time or could be any signal known by the system 700. In contrast, the sixteen sets of the seven digital signals $X_1$-$X_7$, input into the sixteen wave-front multiplexers 213 of the sixteen preprocessor modules 800a-800p, are unknown by the system 700. The sixteen extraneous signals $A_0$ input into the sixteen preprocessor modules 800a-800p are unknown by the system 700.

Referring to FIG. 3C, after sixteen sets of the eight signals $X_1$-$X_8$ are sent into the sixteen wave-front multiplexers 213 of the sixteen preprocessor modules 800a-800p, each wave-front multiplexer 213 of the sixteen preprocessor modules 800a-800p performs the above wave-front multiplexing transform to process a corresponding set of the eight input signals $X_1$-$X_8$ into a corresponding set of eight linear combinations, each combined with the eight input signals $X_1$-$X_8$ in the corresponding set multiplied by respective weightings, represented by a corresponding set of the eight output signals $Y_1$-$Y_8$ each having a frequency bandwidth of J/7 sampled at a sampling rate of K/7. The four signals $Y_4$-$Y_7$ are not shown in FIG. 3C. Thereby, the sixteen wave-front multiplexers 213 of the sixteen preprocessor modules 800a-800p output the sixteen sets of the eight digital signals $Y_1$-$Y_8$ to the eight narrow DBFN modules 801a-801h through, e.g., multiple parallel signal paths, multiple parallel physical channels or multiple parallel wireless channels.

Each of the sixteen wave-front multiplexers 213 of the sixteen preprocessor modules 800a-800p outputs the corresponding set of the eight digital signals $Y_1$-$Y_8$ to the eight narrow DBFN modules 801a-801h through, e.g., eight parallel signal paths, eight parallel physical channels or eight parallel wireless channels. Thereby, the sixteen signals $Y_1$ from the sixteen preprocessor modules 800a-800p are sent to the narrowband DBFN module 801a through, e.g., sixteen parallel signal paths, sixteen parallel physical channels or sixteen parallel wireless channels. The sixteen signals $Y_2$ from the sixteen preprocessor modules 800a-800p are sent to the narrowband DBFN module 801b through, e.g., sixteen parallel signal paths, sixteen parallel physical channels or sixteen parallel wireless channels. The sixteen signals $Y_3$ from the sixteen preprocessor modules 800a-800p are sent to the narrowband DBFN module 801c through, e.g., sixteen parallel signal paths, sixteen parallel physical channels or sixteen parallel wireless channels. The sixteen signals $Y_4$ from the sixteen preprocessor modules 800a-800p are sent to the narrowband DBFN module 801d through, e.g., sixteen parallel signal paths, sixteen parallel physical channels or sixteen parallel wireless channels. The sixteen signals $Y_5$ from the sixteen preprocessor modules 800a-800p are sent to the narrowband DBFN module 801e through, e.g., sixteen parallel signal paths, sixteen parallel physical channels or sixteen parallel wireless channels. The sixteen signals $Y_6$ from the sixteen preprocessor modules 800a-800p are sent to the narrowband DBFN module 801f through, e.g., sixteen parallel signal paths, sixteen parallel physical channels or sixteen parallel wireless channels. The sixteen signals $Y_7$ from the sixteen preprocessor modules 800a-800p are sent to the narrowband DBFN module 801g through, e.g., sixteen parallel signal paths, sixteen parallel physical channels or sixteen parallel wireless channels. The sixteen signals $Y_8$ from the sixteen preprocessor modules 800a-800p are sent to the narrowband DBFN module 801h through, e.g., sixteen parallel signal paths, sixteen parallel physical channels or sixteen parallel wireless channels.

Next, referring to FIG. 3C, the eight narrowband DBFN modules 801a-801h process the sixteen sets of the eight digital signals $Y_1$-$Y_8$ output from the sixteen preprocessor modules 800a-800p and generate four sets of the eight signals or beams $W_1$-$W_8$. The four digital signals or beams $W_1$ output from the narrowband DBFN module 801a are four individual linear combinations, each combined with the sixteen input signals $Y_1$ multiplied by respective weightings. The four digital signals or beams $W_2$ output from the narrowband DBFN module 801b are four individual linear combinations, each combined with the sixteen input signals $Y_2$ multiplied by respective weightings. The four digital signals or beams $W_3$ output from the narrowband DBFN module 801c are four individual linear combinations, each combined with the sixteen input signals $Y_3$ multiplied by respective weightings. The four digital signals or beams $W_4$ output from the narrowband DBFN module 801d are four individual linear combinations, each combined with the sixteen input signals $Y_4$ multiplied by respective weightings. The four digital signals or beams $W_5$ output from the narrowband DBFN module 801e are four individual linear combinations, each combined with the sixteen input signals $Y_5$ multiplied by respective weightings. The four digital signals or beams $W_6$ output from the narrowband DBFN module 801f are four individual linear combinations, each combined with the sixteen input signals $Y_6$ multiplied by respective weightings. The four digital signals or beams $W_7$ output from the narrowband DBFN module 801g are four individual linear combinations, each combined with the sixteen input signals $Y_7$ multiplied by respective weightings. The four digital signals or beams $W_8$ output from the narrowband DBFN module 801h are four individual linear combinations, each combined with the sixteen input signals $Y_8$ multiplied by respective weightings.

Next, referring to FIG. 3C, the eight DBFN modules 801a-801h output the four sets of the eight signals or beams $W_1$-$W_8$ to the four post-processor modules 802a-802d. The DBFN module 801a outputs the four signals or beams $W_1$, each having a frequency bandwidth of J/7 sampled at a sampling rate of K/7, to the four equalizers 231 of the four post-processor modules 802a-802d, respectively. The DBFN module 801b outputs the four signals or beams $W_2$, each having a frequency bandwidth of J/7 sampled at a sampling rate of K/7, to the four equalizers 231 of the four post-processor modules 802a-802d, respectively. The DBFN module 801c outputs the four signals or beams $W_3$, each having a frequency bandwidth of J/7 sampled at a sampling rate of K/7, to the four equalizers 231 of the four post-processor modules 802a-802d, respectively. The DBFN module 801d outputs the four signals or beams $W_4$, each having a frequency bandwidth of J/7 sampled at a sampling rate of K/7, to the four equalizers 231 of the four post-processor modules 802a-802d, respectively. The DBFN module 801e outputs the four signals or beams $W_5$, each having a frequency bandwidth of J/7 sampled at a sampling rate of K/7, to the four equalizers 231 of the four post-processor modules 802a-802d, respectively. The DBFN module 801f outputs the four signals or beams $W_6$, each having a frequency bandwidth of J/7 sampled at a sampling rate of K/7, to the four equalizers 231 of the four post-processor modules 802a-802d, respectively. The DBFN module 801g outputs the four signals or beams $W_7$, each having a frequency bandwidth of J/7 sampled at a sampling rate of K/7, to the four equalizers 231 of the four post-processor modules 802a-802d, respectively. The DBFN module 801h outputs the four signals or beams $W_8$, each having a frequency bandwidth of J/7 sampled at a sampling rate of K/7, to the four equalizers 231 of the four post-processor modules 802a-802d, respectively.

Next, referring to FIG. 3C, each of the four post-processor modules 802a-802d may perform an optimizing and equalizing process by its equalizer 231 and its optimizer 235 to adjust the amplitudes, phases, and/or time-delays of the eight signals $W_1$-$W_8$ output from its eight narrowband DBFN modules 801a-801h, and each of the four equalizers 231 of the four post-processor modules 802a-802d generates a corresponding set of the eight equalized signals $S_1$-$S_8$ each having a frequency bandwidth of J/7 sampled at a sampling rate of K/7 and outputs the corresponding set of the eight equalized signals $S_1$-$S_8$ to the corresponding wave-front demultiplexer 232. The signals $S_3$-$S_7$ are not shown in FIG. 3C. Each of the equalized digital signals $S_1$-$S_8$ in the corresponding set is created by the corresponding equalizer 231 multiplying the corresponding one of the eight digital signals $W_1$-$W_8$ in the corresponding set by a weighting of the corresponding equalizer 231. For example, each of the four equalized digital signals $S_1$ is created by the corresponding equalizer 231 multiplying the corresponding digital signal $W_1$ by a weighting of the corresponding equalizer 231.

Next, referring to FIG. 3C, the four sets of the eight equalized digital signals $S_1$-$S_8$ in the four post-processor modules 802a-802d are respectively transmitted in parallel into the four wave-front demultiplexers 232 of the four post-processor modules 802a-802d through multiple parallel signal paths or multiple parallel wireless or physical channels between the four equalizers 231 of the four post-processor modules 802a-802d and the four wave-front demultiplexers 232 of the four post-processor modules 802a-802d.

Next, referring to FIG. 3C, each of the four wave-front demultiplexers 232 of the four post-processor modules 802a-802d performs the above wave-front demultiplexing transform to process the corresponding set of the eight equalized digital signals $S_1$-$S_8$ into a corresponding set of eight linear combinations, each combined with the eight equalized digital signals $S_1$-$S_8$ in the corresponding set multiplied by respective weightings, represented by the eight digital signals $Z_1$-$Z_8$, each having a frequency bandwidth of J/7 sampled at a sampling rate of K/7, output in parallel from said each of the four wave-front demultiplexers 232 of the four post-processor modules 802a-802d.

Next, referring to FIG. 3C, each of the four wave-front demultiplexers 232 of the four post-processor modules 802a outputs the corresponding signal $Z_8$ to the corresponding optimizer 235, and each optimizer 235 of the four post-processor modules 802a-802d generates a control signal CS and sends the control signal CS to the corresponding equalizer 231 to adjust the weightings of the corresponding equalizer 231, as illustrated in FIG. 1C.

At the same time, the four wave-front demultiplexers 232 of the four post-processor modules 802a-802d output in parallel four sets of the seven digital signals $Z_1$-$Z_7$ to the four 7-to-1 time-domain multiplexers 51 of the four post-processor module 802a-802d, and each of the four 7-to-1 time-domain multiplexers 51 of the four post-processor modules 802a-802d combines or integrates the corresponding set of the seven parallel signals $Z_1$-$Z_7$ into a corresponding single signal or beam $B_0$, having a frequency bandwidth of J sampled at a sampling rate of K, and outputs the signal $B_0$ from its output.

Thereby, referring to FIG. 3C, the sixteen input signals $A_0$ are respectively processed by the sixteen preprocessor modules 800a-800p, and each of the sixteen preprocessor modules 800a-800p outputs a set of the eight digital signals $Y_1$-$Y_8$ to the eight narrowband DBFN modules 801a-801h. The sixteen sets of the eight digital signals $Y_1$-$Y_8$ are processed by the eight narrowband DBFN modules 801a-801h, and the eight narrowband DBFN modules 801a-801h output four sets of the eight digital signals or beams $W_1$-$W_8$ to the four post-processor modules 802a-802d. The four sets of the eight digital signals or beams $W_1$-$W_8$ are respectively processed by the four post-processor modules 802a-802d, and each of the four post-processor modules 802a-802d outputs the digital signal or beam $B_0$.

Referring to FIG. 3C, the broadband DBFN system 700 can process the sixteen input signals $A_0$, each having a bandwidth greater than that of each of the signals $Y_1$-$Y_8$ output from the preprocessor modules 800a-800p, greater than that of each of the signals $W_1$-$W_8$ input into the four post-processor modules 802a-802d, and substantially equal to each of the four signals $B_0$ output from the four post-processor modules 802a-802d. The broadband DBFN system 700 can process the sixteen input signals $A_0$ each sampled at a greater sampling rate than each of the signals $Y_1$-$Y_8$ output from the sixteen preprocessor modules 800a-800p is sampled and than each of the signals $W_1$-$W_8$ input into the four post-processor modules 802a-802d is sampled. The broadband DBFN system 700 can process the sixteen input signals $A_0$ each sampled at the same sampling rate as each signal $B_0$ output from the postprocessor modules 802a-802d is sampled.

Referring to FIG. 3C, each of the signals $A_0$, $X_1$-$X_8$, $Y_1$-$Y_8$, $W_1$-$W_8$, $S_1$-$S_8$, $Z_1$-$Z_8$ and $B_0$ can be, but not limited to, sampled at least twice or triple its (maximum) frequency or bandwidth. Each signal $A_0$ may have a frequency, such as maximum frequency, or bandwidth substantially seven times higher than that of each of the signals $X_1$-$X_8$, $Y_1$-$Y_8$, $W_1$-$W_8$, $S_1$-$S_8$ and $Z_1$-$Z_8$ and substantially equal to that of each signal $B_0$. All of the signals $A_0$ input to the preprocessor modules 800a-800p may have the same maximum frequency or bandwidth, and all of the signals $A_0$ input to the preprocessor modules 800a-800p may be sampled at the same sampling rate. Alternatively, the signals $A_0$ input to the preprocessor modules 800a-800p may have different maximum frequencies or bandwidths from one another, and the signals $A_0$ input to the preprocessor modules 800a-800p may be sampled at different sampling rates from one another.

Figure 3D:
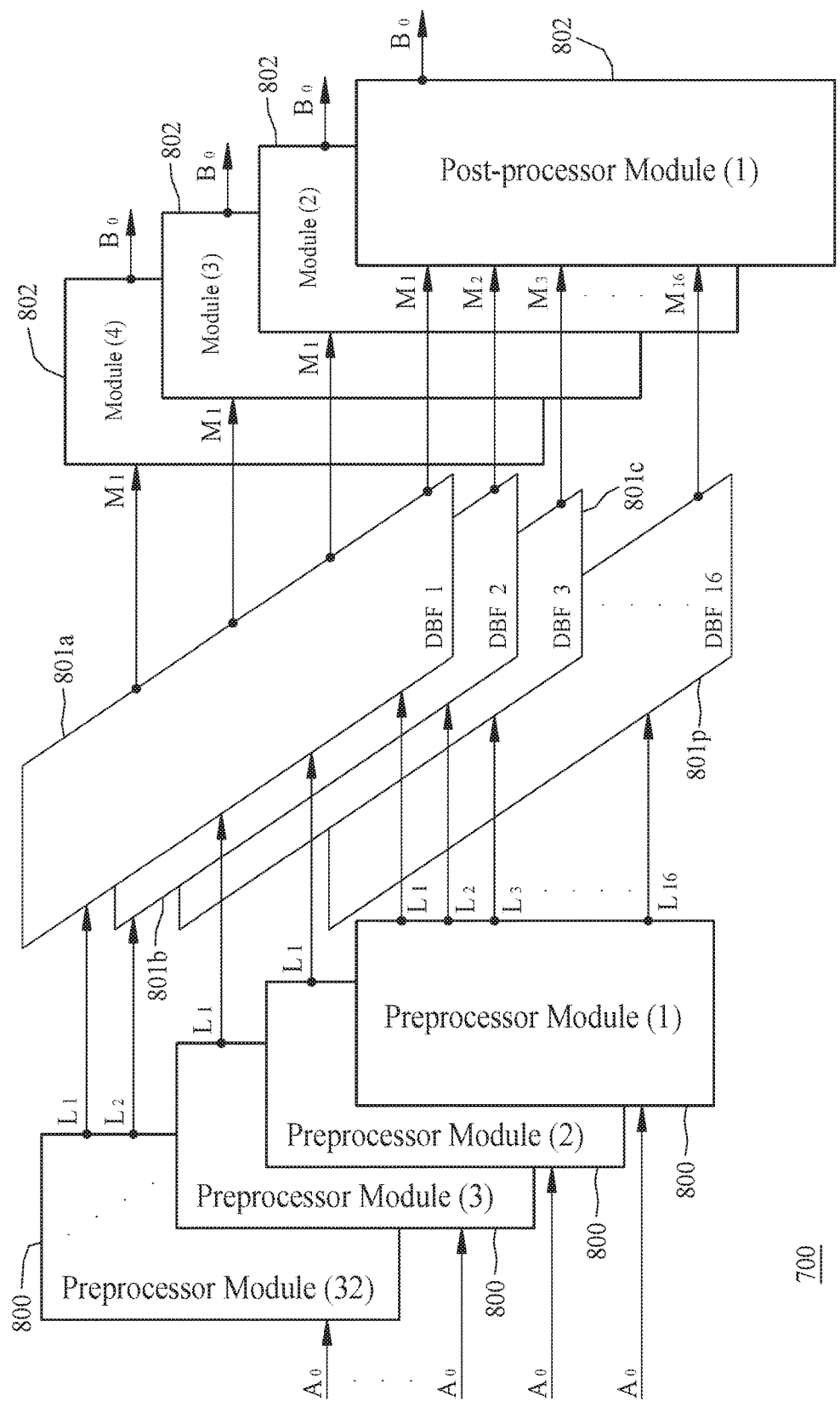
FIG. 3D shows a broadband DBFN system including thirty-two preprocessor modules, sixteen narrowband DBFN modules and four post-processor modules according to an embodiment of the present disclosure.

Alternatively, the system 700 can include more than eight narrowband DBFN modules, such as sixteen narrowband DBFN modules 801a-801p illustrated in FIG. 3D. The narrowband DBFN modules 801d-801o are not shown in FIG. 3D. Moreover, the system 700 can include more than sixteen preprocessor modules, such as thirty-two preprocessor modules 800 illustrated in FIG. 3D, and can include more than or equal to two post-processor modules, such as four post-processor modules 802 illustrated in FIG. 3D. Each of the preprocessor modules of the system 700 may include a 1-to-M time-domain demultiplexer, a H-input and H-output wave-front multiplexer, and multiple U-to-1 time-domain multiplexers, and each of the post-processor modules of the system 700 may include a M-to-1 time-domain multiplexer, an equalizer, a I-input and I-output wave-front demultiplexer, an optimizer, and multiple 1-to-U time-domain demultiplexers, where H is an integer, I is an integer equal to the integer H, M is an integer less than or equal to each of the integers H and I, and U is an integer equal to the total number of the narrowband DBFN modules of the system 700 and less than each of the integers H, I and M. A signal input into the 1-to-M time-domain demultiplexer may have the bandwidth or (maximum) frequency substantially M times greater than that of each of signals output from the 1-to-M time-domain demultiplexer. A signal output from the M-to-1 time-domain multiplexer may have the bandwidth or (maximum) frequency substantially M times greater than that of each of signals input into the M-to-1 time-domain multiplexer. A signal input into the 1-to-U time-domain demultiplexer may have the bandwidth or (maximum) frequency substantially U times greater than that of each of signals output from the 1-to-U time-domain demultiplexer. A signal output from the U-to-1 time-domain multiplexer may have the bandwidth or (maximum) frequency substantially U times greater than that of each of signals input into the U-to-1 time-domain multiplexer.

Figure 3E:
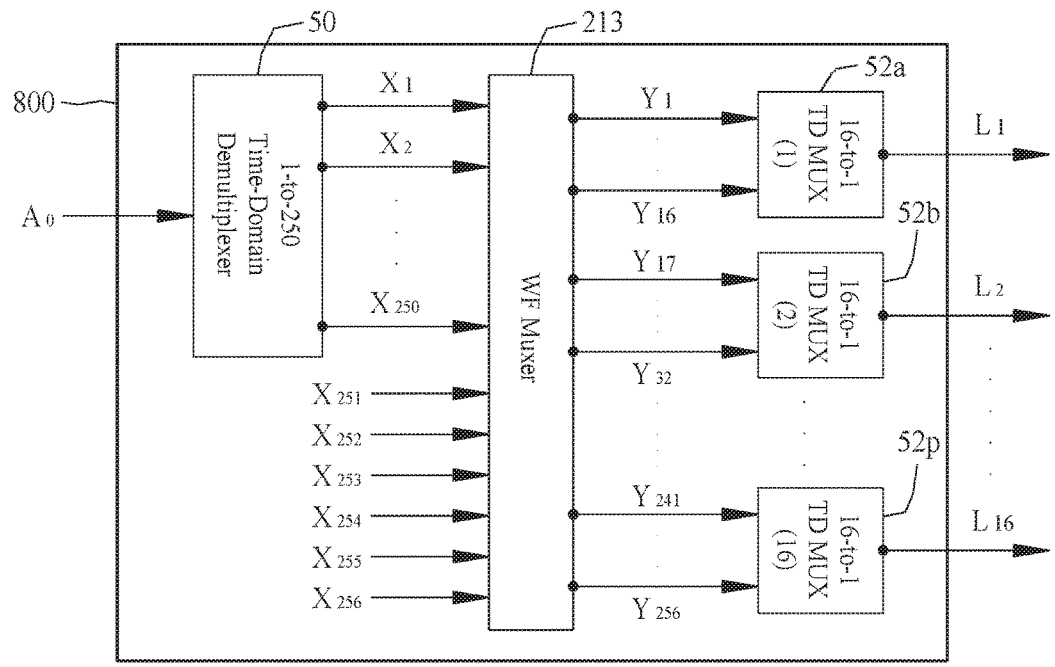
FIG. 3E shows architecture of a preprocessor module according to an embodiment of the present disclosure.

For example, the 1-to-M time-domain demultiplexer can be, but not limited to, a 1-to-250 time-domain demultiplexer 50 illustrated in FIG. 3E, and the 1-to-250 time-domain demultiplexer 50 denotes that it can divide an input signal $A_0$, having a frequency bandwidth of J sampled at a sampling rate of K, into two-hundred-and-fifty output signals $X_1$-$X_{250}$, each having a frequency bandwidth of J/250 sampled at a sampling rate of K/250. The signal $A_0$ input into the 1-to-250 time-domain demultiplexer 50 may have the bandwidth or (maximum) frequency substantially two-hundred-and-fifty times greater than that of each of the two-hundred-and-fifty signals $X_1$-$X_{250}$ output from the 1-to-250 time-domain demultiplexer 50. The M-to-1 time-domain multiplexer can be, but not limited to, a 250-to-1 time-domain multiplexer 51 illustrated in FIG. 3F, and the 250-to-1 time-domain multiplexer 51 denotes that it can combine or integrate two-hundred-and-fifty input signals $Z_1$-$Z_{250}$, each having a frequency bandwidth of J/250 sampled at a sampling rate of K/250, into an output signal $B_0$ having a frequency bandwidth of J sampled at a sampling rate of K. The signal $B_0$ output from the 250-to-1 time-domain multiplexer 51 may have the bandwidth or (maximum) frequency substantially two-hundred-and-fifty times greater than that of each of the two-hundred-and-fifty signals $Z_1$-$Z_{250}$ input into the 250-to-1 time-domain multiplexer 51.

Figure 3F:
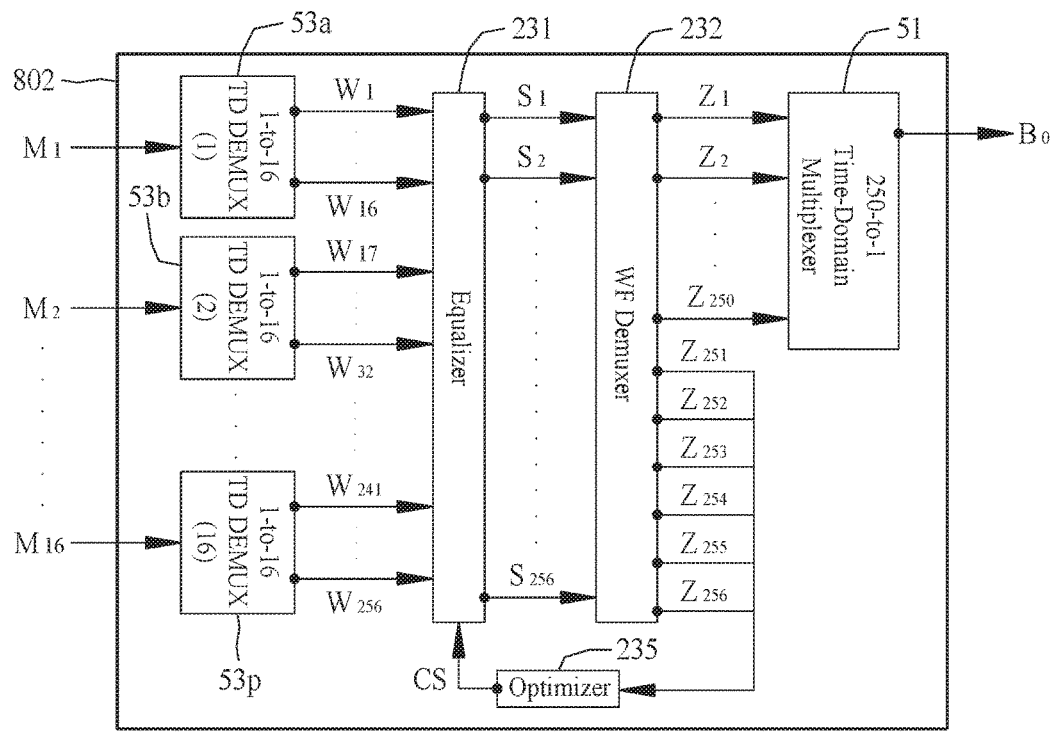
FIG. 3F shows architecture of a post-processor module according to an embodiment of the present disclosure.

Each of the 1-to-U time-domain demultiplexers denotes that it can divide an input signal, having a frequency bandwidth of E sampled at a sampling rate of F, into the number U of output signals, each having a frequency bandwidth of E/U sampled at a sampling rate of F/U. The number E can be, but not limited to, equal to the number of J multiplied by U, divided by M, and the number F can be, but not limited to, equal to the number of K multiplied by U, divided by M. For example, the 1-to-U time-domain demultiplexers can be, but not limited to, sixteen 1-to-16 time-domain demultiplexers 53a-53p shown in FIG. 3F, and each of the sixteen 1-to-16 time-domain demultiplexers 53a-53p denotes that it can divide a corresponding one of sixteen input signal $M_1$-$M_{16}$, each having a frequency bandwidth of E sampled at a sampling rate of F, into a corresponding set of sixteen ones of two-hundred-and-fifty-six output signals $W_1$-$W_{256}$, each having a frequency bandwidth of E/16 sampled at a sampling rate of F/16. In this case, as shown in FIG. 3F, the number E is equal to the number of 16*J/250, and the number F is equal to the number of 16*K/250. The thirteen 1-to-16 time-domain demultiplexers 53c-53o are not shown in FIG. 3F. Each of sixteen signals $M_1$-$M_{16}$ input into the sixteen 1-to-16 time-domain demultiplexers 53a-53p may have the bandwidth or (maximum) frequency substantially 16 times greater than that of each of two-hundred-and-fifty-six signals $W_1$-$W_{256}$ output from the sixteen 1-to-16 time-domain demultiplexers 53a-53p.

Each of the U-to-1 time-domain multiplexers denotes that it can combine or integrate the number U of input signals, each having a frequency bandwidth of E/U sampled at a sampling rate of F/U, into an output signal having a frequency bandwidth of E sampled at a sampling rate of F. The number E can be, but not limited to, equal to the number of J multiplied by U, divided by M, and the number F can be, but not limited to, equal to the number of K multiplied by U, divided by M. For example, the U-to-1 time-domain multiplexers can be, but not limited to, sixteen 16-to-1 time-domain multiplexers 52a-52p shown in FIG. 3E, and each of the sixteen 16-to-1 time-domain multiplexers 52a-52p denotes that it can combine or integrate a corresponding set of sixteen ones of two-hundred-and-fifty-six input signals $Y_1$-$Y_{256}$, each having a frequency bandwidth of E/16 sampled at a sampling rate of F/16, into a corresponding one of sixteen output signals $L_1$-$L_{16}$, each having a frequency bandwidth of E sampled at a sampling rate of F. In this case, as shown in FIG. 3E, the number E is equal to the number of 16*J/250, and the number F is equal to the number of 16*K/250. The thirteen 16-to-1 time-domain multiplexers 52c-52o are not shown in FIG. 3E. Each of sixteen signals $L_1$-$L_{16}$ output from the sixteen 16-to-1 time-domain multiplexers 52a-52p may have the bandwidth or (maximum) frequency substantially 16 times greater than that of each of two-hundred-and-fifty-six signals $Y_1$-$Y_{256}$ input into the sixteen 16-to-1 time-domain multiplexers 52a-52p.

The H-input and H-output wave-front multiplexer can be, but not limited to, a 256-input and 256-output wave-front multiplexer 213 illustrated in FIG. 3E, and the 256-input and 256-output wave-front multiplexer 213 denotes that it has two-hundred-and-fifty-six inputs to receive two-hundred-and-fifty-six input signals $X_1$-$X_{256}$ and two-hundred-and-fifty-six outputs to output two-hundred-and-fifty-six linear combinations, each combined with the two-hundred-and-fifty-six input signals $X_1$-$X_{256}$ multiplied by respective weightings, represented by two-hundred-and-fifty-six output signals $Y_1$-$Y_{256}$, which can be referred to as the description illustrated in FIG. 1D. In this case, the number of H is equal to 256. The wavefront multiplexer 213 illustrated in FIG. 3E may include 256*256 computing units and two-hundred-and-fifty-six summing processors, wherein the computing units form a processor array with two-hundred-and-fifty-six rows and two-hundred-and-fifty-six columns. The input signals $X_1$-$X_{256}$ can be received by the computing units in the respective two-hundred-and-fifty-six columns in the processor array. Upon receiving the input signals $X_1$-$X_{256}$, each of the computing units independently weights its received signal, multiplied by a weighting value, to generate a weighted signal. The two-hundred-and-fifty-six summing processors can output the two-hundred-and-fifty-six signals $Y_1$-$Y_{256}$ each combined with the weighted signals output from the computing units in a corresponding one of the two-hundred-and-fifty-six rows in the processor array.

The I-input and I-output wave-front demultiplexer can be, but not limited to, a 256-input and 256-output wave-front demultiplexer 232 illustrated in FIG. 3F, and the 256-input and 256-output wave-front demultiplexer 232 denotes that it has two-hundred-and-fifty-six inputs to receive two-hundred-and-fifty-six input signals $S_1$-$S_{256}$ and two-hundred-and-fifty-six outputs to output two-hundred-and-fifty-six linear combinations, each combined with the two-hundred-and-fifty-six input signals $S_1$-$S_{256}$ multiplied by respective weightings, represented by two-hundred-and-fifty-six output signals $Z_1$-$Z_{256}$, which can be referred to as the description illustrated in FIG. 1E. In this case, the number of I is equal to 256. The wavefront demultiplexer 232 illustrated in FIG. 3F may include 256*256 computing units and two-hundred-and-fifty-six summing processors, wherein the computing units form a processor array with two-hundred-and-fifty-six rows and two-hundred-and-fifty-six columns. The input signals $S_1$-$S_{256}$ can be received by the computing units in the respective two-hundred-and-fifty-six columns in the processor array. Upon receiving the input signals $S_1$-$S_{256}$, each of the computing units independently weights its received signal, multiplied by a weighting value, to generate a weighted signal. The two-hundred-and-fifty-six summing processors can output the two-hundred-and-fifty-six signals $Z_1$-$Z_{256}$ each combined with the weighted signals output from the computing units in a corresponding one of the two-hundred-and-fifty-six rows in the processor array.

The 256-input and 256-output wave-front multiplexer 213 illustrated in FIG. 3E and the 256-input and 256-output wave-front demultiplexer 232 illustrated in FIG. 3F can be 256-to-256 COTS FFT/IFFT chips.

Referring to FIG. 3D, the system 700 may include the thirty-two preprocessor modules 800 having the same architecture as one another, the sixteen narrowband DBFN modules 801a-801p having the same architecture as one another, and the four post-processor modules 802 having the same architecture as one another. FIG. 3E shows the architecture of one of the preprocessor modules 800 shown in FIG. 3D. Referring to FIGS. 3D and 3E, each of the thirty-two preprocessor modules 800 includes the 1-to-250 time-domain demultiplexer 50, the 256-input and 256-output wave-front multiplexer 213, and sixteen the 16-to-1 time-domain multiplexers 52a-52p. FIG. 3F shows the architecture of one of the post-processor module 802 shown in FIG. 3D. Referring to FIGS. 3D and 3F, each of the four post-processor modules 802 includes the 250-to-1 time-domain multiplexer 51, the sixteen 1-to-16 time-domain demultiplexers 53a-53p, the equalizer 231, the 256-input and 256-output wave-front demultiplexer 232, and the optimizer 235. Referring to FIG. 3D, each of the sixteen narrowband DBFN modules 801a-801p can process thirty-two different signals from the thirty-two preprocessor modules 800 into four coherent signals or beams and outputs the four coherent signals or beams to the four post-processor modules 802.

Figure 3G:
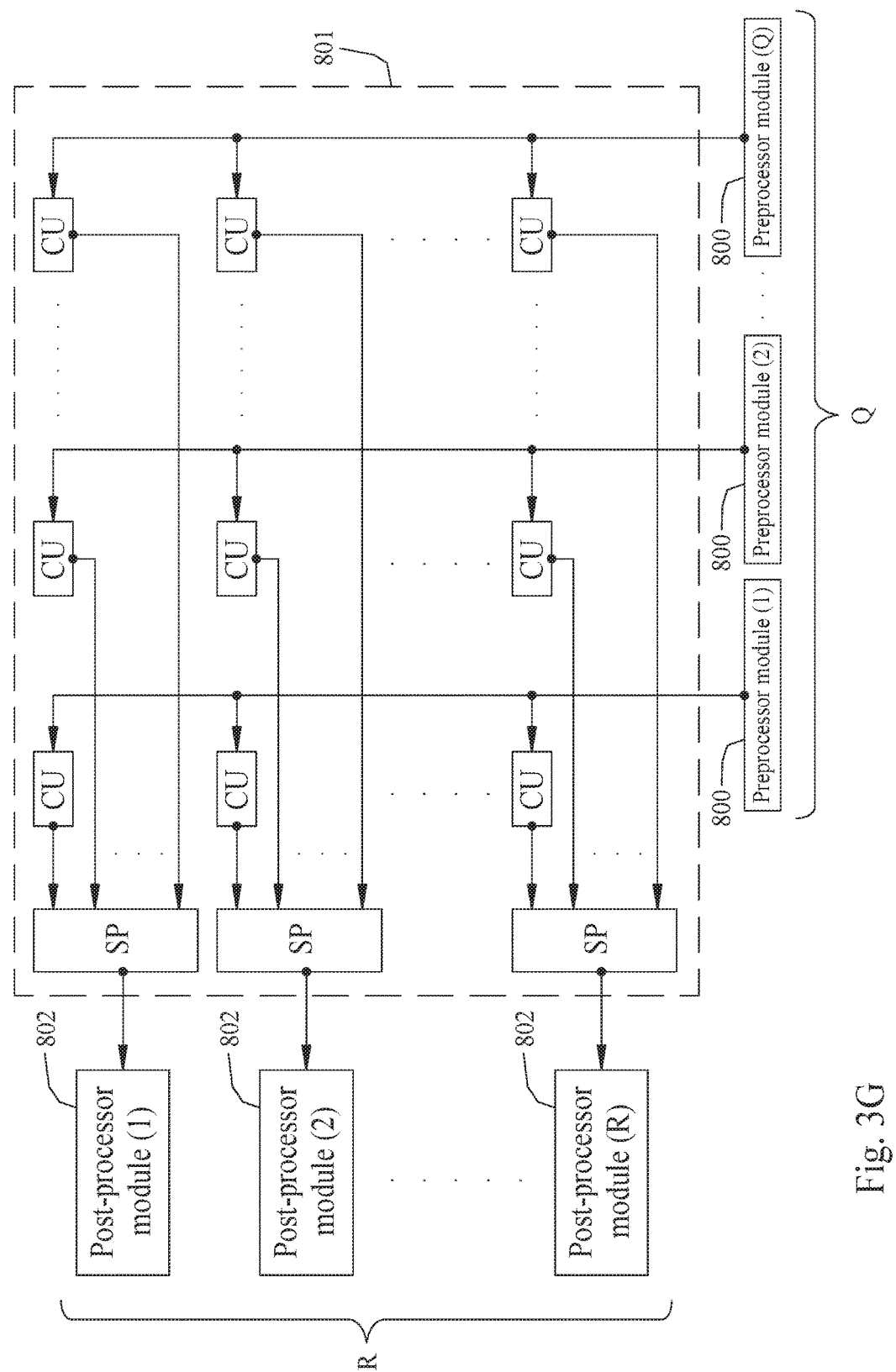
FIG. 3G shows architecture of a narrowband DBFN module according to an embodiment of the present disclosure.

Referring to FIG. 3G showing architecture of a narrowband DBFN module in accordance with the present invention, a narrowband DBFN module 801, such as one of the narrowband DBFN modules 801a-801p as seen in FIG. 3D, may include a field programmable gate array (FPGA), a fixed-function off-the-shelf digital component or a digital signal processor (DSPs) to process multiple input digital signals, wherein the total number of the input digital signals is Q equal to the total number of preprocessor modules 800 of the system 700, and output multiple linear combinations, each combined with the input digital signals multiplied by respective weightings, wherein the total number of the linear combinations is R equal to the total number of post-processor modules 802 of the system 700. The number of Q could be any number greater than or equal to 2, 4, 8, 16, 32, 64, 128, 256 or 512, and the number of R could be any number greater than or equal to 1, 2, 4, 8, 16, 32, 64, 128, 256 or 512. The DBFN module 801 may include the number R*Q of computing units (CUs) and the number R of summing processors (SPs). The computing units form an R-by-Q processor array with the number Q of columns and the number R of rows. The computing units in each column in the processor array receive a corresponding digital signal output from a corresponding one of the preprocessor modules 800, and thus the number Q of the input digital signals output from the number Q of the preprocessor modules 800 can be received by the computing units in the number Q of respective columns in the processor array. Upon receiving the input digital signals output from the preprocessor modules 800, each of the computing units independently weights its received digital signal to generate a weighted signal. Each of the summing processors provides a means for summing weighted signals generated by the corresponding computing units in same row in the processor array to produce a corresponding digital signal or beam, i.e. beam weighting vector, output to the corresponding post-processor module 802. Accordingly, the number R of the summing processors can output the number R of digital signals or beams, each combined with the weighted signals output from the computing units in a corresponding one of the number R of rows in the processor array. In this case, as seen in FIG. 3D, the number of Q is equal to 32, and the number of R is equal to 4. Each of the narrowband DBFN modules 801a-801p may include 4*32 computing units and four summing processors, wherein the computing units in the same column receive a corresponding one of the digital signals $L_1$-$L_{16}$ output from a corresponding one of the preprocessor modules 800, each of the summary processors provides a means of summing corresponding signals weighted by the corresponding computing units in the same row and outputs a corresponding one of the digital signals $M_1$-$M_{16}$ to a corresponding one of the post-processor modules 802.

In another case, as seen in FIG. 3A, the number of Q is equal to 16, and the number of R is equal to 4. Referring to FIGS. 3A and 3G, each of the narrowband DBFN modules 801a-801d may include 4*16 computing units and four summing processors, wherein the computing units in the same column receive a corresponding one of the digital signals $Y_1$-$Y_4$ output from a corresponding one of the preprocessor modules 800a-800p, each of the summary processors provides a means of summing corresponding signals weighted by the corresponding computing units in the same row and outputs a corresponding one of the digital signals $W_1$-$W_4$ to a corresponding one of the post-processor modules 802a-802d.

In another case, as seen in FIG. 3C, the number Q is equal to 16, and the number of R is equal to 4. Referring to FIGS. 3C and 3G, each of the narrowband DBFN modules 801a-801h may include 4*16 computing units and four summing processors, wherein the computing units in the same column receive a corresponding one of the digital signals $Y_1$-$Y_8$ output from a corresponding one of the preprocessor modules 800a-800p, each of the summary processors provides a means of summing corresponding signals weighted by the corresponding computing units in the same row and outputs a corresponding one of the digital signals $W_1$-$W_8$ to a corresponding one of the post-processor modules 802a-802d.

A method for processing data streams or signals by using the system 700 shown in FIG. 3D is described below. Referring to FIGS. 3D and 3E, the thirty-two different signals $A_0$ from, e.g., one or more wireless base stations (such as mobile base stations or Wi-Fi base stations) or array elements such as antenna array elements are respectively transmitted into the thirty-two 1-to-250 time-domain demultiplexers 50 of the thirty-two preprocessor modules 800 through, e.g., thirty-two parallel signal paths, thirty-two parallel physical channels or thirty-two parallel wireless channels. Alternatively, the thirty-two signals $A_0$ can be or come from, but not limited to, thirty-two digital signals including the four digital signals $Z_1$, $Z_2$, $Z_3$ and $Z_4$ illustrated in FIG. 2A, including the three digital signals $Z_1$, $Z_2$ and $Z_3$ illustrated in FIG. 2B, including the seven digital signals $Z_1$-$Z_7$ illustrated in FIG. 2C, or including the digital signal $Z_0$ or $Z_1$ illustrated in FIG. 2D. Each of the thirty-two digital signals $A_0$ can be, but not limited to, an IF digital signal, a RF digital signal, or a real-time digital signal. In FIGS. 3D, 3E and 3F, the signals with the same reference number may not represent the signals carrying the same information.

Next, referring to FIGS. 3D and 3E, each of the thirty-two 1-to-250 time-domain demultiplexers 50 of the thirty-two preprocessor modules 800 divides the received signal $A_0$ having a frequency bandwidth of J sampled at a sampling rate of K into a set of the two-hundred-and-fifty digital signals $X_1$-$X_{250}$ each having a frequency bandwidth of J/250 sampled at a sampling rate of K/250 and outputs the set of the two-hundred-and-fifty digital signals $X_1$-$X_{250}$ from its two-hundred-and-fifty outputs. The signals $X_3$-$X_{249}$ are not shown in FIG. 3E. Next, the thirty-two sets of the two-hundred-and-fifty digital signals $X_1$-$X_{250}$, output from the thirty-two 1-to-250 time-domain demultiplexers 50 of the thirty-two preprocessor modules 800, are respectively transmitted in parallel to the thirty-two wave-front multiplexers 213 of the thirty-two preprocessor modules 800, and at the same time, thirty-two sets of six digital pilot or diagnostic signals $X_{251}$-$X_{256}$ are respectively transmitted in parallel to the thirty-two wave-front multiplexers 213 of the thirty-two preprocessor modules 800. Each of the pilot or diagnostic signals $X_{251-256}$ may have a single frequency and fixed amplitude. Alternatively, each of the pilot or diagnostic signals $X_{251-256}$ could change based on time or could be any signal known by the system 700. In contrast, the thirty-two sets of the two-hundred-and-fifty digital signals $X_1$-$X_{250}$ input into the thirty-two wave-front multiplexers 213 of the thirty-two preprocessor modules 800 are unknown by the system 700. The thirty-two extraneous signals $A_0$ input into the thirty-two preprocessor modules 800 are unknown by the system 700. Each of the thirty-two signals $A_0$ can be, but not limited to, sampled at least triple as fast as its bandwidth or maximum frequency. For example, if each of the thirty-two signals $A_0$ has the bandwidth or maximum frequency of 500 MHz, each of the thirty-two signals $A_0$ can be sampled at 1.5 Gsps (giga-samples per second).

Referring to FIGS. 3D and 3E, after thirty-two sets of the two-hundred-and-fifty-six signals $X_1$-$X_{256}$ are respectively input into the thirty-two wave-front multiplexers 213 of the thirty-two preprocessor modules 800, each of the thirty-two wave-front multiplexers 213 of the thirty-two preprocessor modules 800 performs the above wave-front multiplexing transform to process a corresponding set of the two-hundred-and-fifty-six signals $X_1$-$X_{256}$ into a corresponding set of two-hundred-and-fifty-six linear combinations, each combined with the received signals $X_1$-$X_{256}$ in the corresponding set multiplied by respective weightings, represented by the two-hundred-and-fifty-six digital signals $Y_1$-$Y_{256}$ and outputs the corresponding set of the two-hundred-and-fifty-six signals $Y_1$-$Y_{256}$. Each of the digital signals $Y_1$-$Y_{256}$ may have a bandwidth of J/250 sampled at a sampling rate of K/250. The signals $Y_2$-$Y_{15}$, $Y_{18}$-$Y_{31}$, $Y_{33}$-$Y_{240}$, and $Y_{242}$-$Y_{255}$ are not shown in FIG. 3E. Next, in each of the thirty-two preprocessor modules 800, sixteen sets of sixteen ones of the two-hundred-and-fifty-six digital signals $Y_1$-$Y_{256}$ are respectively transmitted to the sixteen 16-to-1 time-domain multiplexers 52a-52p through, e.g., multiple parallel signal paths, multiple parallel physical channels or multiple parallel wireless channels. Each of the signals $X_1$-$X_{250}$ can be, but not limited to, sampled at least triple as fast as its bandwidth or maximum frequency. For example, if each of the signals $X_1$-$X_{250}$ has the bandwidth or maximum frequency of 2 MHz, each of the signals $X_1$-$X_{250}$ can be sampled at 6 Msps (mega samples per second). Each of the signals $Y_1$-$Y_{250}$ can be, but not limited to, sampled at least triple as fast as its bandwidth or maximum frequency. For example, if each of the signals $Y_1$-$Y_{250}$ has the bandwidth or maximum frequency of 2 MHz, each of the signals $Y_1$-$Y_{250}$ can be sampled at 6 Msps.

Next, referring to FIGS. 3D and 3E, in each of the thirty-two preprocessor modules 800, each of the sixteen 16-to-1 time-domain multiplexers 52a-52p combines or integrates a corresponding set of the received sixteen ones of the two-hundred-and-fifty-six digital signals $Y_1$-$Y_{256}$ into a corresponding one of the sixteen digital signals $L_1$-$L_{16}$ and outputs the corresponding one of the sixteen signals $L_1$-$L_{16}$ to a corresponding one of the sixteen DBFN modules 801a-801p. Each of the digital signals $L_1$-$L_{16}$ may have a bandwidth of 16*J/250 sampled at a sampling rate of 16*K/250. The twelve DBFN modules 801d-801o are not shown in FIG. 3D, and the thirteen signals $L_3$-$L_5$ are not shown in FIG. 3E. Thereby, thirty-two sets of the sixteen signals $L_1$-$L_{16}$ from the thirty-two preprocessor modules 800 are transmitted to the sixteen DBFN modules 801a-801p. That is, the sixteen signals $L_1$-$L_{16}$ output from each of the thirty-two preprocessor modules 800 are transmitted in parallel to the sixteen narrowband DBFN modules 801a-801p, respectively.

Referring to FIGS. 3D and 3E, the thirty-two signals $L_1$ from the thirty-two preprocessor modules 800 are transmitted in parallel to the DBFN module 801a through, e.g., thirty-two parallel signal paths, thirty-two parallel physical channels or thirty-two parallel wireless channels. The thirty-two signals $L_2$ from the thirty-two preprocessor modules 800 are transmitted in parallel to the DBFN module 801b through, e.g., thirty-two parallel signal paths, thirty-two parallel physical channels or thirty-two parallel wireless channels. The thirty-two signals $L_3$ from the thirty-two preprocessor modules 800 are transmitted in parallel to the DBFN module 801c through, e.g., thirty-two parallel signal paths, thirty-two parallel physical channels or thirty-two parallel wireless channels. The thirty-two signals $L_{16}$ from the thirty-two preprocessor modules 800 are transmitted in parallel to the DBFN module 801p through, e.g., thirty-two parallel signal paths, thirty-two parallel physical channels or thirty-two parallel wireless channels. Each of the signals $L_1$-$L_{16}$ can be, but not limited to, sampled at least triple as fast as its bandwidth or maximum frequency. For example, if each of the signals $L_1$-$L_{16}$ has the bandwidth or maximum frequency of 32 MHz, each of the signals $L_1$-$L_{16}$ can be sampled at 96 Msps.

Next, referring to FIGS. 3D, 3E and 3F, the sixteen DBFN modules 801a-801p process the thirty-two sets of the sixteen signals $L_1$-$L_{16}$ from the thirty-two preprocessor modules 800 into four sets of the sixteen signals or beams $M_1$-$M_{16}$ and output the four sets of the sixteen signals or beams $M_1$-$M_{16}$ to the four post-processor modules 802. The four signals or beams $M_1$ output from the DBFN module 801a are four linear combinations, each combined with the thirty-two received signals $L_1$ multiplied by respective weightings. The four signals or beams $M_2$ output from the DBFN module 801b are four linear combinations, each combined with the thirty-two received signals $L_2$ multiplied by respective weightings. The four signals or beams $M_3$ output from the DBFN module 801c are four linear combinations, each combined with the thirty-two received signals $L_3$ multiplied by respective weightings. The four signals or beams $M_4$ output from the DBFN module 801d are four linear combinations, each combined with the thirty-two received signals $L_4$ multiplied by respective weightings. The four signals or beams $M_5$ output from the DBFN module 801e are four linear combinations, each combined with the thirty-two received signals $L_5$ multiplied by respective weightings. The four signals or beams $M_6$ output from the DBFN module 801f are four linear combinations, each combined with the thirty-two received signals $L_6$ multiplied by respective weightings. The four signals or beams $M_7$ output from the DBFN module 801g are four linear combinations, each combined with the thirty-two received signals $L_7$ multiplied by respective weightings. The four signals or beams $M_8$ output from the DBFN module 801h are four linear combinations, each combined with the thirty-two received signals $L_8$ multiplied by respective weightings. The four signals or beams $M_9$ output from the DBFN module 801i are four linear combinations, each combined with the thirty-two received signals $L_9$ multiplied by respective weightings. The four signals or beams $M_{10}$ output from the DBFN module 801j are four linear combinations, each combined with the thirty-two received signals $L_{10}$ multiplied by respective weightings. The four signals or beams $M_{11}$ output from the DBFN module 801k are four linear combinations, each combined with the thirty-two received signals $L_{11}$ multiplied by respective weightings. The four signals or beams $M_{12}$ output from the DBFN module 801l are four linear combinations, each combined with the thirty-two received signals $L_{12}$ multiplied by respective weightings. The four signals or beams $M_{13}$ output from the DBFN module 801m are four linear combinations, each combined with the thirty-two received signals $L_{13}$ multiplied by respective weightings. The four signals or beams $M_{14}$ output from the DBFN module 801n are four linear combinations, each combined with the thirty-two received signals $L_{14}$ multiplied by respective weightings. The four signals or beams $M_{15}$ output from the DBFN module 801o are four linear combinations, each combined with the thirty-two received signals $L_{15}$ multiplied by respective weightings. The four signals or beams $M_{16}$ output from the DBFN module 801p are four linear combinations, each combined with the thirty-two received signals $L_{16}$ multiplied by respective weightings. Each of the digital signals or beams $M_1$-$M_{16}$ may have a bandwidth of 16*J/250 sampled at a sampling rate of 16*K/250.

Referring to FIGS. 3D and 3F, the four sets of the sixteen signals or beams $M_1$-$M_{16}$ are input into four sets of the sixteen 1-to-16 time-domain demultiplexers 53a-53p of the four post-processor modules 802, respectively. That is, in each of the four post-processor modules 802, its sixteen 1-to-16 time-domain demultiplexers 53a-53p receive the sixteen corresponding signals or beams $M_1$-$M_{16}$, respectively. Each of the signals $M_1$-$M_{16}$ can be, but not limited to, sampled at least triple as fast as its bandwidth or maximum frequency. For example, if each of the signals $M_1$-$M_{16}$ has the bandwidth or maximum frequency of 32 MHz, each of the signals $M_1$-$M_{16}$ can be sampled at 96 Msps.

Next, referring to FIGS. 3D and 3F, the sixteen 1-to-16 time-domain demultiplexers 53a-53p in each of the four post-processor modules 802 divide the received sixteen signals or beams $M_1$-$M_{16}$ into the corresponding two-hundred-and-fifty-six signals $W_1$-$W_{256}$ each having a frequency bandwidth of J/250 sampled at a sampling rate of K/250 and output the corresponding two-hundred-and-fifty-six signals $W_1$-$W_{256}$ to the corresponding equalizer 231. Each of the sixteen 1-to-16 time-domain demultiplexers 53a-53p outputs sixteen corresponding ones of the two-hundred-and-fifty-six signals $W_1$-$W_{256}$. For example, the 1-to-16 time-domain demultiplexer 53a divides the received signal $M_1$, having a frequency bandwidth of 16*J/250 sampled at a sampling rate of 16*K/250, into the sixteen output signals $W_1$-$W_{16}$, each having a frequency bandwidth of J/250 sampled at a sampling rate of K/250, and outputs the sixteen output signals $W_1$-$W_{16}$ to the equalizer 231. The 1-to-16 time-domain demultiplexer 53b divides the received signal $M_2$, having a frequency bandwidth of 16*J/250 sampled at a sampling rate of 16*K/250, into the sixteen output signals $W_{17}$-$W_{32}$, each having a frequency bandwidth of J/250 sampled at a sampling rate of K/250, and outputs the sixteen output signals $W_{17}$-$W_{32}$ to the equalizer 231. The 1-to-16 time-domain demultiplexer 53p divides the received signal $M_{16}$, having a frequency bandwidth of 16*J/250 sampled at a sampling rate of 16*K/250, into the sixteen output signals $W_{241}$-$W_{256}$, each having a frequency bandwidth of J/250 sampled at a sampling rate of K/250, and outputs the sixteen output signals $W_{241}$-$W_{256}$ to the equalizer 231.

Next, referring to FIGS. 3D and 3F, each of the four post-processor modules 802 may perform an optimizing and equalizing process by its equalizer 231 and its optimizer 235 to adjust the amplitudes, phases, and/or time-delays of the two-hundred-and-fifty-six signals $W_1$-$W_{256}$ output from its sixteen 1-to-16 time-domain demultiplexers 53a-53p, and each of the four equalizers 231 of the four post-processor modules 802 generates a corresponding set of the two-hundred-and-fifty-six equalized signals $S_1$-$S_{256}$ each having a frequency bandwidth of J/250 sampled at a sampling rate of K/250 and outputs the corresponding set of the two-hundred-and-fifty-six equalized signals $S_1$-$S_{256}$ to the corresponding wave-front demultiplexer 232. Each of the equalized digital signals $S_1$-$S_{256}$ in the corresponding set is created by the corresponding equalizer 231 multiplying the corresponding one of the digital signals $W_1$-$W_{256}$ in the corresponding by a weighting of the corresponding equalizer 231. For example, each of the four equalized signals $S_1$ is created by the corresponding equalizer 231 multiplying the corresponding signal $W_1$ by a weighting of the corresponding equalizer 231. The signals $S_3$-$S_{255}$ are not shown in FIG. 3F. Each of the signals $W_1$-$W_{256}$ can be, but not limited to, sampled at least triple as fast as its bandwidth or maximum frequency. For example, if each of the signals $W_1$-$W_{256}$ has the bandwidth or maximum frequency of 2 MHz, each of the signals $W_1$-$W_{256}$ can be sampled at 6 Msps. Each of the signals $S_1$-$S_{256}$ can be, but not limited to, sampled at least triple as fast as its bandwidth or maximum frequency. For example, if each of the signals $S_1$-$S_{256}$ has the bandwidth or maximum frequency of 2 MHz, each of the signals $S_1$-$S_{256}$ can be sampled at 6 Msps.

Next, referring to FIGS. 3D and 3F, each of the four wave-front demultiplexers 232 of the four post-processor modules 802 performs the above wave-front demultiplexing transform to process the corresponding set of the two-hundred-and-fifty-six equalized signals $S_1$-$S_{256}$ into a corresponding set of two-hundred-and-fifty-six linear combinations, each combined with the two-hundred-and-fifty-six equalized signals $S_1$-$S_{256}$ in the corresponding set multiplied by respective weightings, represented by the two-hundred-and-fifty-six digital signals $Z_1$-$Z_{256}$ each having a frequency bandwidth of J/250 sampled at a sampling rate of K/250.

Next, referring to FIGS. 3D and 3F, the four wave-front demultiplexers 232 of the four post-processor modules 802 output in parallel four sets of the six digital signals $Z_{251}$-$Z_{256}$ to the four optimizers 235, and each of the four optimizers 235 of the four post-processor modules 802 generates a control signal CS and sends the control signal CS to the corresponding equalizer 231 to adjust the weightings of the corresponding equalizer 231, as illustrated in FIG. 1C.

At the same time, the four wave-front demultiplexers 232 of the four post-processor modules 802 output in parallel four sets of the two-hundred-and-fifty signals $Z_1$-$Z_{250}$ to the four 250-to-1 time-domain multiplexers 51, and each of the four 250-to-1 time-domain multiplexers 51 of the four post-processor modules 802 combines or integrates the corresponding set of the two-hundred-and-fifty signals $Z_1$-$Z_{250}$, each having a frequency bandwidth of J/250 sampled at a sampling rate of K/250, into a single corresponding signal or beam $B_0$ having a frequency bandwidth of J sampled at a sampling rate of K and outputs the corresponding signal or beam $B_0$ from its output. Each of the signals $Z_1$-$Z_{250}$ can be, but not limited to, sampled at least triple as fast as its bandwidth or maximum frequency. For example, if each of the signals $Z_1$-$Z_{250}$ has the bandwidth or maximum frequency of 2 MHz, each of the signals $Z_1$-$Z_{250}$ can be sampled at 6 Msps. Each of the four signals $B_0$ can be, but not limited to, sampled at least triple as fast as its bandwidth or maximum frequency. For example, if each of the four signals $B_0$ has the bandwidth or maximum frequency of 500 MHz, each of the four signals $B_0$ can be sampled at 1.5 Gsps.

Thereby, referring to FIGS. 3D, 3E and 3F, the broadband DBFN system 700 can process the thirty-two input signals $A_0$, each having a frequency bandwidth greater than that of each of the signals $L_1$-$L_{16}$ output from the preprocessor modules 800, greater than that of each of the signals $M_1$-$M_{16}$ input into the post-processor modules 802, and substantially equal to each signal $B_0$ output from the post-processor modules 802. The broadband DBFN system 700 can process the thirty-two input signals $A_0$ each sampled at a greater sampling rate than each of the signals $L_1$-$L_{16}$ output from the preprocessor modules 800 is sampled and than each of the signals $M_1$-$M_{16}$ input into the post-processor modules 802 is sampled. The broadband DBFN system 700 can process the thirty-two input signals $A_0$ each sampled at the same sampling rate as each signal $B_0$ output from the postprocessor modules 802 is sampled. Each of the signals $A_0$, $X_1$-$X_{256}$, $Y_1$-$Y_{256}$, $L_1$-$L_{16}$, $M_1$-$M_{16}$, $W_1$-$W_{256}$, $S_1$-$S_{256}$, $Z_1$-$Z_{256}$ and $B_0$ can be, but not limited to, sampled at least twice or triple its (maximum) frequency or bandwidth. All of the signals $A_0$ input to the thirty-two preprocessor modules 800 may have the same maximum frequency or bandwidth, and all of the signals $A_0$ input to the thirty-two preprocessor modules 800 may be sampled at the same sampling rate. Alternatively, the signals $A_0$ input to the thirty-two preprocessor modules 800 may have different maximum frequencies or bandwidths from one another, and the signals $A_0$ input to the thirty-two preprocessor modules 800 may be sampled at different sampling rates from one another.

Alternatively, the system 700 can include any number of narrowband DBFN modules 801, where the total number of the narrowband DBFN modules 801 is equal to any number greater than or equal to two, four, eight, sixteen, thirty two, or sixty four. Moreover, the system 700 can include any number of the preprocessor modules 800, where the total number of the preprocessor modules 800 is equal to any number greater than or equal to two, four, eight, sixteen, thirty two, or sixty four. The system 700 can include any number of the post-processor modules 802, where the total number of the post-processor modules 802 is equal to any number greater than or equal to two, four, eight, sixteen, thirty two, or sixty four.

Third Embodiment: Application to Linear Processor

Figure 4A:
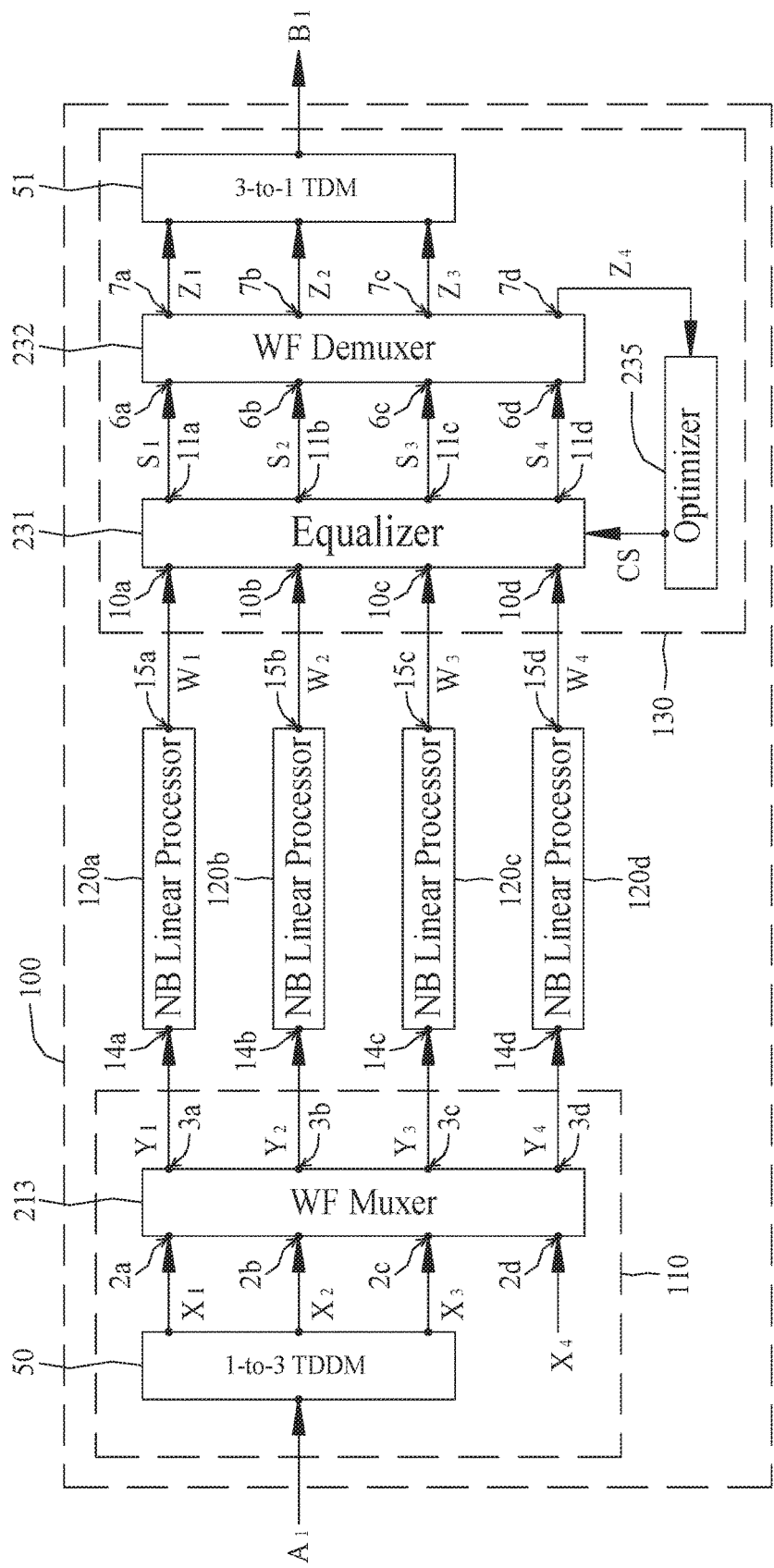
FIG. 4A shows a broad-band linear processing system including a 1-to-3 time-domain demultiplexer, a wave-front multiplexer, four narrowband linear processors, a wave-front demultiplexer, an equalizer, an optimizer and a 3-to-1 time-domain multiplexer according to an embodiment of the present disclosure.

Referring to FIG. 4A, a broad-band linear processing system 100 includes a preprocessing module or preprocessor 110, four narrowband (NB) linear processors 120a, 120b, 120c and 120d, and a post-processing module or post-processor 130. The preprocessor 100 can be, but not limited to, a single integrated circuit chip, a single system-on chip or a single chip package or implemented by using multiple integrated circuit chips, multiple system-on chips or multiple chip packages. The post-processor 130 can be, but not limited to, a single integrated circuit chip, a single system-on chip or a single chip package or implemented by using multiple integrated circuit chips, multiple system-on chips or multiple chip packages. The four linear processors 120a, 120b, 120c and 120d can be, but not limited to, embedded in a processing module or in the number Np of processing modules, where Np is an integer equal to or more than 2, 3 or 4. Each of the four linear processors 120a, 120b, 120c and 120d, for example, can be a multiplier, an adder, a subtractor or a divider. Alternatively, each of the four linear processors 120a, 120b, 120c and 120d may include, but not limited to, one or more multipliers, one or more adders, one or more subtractors, or/and one or more dividers. In other words, each of the linear processors 120a, 120b, 120c and 120d can perform at least one of addition, subtraction, multiplication and division to its input signal. Each of the four linear processors 120a, 120b, 120c and 120d, for example, can be made of resistors, capacitors, inductors, transformers and so on without any transistor. All of the four linear processors 120a, 120b, 120c and 120d may have the same processing speed and capability or different processing speeds and capabilities.

Referring to FIG. 4A, the preprocessor 110 may include a 1-to-3 time-domain demultiplexer (TDDM) 50 and a wave-front multiplexer 213. The description of the 1-to-3 time-domain demultiplexer 50 illustrated in FIG. 4A can be referred to as the description of the 1-to-3 time-domain demultiplexer 50 as illustrated in FIG. 3A. The description of the wave-front multiplexer 213 illustrated in FIG. 4A can be referred to as the description of the wave-front multiplexer 213 as illustrated in FIG. 1A, 1B or 3A. The post-processor 130 may include a 3-to-1 time-domain multiplexer (TDM) 51, an equalizer 231, a wave-front demultiplexer 232, and an optimizer 235. The description of the 3-to-1 time-domain multiplexer 51 illustrated in FIG. 4A can be referred to as the description of the 3-to-1 time-domain multiplexer 51 as illustrated in FIG. 3A. The description of the wave-front demultiplexer 232 illustrated in FIG. 4A can be referred to as the description of the wave-front demultiplexer 232 as illustrated in FIG. 1A, 1B or 3A. The description of the equalizer 231 illustrated in FIG. 4A can be referred to as the description of the equalizer 231 as illustrated in FIG. 1B or 3A. The description of the optimizer 235 illustrated in FIG. 4A can be referred to as the description of the optimizer 235 as illustrated in FIG. 1B or 3A.

In FIG. 4A, the orthogonal functional transformation characterizing the wave-front multiplexer 213 can be, but not limited to, fast Fourier transformation (FFT), and the inverse orthogonal functional transformation characterizing the wave-front demultiplexer 232 can be, but not limited to, inverse fast Fourier transformation (IFFT). Alternatively, the orthogonal functional transformation characterizing the wave-front multiplexer 213 can be, but not limited to, Hadamard transformation, and the inverse orthogonal functional transformation characterizing the wave-front demultiplexer 232 can be, but not limited to, Hadamard transformation.

A method for processing signals or data streams by using the system 200 shown in FIG. 4A is described below. Referring to FIG. 4A, a signal $A_1$ is transmitted into the 1-to-3 time-domain demultiplexer 50 through, e.g., a signal path, a wireless channel or a physical channel, and the 1-to-3 time-domain demultiplexer 50 divides the received signal $A_1$, having a frequency bandwidth of J sampled at a sampling rate of K, into three signals $X_1$, $X_2$ and $X_3$, each having a frequency bandwidth of J/3 sampled at a sampling rate of K/3, output in parallel from its three outputs. Next, the three signals $X_1$, $X_2$ and $X_3$ and an pilot or diagnostic signal $X_4$ are respectively transmitted in parallel to four input ports 2a, 2b, 2c and 2d of the wave-front multiplexer 213. The pilot or diagnostic signal $X_4$ may have a single frequency and fixed amplitude. Alternatively, the pilot or diagnostic signal $X_4$ could change based on time or could be any signal known by the system 100. In contrast, the three signals $X_1$, $X_2$ and $X_3$ are unknown by the system 100. The signal $A_1$ input into the preprocessor module 110 is unknown by the system 100.

Referring to FIG. 4A, after the four signals $X_1$, $X_2$, $X_3$ and $X_4$ are input into the wave-front multiplexer 213, the wave-front multiplexer 213 performs the above-mentioned wave-front multiplexing transformation to process the signals $X_1$, $X_2$, $X_3$ and $X_4$ into four linear combinations, each combined with the four signals $X_1$, $X_2$, $X_3$ and $X_4$ multiplied by respective weightings, represented by four signals $Y_1$, $Y_2$, $Y_3$ and $Y_4$ each having a frequency bandwidth of J/3 sampled at a sampling rate of K/3. Next, the wave-front multiplexer 213 outputs the four signals $Y_1$, $Y_2$, $Y_3$ and $Y_4$ from its output ports 3a, 3b, 3c and 3d, and the signals $Y_1$, $Y_2$, $Y_3$ and $Y_4$ are transmitted to four input ports 14a, 14b, 14c and 14d of the four narrowband linear processors 120a, 120b, 120c and 120d through, e.g., four parallel signal paths, four parallel wireless channels or four parallel physical channels.

Referring to FIG. 4A, after the four signals $Y_1$, $Y_2$, $Y_3$ and $Y_4$ are input into the four narrowband linear processors 120a, 120b, 120c and 120d, the four narrowband linear processors 120a, 120b, 120c and 120d perform at least one of addition, subtraction, multiplication and division to the four respective signals $Y_1$, $Y_2$, $Y_3$ and $Y_4$ into four respective signals $W_1$, $W_2$, $W_3$ and $W_4$ each having a frequency bandwidth of J/3 sampled at a sampling rate of K/3 and outputs the four signals $W_1$, $W_2$, $W_3$ and $W_4$ from their output ports 15a, 15b, 15c and 15d. Next, the four signals $W_1$, $W_2$, $W_3$ and $W_4$ are transmitted in parallel to four input ports 10a, 10b, 10c and 10d of the equalizer 231 through, e.g., four parallel signal paths, four parallel wireless channels or four parallel physical channels. The input ports 10a, 10b, 10c and 10d are arranged in parallel for receiving the four signals $W_1$, $W_2$, $W_3$ and $W_4$, respectively. After the four signals $W_1$, $W_2$, $W_3$ and $W_4$ are transmitted in parallel into the equalizer 231, an optimizing and equalizing process is performed such that the four signals $W_1$, $W_2$, $W_3$ and $W_4$ can be compensated to be multiplied by four respective weightings by the equalizer 231, wherein the four respective weightings of the equalizer 231 can be adjusted based on a control signal CS output from the optimizer 235 and input into the equalizer 231. The optimizing and equalizing process can be referred to as the optimizing and equalizing process as illustrated in FIGS. 1B and 1C.

Referring to FIG. 4A, after the optimizing and equalizing process, the equalizer 231 outputs four equalized signals $S_1$, $S_2$, $S_3$ and $S_4$, each having a frequency bandwidth of J/3 sampled at a sampling rate of K/3, from its output ports 11a, 11b, 11c and 11d. The equalized signal $S_1$ is created by the equalizer 231 multiplying the signal $W_1$ by one of the weightings of the equalizer 231, the equalized signal $S_2$ is created by the equalizer 231 multiplying the signal $W_2$ by another one of the weightings of the equalizer 231, the equalized signal $S_3$ is created by the equalizer 231 multiplying the signal $W_3$ by another one of the weightings of the equalizer 231, and the equalized signal $S_4$ is created by the equalizer 231 multiplying the signal $W_4$ by the other one of the weightings of the equalizer 231. Each of the four respective weightings of the equalizer 231 can be, but not limited to, a complex value such that the equalized signals $S_1$, $S_2$, $S_3$ and $S_4$ can be rotated precisely to become in phase. In this case, the equalizer 231 can be performed by the narrow band equalizer, as illustrated in FIG. 1C. Alternatively, the equalizer 231 can be performed by the broadband equalizer, as illustrated in FIG. 1C.

Next, referring to FIG. 4A, the equalized signals $S_1$, $S_2$, $S_3$ and $S_4$ are transmitted in parallel to input ports 6a, 6b, 6c and 6d of the wave-front demultiplexer 232 through, e.g., four parallel signal paths or channels between the output ports 11a, 11b, 11c and 11d of the equalizer 231 and the input ports 6a, 6b, 6c and 6d of the wave-front demultiplexer 232.

Referring to FIG. 4A, after the equalized signals $S_1$, $S_2$, $S_3$ and $S_4$ are input in parallel to the wave-front demultiplexer 232, the wave-front demultiplexer 232 performs the above-mentioned wave-front demultiplexing transformation to process the equalized signals $S_1$, $S_2$, $S_3$ and $S_4$ into four linear combinations, each combined with the equalized signals $S_1$, $S_2$, $S_3$ and $S_4$ multiplied by respective weightings, represented by four signals $Z_1$, $Z_2$, $Z_3$ and $Z_4$, each having a frequency bandwidth of J/3 sampled at a sampling rate of K/3, output in parallel from its four parallel output ports 7a, 7b, 7c and 7d.

Next, referring to FIG. 4A, the three signals $Z_1$, $Z_2$ and $Z_3$ are transmitted in parallel to three input ports of the 3-to-1 time-domain multiplexer 51, and the signal $Z_4$ is transmitted into the optimizer 235. The signal $Z_4$ can be used as an output pilot or diagnostic signal featuring a value to be compared with that featured by the input pilot or diagnostic signal $X_4$ during the optimizing and equalizing process. After the three signals $Z_1$, $Z_2$ and $Z_3$ are input into the 3-to-1 time-domain multiplexer 51, the 3-to-1 time-domain multiplexer 51 combines or integrates the three signals $Z_1$, $Z_2$ and $Z_3$ into a single signal $B_1$ having a frequency bandwidth of J sampled at a sampling rate of K and outputs the signal $B_1$ from its output port.

Therefore, the broad-band linear processing system 100 illustrated in FIG. 4A can process the input signal $A_1$ having a bandwidth greater than that of each of the four signals $Y_1$, $Y_2$, $Y_3$ and $Y_4$ input into the four narrowband linear processors 120a, 120b, 120c and 120d, greater than that of each of the four signals $W_1$, $W_2$, $W_3$ and $W_4$ output from the four narrowband linear processors 120a, 120b, 120c and 120d, and substantially equal to that of the signal $B_1$ output from the 3-to-1 time-domain multiplexer 51. The signal $A_1$ may have a frequency, such as maximum frequency, or bandwidth substantially equal to that of the signal $B_1$ and at least three times higher than that of each of the signals $X_1$, $X_2$, $X_3$, $X_4$, $Y_1$, $Y_2$, $Y_3$, $Y_4$, $W_1$, $W_2$, $W_3$, $W_4$, $S_1$, $S_2$, $S_3$, $S_4$, $Z_1$, $Z_2$, $Z_3$ and $Z_4$.

Figure 4B:
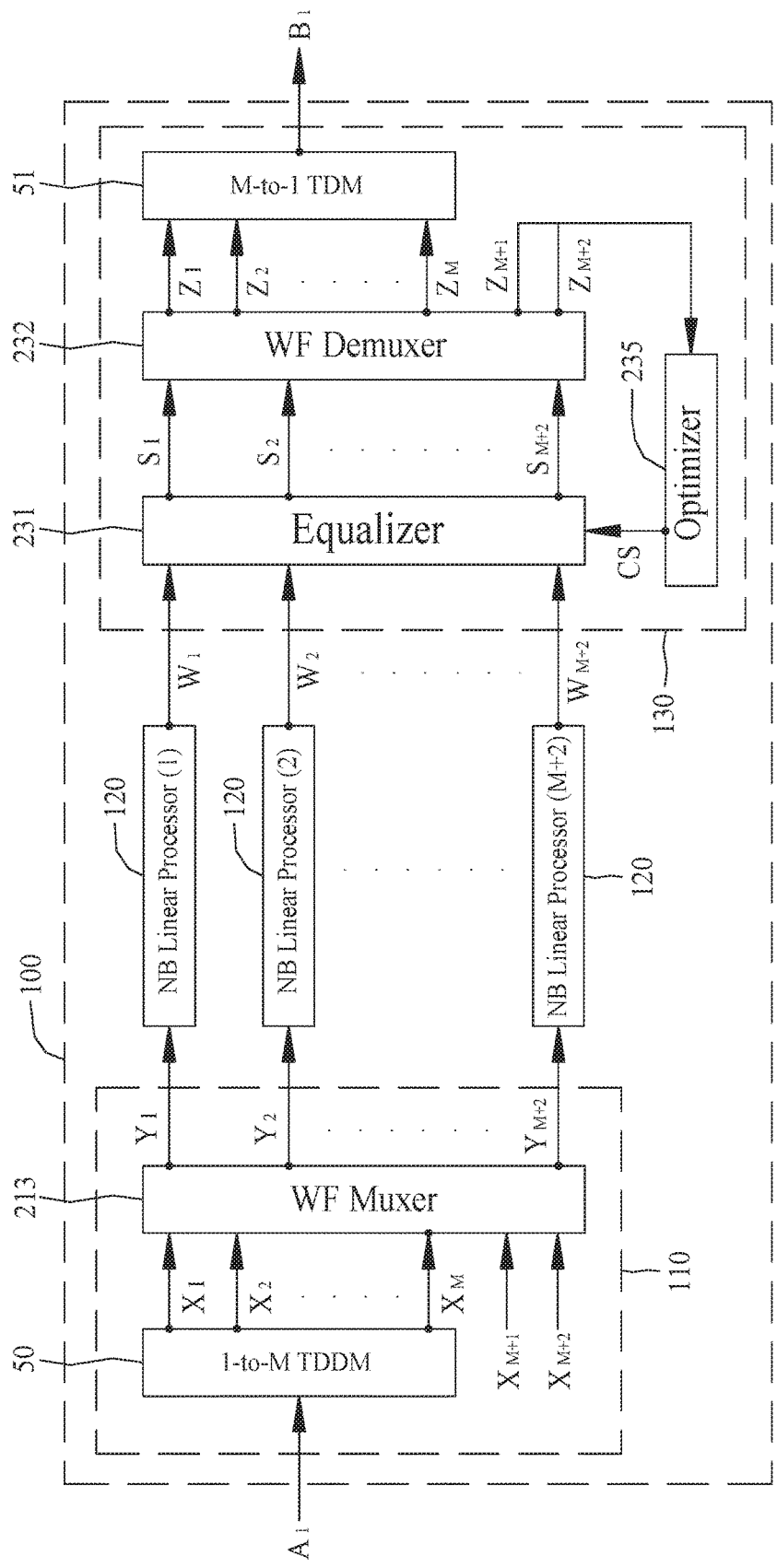
FIG. 4B shows a broad-band linear processing system including a 1-to-M time-domain demultiplexer, a wave-front multiplexer, multiple narrowband linear processors, a wave-front demultiplexer, an equalizer, an optimizer and a M-to-1 time-domain multiplexer according to an embodiment of the present disclosure.

Alternatively, referring to FIG. 4B, the 1-to-3 time-domain demultiplexer 50 of the system 100 illustrated in FIG. 4A can be replaced with the 1-to-M time-domain demultiplexer mentioned in the second embodiment, and the 3-to-1 time-domain multiplexer 51 of the system 100 illustrated in FIG. 4A can be replaced with the M-to-1 time-domain multiplexer mentioned in the second embodiment, where M is an integer equal to or greater than 4, 8, 16, 32, 64 or 256. In this case, the system 100 illustrated in FIG. 4B includes the number M+2 of (narrowband) linear processors 120. The wave-front multiplexer 213 of the system 200 illustrated in FIG. 4B processes the number M+2 of input signals $X_1$-$X_{M+2}$ into the number M+2 of output signals $Y_1$-$Y_{M+2}$. The equalizer 231 of the system 200 illustrated in FIG. 4B performs amplitude, phase, and time-delay compensation to adjust the amplitudes, phases, and/or time-delays of the number M+2 of signals $W_1$-$W_{M+2}$ and outputs the number M+2 of the equalized signals $S_1$-$S_{M+2}$. The wave-front demultiplexer 232 of the system 200 illustrated in FIG. 4B processes the number M+2 of the signals $S_1$-$S_{M+2}$ into the number M+2 of output signals $Z_1$-$Z_{M+2}$. The 1-to-M time-domain demultiplexer 50 of the system 100 illustrated in FIG. 4B divides a signal $A_1$ into the number M of the signals $X_1$-$X_M$. The M-to-1 time-domain multiplexer 51 of the system 100 illustrated in FIG. 4B combines or integrates the number M of the signals $Z_1$-$Z_M$ into an output signal $B_1$.

Referring to FIG. 4B, the linear processors 120 can be, but not limited to, embedded in a processing module or in the number Nm of processing modules, where Nm is an integer equal to or more than 2, 3, 4, 5, 6, 7 or 8. Each of the linear processors 120, for example, can be a multiplier, an adder, a subtractor or a divider. Alternatively, each of the linear processors 120 may include, but not limited to, one or more multipliers, one or more adders, one or more subtractors, or/and one or more dividers. All of the linear processors 120 may have the same processing speed and capability or different processing speeds and capabilities.

In FIG. 4B, the orthogonal functional transformation characterizing the wave-front multiplexer 213 can be, but not limited to, fast Fourier transformation (FFT), and the inverse orthogonal functional transformation characterizing the wave-front demultiplexer 232 can be, but not limited to, inverse fast Fourier transformation (IFFT). Alternatively, the orthogonal functional transformation characterizing the wave-front multiplexer 213 can be, but not limited to, Hadamard transformation, and the inverse orthogonal functional transformation characterizing the wave-front demultiplexer 232 can be, but not limited to, Hadamard transformation.

A method for processing signals or data streams by using the system 100 shown in FIG. 4B is described below. Referring to FIG. 4B, the signal $A_1$ is transmitted into the 1-to-M time-domain demultiplexer 50 through, e.g., a signal path, a wireless channel or a physical channel, and the 1-to-M time-domain demultiplexer 50 divides the signal $A_1$, having a frequency bandwidth of J sampled at a sampling rate of K, into the signals $X_1$-$X_M$, each having a frequency bandwidth of J/M sampled at a sampling rate of K/M. Next, the signals $X_1$-$X_M$ and two pilot or diagnostic signals $X_{M+1}$ and $X_{M+2}$ are respectively transmitted in parallel to the number M+2 of input ports of the wave-front multiplexer 213. Each of the pilot or diagnostic signals $X_{M+1}$ and $X_{M+2}$ may have a single frequency and fixed amplitude. Alternatively, each of the pilot or diagnostic signals $X_{M+1}$ and $X_{M+2}$ could change based on time or could be any signal known by the system 100. In contrast, the signals $X_1$-$X_M$ are unknown by the system 100. The signal $A_1$ input into the preprocessor module 110 is unknown by the system 100.

Referring to FIG. 4B, after the signals $X_1$-$X_{M+2}$ are input into the wave-front multiplexer 213, the wave-front multiplexer 213 performs the above-mentioned wave-front multiplexing transformation to process the signals $X_1$-$X_{M+2}$ into the number M+2 of linear combinations, each combined with the signals $X_1$-$X_{M+2}$ multiplied by respective weightings, represented by the signals $Y_1$-$Y_{M+2}$ each having a frequency bandwidth of J/M sampled at a sampling rate of K/M. Next, the wave-front multiplexer 213 outputs the signals $Y_1$-$Y_{M+2}$ from its output ports, and the signals $Y_1$-$Y_{M+2}$ are respectively transmitted in parallel to the narrowband linear processors 120 through, e.g., multiple parallel signal paths, multiple parallel wireless channels or multiple parallel physical channels.

Referring to FIG. 4B, after the signals $Y_1$-$Y_{M+2}$ are input into the narrowband linear processors 120, the narrowband linear processors 120 perform at least one of addition, subtraction, multiplication and division to the respective signals $Y_1$-$Y_{M+2}$ into the respective signals $W_1$-$W_{M+2}$ each having a frequency bandwidth of J/M sampled at a sampling rate of K/M and outputs the signals $W_1$-$W_{M+2}$ from their output ports. Next, the signals $W_1$-$W_{M+2}$ are transmitted in parallel to the equalizer 231 through, e.g., multiple parallel signal paths, multiple parallel wireless channels or multiple parallel physical channels. Next, an optimizing and equalizing process is performed such that the signals $W_1$-$W_{M+2}$ can be compensated to be multiplied by respective weightings by the equalizer 231, wherein the respective weightings of the equalizer 231 can be adjusted based on a control signal CS output from the optimizer 235 and input into the equalizer 231. The optimizing and equalizing process can be referred to as the optimizing and equalizing process as illustrated in FIG. 1C. After the optimizing and equalizing process, the equalizer 231 outputs the equalized signals $S_1$-$S_{M+2}$, each having a frequency bandwidth of J/M sampled at a sampling rate of K/M, from its output ports. Each of the equalized signals $S_1$-$S_{M+2}$ is created by the equalizer 231 multiplying the corresponding one of the signals $W_1$-$W_{M+2}$ by a weighting of the equalizer 231. Each of the respective weightings of the equalizer 231 can be, but not limited to, a complex value such that the equalized signals $S_1$-$S_{M+2}$ can be rotated precisely to become in phase. In this case, the equalizer 231 can be performed by the narrow band equalizer, as illustrated in FIG. 1C. Alternatively, the equalizer 231 can be performed by the broadband equalizer, as illustrated in FIG. 1C.

Next, referring to FIG. 4B, the equalized signals $S_1$-$S_{M+2}$ are transmitted in parallel to the wave-front demultiplexer 232 through, e.g., multiple parallel signal paths, multiple wireless channels or multiple physical channels. Next, the wave-front demultiplexer 232 performs the above-mentioned wave-front demultiplexing transformation to process the equalized signals $S_1$-$S_{M+2}$ into the number M of linear combinations, each combined with the equalized signals $S_1$-$S_{M+2}$ multiplied by respective weightings, represented by the signals $Z_1$-$Z_{M+2}$, each having a frequency bandwidth of J/M sampled at a sampling rate of K/M, output in parallel from its output ports.

Next, referring to FIG. 4B, the signals $Z_1$-$Z_M$ are transmitted in parallel to the M-to-1 time-domain multiplexer 51, and the two signals $Z_{M+1}$ and $Z_{M+2}$ are transmitted into the optimizer 235. The signal $Z_{M+1}$ is used as a first output pilot or diagnostic signal featuring a value to be compared with that featured by the input pilot or diagnostic signal $X_{M+1}$ during the optimizing and equalizing process. The signal $Z_{M+2}$ is used as a second output pilot or diagnostic signal featuring a value to be compared with that featured by the input pilot or diagnostic signal $X_{M+2}$ during the optimizing and equalizing process. After the signals $Z_1$-$Z_M$ are input into the M-to-1 time-domain multiplexer 51, the M-to-1 time-domain multiplexer 51 combines or integrates the signals $Z_1$-$Z_M$ into the output signal $B_1$ having a frequency bandwidth of J sampled at a sampling rate of K and outputs the signal $B_1$ from its output port.

Therefore, the broad-band linear processing system 100 illustrated in FIG. 4B can process the input signal $A_1$ having a bandwidth greater than that of each of the signals $Y_1$-$Y_{M+2}$ input into the narrowband linear processors 120, greater than that of each of the signals $W_1$-$W_{M+2}$ output from the narrowband linear processors 120, and substantially equal to that of the signal $B_1$ output from the M-to-1 time-domain multiplexer 51. The signal $A_1$ may have a frequency, such as maximum frequency, or bandwidth substantially equal to that of the signal $B_1$ and at least M times higher than that of each of the signals $X_1$-$X_{M+2}$, $Y_1$-$Y_{M+}2$, $W_1$-$W_{M+}2$, $S_1$-$S_{M+}2$, and $Z_1$-$Z_{M+}2$, where M is an integer equal to or greater than 4, 8, 16, 32, 64 or 256.

Figure 4C:
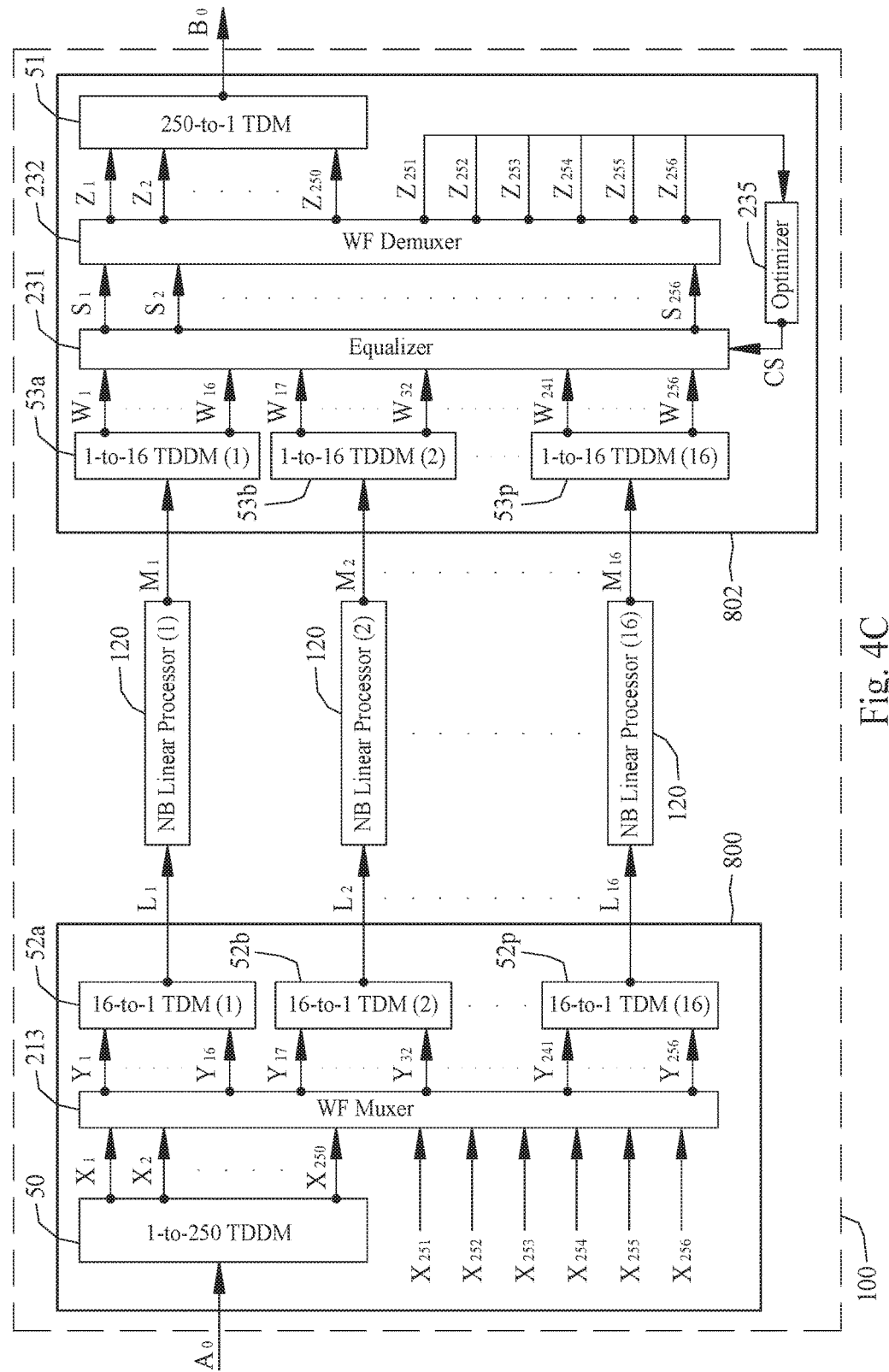
FIG. 4C shows a broad-band linear processing system including a preprocessor module, sixteen narrowband linear processors, and a post-processor module according to an embodiment of the present disclosure.

Referring to FIG. 4C, the preprocessor module 800 illustrated in FIG. 3E and the post-processor module 802 illustrated in FIG. 3F can be applied to a broad-band linear processing system 100. In this case, the system 100 shown in FIG. 4C includes sixteen (narrowband) linear processors 120 to process the sixteen signals $L_1$-$L_{16}$, output from the sixteen 16-to-1 time-domain multiplexers 52a-52p of the preprocessor module 800, into the sixteen signals $M_1$-$M_{16}$ and then output the sixteen signals $M_1$-$M_{16}$ to the sixteen 1-to-16 time-domain demultiplexers 53a-53p of the post-processor module 802. Thereby, the system 100 can process an input signal $A_0$ into an output signal $B_0$. All of the sixteen linear processors 120 shown in FIG. 4C, for example, may have the same processing speed and capability, and the sixteen 16-to-1 time-domain multiplexers 52a-52p of the preprocessor module 800 are identical. In FIG. 4C, the orthogonal functional transformation characterizing the wave-front multiplexer 213 can be, but not limited to, fast Fourier transformation (FFT), and the inverse orthogonal functional transformation characterizing the wave-front demultiplexer 232 can be, but not limited to, inverse fast Fourier transformation (IFFT).

A method for processing signals or data streams by using the system 100 shown in FIG. 4C is described below. Referring to FIG. 4C, the input signal $A_0$ is transmitted into the 1-to-250 time-domain demultiplexer 50 of the preprocessor module 800. Next, the 1-to-250 time-domain demultiplexer 50 divides the received signal $A_0$ having a frequency bandwidth of J sampled at a sampling rate of K into two-hundred-and-fifty signals $X_1$-$X_{250}$ each having a frequency bandwidth of J/250 sampled at a sampling rate of K/250 and outputs the two-hundred-and-fifty signals $X_1$-$X_{250}$ from its two-hundred-and-fifty outputs. The signals $X_3$-$X_{249}$ are not shown in FIG. 4C. Next, the two-hundred-and-fifty signals $X_1$-$X_{250}$ and six pilot or diagnostic signals $X_{251}$-$X_{256}$ are transmitted in parallel to the wave-front multiplexer 213. Each of the signals $X_{251-256}$ may have a single frequency and fixed amplitude. Alternatively, each of the signals $X_{251-256}$ could change based on time or could be any signal known by the system 100. In contrast, the two-hundred-and-fifty signals $X_1$-$X_{250}$ are unknown by the system 100. The signal $A_0$ is unknown by the system 100. The signal $A_0$ can be, but not limited to, sampled at least triple as fast as its bandwidth or maximum frequency. For example, if the signal $A_0$ has the bandwidth or maximum frequency of 500 MHz, the signal $A_0$ can be sampled at 1.5 Gsps.

Referring to FIG. 4C, after the two-hundred-and-fifty-six signals $X_1$-$X_{256}$ are input into the wave-front multiplexer 213, the wave-front multiplexer 213 performs the above-mentioned wave-front multiplexing transformation to process the signals $X_1$-$X_{256}$ into two-hundred-and-fifty-six linear combinations, each combined with the signals $X_1$-$X_{256}$ multiplied by respective weightings, represented by two-hundred-and-fifty-six signals $Y_1$-$Y_{256}$ and outputs the two-hundred-and-fifty-six signals $Y_1$-$Y_{256}$. Each of the signals $Y_1$-$Y_{256}$ may have a bandwidth of J/250 sampled at a sampling rate of K/250. The signals $Y_2$-$Y_{15}$, $Y_{18}$-$Y_{31}$, $Y_{33}$-$Y_{240}$, and $Y_{242}$-$Y_{255}$ are not shown in FIG. 4C. Next, sixteen sets of sixteen ones of the signals $Y_1$-$Y_{256}$ are respectively transmitted to the sixteen 16-to-1 time-domain multiplexers 52a-52p through, e.g., multiple parallel signal paths, multiple parallel physical channels or multiple parallel wireless channels. Each of the signals $X_1$-$X_{250}$ can be, but not limited to, sampled at least triple as fast as its bandwidth or maximum frequency. For example, if each of the signals $X_1$-$X_{250}$ has the bandwidth or maximum frequency of 2 MHz, each of the signals $X_1$-$X_{250}$ can be sampled at 6 Msps. Each of the signals $Y_1$-$Y_{250}$ can be, but not limited to, sampled at least triple as fast as its bandwidth or maximum frequency. For example, if each of the signals $Y_1$-$Y_{250}$ has the bandwidth or maximum frequency of 2 MHz, each of the signals $Y_1$-$Y_{250}$ can be sampled at 6 Msps.

Next, referring to FIG. 4C, each of the sixteen 16-to-1 time-domain multiplexers 52a-52p combines or integrates a corresponding set of the received sixteen ones of the signals $Y_1$-$Y_{256}$ into a corresponding one of the sixteen signals $L_1$-$L_{16}$ and outputs the corresponding one of the sixteen signals $L_1$-$L_{16}$ to a corresponding one of the sixteen linear processors 120. Each of the signals $L_1$-$L_{16}$ may have a bandwidth of 16*J/250 sampled at a sampling rate of 16*K/250. Only three linear processors 120 are shown in FIG. 4C, and only the three signals $L_1$, $L_2$ and $L_{16}$ are shown in FIG. 4C. Thereby, the sixteen signals $L_1$-$L_{16}$ output from the sixteen 16-to-1 time-domain multiplexers 52a-52p of the preprocessor module 800 are respectively transmitted in parallel to the sixteen linear processors 120. Each of the signals $L_1$-$L_{16}$ can be, but not limited to, sampled at least triple as fast as its bandwidth or maximum frequency. For example, if each of the signals $L_1$-$L_{16}$ has the bandwidth or maximum frequency of 32 MHz, each of the signals $L_1$-$L_{16}$ can be sampled at 96 Msps.

Next, referring to FIG. 4C, the sixteen linear processors 120 perform at least one of addition, subtraction, multiplication and division to the respective sixteen signals $L_1$-$L_{16}$ into the respective sixteen signals $M_1$-$M_{16}$ and output the signals $M_1$-$M_{16}$ to the sixteen 1-to-16 time-domain demultiplexers 53a-53p of the post-processor module 802. Each of the signals $M_1$-$M_{16}$ may have a bandwidth of 16*J/250 sampled at a sampling rate of 16*K/250. Each of the signals $M_1$-$M_{16}$ can be, but not limited to, sampled at least triple as fast as its bandwidth or maximum frequency. For example, if each of the signals $M_1$-$M_{16}$ has the bandwidth or maximum frequency of 32 MHz, each of the signals $M_1$-$M_{16}$ can be sampled at 96 Msps.

Next, referring to FIG. 4C, the sixteen 1-to-16 time-domain demultiplexers 53a-53p of the post-processor module 802 divide the received sixteen signals $M_1$-$M_{16}$ into two-hundred-and-fifty-six signals $W_1$-$W_{256}$ each having a frequency bandwidth of J/250 sampled at a sampling rate of K/250 and output the signals $W_1$-$W_{256}$ to the equalizer 231. Each of the sixteen 1-to-16 time-domain demultiplexers 53a-53p outputs sixteen corresponding ones of the signals $W_1$-$W_{256}$. For example, the 1-to-16 time-domain demultiplexer 53a divides the received signal $M_1$, having a frequency bandwidth of 16*J/250 sampled at a sampling rate of 16*K/250, into the sixteen output signals $W_1$-$W_{16}$, each having a frequency bandwidth of J/250 sampled at a sampling rate of K/250, and outputs the sixteen output signals $W_1$-$W_{16}$ to the equalizer 231. The 1-to-16 time-domain demultiplexer 53b divides the received signal $M_2$, having a frequency bandwidth of 16*J/250 sampled at a sampling rate of 16*K/250, into the sixteen output signals $W_{17}$-$W_{32}$, each having a frequency bandwidth of J/250 sampled at a sampling rate of K/250, and outputs the sixteen output signals $W_{17}$-$W_{32}$ to the equalizer 231. The 1-to-16 time-domain demultiplexer 53p divides the received signal $M_{16}$, having a frequency bandwidth of 16*J/250 sampled at a sampling rate of 16*K/250, into the sixteen output signals $W_{241}$-$W_{256}$, each having a frequency bandwidth of J/250 sampled at a sampling rate of K/250, and outputs the sixteen output signals $W_{241}$-$W_{256}$ to the equalizer 231.

Next, referring to FIG. 4C, the post-processor module 802 may perform an optimizing and equalizing process by its equalizer 231 and its optimizer 235 to adjust the amplitudes, phases, and/or time-delays of the signals $W_1$-$W_{256}$ output from its sixteen 1-to-16 time-domain demultiplexers 53a-53p, and the equalizer 231 generates two-hundred-and-fifty-six equalized signals $S_1$-$S_{256}$ each having a frequency bandwidth of J/250 sampled at a sampling rate of K/250 and outputs the equalized signals $S_1$-$S_{256}$ to the wave-front demultiplexer 232. Each of the equalized signals $S_1$-$S_{256}$ is created by the equalizer 231 multiplying the corresponding one of the signals $W_1$-$W_{256}$ by a weighting of the equalizer 231. For example, the equalized signal $S_1$ is created by the equalizer 231 multiplying the corresponding signal $W_1$ by a weighting of the equalizer 231. The signals $S_3$-$S_{255}$ are not shown in FIG. 4C. Each of the signals $W_1$-$W_{256}$ can be, but not limited to, sampled at least triple as fast as its bandwidth or maximum frequency. For example, if each of the signals $W_1$-$W_{256}$ has the bandwidth or maximum frequency of 2 MHz, each of the signals $W_1$-$W_{256}$ can be sampled at 6 Msps. Each of the signals $S_1$-$S_{256}$ can be, but not limited to, sampled at least triple as fast as its bandwidth or maximum frequency. For example, if each of the signals $S_1$-$S_{256}$ has the bandwidth or maximum frequency of 2 MHz, each of the signals $S_1$-$S_{256}$ can be sampled at 6 Msps.

Next, referring to FIG. 4C, the wave-front demultiplexer 232 performs the above-mentioned wave-front demultiplexing transformation to process the equalized signals $S_1$-$S_{256}$ into two-hundred-and-fifty-six linear combinations, each combined with the signals $S_1$-$S_{256}$ multiplied by respective weightings, represented by two-hundred-and-fifty-six signals $Z_1$-$Z_{256}$ each having a frequency bandwidth of J/250 sampled at a sampling rate of K/250. Next, the wave-front demultiplexer 232 outputs the two-hundred-and-fifty signals $Z_1$-$Z_{250}$ to the 250-to-1 time-domain multiplexer 51 and outputs the six signals $Z_{251}$-$Z_{256}$ to the optimizer 235. The optimizer 235 generates a control signal CS and outputs the control signal CS to the equalizer 231 to adjust the weightings of the equalizer 231, as illustrated in FIG. 1C.

Referring to FIG. 4C, after the signals $Z_1$-$Z_{250}$ are input into the 250-to-1 time-domain multiplexer 51, the 250-to-1 time-domain multiplexer 51 combines or integrates the signals $Z_1$-$Z_{250}$, each having a frequency bandwidth of J/250 sampled at a sampling rate of K/250, into the signal $B_0$ having a frequency bandwidth of J sampled at a sampling rate of K and outputs the signal $B_0$ from its output. Each of the signals $Z_1$-$Z_{250}$ can be, but not limited to, sampled at least triple as fast as its bandwidth or maximum frequency. For example, if each of the signals $Z_1$-$Z_{250}$ has the bandwidth or maximum frequency of 2 MHz, each of the signals $Z_1$-$Z_{250}$ can be sampled at 6 Msps. The signal $B_0$ can be, but not limited to, sampled at least triple as fast as its bandwidth or maximum frequency. For example, the signal $B_0$ has the bandwidth or maximum frequency of 500 MHz, the signal $B_0$ can be sampled at 1.5 Gsps.

Thereby, referring to FIG. 4C, the system 100 can process the signal $A_0$, having a frequency bandwidth greater than that of each of the signals $L_1$-$L_{16}$, greater than that of each of the signals $M_1$-$M_{16}$, and substantially equal to the signal $B_0$. The system 100 can process the signal $A_0$ sampled at a greater sampling rate than each of the signals $L_1$-$L_{16}$ is sampled and than each of the signals $M_1$-$M_{16}$ is sampled. The system 100 can process the signal $A_0$ sampled at the same sampling rate as the signal $B_0$ is sampled.

Alternatively, the sixteen 16-to-1 time-domain multiplexers $52a$-$52p$ of the preprocessor module 800 shown in FIG. 4C can be replaced with sixteen frequency division or domain multiplexers (FDMs), and the sixteen 1-to-16 time-domain demultiplexers $53a$-$53p$ of the post-processor module 802 can be replaced with sixteen frequency division or domain demultiplexers.

The linear processors can operate at different processing speeds and capabilities, and thereby the multiplexer 213 and demultiplexer 232 can allocate the different number of I/O ports for different linear processors 120 based on their processing speeds and capabilities. For example, in FIG. 4B, both multiplexers and demultiplexers can provide the number $N_L$ of sets of one port for the number $N_L$ of the linear processors, respectively and provide the number $N_V$ of sets of multiple ports for the number $N_V$ of the linear processors, respectively. Each of the number $N_V$ of the linear processors operates at higher processing speeds and capabilities than each of the number $N_L$ of the linear processors operates. In this case, the number $N_L+N_V$ can be less than the total number M+2 of output ports of the wave-front multiplexer 213 and less than the total number M+2 of input ports of the wave-front demultiplexer 213. Alternatively, in FIG. 4C, the number $N_B$ of linear processors 120 each receive one signal from a corresponding 16-to-1 time domain multiplexer and output one signal to a corresponding 1-to-16 time domain demultiplexer, and the number $N_C$ of linear processors 120 each receive multiple signals from multiple corresponding 16-to-1 time domain multiplexers and output multiple signals to multiple corresponding 1-to-16 time domain demultiplexers. Each of the number $N_C$ of the linear processors operates at higher processing speeds and capabilities than each of the number $N_B$ of the linear processors operates. In this case, the number $N_B+N_C$ can be less than the total number of the 16-to-1 time domain multiplexers and less than the total number of input ports of the 1-to-16 time domain demultiplexers.

Alternatively, the sixteen 16-to-1 time-domain multiplexers $52a$-$52p$ of the preprocessor module 800 shown in FIG. 4C can be replaced with sixteen code division or domain multiplexers (CDMs), and the sixteen 1-to-16 time-domain demultiplexers $53a$-$53p$ of the post-processor module 802 can be replaced with sixteen code division or domain demultiplexers. In this case, the sixteen linear processors 120 shown in FIG. 4C can operate at different processing speeds and capabilities.

Figure 4D:
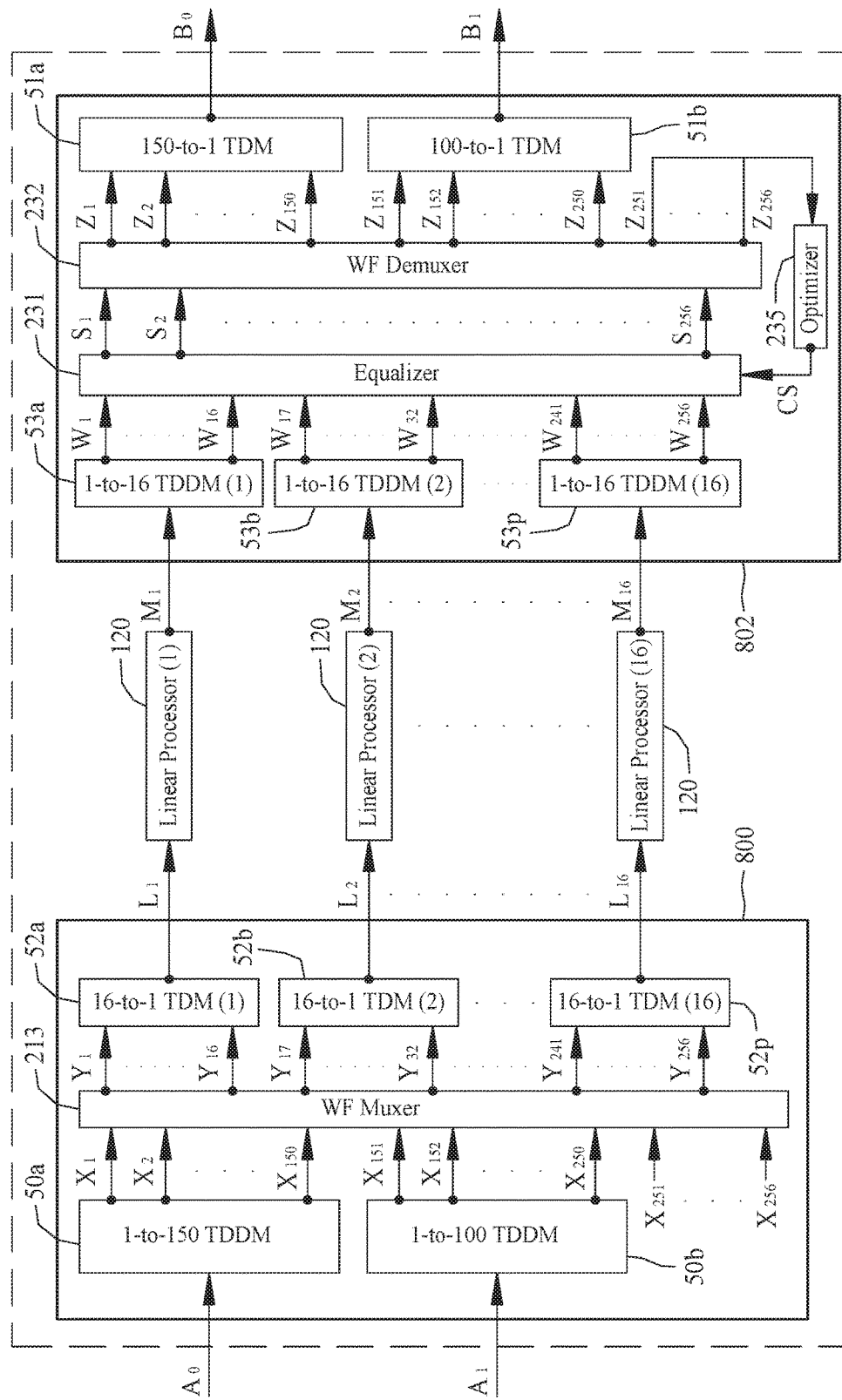
FIG. 4D shows a broad-band linear processing system including a preprocessor module, sixteen narrowband linear processors, and a post-processor module according to an embodiment of the present disclosure.

FIG. 4D shows that two signals or data streams $A_0$ and $A_1$ are processed by a linear processing system 100 so as to output two signals or data streams $B_0$ and $B_1$. Referring to FIG. 4D, the preprocessor module 800 shown in FIG. 4D is similar to the preprocessor module 800 illustrated in FIG. 4C except that the preprocessor module 800 shown in FIG. 4D includes two 1-to-M time-domain demultiplexers, such as 1-to-150 time-domain demultiplexer $50a$ and 1-to-100 time-domain demultiplexer $50b$, processing the two input signals or data streams $A_0$ and $A_1$ into two-hundred-and-fifty signals or data streams $X_1$-$X_{250}$. The post-processor module 802 shown in FIG. 4D is similar to the post-processor module 802 illustrated in FIG. 4C except that the post-processor module 802 shown in FIG. 4D includes two M-to-1 time-domain multiplexers, such as 150-to-1 time-domain multiplexer $51a$ and 100-to-1 time-domain multiplexer $51b$, processing two-hundred-and-fifty signals or data streams $Z_1$-$Z_{250}$ into output the two signals or data streams $B_0$ and $B_1$.

A method for processing signals or data streams by using the system 100 shown in FIG. 4D is briefly described below.

Referring to FIG. 4D, the input signal $A_0$ is transmitted into the 1-to-150 time-domain demultiplexer $50a$ of the preprocessor module 800, and the input signal $A_1$ is transmitted into the 1-to-100 time-domain demultiplexer $50b$ of the preprocessor module 800. Next, the 1-to-150 time-domain demultiplexer $50a$ divides the received signal $A_0$ into one-hundred-and-fifty signals $X_1$-$X_{150}$ and outputs the signals $X_1$-$X_{150}$ from its output ports, and the 1-to-100 time-domain demultiplexer $50b$ divides the received signal $A_1$ into one-hundred signals $X_{15}$-$X_{250}$ and outputs the signals $X_{15}$-$X_{250}$ from its output ports. Next, the two-hundred-and-fifty signals $X_1$-$X_{250}$ and six pilot or diagnostic signals $X_{251}$-$X_{256}$ are transmitted in parallel to the wave-front multiplexer 213. Each of the signals $X_{251-256}$ may have a single frequency and fixed amplitude. Alternatively, each of the signals $X_{251-256}$ could change based on time or could be any signal known by the system 100. In contrast, the two-hundred-and-fifty signals $X_1$-$X_{250}$ are unknown by the system 100. The signals $A_0$ and $A_1$ are unknown by the system 100. Next, the following processing steps can be referred to as the corresponding processing steps as illustrated in FIG. 4C so as to generate two-hundred-and-fifty-six signals $Z_1$-$Z_{256}$. Next, the one-hundred-and-fifty signals $Z_1$-$Z_{150}$ are transmitted in parallel to the 150-to-1 time-domain multiplexer $51a$, the one-hundred signals $Z_{151}$-$Z_{250}$ are transmitted in parallel to the 100-to-1 time-domain multiplexer $51b$, and the six signals $Z_{251}$-$Z_{256}$ are transmitted to the optimizer 235. The optimizer 235 generates a control signal CS and outputs the control signal CS to the equalizer 231 to adjust the weightings of the equalizer 231, as illustrated in FIG. 1C.

Referring to FIG. 4D, after the signals $Z_1$-$Z_{150}$ are input into the 150-to-1 time-domain multiplexer $51a$, the 150-to-1 time-domain multiplexer $51a$ combines or integrates the signals $Z_1$-$Z_{150}$ into the signal $B_0$ and outputs the signal $B_0$ from its output. After the signals $Z_{151}$-$Z_{250}$ are input into the 100-to-1 time-domain multiplexer $51b$, the 100-to-1 time-domain multiplexer $51b$ combines or integrates the signals $Z_{151}$-$Z_{250}$ into the signal $B_1$ and outputs the signal $B_1$ from its output.

Thereby, referring to FIG. 4D, the system 100 processes the signal $A_0$, having a frequency bandwidth greater than that of each of the signals $L_1$-$L_{16}$, greater than that of each of the signals $M_1$-$M_{16}$, and substantially equal to the signal $B_0$ and processes the signal $A_1$, having a frequency bandwidth greater than that of each of the signals $L_1$-$L_{16}$, greater than that of each of the signals $M_1$-$M_{16}$, and substantially equal to the signal $B_1$. The system 100 processes the signals $A_0$ and $A_1$ each sampled at a greater sampling rate than each of the signals $L_1$-$L_{16}$ is sampled and than each of the signals $M_1$-$M_{16}$ is sampled. The system 100 processes the signal $A_0$ sampled at substantially the same sampling rate as the signal $B_0$ is sampled and processes the signal $A_1$ sampled at substantially the same sampling rate as the signal $B_1$ is sampled. Each of the signals $A_0$, $X_1$-$X_{256}$, $Y_1$-$Y_{256}$, $L_1$-$L_{16}$, $M_1$-$M_{16}$, $W_1$-$W_{256}$, $S_1$-$S_{256}$, $Z_1$-$Z_{256}$ and $B_0$ can be, but not limited to, sampled at least twice or triple its (maximum) frequency or bandwidth.

Figure 4E:
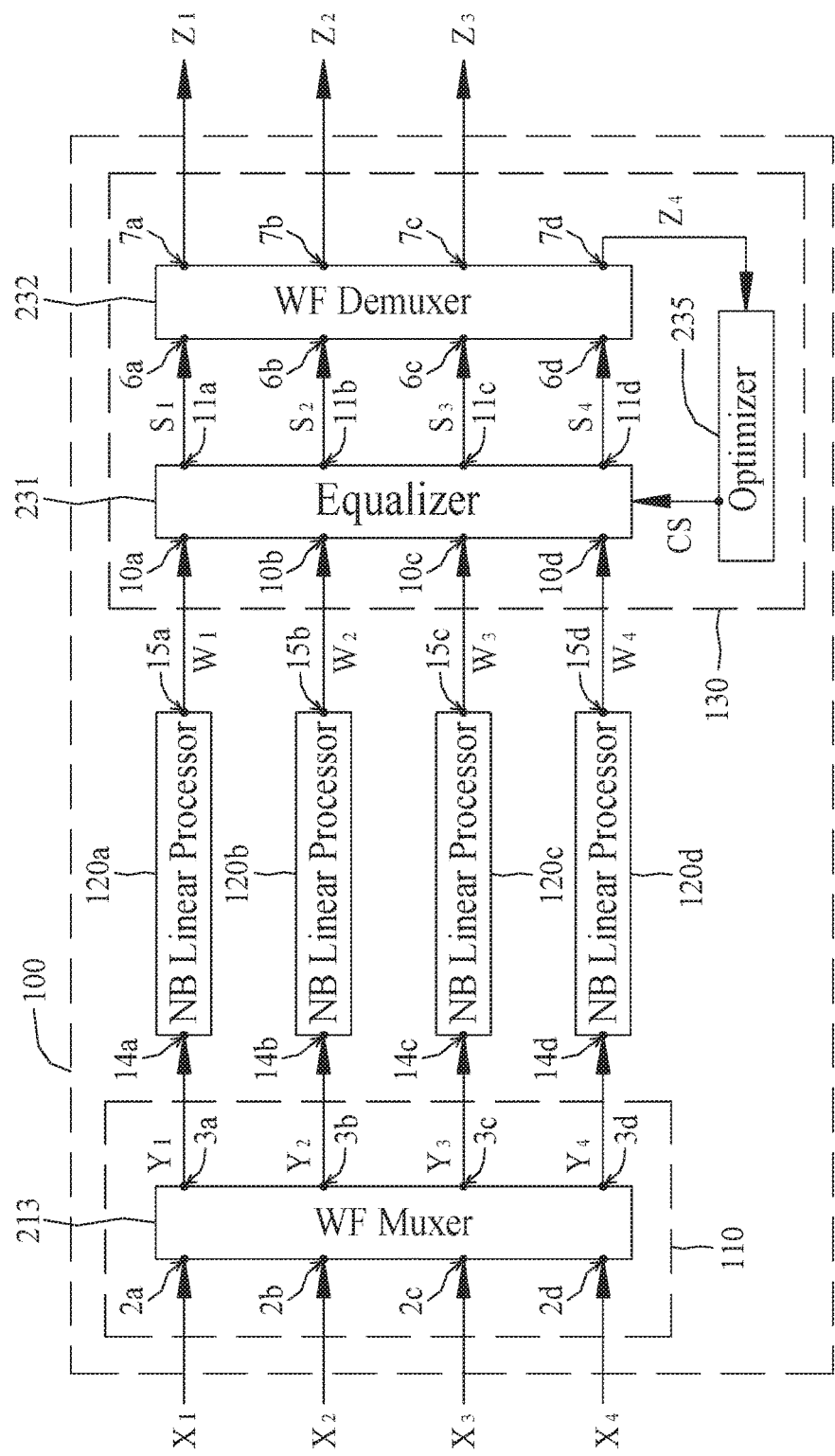
FIG. 4E shows a broad-band linear processing system including a wave-front multiplexer, four narrowband linear processors, a wave-front demultiplexer, an equalizer and an optimizer according to an embodiment of the present disclosure.

Referring to FIG. 4E, the system 100 shown in FIG. 4E is similar to the system 100 illustrated in FIG. 4A except that the preprocessor 110 shown in FIG. 4E does not include the 1-to-3 time-domain demultiplexer 50 and that the post-processor 130 shown in FIG. 4E does not include the 3-to-1 time-domain multiplexer 51.

A method for processing signals or data streams by using the system 200 shown in FIG. 4E is briefly described below. Three signals $X_1$, $X_2$ and $X_3$ and a pilot or diagnostic signal $X_4$ are transmitted in parallel to the wave-front multiplexer 213. Next, the following processing steps can be referred to as the corresponding processing steps as illustrated in FIG. 4A so as to generate four signals $Z_1$-$Z_4$.

Figure 4F:
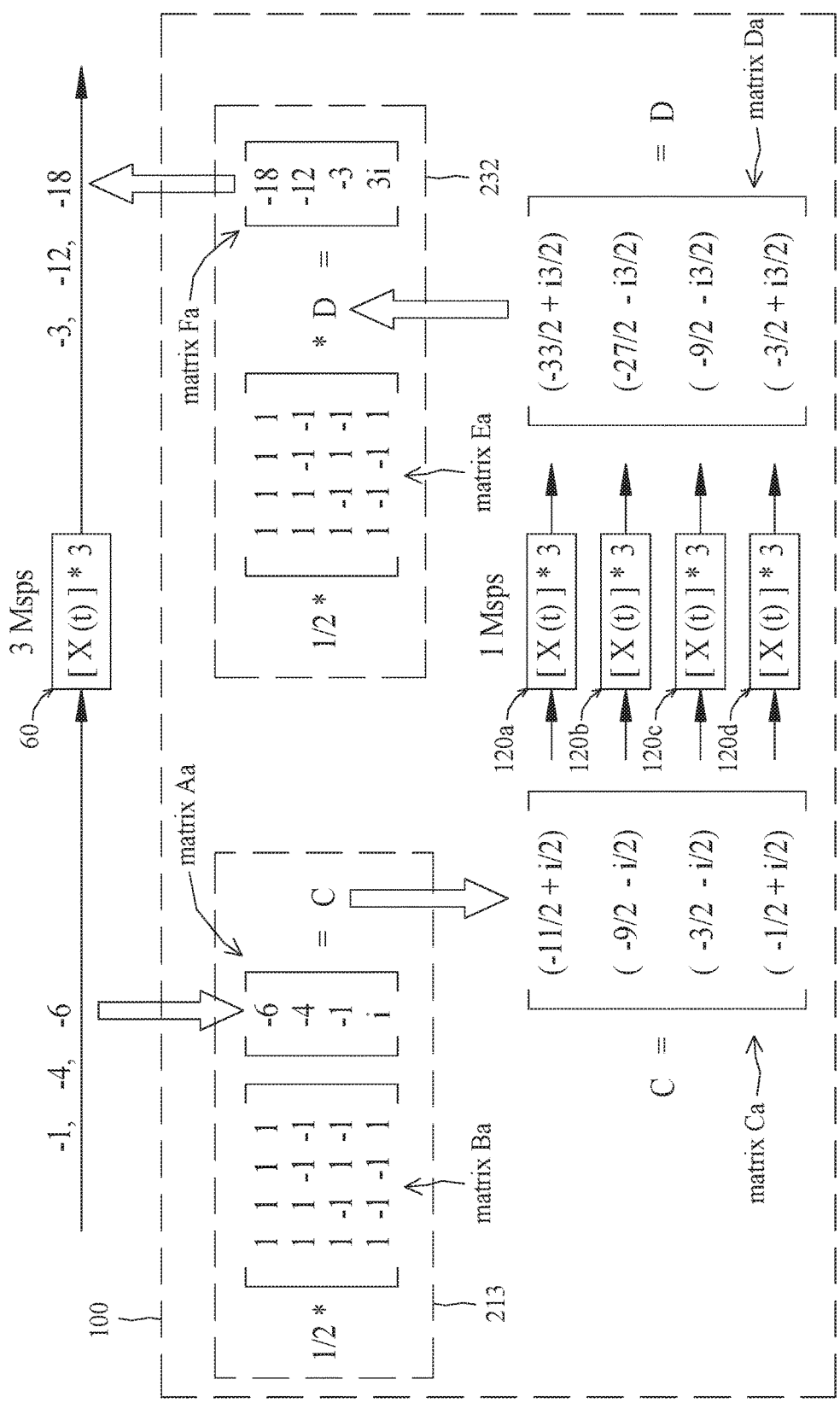
FIG. 4F shows a calculation of a broad-band linear processing system according to an embodiment of the present disclosure.

FIG. 4F shows a numerical example of the system 100 illustrated in FIG. 4E using Hadamard transformations performed by the wave-front multiplexer 213 and the wave-front demultiplexer 232. In this case, the four linear processors 120a, 120b, 120c and 120d feature multiplication by a scalar, and each of the four linear processors 120a, 120b, 120c and 120d has a sampling rate of 1 Msps. The descriptions of the wave-front multiplexer 213 and the wave-front demultiplexer 232 as illustrated in FIG. 1A can be applied to this embodiment illustrated in FIGS. 4E and 4F.

Referring to FIGS. 4E and 4F, the number of −6 represents a slice, i.e. slice a, of the input signal $X_1$, the number of −4 represents a slice, i.e. slice b, of the input signal $X_2$, the number of −1 represents a slice, i.e. slice c, of the input signal $X_3$, and the pilot code of i represents a slice, i.e. slice d, of the pilot or diagnostic signal $X_4$. After the four slices a, b, c and d are input into the wave-front multiplexer 213, the wave-front multiplexer 213 performs the wave-front multiplexing transform, which can be referred to as the description illustrated in FIG. 1A. In this case, the system 100 uses the same 4*4 Hadamard matrixes Ba and Ea to achieve the wave-front multiplexing and demultiplexing transforms, respectively. An input matrix Aa including the four slices a, b, c and d shown in FIG. 4F can represent the input matrix A illustrated in FIG. 1A. A 4×4 Hadamard matrix Ba shown in FIG. 4F can represent the orthogonal matrix B illustrated in FIG. 1A. The first column of the matrix Ba is defined herein as a first wave-front multiplexing vector (WFMV1) for processing the slice a. The second column of the matrix Ba is defined herein as a second wave-front multiplexing vector (WFMV2) for processing the slice b. The third column of the matrix Ba is defined herein as a third wave-front multiplexing vector (WFMV3) for processing the slice c. The fourth column of the matrix Ba is defined herein as a fourth wave-front multiplexing vector (WFMV4) for processing the slice d.

After performing the wave-front multiplexing transform, the wave-front multiplexer 213 obtains four output signals $Y_1$, $Y_2$, $Y_3$ and $Y_4$ represented by a 4×1 matrix Ca, which can represent the matrix C illustrated in FIG. 1A, and then outputs the four output signals $Y_1$, $Y_2$, $Y_3$ and $Y_4$ from its four outputs 3a, 3b, 3c and 3d. Next, the four output signals $Y_1$, $Y_2$, $Y_3$ and $Y_4$ are respectively transmitted in parallel to four input ports 14a, 14b, 14c and 14d of the four linear processors 120a, 120b, 120c and 120d through, e.g., four parallel signal paths, four parallel wireless channels or four parallel physical channels. Next, each of the four linear processors 120a, 120b, 120c and 120d processes a corresponding one of the four signals $Y_1$, $Y_2$, $Y_3$ and $Y_4$ to be multiplied by a constant of 3 at a sampling rate of 1 Msps. Next, the four linear processors 120a, 120b, 120c and 120d respectively output four signals $W_1$, $W_2$, $W_3$ and $W_4$ to four input ports 10a, 10b, 10c and 10d of the equalizer 231 through, e.g., four parallel signal paths, four parallel wireless channels or four parallel physical channels. After the four signals $W_1$, $W_2$, $W_3$ and $W_4$ are transmitted in parallel into the equalizer 231, an optimizing and equalizing process is performed such that the four signals $W_1$, $W_2$, $W_3$ and $W_4$ can be compensated to be multiplied by four respective weightings by the equalizer 231, wherein the four respective weightings of the equalizer 231 can be adjusted based on a control signal CS output from the optimizer 235 and input into the equalizer 231. The optimizing and equalizing process can be referred to as the optimizing and equalizing process as illustrated in FIGS. 1B and 1C.

After the optimizing and equalizing process, the equalizer 231 outputs four equalized signals $S_1$, $S_2$, $S_3$ and $S_4$ represented by a 4×1 matrix Da, which can represent the matrix D illustrated in FIG. 1A, from its output ports 11a, 11b, 11c and 11d. Next, the four signals $S_1$, $S_2$, $S_3$ and $S_4$ are transmitted in parallel to input ports 6a, 6b, 6c and 6d of the wave-front demultiplexer 232 through, e.g., four parallel signal paths or channels between the output ports 11a, 11b, 11c and 11d of the equalizer 231 and the input ports 6a, 6b, 6c and 6d of the wave-front demultiplexer 232. After the equalized signals $S_1$, $S_2$, $S_3$ and $S_4$ are input in parallel to the wave-front demultiplexer 232, the wave-front demultiplexer 232 performs the wave-front demultiplexing transform, which can be referred to as the description illustrated in FIG. 1A. A 4×4 Hadamard matrix Ea shown in FIG. 4F can represent the orthogonal matrix E illustrated in FIG. 1A. The first column of the matrix Ea is defined herein as a first wave-front demultiplexing vector (WFDV1) for processing the component of (−33/2+i3/2) in the matrix Da. The second column of the matrix Ea is defined herein as a second wave-front demultiplexing vector (WFDV2) for processing the component of (−27/2+i3/2) in the matrix Da. The third column of the matrix Ea is defined herein as a third wave-front demultiplexing vector (WFDV3) for processing the component of (−9/2+i3/2) in the matrix Da. The fourth column of the matrix Ea is defined herein as a fourth wave-front demultiplexing vector (WFDV4) for processing the component of (−3/2+i3/2) in the matrix Da.

After performing the wave-front demultiplexing transform, the wave-front demultiplexer 232 obtains four signals $Z_1$, $Z_2$, $Z_3$ and $Z_4$ represented by a 4×1 matrix Fa, which can represent the matrix F illustrated in FIG. 1A, and outputs the four signals $Z_1$, $Z_2$, $Z_3$ and $Z_4$. The signal $Z_4$ is transmitted into the optimizer 235. The signal $Z_4$ can be used as an output pilot or diagnostic signal featuring a value to be compared with that featured by the input pilot or diagnostic signal $X_4$ during the optimizing and equalizing process.

FIG. 4F also shows a broad-band linear processor 60, which is not part of the system 100, to process the three slices a, b and c multiplied by a constant of 3 at a sampling rate of 3 Msps. In contrast, the system 100 can use four narrowband linear processors 120a, 120b, 120c and 120d to achieve the same purpose that the broad-band linear processor 60 achieved.

Fourth Embodiment: Application to Fiber Optical Communications

FIGS. 5A and 5C-5H show multiple systems each including fiber optical communication using multiple light sources and various propagation paths grouped with a wave-front multiplexer and a wave-front demultiplexer according to an exemplary embodiment of the present disclosure. These systems in accordance with the fourth embodiment create various mode groups (MGs) of light via mode group diversity multiplexing (MGDM) as means for multiple parallel paths in a multimode fiber (MMF). Alternatively, instead of the mode group diversity multiplexing, the systems in accordance with the embodiment could perform a wavelength diversity multiplexing (WDM) process to create multiple wavelengths, i.e. various colorful lasers or light beams, passing through multiple single mode fibers.

Figure 5A:
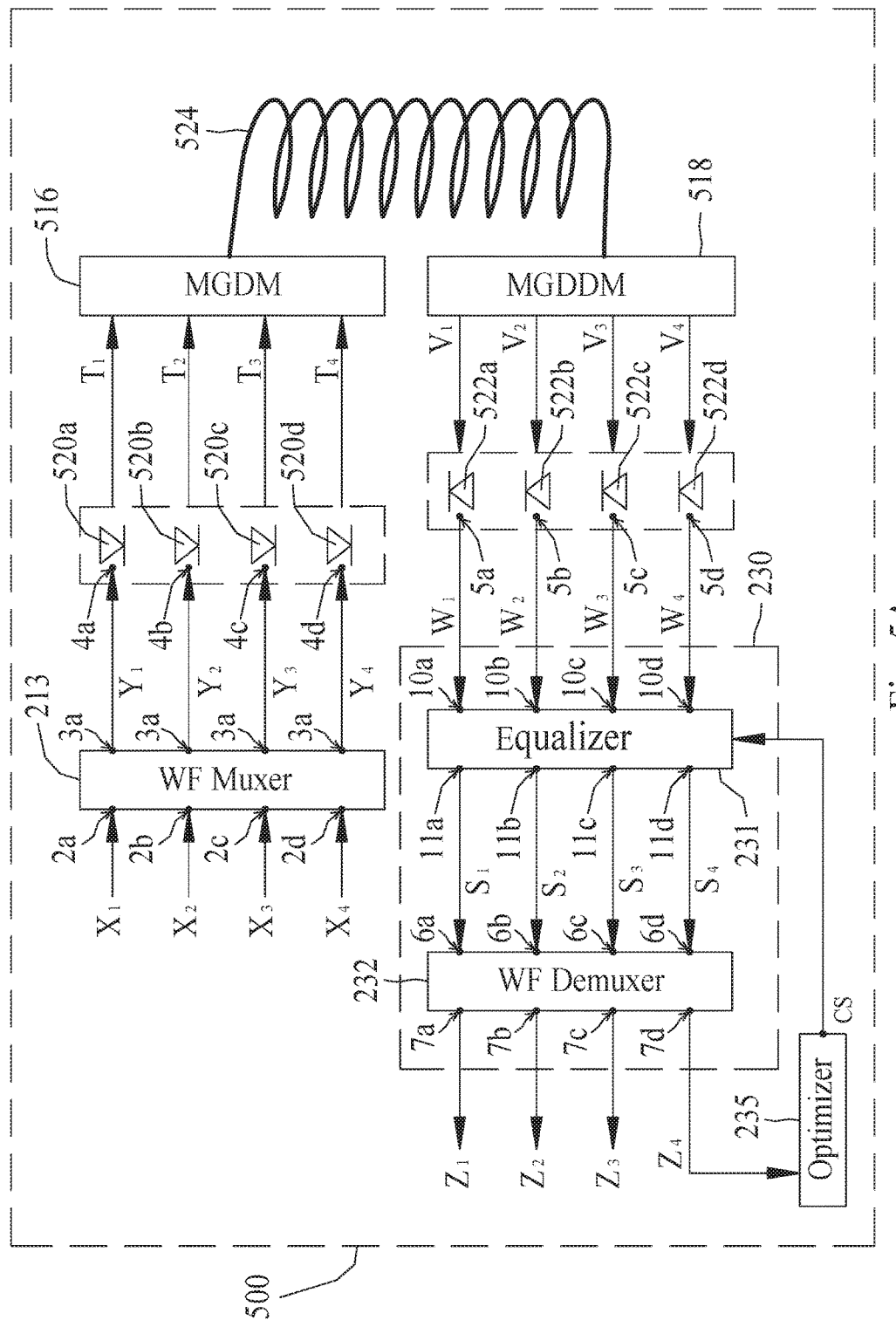
FIG. 5A shows a system including a wave-front multiplexer, four optical transmit devices, four optical detectors, a MGDM device, a MGDDM device, a multimode fiber, a wave-front demultiplexer, an equalizer and an optimizer according to an embodiment of the present disclosure.

Referring to FIG. 5A, a system 500 includes a wave-front multiplexer 213, four individual optical transmit devices or transmitters 520a, 520b, 520c and 520d, four individual optical detectors 522a, 522b, 522c and 522d, a mode group diversity multiplexing (MGDM) device 516, a mode group diversity demultiplexing (MGDDM) device 518, a multi-mode fiber (MMF) 524, an equalizer or equalization processor 231, a wave-front demultiplexer 232, and an optimizer or optimization processor 235. The description of the wave-front multiplexer 213 illustrated in FIG. 5A can be referred to as that as illustrated in FIG. 1A or 1B. The description of the wave-front demultiplexer 232 illustrated in FIG. 5A can be referred to as that as illustrated in FIG. 1A or 1B. The description of the equalizer 231 illustrated in FIG. 5A can be referred to as that as illustrated in FIG. 1B. The description of the optimizer 235 illustrated in FIG. 5A can be referred to as that as illustrated in FIG. 1B.

Each of the optical transmit devices 520a, 520b, 520c and 520d includes a laser generator or light source, e.g., including one or more light-emitting-diode (LED) chips, wherein the optical transmit devices 520a, 520b, 520c and 520d can be, but not limited to, integrated or embedded in hardware such as module or processor. In this embodiment, the processor 998 including the four processing units 999a, 999b, 999c and 999d as illustrated in FIG. 1A can be replaced with a communication medium including the four optical transmit devices 520a-520d, the four optical detectors 522a-522d and the MMF 524 as illustrated in FIG. 5A.

Figure 5B:
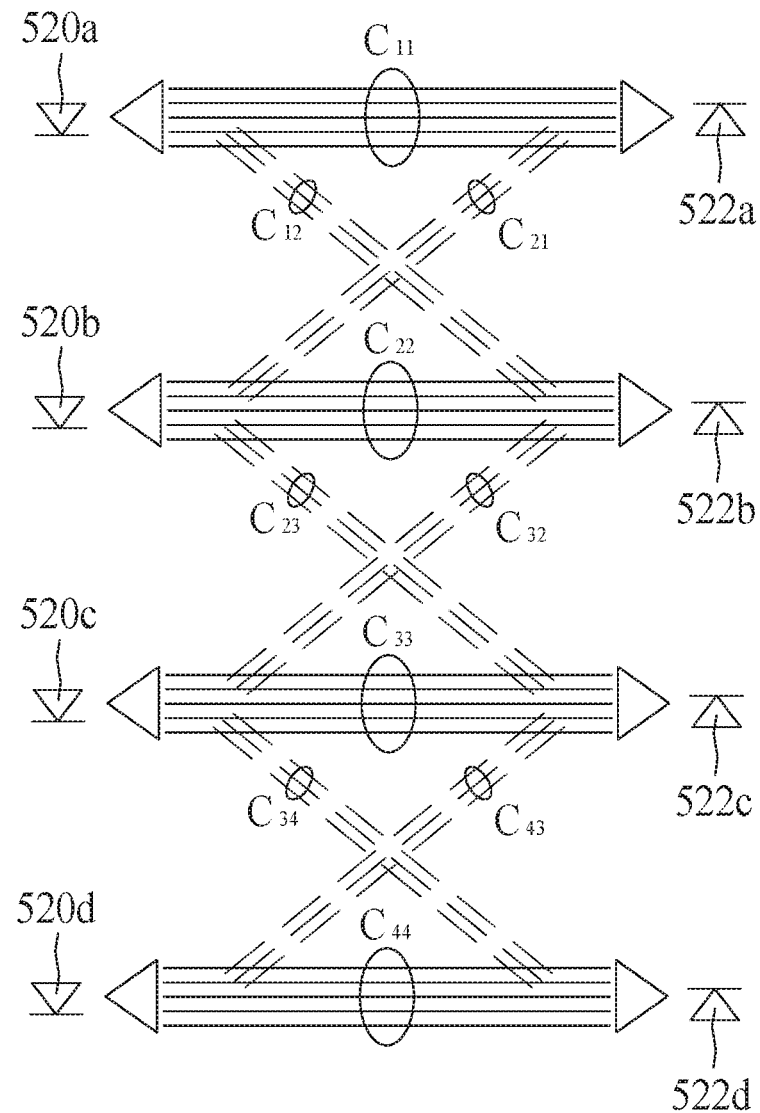
FIG. 5B shows a mathematical model of mode-coupling among four propagation paths in a multimode fiber according to an embodiment of the present disclosure.

The MMF 524 provides multiple concurrent pairs of optical transmit devices 520a-520d and detectors 522a-522d over an optical carrier frequency (or optical wavelength) with good isolations among the pairs via multiple mode-group (MG) diversity in the MMF 524 in optical communications to increase the communication capacity of the MMF 524. In the MMF 524, various signals in different propagation mode-groups (MGs) feature "mutual coupling" at the same frequency or wavelength due to imperfections of the optical fiber, e.g. non perfect circular cross-sections, temperature gradient, inhomogeneous densities, mechanical bending of fibers, and etc., as illustrated in FIG. 5B depicting a mathematical model of mode-coupling among four propagation paths in the MMF 524. In the current multimode fiber, normalized power radiated by an optical transmit devices would be scattered into multiple portions captured by different optical detectors. For example, referring to FIG. 5B, some of the coupling coefficients $C_{11}$, $C_{22}$, $C_{33}$, $C_{44}$, $C_{21}$, $C_{12}$, $C_{23}$, $C_{32}$, $C_{34}$ and $C_{43}$ among the four propagation paths from various sources, such as optical transmit devices 520a, 520b, 520c and 520d, to different destinations, such as optical detectors 522a, 522b, 522c and 522d are illustrated. $C_{11}$ is the coupling coefficient between the optical transmits device 520a and the optical detector 522a and standing for amount of power captured by the optical detector 522a from a normalized power radiated by the optical transmit device 520a. $C_{12}$ is the coupling coefficient between the optical transmits device 520a and optical detector 522b and standing for amount of power captured by the optical detector 522b from a normalized power radiated by the optical transmit device 520a. $C_{23}$ is the coupling coefficient between the optical transmits device 520b and optical detector 522c and standing for amount of power captured by the optical detector 522c from a normalized power radiated by the optical transmit device 520b. As a result, signals radiated by the optical transmit device 520a might not only appear at the optical detector 522a but also at the optical detectors 522b, 522c and 522d.

Referring to FIG. 5A, the wave-front multiplexer 213 can receive, in parallel, four individual and independent digital signals $X_1$, $X_2$, $X_3$ and $X_4$, to process the digital signals $X_1$, $X_2$, $X_3$ and $X_4$ into four digital signals $Y_1$, $Y_2$, $Y_3$ and $Y_4$ by the above-mentioned wave-front multiplexing transform, and outputs the digital signals $Y_1$, $Y_2$, $Y_3$ and $Y_4$ in parallel, which can be referred to as the description illustrated in FIG. 1A. Each of the digital signals $Y_1$, $Y_2$, $Y_3$ and $Y_4$ is a linear combination, i.e. weighted sum, each combined with the digital signals $X_1$, $X_2$, $X_3$ and $X_4$ multiplied by respective weightings, and distributions of the weightings of any two input components in all digital signals $Y_1$, $Y_2$, $Y_3$ and $Y_4$ are orthogonal, which can be referred to as the description illustrated in FIGS. 1A and 1D. In this case, as illustrated in FIG. 1D, the number of H is equal to 4. The wave-front multiplexer 213 has 4*4 computing units and four summing processors. The computing units form a processor array with four rows and four columns. The input signals $X_1$-$X_4$ can be received by the computing units in the respective four columns in the processor array. Upon receiving the input signals $X_1$-$X_4$, each of the computing units independently weights its received signal, multiplied by a weighting value, to generate a weighted signal. The four summing processors can output the four signals $Y_1$-$Y_4$ each combined with the weighted signals output from the computing units in a corresponding one of the four rows in the processor array. The digital signals $X_1$, $X_2$, $X_3$ and $X_4$ can be, but not limited to, four IF digital signals or four RF digital signals.

The signal $X_4$ may be a pilot or diagnostic signal that may have a single frequency and fixed amplitude. Alternatively, the pilot or diagnostic signal $X_4$ could change based on time or could be any signal known by the system 500. The extraneous signals $X_1$, $X_2$ and $X_3$ are unknown by the system 500 and input into the system 500 from an extraneous system.

The wave-front multiplexer 213 can be, but not limited to, embedded in a processor. The wave-front multiplexer 213 can be, but not limited to, hardware, such as a device of four-by-four Butler matrix or a device performing any transformation of a four-by-four orthogonal matrix.

Referring to FIG. 5A, each of the optical transmit devices or transmitters $520_a$, $520_b$, $520_c$ and $520_d$ can be a laser generator, wherein the laser generator can emit a distributed feedback laser (DFB laser), a Fabry-perot laser (F-P laser) or a vertical cavity surface emitting laser (VCSEL) to the mode-group diversity multiplexing (MGDM) device 516. Upon receiving the digital signals $Y_1$, $Y_2$, $Y_3$ and $Y_4$ input in parallel from multiple parallel output ports $3_a$-$3_d$ of the wave-front multiplexer 513 respectively, the optical transmit devices $520_a$, $520_b$, $520_c$ and $520_d$ emit four individual optical signals $T_1$-$T_4$ based on the digital signals $Y_1$, $Y_2$, $Y_3$ and $Y_4$ to the MGDM device 516, wherein the optical signal $T_1$ carries information associated with the digital signal $Y_1$, the optical signal $T_2$ carries information associated with the digital signal $Y_2$, the optical signal $T_3$ carries information associated with the digital signal $Y_3$, and the optical signal $T_4$ carries information associated with the digital signal $Y_4$. The MGDM device 516 has been proposed as a way of creating parallel communication channels over the multi-mode fiber (MMF) 524. The MGDM 516 has been proved as an efficient scheme to overcome the limited bandwidth of the multimode fiber (MMF) 524. MGDM device 516 can multiplex the optical signals $T_1$-$T_4$ into different mode groups of light, propagating with different angles in the MMF 524, wherein each mode groups of the light are used to carry different information so that the data throughput is increased without having additional bandwidth.

Referring to FIG. 5A, upon receiving the different mode groups of the light output from the MGDM device 516 and propagating over the MMF 524, the mode-group diversity demultiplexing (MGDDM) device 518 demultiplexes the different mode groups of the light based on the time when the different mode groups of the light approach the MGDDM device 518 and on the angles of the different mode groups of the light into multiple optical signals $V_1$-$V_4$ received by the optical detectors 522a, 522b, 522c and 522d. Upon respectively receiving the four optical signals $V_1$-$V_4$ output in parallel from the MGDDM device 518 respectively, the four optical detectors 522a, 522b, 522c and 522d can send four digital signals $W_1$, $W_2$, $W_3$ and $W_4$ to the equalizer 231, respectively. The digital signal $W_1$ carries information associated with the optical signal $V_1$, the digital signal $W_2$ carries information associated with the optical signal $V_2$, the digital signal $W_3$ carries information associated with the optical signal $V_3$, and the digital signal $W_4$ carries information associated with the optical signal $V_4$.

Next, referring to FIG. 5A, the digital signals $W_1$, $W_2$, $W_3$ and $W_4$ are transmitted in parallel into four input ports 10a, 10b, 10c and 10d of the equalizer 231 through, e.g., four parallel channels, such as wireless channels or physical channels. The input ports 10a, 10b, 10c and 10d are arranged in parallel for receiving the digital signals $W_1$, $W_2$, $W_3$ and $W_4$, respectively. After the digital signals $W_1$, $W_2$, $W_3$ and $W_4$ are transmitted in parallel into the equalizer 231, the above optimizing and equalizing process, as illustrated in FIGS. 1B and 1C, is performed such that the digital signals $W_1$, $W_2$, $W_3$ and $W_4$ can be compensated to be multiplied by four respective weightings by the equalizer 231, wherein the four respective weightings of the equalizer 231 can be adjusted based on a control signal CS, output from the optimizer 235 and input into the equalizer 231. The optimizing and equalizing process can be referred to as the optimizing and equalizing process as illustrated in FIGS. 1B and 1C. After the optimizing and equalizing process, the equalizer 231 outputs four equalized digital signals $S_1$, $S_2$, $S_3$ and $S_4$, respectively, from its output ports 11a, 11b, 11c and 11d. The equalized digital signal $S_1$ is created by the equalizer 231 multiplying the digital signal $W_1$ by a weighting of the equalizer 231, the equalized digital signal $S_2$ is created by the equalizer 231 multiplying the digital signal $W_2$ by another weighting of the equalizer 231, the equalized digital signal $S_3$ is created by the equalizer 231 multiplying the digital signal $W_3$ by another weighting of the equalizer 231, and the equalized digital signal $S_4$ is created by the equalizer 231 multiplying the digital signal $W_4$ by the other weighting of the equalizer 231. Next, the equalized digital signals $S_1$, $S_2$, $S_3$ and $S_4$ are transmitted in parallel into input ports 6a, 6b, 6c and 6d of the wave-front demultiplexer 232 through four parallel signal paths between the output ports 11a, 11b, 11c and 11d of the equalizer 231 and the input ports 6a, 6b, 6c and 6d of the wave-front demultiplexer 232. Each of the four respective weightings of the equalizer 231 can be, but not limited to, a complex value such that the equalized signals $S_1$, $S_2$, $S_3$ and $S_4$ can be rotated precisely to become in phase. In this case, the equalizer 231 can be performed by the narrow band equalizer, as illustrated in FIG. 1C. The narrow band equalizer 231 can provide phase and amplitude modifications to each of the signals $W_1$, $W_2$, $W_3$ and $W_4$ featuring a constant phase shift and a constant amplitude attenuation across a narrow frequency band. Alternatively, the equalizer 231 can be performed by the broadband equalizer, as illustrated in FIG. 1C. The broadband equalizer 231 can provide phase and amplitude modifications to each of the signals $W_1$, $W_2$, $W_3$ and $W_4$ featuring a constant phase shift and a constant amplitude attenuation in each sub-band across a broad frequency band, but the phase shift and amplitude attenuation in one sub-band across the broad frequency band is different from those in the other sub-bands across the broad frequency band.

Referring to FIG. 5A, upon receiving, in parallel, the equalized digital signals $S_1$, $S_2$, $S_3$ and $S_4$ output in parallel from the equalizer 531, the wave-front demultiplexer 232 extracts multiple coherently combined digital signals $Z_1$, $Z_2$, $Z_3$ and $Z_4$, which are substantially equal to the digital signals $X_1$, $X_2$, $X_3$ and $X_4$, respectively, or to the digital signals $X_1$, $X_2$, $X_3$ and $X_4$ multiplied by the same scalar, respectively, from the digital signals $S_1$, $S_2$, $S_3$ and $S_4$ by the above-mentioned wave-front demultiplexing transform, and outputs the digital signals $Z_1$, $Z_2$, $Z_3$ and $Z_4$ in parallel, which can be referred to as the description illustrated in FIGS. 1A and 1E. In this case, as illustrated in FIG. 1E, the number of I is equal to 4. The wave-front demultiplexer 232 has 4*4 computing units and four summing processors. The computing units form a processor array with four rows and four columns. The input signals $S_1$-$S_4$ can be received by the computing units in the respective four columns in the processor array. Upon receiving the input signals $S_1$-$S_4$, each of the computing units independently weights its received signal, multiplied by a weighting value, to generate a weighted signal. The four summing processors can output the four signals $Z_1$-$Z_4$ each combined with the weighted signals output from the computing units in a corresponding one of the four rows in the processor array. The digital signals $Z_1$, $Z_2$, $Z_3$ and $Z_4$ can be, but not limited to, four IF digital signals or four RF digital signals. Each of the digital signals $Z_1$, $Z_2$, $Z_3$ and $Z_4$ is a linear combination, i.e. weighted sum, each combined with the digital signals $S_1$, $S_2$, $S_3$ and $S_4$ multiplied by respective weightings, and distributions of the weightings of any two input components in all digital signals $Z_1$, $Z_2$, $Z_3$ and $Z_4$ are orthogonal, which can be referred to as the description illustrated in FIG. 1A.

The wave-front demultiplexer 232 can be, but not limited to, embedded in a processor. The wave-front demultiplexer 232 can be hardware achieving the wave-front demultiplexing transform, such as IFFT chip, a component for four-by-four inverse Butler matrix, or a device performing inverse Fourier transformation, inverse discrete Fourier transformation, inverse Hartley transformation, Hadamard transformation, any other inverse Fourier-related transformation, or any transformation of a four-by-four orthogonal matrix. Alternatively, the function of the wave-front demultiplexer 232 can be realized by software installed in and performed by the processor, wherein the software can perform the above wave-front demultiplexing transform.

The optimizer 235 can be in a signal path between the output ports 7a, 7b, 7c and 7d and the equalizer 231 (only one signal path between the output port 7d and the equalizer 231 is shown in FIG. 5A). The flow chart of the optimizing and equalizing process shown in FIG. 1C can be applied to the embodiment illustrated in FIG. 5A.

The equalizer 231, the wave-front demultiplexer 232 and the optimizer 235 can be, but not limited to, embedded in a processor 230, such as single integrated circuit chip or single chip package. The equalizer 231 can be hardware or can be realized by software installed in and performed by the processor 230. The optimizer 235 can be hardware or can be realized by software installed in and performed by the processor 230.

Figure 5C:
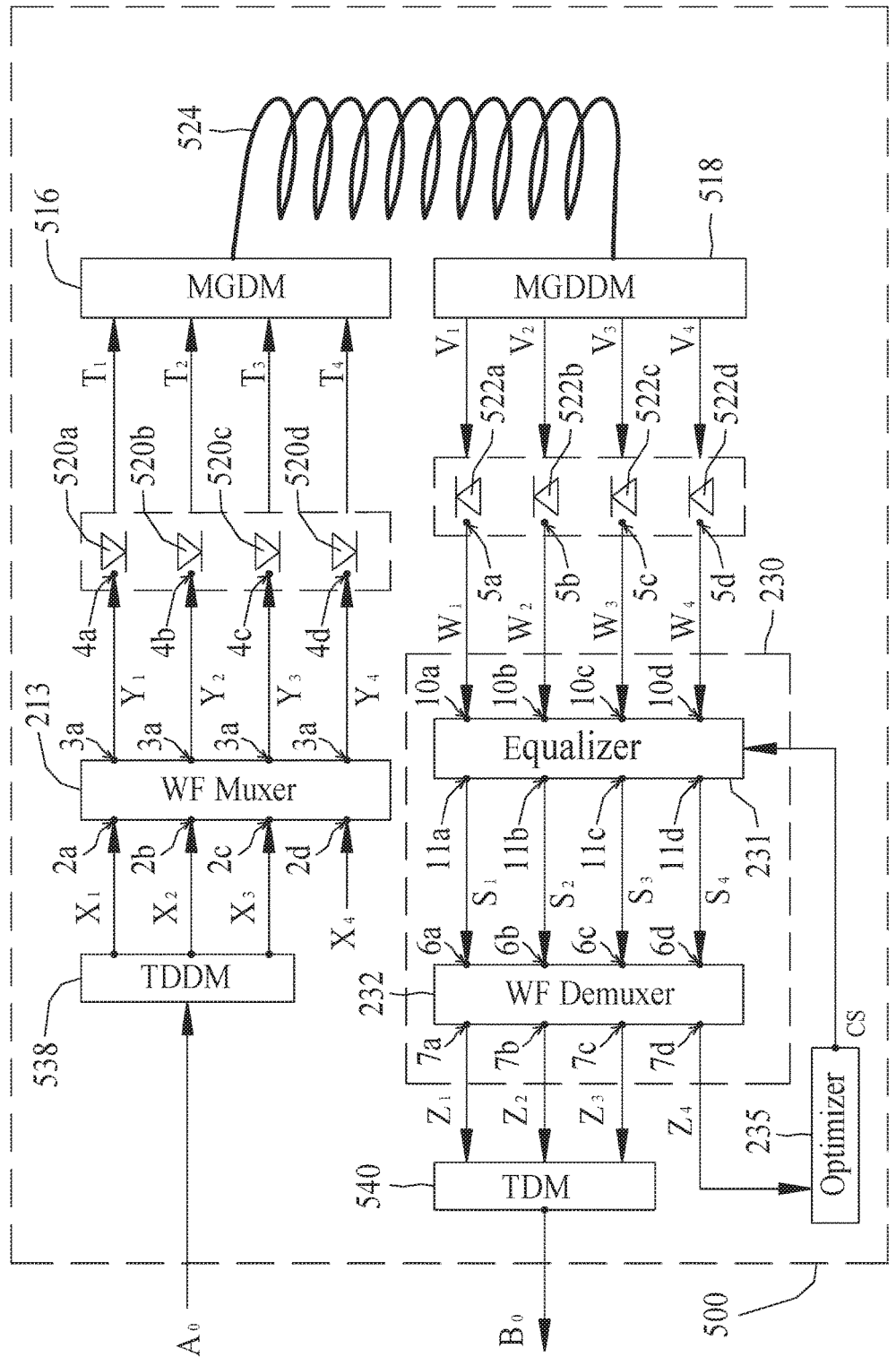
FIG. 5C shows a system including a 1-to-3 time-domain demultiplexer, a wave-front multiplexer, four optical transmit devices, four optical detectors, a MGDM device, a MGDDM device, a multimode fiber, a wave-front demultiplexer, an equalizer, an optimizer and a 3-to-1 time-domain multiplexer according to an embodiment of the present disclosure.

Referring to FIG. 5C, the system 500 features point-to-point communications. The system 500 shown in FIG. 5C is similar to the system 500 illustrated in FIG. 5A except that the system 500 illustrated in FIG. 5C further includes a 1-to-3 time-domain demultiplexer (TDDM) 538 and the 3-to-1 time-domain multiplexer (TDM) 540. The 1-to-3

TDDM 538 includes an input port receiving a digital signal $A_0$ and three output ports outputting the three digital signals $X_1$, $X_2$ and $X_3$. The TDDM is defined herein to divide an input signal having a high bandwidth sampled at a high sampling rate into multiple output signals each having a low bandwidth sampled at a low sampling rate. For example, in this embodiment, the 1-to-3 TDDM 538 can divide an input digital signal $A_0$ having a bandwidth of J sampled at a sampling rate of K into three output digital signals $X_1$, $X_2$ and $X_3$, each having a frequency bandwidth of J/3 sampled at a sampling rate of K/3, passing through three parallel signal paths, such as physical or wireless channels, coupled to the wave-front multiplexer 213.

The 3-to-1 TDM 540 includes three input ports receiving the digital signals $Z_1$, $Z_2$ and $Z_3$ and an output port outputting a digital signal $B_0$. The 3-to-1 TDM 540 can combine or integrate the input signals $Z_1$, $Z_2$ and $Z_3$, each having a frequency bandwidth of J/3 sampled at a sampling rate of K/3, passing through three parallel signal paths, such as physical or wireless channels, coupled to the wave-front demultiplexer 532 into an output signal $B_0$ having a frequency bandwidth of J sampled at a sampling rate of K.

The output signal $B_0$ is reconstituted by combining or integrating the three recovered signals $Z_1$, $Z_2$ and $Z_3$ into one with high data flow rate through the TDM 540. The output signal $B_0$ is substantially equal to the input signal $A_1$. As a result, the input signal $A_0$ will be fully recovered.

For more elaboration, a 1-to-M TDDM (TDDM) denotes that it can divide an input signal, having a frequency bandwidth of J sampled at a sampling rate of K, into the number M of output signals, each having a frequency bandwidth of J/M sampled at a sampling rate of K/M. For example, the 1-to-M TDDM can be, but not limited to, a 1-to-3 TDDM 538 shown in FIG. 5C, and the 1-to-3 time-domain demultiplexer (TDDM) 538 denotes that it can divide an input signal, having a frequency bandwidth of J sampled at a sampling rate of K, into three output signals, each having a frequency bandwidth of J/3 sampled at a sampling rate of K/3. An M-to-1 TDM denotes that it can combine or integrate the number M of input signals, each having a frequency bandwidth of J/M sampled at a sampling rate of K/M, into an output signal having a frequency bandwidth of J sampled at a sampling rate of K. For example, the M-to-1 TDM can be, but not limited to, a 3-to-1 time-domain multiplexer 540 shown in FIG. 5C, and the 3-to-1 time-domain multiplexer 540 denotes that it can combine or integrate three input signals, each having a frequency bandwidth of J/3 sampled at a sampling rate of K/3, into an output signal having a frequency bandwidth of J sampled at a sampling rate of K.

Next, referring to FIG. 5C, the digital signals $X_1$, $X_2$ and $X_3$ output from the 1-to-3 TDDM 538 and the pilot or diagnostic signal $X_4$ can be transmitted to the wave-front multiplexer 213 and then can be processed as illustrated in FIG. 5A until the digital signals $Z_1$-$Z_4$ are output from the wave-front demultiplexer 232. Upon the wave-front demultiplexer 232 outputting the digital signals $Z_1$-$Z_4$, the 3-to-1 time-domain multiplexer 540 can combine or integrate the digital signals $Z_1$-$Z_3$, each having a frequency bandwidth of J/3 sampled at a sampling rate of K/3, into an output signal $B_0$ having a frequency bandwidth of J sampled at a sampling rate of K.

Figure 5D:
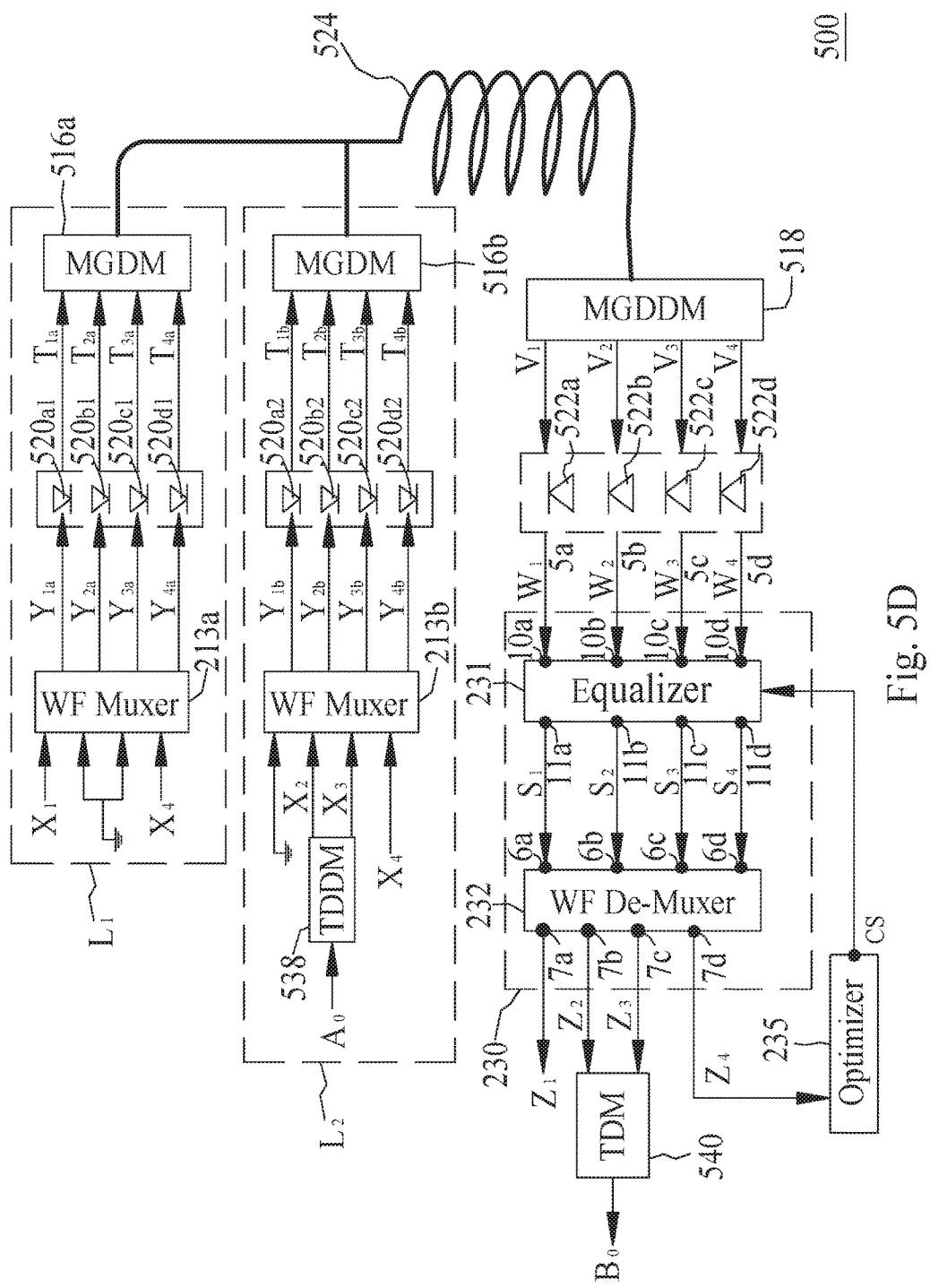
FIG. 5D shows a system including a 1-to-3 time-domain demultiplexer, two wave-front multiplexers, two sets of four optical transmit devices, a set of four optical detectors, two MGDM devices, a MGDDM device, a multimode fiber, a wave-front demultiplexer, an equalizer, an optimizer and a 3-to-1 time-domain multiplexer according to an embodiment of the present disclosure.

Referring to FIG. 5D, the system 500 is for a multipoint-to-point design, but the system 500 shown in FIG. 5D is still similar to the system 500 illustrated in FIG. 5B except that the system 500 illustrated in FIG. 5D uses the number Nt of signal transmitting sources, such as including a first transmitting source $L_1$ processing one, i.e. $X_1$, of the digital signals $X_1$, $X_2$ and $X_3$, and a second transmitting source $L_2$ processing two, i.e. $X_2$ and $X_3$, of the digital signals $X_1$, $X_2$ and $X_3$, and the number Nr of signal receiving sources, such as such as including only one receiving source outputting the three digital signals $Z_1$, $Z_2$ and $Z_3$ substantially equal to the digital signals $X_1$, $X_2$ and $X_3$ respectively or to the digital signals $X_1$, $X_2$ and $X_3$ multiplied by the same scalar, respectively, wherein the number of Nt could be any number equal to or greater than 2, 3, 4, 5, 6, 7, 8, 9 or 10, and could be greater than the number of Nr that could be one in this embodiment. The number Nt of the transmitting sources have the same wave-front multiplexer as one another or each other and use different input ports in sequence for receiving different extraneous signals. For example, referring to FIG. 5D, the two transmitting sources $L_1$ and $L_2$ contains two wave-front multiplexers 213a and 213b each having the same architecture as each other, and the wave-front multiplexers 213a and 213b use different input ports in sequence for receiving the different extraneous signals $X_1$, $X_2$ and $X_3$, wherein the wave-front multiplexer 213a uses the topmost port for receiving the extraneous signals $X_1$, but the wave-front multiplexer 213b uses the middle two ports, for receiving the extraneous signals $X_2$ and $X_3$ output from a 1-2 time domain demultiplexer (TDDM), different in sequence from the port of the wave-front multiplexer 213a for receiving the extraneous signals $X_1$. In this case, referring to FIG. 5C, the same pilot or diagnostic signals $X_4$ carrying the same information can be input to the bottommost ports of the wave-front multiplexers 213a and 213b. The other ports of the wave-front multiplexers 213a and 213b can be connected to a ground reference for receiving ground signals. The number Nt of the signal transmitting sources contains the number Nt of mode-group diversity multiplexing (MGDM) device, wherein the mode groups of the lights output from output ports of the MGDM devices in the same mode can be combined together. For example, the mode group of the light carrying information associated with the signal $X_1$ input to the topmost one of the input ports of the MGDM device 516a can be combined with the mode group of the light carrying information associated with the ground signal input to the topmost one of the input ports of the MGDM device 516b. The mode group of the light carrying information associated with the ground signal input to the second topmost one of the input ports of the MGDM device 516a can be combined with the mode group of the light carrying information associated with the signal $X_2$ input to the second topmost one of the input ports of the MGDM device 516b. The mode group of the light carrying information associated with the ground signal input to the third topmost one of the input ports of the MGDM device 516a can be combined with the mode group of the light carrying information associated with the signal $X_3$ input to the third topmost one of the input ports of the MGDM device 516b. The mode group of the light carrying information associated with the signal $X_4$ input to the bottommost one of the input ports of the MGDM device 516a can be combined with the mode group of the light carrying information associated with the signal $X_4$ input to the bottommost one of the input ports of the MGDM device 516b.

The number Nr of the receiving sources use different output ports in sequence for outputting different signals. For example, referring to FIG. 5D, the wave-front demultiplexer 232 uses a topmost output port for outputting the digital signal $Z_1$, substantially equal to the digital signal $X_1$ or to the digital signal $X_1$ multiplied by the same scalar, in the same sequence as the input port of the wave-front multiplexer 213a for receiving the digital signal $X_1$. The wave-front demultiplexer 232 uses a second topmost output port for outputting the digital signal $Z_2$, substantially equal to the digital signal $X_2$ or to the digital signal $X_2$ multiplied by the same scalar, in the same sequence as the input port of the wave-front multiplexer 213b for receiving the digital signal $X_2$. The wave-front demultiplexer 232 uses a third topmost output port for outputting the digital signal $Z_3$, substantially equal to the digital signal $X_3$ or to the digital signal $X_3$ multiplied by the same scalar, in the same sequence as the input port of the wave-front multiplexer 213b for receiving the digital signal $X_3$. The wave-front demultiplexer 232 uses a bottommost output port for outputting the digital pilot or diagnostic signal $Z_4$, substantially equal to the digital signal $X_4$ or to the digital signal $X_4$ multiplied by the same scalar, in the same sequence as the input port of the wave-front multiplexer 213a for receiving the digital signal $X_4$ and as the input port of the wave-front multiplexer 213b for receiving the digital signal $X_4$. A method for processing signals or data streams by using the system 500 shown in FIG. 5D is described below. In sources $L_1$, there are an extraneous digital signal $X_1$, the digital pilot or diagnostic signal $X_4$ and two ground signals input in parallel to input ports of the wave-front multiplexer 213a through, e.g., four parallel channels, such as wireless channels or physical channels, wherein the middle two of the input ports of the wave-front multiplexer 213a are connected to a ground reference for receiving the two ground signals. The digital pilot or diagnostic signal $X_4$ may have a single frequency and fixed amplitude. Alternatively, the digital pilot or diagnostic signal $X_4$ could change based on time or could be any signal known by the system 500. The extraneous digital signal $X_1$ is unknown by the system 500 and input into the system 500 from an extraneous system. The two ground signals represent no extraneous signals input to the input ports of the wave-front multiplexer 213a.

Next, the wave-front multiplexer 213a performs the above wave-front multiplexing transform to process the digital signals $X_1$ and $X_4$ and the two ground signals into multiple linear combinations, each combined with the digital signals $X_1$ and $X_4$ and the two ground signals multiplied by respective weightings, represented by four digital signals $Y_{1a}$, $Y_{2a}$, $Y_{3a}$ and $Y_{4a}$, which can referred to as FIGS. 1A and 1D. In this case, as illustrated in FIG. 1D, the number of H is equal to 4. The wave-front multiplexer 213a has 4*4 computing units and four summing processors. The computing units form a processor array with four rows and four columns. The digital signals $X_1$ and $X_4$ and the two ground signals can be received by the computing units in the respective four columns in the processor array. Upon receiving the input signals $X_1$ and $X_4$ and the two ground signals, each of the computing units independently weights its received signal, multiplied by a weighting value, to generate a weighted signal. The four summing processors can output the four signals $Y_{1a}$, $Y_{2a}$, $Y_{3a}$ and $Y_{4a}$ each combined with the weighted signals output from the computing units in a corresponding one of the four rows in the processor array. The digital signals $X_1$ and $X_4$ can be, but not limited to, four IF digital signals or four RF digital signals.

Next, the digital signals $Y_{1a}$, $Y_{2a}$, $Y_{3a}$ and $Y_{4a}$ output from the wave-front multiplexer 213a are respectively transmitted into four input ports of the optical transmit device $520a_1$, $520b_1$, $520c_1$ and $520d_1$ through, e.g., four parallel channels, such as wireless channels or physical channels. Next, upon receiving the digital signals $Y_{1a}$, $Y_{2a}$, $Y_{3a}$ and $Y_{4a}$ output in parallel from four parallel output ports of the wave-front multiplexer 213a, the optical transmit device $520a_1$, $520b_1$, $520c_1$ and $520d_1$ emit four individual optical signals $T_{1a}$-$T_{4a}$ based on the digital signals $Y_{1a}$-$Y_{4a}$ to a MGDM device 516a that can be referred as the MGDM device 516 as illustrated in FIG. 5A, wherein the optical signal $T_{1a}$ carries information associated with the digital signal $Y_{1a}$, the optical signal $T_{2a}$ carries information associated with the digital signal $Y_{2a}$, the optical signal $T_{3a}$ carries information associated with the digital signal $Y_{3a}$, and the optical signal $T_{4a}$ carries information associated with the digital signal $Y_{4a}$. Upon receiving the optical signals $T_{1a}$-$T_{4a}$, the MGDM device 516a can multiplex the optical signals $T_{1a}$-$T_{4a}$ into different mode groups of light, propagating with different angles in the MMF 524.

The sources $L_2$ includes a 1-to-2 time-domain demultiplexer (TDDM) 538 having an input port receiving a digital signal $A_0$ and two output ports outputting two digital signals $X_2$ and $X_3$. The 1-to-2 TDDM 538 can divide an extraneous digital signal $A_0$ having a frequency bandwidth of J sampled at a sampling rate of K into two output digital signals $X_2$ and $X_3$, each having a bandwidth of J/2 sampled at a sampling rate of K/2, passing through two parallel signal paths, such as physical or wireless channels, coupled to the wave-front multiplexer 213b.

The digital signals $X_2$ and $X_3$, the pilot or diagnostic signal $X_4$ and a ground signal can be input in parallel to input ports of the wave-front multiplexer 513b through, e.g., four parallel channels, such as wireless channels or physical channels, wherein the topmost one of the input ports of the wave-front multiplexer 213b is connected to a ground reference for receiving the ground signal. The signals $X_2$ and $X_3$ could be independent from each other. The pilot or diagnostic signal $X_4$ input to the wave-front multiplexer 513b can be the same as the pilot or diagnostic signal $X_4$ input to the wave-front multiplexer 513a. The pilot or diagnostic signals may have a single frequency and fixed amplitude. Alternatively, the pilot or diagnostic signals $X_4$ could change based on time or could be any signal known by the system 500. Instead, the extraneous digital signals $X_2$ and $X_3$ input to the wave-front multiplexer 513b and the extraneous digital signal $X_1$ input to the wave-front multiplexer 513a are unknown by the system 500 and input into the system 500 from an extraneous system. The ground signal represents no extraneous signal input to the input port of the wave-front multiplexer 213b.

Next, the wave-front multiplexer 213b performs the above wave-front multiplexing transform to process the digital signals $X_2$, $X_3$ and $X_4$ and the ground signal into multiple linear combinations, each summed with the digital signals $X_2$, $X_3$ and $X_4$ and the ground signal multiplied by respective weightings, represented by four digital signals $Y_{1b}$, $Y_{2b}$, $Y_{3b}$ and $Y_{4b}$, which can referred to as FIGS. 1A and 1D. In this case, as illustrated in FIG. 1D, the number of H is equal to 4. The wave-front multiplexer 213b has 4*4 computing units and four summing processors. The computing units form a processor array with four rows and four columns. The digital signals $X_2$, $X_3$ and $X_4$ and the ground signal can be received by the computing units in the respective four columns in the processor array. Upon receiving the input signals $X_2$, $X_3$ and $X_4$ and the ground signal, each of the computing units independently weights its received signal, multiplied by a weighting value, to generate a weighted signal. The four summing processors can output the four signals $Y_{1b}$, $Y_{2b}$, $Y_{3b}$ and $Y_{4b}$ each summed with the weighted signals output from the computing units in a corresponding one of the four rows in the processor array. The digital signals $X_2$, $X_3$ and $X_4$ can be, but not limited to, four IF digital signals or four RF digital signals.

Next, the digital signals $Y_{1b}$, $Y_{2b}$, $Y_{3b}$ and $Y_{4b}$ output from the wave-front multiplexer 213b are respectively transmitted into four input ports of the optical transmit device 520$a_2$, 520$b_2$, 520$c_2$ and 520$d_2$ through, e.g., four parallel channels, such as wireless channels or physical channels. Next, upon receiving the digital output signals $Y_{1b}$, $Y_{2b}$, $Y_{3b}$ and $Y_{4b}$ output in parallel from four parallel output ports of the wave-front multiplexer 513b, the optical transmit device 520$a_2$, 520$b_2$, 520$c_2$ and 520$d_2$ emit four individual optical signals $T_{1b}$-$T_{4b}$ based on the digital signals $Y_{1b}$-$Y_{4b}$ to a MGDM device 516b that can be referred as the MGDM device 516 as illustrated in FIG. 5A, wherein the optical signal $T_{1b}$ carries information associated with the digital signal $Y_{1b}$, the optical signal $T_{2b}$ carries information associated with the digital signal $Y_{2b}$, the optical signal $T_{3b}$ carries information associated with the digital signal $Y_{3b}$, and the optical signal $T_{4b}$ carries information associated with the digital signal $Y_{4b}$. Upon receiving the optical signals $T_{1b}$-$T_{4b}$, the MGDM device 516b can multiplex the optical signals $T_{1b}$-$T_{4b}$ into different mode groups of light, propagating with different angles in the MMF 524.

Referring to FIG. 5D, upon receiving the different mode groups of the light output from the MGDM devices 516a and 516b and propagating over the MMF 524, the mode-group diversity demultiplexing (MGDDM) device 518 demultiplexes the different mode groups of the light based on the time when the different mode groups of the light approach the MGDDM device 518 and on the angles of the different mode groups of the light into multiple optical signals $V_1$-$V_4$ received by the optical detectors 522a, 522b, 522c and 522d. Upon respectively receiving the four optical signals $V_1$-$V_4$ output in parallel from the MGDDM device 518, the four optical detectors 522a, 522b, 522c and 522d can send four digital signals $W_1$, $W_2$, $W_3$ and $W_4$, to the equalizer 231, respectively. The digital signal $W_1$ carries information associated with the optical signal $V_1$, the digital signal $W_2$ carries information associated with the optical signal $V_2$, the digital signal $W_3$ carries information associated with the optical signal $V_3$, and the digital signal $W_4$ carries information associated with the optical signal $V_4$.

Next, referring to FIG. 5D, the digital signals $W_1$, $W_2$, $W_3$ and $W_4$ are transmitted in parallel into four input ports 10a, 10b, 10c and 10d of the equalizer 231 through, e.g., four parallel channels, such as wireless channels or physical channels. The input ports 10a, 10b, 10c and 10d are arranged in parallel for receiving the digital signals $W_1$, $W_2$, $W_3$ and $W_4$, respectively. After the digital signals $W_1$, $W_2$, $W_3$ and $W_4$ are transmitted in parallel into the equalizer 231, the above optimizing and equalizing process, as illustrated in FIGS. 1B and 1C, is performed such that the digital signals $W_1$, $W_2$, $W_3$ and $W_4$ can be compensated to be multiplied by four respective weightings by the equalizer 231, wherein the four respective weightings of the equalizer 231 can be adjusted based on a control signal CS, output from the optimizer 235 and input into the equalizer 231. The optimizing and equalizing process can be referred to as the optimizing and equalizing process as illustrated in FIGS. 1B and 1C. After the optimizing and equalizing process, the equalizer 231 outputs four equalized digital signals $S_1$, $S_2$, $S_3$ and $S_4$, respectively, from its output ports 11a, 11b, 11c and 11d. The equalized digital signal $S_1$ is created by the equalizer 231 multiplying the digital signal $W_1$ by a weighting of the equalizer 231, the equalized digital signal $S_2$ is created by the equalizer 231 multiplying the digital signal $W_2$ by another weighting of the equalizer 231, the equalized digital signal $S_3$ is created by the equalizer 231 multiplying the digital signal $W_3$ by another weighting of the equalizer 231, and the equalized digital signal $S_4$ is created by the equalizer 231 multiplying the digital signal $W_4$ by the other weighting of the equalizer 231. Next, the equalized digital signals $S_1$, $S_2$, $S_3$ and $S_4$ are transmitted in parallel into input ports 6a, 6b, 6c and 6d of the wave-front demultiplexer 232 through four parallel signal paths between the output ports 11a, 11b, 11c and 11d of the equalizer 231 and the input ports 6a, 6b, 6c and 6d of the wave-front demultiplexer 232. Each of the four respective weightings of the equalizer 231 can be, but not limited to, a complex value such that the equalized signals $S_1$, $S_2$, $S_3$ and $S_4$ can be rotated precisely to become in phase. In this case, the equalizer 231 can be performed by the narrow band equalizer, as illustrated in FIG. 1C. The narrow band equalizer 231 can provide phase and amplitude modifications to each of the signals $W_1$, $W_2$, $W_3$ and $W_4$ featuring a constant phase shift and a constant amplitude attenuation across a narrow frequency band. Alternatively, the equalizer 231 can be performed by the broadband equalizer, as illustrated in FIG. 1C. The broadband equalizer 231 can provide phase and amplitude modifications to each of the signals $W_1$, $W_2$, $W_3$ and $W_4$ featuring a constant phase shift and a constant amplitude attenuation in each sub-band across a broad frequency band, but the phase shift and amplitude attenuation in one sub-band across the broad frequency band is different from those in the other sub-bands across the broad frequency band.

Next, referring to FIG. 5D, upon receiving, in parallel, the equalized digital signals $S_1$, $S_2$, $S_3$ and $S_4$ output in parallel from the equalizer 531, the wave-front demultiplexer 232 extracts multiple coherently combined digital signals $Z_1$, $Z_2$, $Z_3$ and $Z_4$, which are substantially equal to the digital signals $X_1$, $X_2$, $X_3$ and $X_4$ respectively or to the digital signals $X_1$, $X_2$, $X_3$ and $X_4$ multiplied by the same scalar, respectively, from the digital signals $S_1$, $S_2$, $S_3$ and $S_4$ by the above-mentioned wave-front demultiplexing transform, and outputs the digital signals $Z_1$, $Z_2$, $Z_3$ and $Z_4$ in parallel, which can be referred to as the description illustrated in FIGS. 1A and 1E. In this case, as illustrated in FIG. 1E, the number of I is equal to 4. The wave-front demultiplexer 232 has 4*4 computing units and four summing processors. The computing units form a processor array with four rows and four columns. The input signals $S_1$-$S_4$ can be received by the computing units in the respective four columns in the processor array. Upon receiving the input signals $S_1$-$S_4$, each of the computing units independently weights its received signal, multiplied by a weighting value, to generate a weighted signal. The four summing processors can output the four signals $Z_1$-$Z_4$ each combined with the weighted signals output from the computing units in a corresponding one of the four rows in the processor array. The digital signals $Z_1$, $Z_2$, $Z_3$ and $Z_4$ can be, but not limited to, four IF digital signals or four RF digital signals. Each of the digital signals $Z_1$, $Z_2$, $Z_3$ and $Z_4$ is a linear combination, i.e. weighted sum, each summed with the digital signals $S_1$, $S_2$, $S_3$ and $S_4$ multiplied by respective weightings, and distributions of the weightings of any two input components in all digital signals $Z_1$, $Z_2$, $Z_3$ and $Z_4$ are orthogonal, which can be referred to as the description illustrated in FIG. 1A.

Next, the 2-to-1 TDM 540 can combine or integrate the two input signals $Z_2$ and $Z_3$, each having a bandwidth of J/2 sampled at a sampling rate of K/2, passing through two parallel signal paths, such as physical or wireless channels, coupled to the wave-front demultiplexer 532 into an output signal $B_0$ having a bandwidth of J sampled at a sampling rate of K.

The output signal $B_0$ is reconstituted by combining the two recovered signals $Z_2$ and $Z_3$ into one with high data flow rate through a time-domain demultiplexer 540. The output signal $B_0$ is substantially equal to the input signal $A_0$ or to the input signal $A_0$ multiplied by the same scalar as the input signal $X_1$ multiplied by. As a result, the input signal $A_0$ will be fully recovered due to the above optimizing and equalizing process.

Figure 5E:
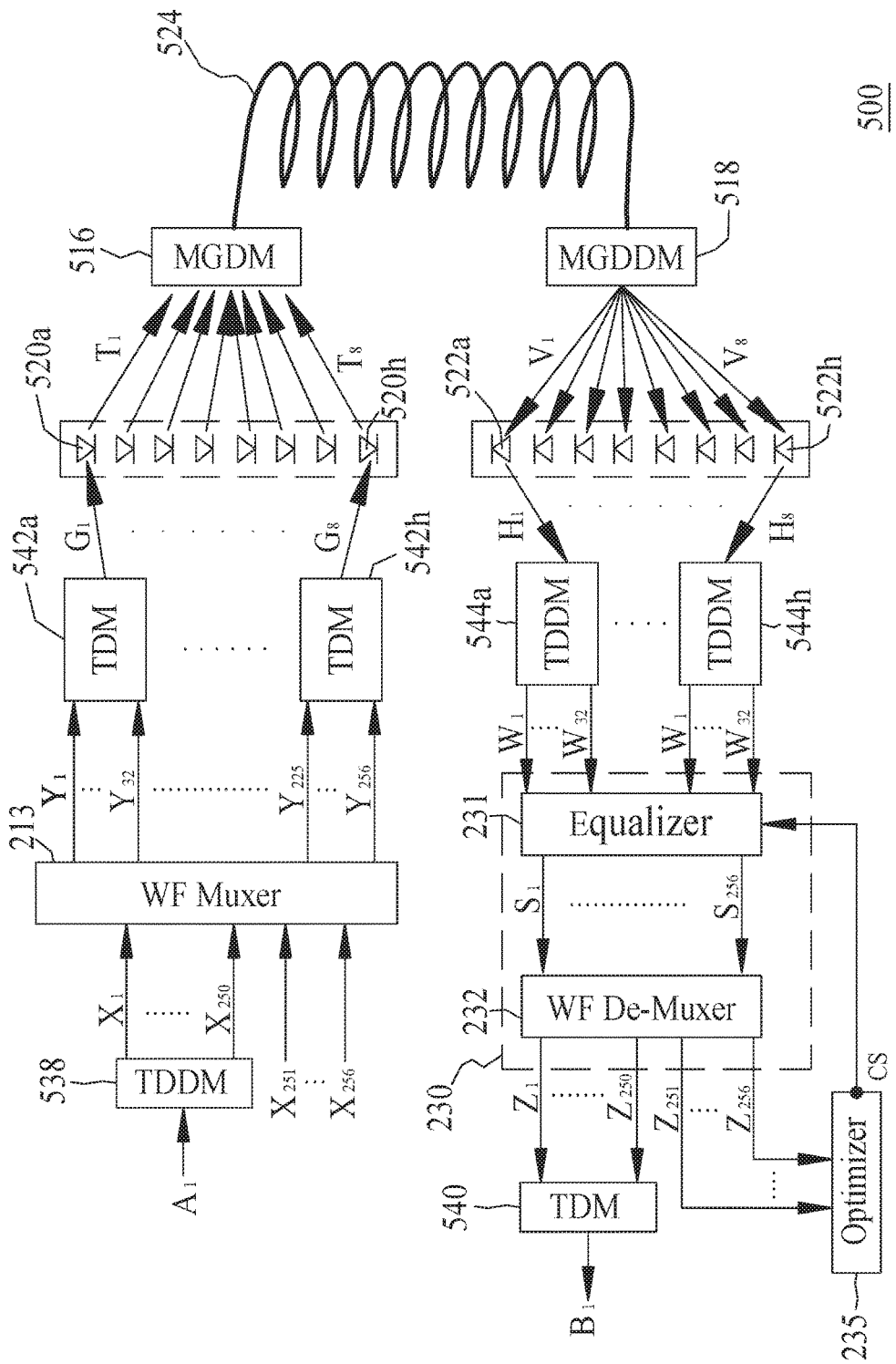
FIG. 5E shows a system including a 1-to-250 time-domain demultiplexer, a wave-front multiplexer, eight 32-to-1 time-domain multiplexers, eight optical transmit devices, eight optical detectors, a MGDM device, a MGDDM device, a multimode fiber, eight 1-to-32 time-domain demultiplexers, a wave-front demultiplexer, an equalizer, an optimizer and a 250-to-1 time-domain multiplexer according to an embodiment of the present disclosure.

Referring to FIG. 5E, a system 500 shown in FIG. 5E is similar to the system 500 illustrated in FIG. 5C except that the system 500 illustrated in FIG. 5E further includes a 1-to-250 time-domain demultiplexer 538, eight 32-to-1 time-domain multiplexers 542a-542h, eight 1-to-32 time-domain demultiplexers 544a-544h, and a 250-to-1 time-domain multiplexer 540. The 1-to-250 time-domain demultiplexer 538 divides an input signal $A_1$, having a frequency bandwidth of J sampled at a sampling rate of K, into two-hundred-and-fifty output signals $X_1$-$X_{250}$, each having a frequency bandwidth of J/250 sampled at a sampling rate of K/250 and outputs the signals $X_1$-$X_{250}$ from its two-hundred-and-fifty output ports. The description of the above-mentioned M-to-1 time-domain multiplexer can be applied to the 250-to-1 time-domain multiplexer 540.

Next, the signals $X_1$-$X_{250}$ and six signals $X_{251}$-$X_{256}$ are transmitted in parallel to the wave-front multiplexer 213. Each of the signals $X_{251}$-$X_{256}$ is a stream of pilot codes. Each of the signals $X_{251}$-$X_{256}$, for example, may have a single frequency and fixed amplitude. Alternatively, the six signal $X_{251}$-$X_{256}$ could change based on time or could be any signal known by the system 500. The signals $X_1$-$X_{250}$ are unknown by the system 500. The extraneous signal $A_1$ is unknown by the system 500 and input into the system 500 from an extraneous system.

Next, the wave-front multiplexer 213 performs the above-mentioned wave-front multiplexing transformation to process the two-hundred-and-fifty-six signals $X_1$-$X_{256}$ into two-hundred-and-fifty-six linear combinations, each combined with the signals $X_1$-$X_{256}$ multiplied by respective weightings, represented by two-hundred-and-fifty-six signals $Y_1$-$Y_{256}$, which can be referred to as the description illustrated in FIG. 1D. In this case, the number of H is equal to 256. The wave-front multiplexer 213 may include 256*256 computing units and 256 summing processors. The computing units form a processor array with 256 rows and 256 columns. The input signals $X_1$-$X_{256}$ can be received by the computing units in the respective 256 columns in the processor array. Upon receiving the input signals $X_1$-$X_{256}$, each of the computing units independently weights its received signal, multiplied by a weighting value, to generate a weighted signal. The 256 summing processors can output the 256 signals $Y_1$-$Y_{256}$ each combined with the weighted signals output from the computing units in a corresponding one of the 256 rows in the processor array. The signals $X_1$-$X_{256}$ can be, but not limited to, 256 IF digital signals or 256 RF digital signals.

The wave-front multiplexer 213 can be, but not limited to, embedded or integrated in a module or processor. The wave-front multiplexer 213 can be, but not limited to, implemented by hardware which performing the above wave-front multiplexing transformation, such as FFT chip, 256×256 Butler matrix, or a device performing a transformation of a 256-by-256 orthogonal matrix.

Next, eight sets of thirty-two ones of the two-hundred-and-fifty-six signals $Y_1$-$Y_{256}$ are respectively transmitted in parallel to the eight 32-to-1 time-domain multiplexers 542a-542h through, e.g., multiple parallel signal paths, multiple parallel physical channels or multiple parallel wireless channels. The six 32-to-1 time-domain multiplexers 542b-542g are not shown in FIG. 5E. Next, each of the eight 32-to-1 time-domain multiplexers 542a-542h combines or integrates a corresponding set of the received thirty-two ones of the two-hundred-and-fifty-six signals $Y_1$-$Y_{256}$ into a corresponding one of eight output signals $G_1$-$G_8$ and outputs the corresponding one of the eight output signals $G_1$-$G_8$ to a corresponding one of the eight optical transmit devices or transmitters 520a-520h. The description of the above-mentioned U-to-1 time-domain multiplexer can be applied to each of the 32-to-1 time-domain multiplexers 542a-542h. For example, the 32-to-1 time-domain multiplexer 542a combines or integrates the received thirty-two signals $Y_1$-$Y_{32}$ into the output signal $G_1$ and outputs the output signal $G_1$ to the optical transmit device 520a. The description of the above-mentioned U-to-1 time-domain multiplexer can be applied to each of the 32-to-1 time-domain multiplexers 542a-542h. The 32-to-1 time-domain multiplexer 542h combines or integrates the received thirty-two signals $Y_{225}$-$Y_{256}$ into the output signal $G_8$ and outputs the output signal $G_8$ to the optical transmit device 520h. The description of the above-mentioned U-to-1 time-domain multiplexer can be applied to each of the 32-to-1 time-domain multiplexers 542a-542h.

After the eight output signals $G_1$-$G_8$ are respectively input in parallel to the eight optical transmit devices 520a-520h, the eight optical transmit devices 520a-520h emit eight individual optical signals $T_1$-$T_8$ based on the signals $G_1$-$G_8$ to the MGDM device 516, respectively. The optical signal $T_1$ carries information associated with the digital signal $G_1$. The optical signal $T_2$ carries information associated with the digital signal $G_2$. The optical signal $T_3$ carries information associated with the digital signal $G_3$. The optical signal $T_4$ carries information associated with the digital signal $G_4$. The optical signal $T_5$ carries information associated with the digital signal $G_5$. The optical signal $T_6$ carries information associated with the digital signal $G_6$. The optical signal $T_7$ carries information associated with the digital signal $G_7$. The optical signal $T_8$ carries information associated with the digital signal $G_8$. Each of the optical transmit devices 520a-520h can be, but not limited to, a laser generator and emits a distributed feedback laser (DFB laser), a Fabry-perot laser (F-P laser) or a vertical cavity surface emitting laser (VCSEL) featuring the optical signals $T_1$-$T_8$ to the MGDM device 516.

The MGDM device 516 has been proposed as a way of creating parallel, independent communication channels over the multimode fiber 524. The MGDM 516 has been proved as an efficient scheme to overcome the limited bandwidth of the multimode fiber 524. The MGDM device 516 can multiplex the optical signals $T_1$-$T_8$ into different mode groups of light, propagating with different angles in the MMF 524, wherein each mode groups of the light are used to carry different information so that the data throughput is increased without having additional bandwidth. The signals $G_2$-$G_7$ are not shown in FIG. 5E.

Referring to FIG. 5E, upon receiving the different mode groups of the light output from the MGDM device 516 and propagating over the MMF 524, the mode-group diversity demultiplexing (MGDDM) device 518 demultiplexers the different mode groups of the light based on the time when the different mode groups of the light approach the MGDDM device 518 and on the angles of the different mode groups of the light into multiple optical signals $V_1$-$V_8$ received by the eight optical detectors 522a-522h. Upon respectively receiving the eight optical signals $V_1$-$V_8$ output in parallel from the MGDDM device 518, the eight optical detectors 522a-522h send eight digital signals $H_1$-$H_8$ to the eight 1-to-32 time-domain demultiplexers 544a-544h, respectively. The digital signal $H_1$ carries information associated with the optical signal $V_1$. The digital signal $H_2$ carries information associated with the optical signal $V_2$. The digital signal $H_3$ carries information associated with the optical signal $V_3$. The digital signal $H_4$ carries information associated with the optical signal $V_4$. The digital signal $H_5$ carries information associated with the optical signal $V_5$. The digital signal $H_6$ carries information associated with the optical signal $V_6$. The digital signal $H_7$ carries information associated with the optical signal $V_7$. The digital signal $H_8$ carries information associated with the optical signal $V_5$. The six 1-to-32 time-domain demultiplexers 544b-544g and the six signals $H_2$-$H_7$ are not shown in FIG. 5E.

Next, the 1-to-32 TDDM 544a divides the input digital signal $H_1$ into thirty-two output digital signals $W_1$-$W_{32}$ passing through thirty-two parallel signal paths or channels coupled to the Equalizer 231. The 1-to-32 TDDM 544b divides the input digital signal $H_2$ into thirty-two output digital signals $W_{33}$-$W_{64}$ passing through thirty-two parallel signal paths or channels coupled to the Equalizer 231. The 1-to-32 TDDM 544c divides the input digital signal $H_3$ into thirty-two output digital signals $W_{65}$-$W_{96}$ passing through thirty-two parallel signal paths or channels coupled to the Equalizer 231. The 1-to-32 TDDM 544d divides the input digital signal $H_4$ into thirty-two output digital signals $W_{97}$-$W_{128}$ passing through thirty-two parallel signal paths or channels coupled to the Equalizer 231. The 1-to-32 TDDM 544e divides the input digital signal $H_5$ into thirty-two output digital signals $W_{129}$-$W_{160}$ passing through thirty-two parallel signal paths or channels coupled to the Equalizer 231. The 1-to-32 TDDM 544f divides the input digital signal $H_6$ into thirty-two output digital signals $W_{161}$-$W_{192}$ passing through thirty-two parallel signal paths or channels coupled to the Equalizer 231. The 1-to-32 TDDM 544g divides the input digital signal $H_7$ into thirty-two output digital signals $W_{193}$-$W_{224}$ passing through thirty-two parallel signal paths or channels coupled to the Equalizer 231. The 1-to-32 TDDM 544h divides the input digital signal $H_8$ into thirty-two output digital signals $W_{225}$-$W_{256}$ passing through thirty-two parallel signal paths or channels coupled to the Equalizer 231.

Next, referring to FIG. 5E, the two-hundred-and-fifty-six digital signals $W_1$-$W_{256}$ are transmitted in parallel into the equalizer 231 through, e.g., two-hundred-and-fifty-six parallel signal paths, wireless channels or physical channels. After the digital signals $W_1$-$W_{256}$ are transmitted in parallel into the equalizer 231, an optimizing and equalizing process is performed such that the digital signals $W_1$-$W_{256}$ can be compensated to be multiplied by two-hundred-and-fifty-six respective weightings by the equalizer 231, wherein the respective weightings of the equalizer 231 can be adjusted based on a control signal CS output from the optimizer 235 and input into the equalizer 231. The optimizing and equalizing process can be referred to as the optimizing and equalizing process as illustrated in FIG. 1C. After the optimizing and equalizing process, the equalizer 231 outputs two-hundred-and-fifty-six equalized digital signals $S_1$-$S_{256}$ from its output ports, respectively. Each of the equalized digital signals $S_1$-$S_{256}$ is created by the equalizer 231 multiplying the corresponding one of the digital signals $W_1$-$W_{256}$ by a weighting of the equalizer 231. For example, the equalized digital signal $S_1$ is created by the equalizer 231 multiplying the digital signal $W_1$ by a weighting of the equalizer 231, and the equalized digital signal $S_8$ is created by the equalizer 231 multiplying the digital signal $W_8$ by another weighting of the equalizer 231. Each of the 256 respective weightings of the equalizer 231 can be, but not limited to, a complex value such that the equalized signals $S_1$-$S_{256}$ can be rotated precisely to become in phase.

In this case, the equalizer 231 can be performed by the narrow band equalizer, as illustrated in FIG. 1C. The narrow band equalizer 231 can provide phase and amplitude modifications to each of the signals $W_1$-$W_{256}$ featuring a constant phase shift and constant amplitude attenuation across a narrow frequency band. Alternatively, the equalizer 231 can be performed by the broadband equalizer, as illustrated in FIG. 1C. The broadband equalizer 231 can provide phase and amplitude modifications to each of the signals $W_1$-$W_{256}$ featuring a constant phase shift and a constant amplitude attenuation in each sub-band across a broad frequency band, but the phase shift and amplitude attenuation in one sub-band across the broad frequency band is different from those in the other sub-bands across the broad frequency band.

Next, the equalized digital signals $S_1$-$S_{256}$ are transmitted in parallel to the wave-front demultiplexer 232 through, e.g., two-hundred-and-fifty-six parallel signal paths or channels between the output ports of the equalizer 231 and the input ports of the wave-front demultiplexer 232.

Referring to FIG. 5E, upon receiving, in parallel, the equalized digital signals $S_1$-$S_{256}$ output in parallel from the equalizer 531, the wave-front demultiplexer 232 extracts two-hundred-and-fifty-six coherently combined digital signals $Z_1$-$Z_{256}$, which are substantially equal to the digital signals $X_1$-$X_{256}$ respectively or to the digital signals $X_1$-$X_{256}$ multiplied by the same scalar, from the digital signals $S_1$-$S_{256}$ by performing the above-mentioned wave-front demultiplexing transformation and outputs the digital signals $Z_1$-$Z_{256}$ in parallel, which can be referred to as the description illustrated in FIG. 1E. In this case, as illustrated in FIG. 1E, the number of I is equal to 256. The wave-front demultiplexer 232 may include 256*256 computing units and 256 summing processors. The computing units form a processor array with 256 rows and 256 columns. The input signals $S_1$-$S_{256}$ can be received by the computing units in the respective 256 columns in the processor array. Upon receiving the input signals $S_1$-$S_{256}$, each of the computing units independently weights its received signal, multiplied by a weighting value, to generate a weighted signal. The 256 summing processors can output the four signals $Z_1$-$Z_{256}$ each combined with the weighted signals output from the computing units in a corresponding one of the 256 rows in the processor array. The digital signals $Z_1$-$Z_{256}$ can be, but not limited to, IF digital signals or RF digital signals. Each of the digital signals $Z_1$-$Z_{256}$ is a linear combination, i.e. weighted sum, each summed with the digital signals $S_1$-$S_{256}$ multiplied by respective weightings, and distributions of the weightings of any two input components in all digital signals $Z_1$-$Z_{256}$ are orthogonal, which can be referred to as the description illustrated in FIG. 1E.

The wave-front demultiplexer 232 can be, but not limited to, embedded in a processor. The wave-front demultiplexer 232 can be hardware achieving the wave-front demultiplexing transform, such as IFFT chip, 256-by-256 Butler matrix, or a device performing inverse Fourier transformation, inverse discrete Fourier transformation, inverse Hartley transformation, Hadamard transformation, any other inverse Fourier-related transformation, or any transformation of a 256-by-256 orthogonal matrix. Alternatively, the function of the wave-front demultiplexer 232 can be realized by software installed in and performed by the processor, wherein the software can perform the above wave-front demultiplexing transformation.

The flow chart of the optimizing and equalizing process shown in FIG. 1C can be applied to the embodiment illustrated in FIG. 5E. For example, the optimizer 235 receives the signals $Z_{251}$-$Z_{256}$ output from the wave-front demultiplexer 232 and outputs the control signal CS to the equalizer 231 so as to adjust the respective weightings of the equalizer 231 when the optimizing and equalizing process is performed.

The equalizer 231, the wave-front demultiplexer 232 and the optimizer 235 can be, but not limited to, embedded in a module or processor 230. The module or processor 230 may include one or more integrated circuit chips, one or more system-on chips, or one or more chip packages. The equalizer 231 can be hardware or can be realized by software installed in and performed by the processor 230. The optimizer 235 can be hardware or can be realized by software installed in and performed by the processor 230.

Next, the 250-to-1 time-domain multiplexer 540 combines or integrates the two-hundred-and-fifty input signals $Z_1$-$Z_{250}$, each having a frequency bandwidth of J/250 sampled at a sampling rate of K/250, into an output signal $B_1$, having a frequency bandwidth of J sampled at a sampling rate of K, with high data flow rate. Thereby, the output signal $B_1$ is substantially equal to the input signal $A_1$. As a result, the input signal $A_1$ will be fully recovered. The input signals $Z_1$-$Z_{250}$ are substantially equal to the input signals $X_1$-$X_{250}$, respectively. The input signals $Z_1$-$Z_{250}$ are substantially equal to the input signals $X_1$-$X_{250}$, respectively, or to the signals $X_1$-$X_{250}$ multiplied by the same scalar, respectively.

Figure 5F:
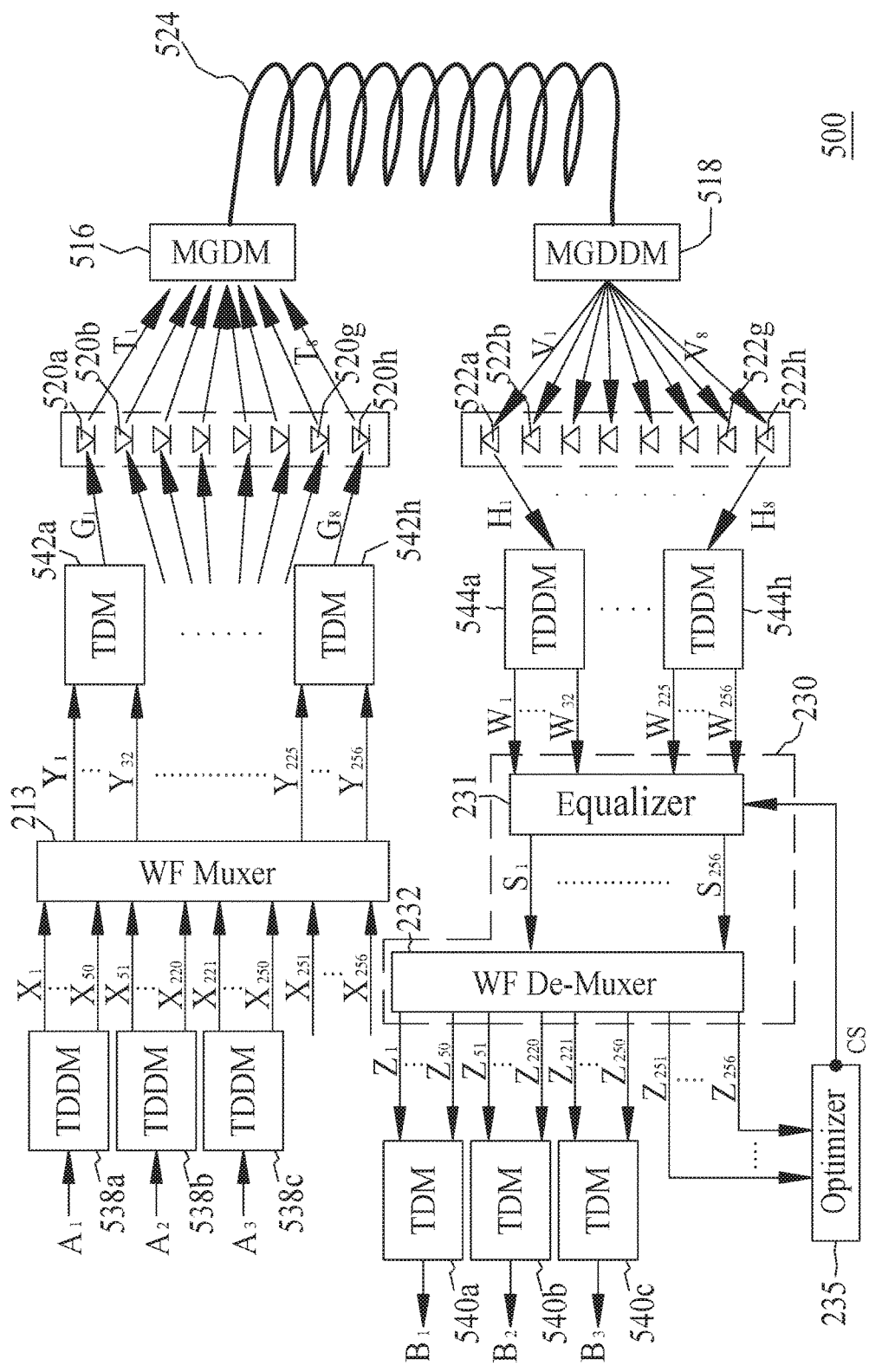
FIG. 5F shows a system including a 1-to-50 time-domain demultiplexer, a 1-to-170 time-domain demultiplexer, a 1-to-30 time-domain demultiplexer, a wave-front multiplexer, eight 32-to-1 time-domain multiplexers, eight optical transmit devices, eight optical detectors, a MGDM device, a MGDDM device, a multimode fiber, eight 1-to-32 time-domain demultiplexers, a wave-front demultiplexer, an equalizer, an optimizer, a 50-to-1 time-domain multiplexer, a 170-to-1 time-domain multiplexer and a 30-to-1 time-domain multiplexer according to an embodiment of the present disclosure.

Referring to FIG. 5F, the system 500 shown in FIG. 5F is similar to the system 500 illustrated in FIG. 5E except that the system 500 illustrated in FIG. 5F further includes a 1-to-50 time-domain demultiplexer 538a, a 1-to-170 time-domain demultiplexer 538b, a 1-to-30 time-domain demultiplexer 538c, a 50-to-1 time-domain multiplexer 540a, a 170-to-1 time-domain multiplexer 540b, and a 30-to-1 time-domain multiplexer 540c.

The 1-to-50 time-domain demultiplexer 538a includes an input port and 50 output ports and can divide an input signal $A_1$ from the input port to 50 parallel outputs signals $X_1$-$X_{50}$, respectively output from its 50 output ports, sequentially in time. The TDDM 538b includes an input port and 170 output ports and can divide an input signal $A_2$ from the input port to 170 parallel outputs signals $X_{51}$-$X_{220}$, respectively output from its 170 output ports, sequentially in time. The TDDM 538c includes an input port and 30 output ports and can divide an input signal $A_3$ from the input port to 30 parallel outputs signals $X_{221}$-$X_{250}$, respectively output from its 30 output ports, sequentially in time. Each of the $X_{251}$-$X_{256}$ is a stream of pilot codes input to the wave-front multiplexer 213.

The TDDM 538a can divide an input digital signal $A_1$ having a frequency bandwidth of J sampled at a sampling rate of K into 50 output digital signals $X_1$-$X_{50}$, each having a frequency bandwidth of J/50 sampled at a sampling rate of K/50, passing through 50 parallel signal paths, such as physical or wireless channels, coupled to the wave-front multiplexer 213. The TDDM 538b can divide an input digital signal $A_2$ having a frequency bandwidth of J sampled at a sampling rate of K into 170 output digital signals $X_{51}$-$X_{220}$, each having a frequency bandwidth of J/170 sampled at a sampling rate of K/170, passing through 170 parallel signal paths, such as physical or wireless channels, coupled to the wave-front multiplexer 213. The TDDM 538c can divide an input digital signal $A_2$ having a frequency bandwidth of J sampled at a sampling rate of K into 30 output digital signals $X_{221}$-$X_{250}$, each having a frequency bandwidth of J/30 sampled at a sampling rate of K/30, passing through 30 parallel signal paths, such as physical or wireless channels, coupled to the wave-front multiplexer 213.

Next, the signals $X_1$-$X_{256}$ are processed to be output as the signals $Z_1$-$Z_{256}$, which can be referred to as the description illustrated in FIG. 5E.

The 50-to-1 TDM 540a can integrate multiple input signals $Z_1$-$Z_{50}$, each having a frequency bandwidth of J/50 sampled at a sampling rate of K/50, passing through 50 parallel signal paths, such as physical or wireless channels, coupled to the wave-front demultiplexer 232 into an output signal $B_1$ having a frequency bandwidth of J sampled at a sampling rate of K. The 170-to-1 TDM 540b can integrate multiple input signals $Z_{51}$-$Z_{220}$, each having a frequency bandwidth of J/170 sampled at a sampling rate of K/170, passing through 170 parallel signal paths, such as physical or wireless channels, coupled to the wave-front demultiplexer 232 into an output signal $B_2$ having a frequency bandwidth of J sampled at a sampling rate of K. The 30-to-1 TDM 540c can integrate multiple input signals $Z_{221}$-$Z_{250}$, each having a frequency bandwidth of J/30 sampled at a sampling rate of K/30, passing through 30 parallel signal paths, such as physical or wireless channels, coupled to the wave-front demultiplexer 232 into an output signal $B_3$ having a frequency bandwidth of J sampled at a sampling rate of K.

The output signal $B_1$ is reconstituted by combining the 50 recovered signals $Z_1$-$Z_{50}$ into one with high data flow rate through a TDM 540a. The output signal $B_1$ is substantially equaled to the input signal $A_1$. As a result, the input signal $A_1$ will be fully recovered. The output signal $B_2$ is reconstituted by combining the 170 recovered signals $Z_{51}$-$Z_{220}$ into one with high data flow rate through a TDM 540b. The output signal $B_2$ is substantially equaled to the input signal $A_2$. As a result, the input signal $A_2$ will be fully recovered. The output signal $B_3$ is reconstituted by combining the 30 recovered signals $Z_{221}$-$Z_{250}$ into one with high data flow rate through a TDM 540b. The output signal $B_3$ is substantially equaled to the input signal $A_3$. As a result, the input signal $A_3$ will be fully recovered.

Figure 5G:
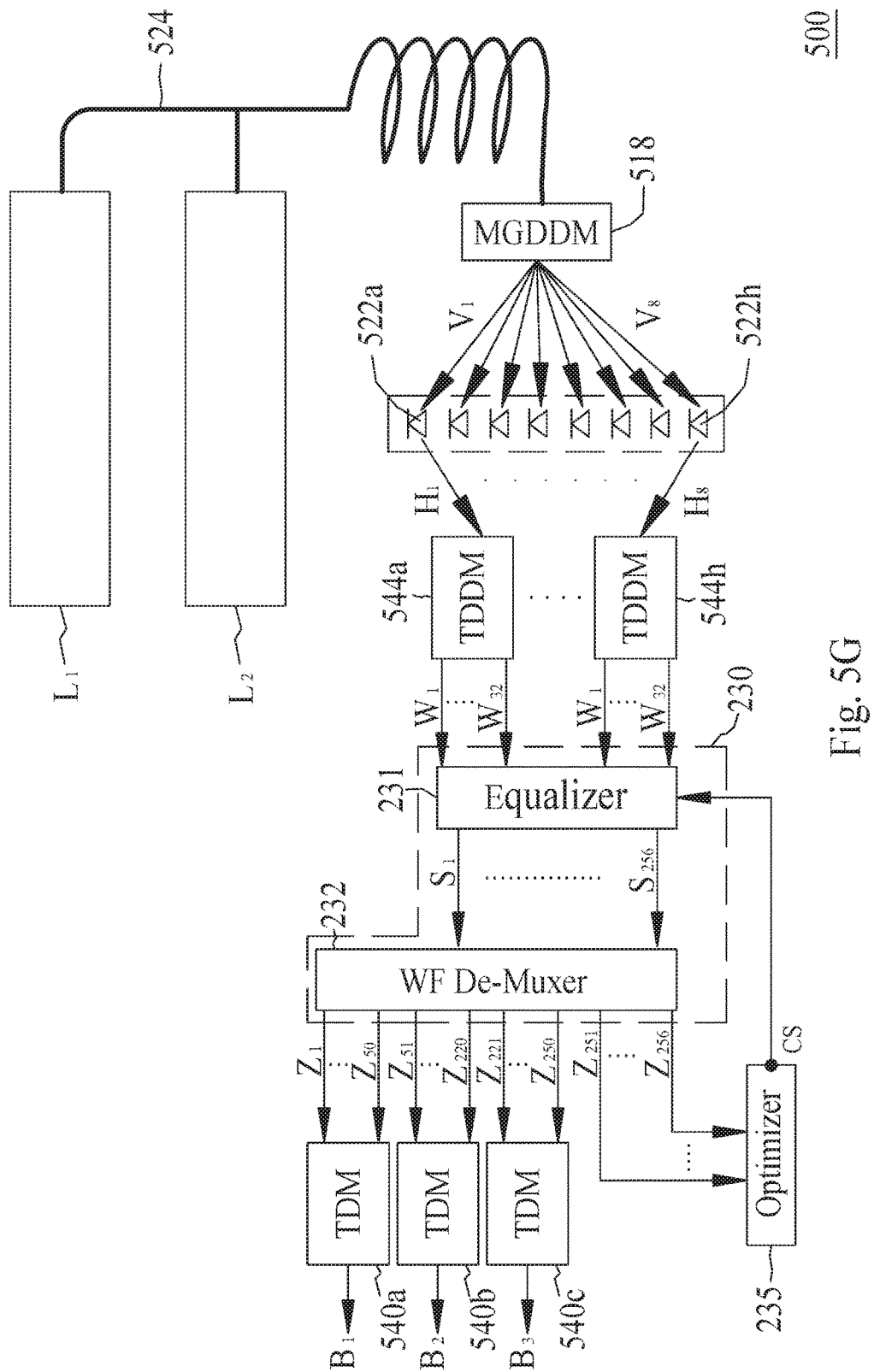
FIGS. 5G and 5H show a system including a 1-to-50 time-domain demultiplexer, a 1-to-170 time-domain demultiplexer, a 1-to-30 time-domain demultiplexer, two wave-front multiplexers, two sets of eight 32-to-1 time-domain multiplexers, two sets of eight optical transmit devices, two MGDM devices, a multimode fiber, a MGDDM device, a set of eight optical detectors, a set of eight 1-to-32 time-domain demultiplexers, an equalizer, a wave-front demultiplexer, an optimizer, a 50-to-1 time-domain multiplexer, a 170-to-1 time-domain multiplexer and a 30-to-1 time-domain multiplexer according to an embodiment of the present disclosure.
Figure 5H:
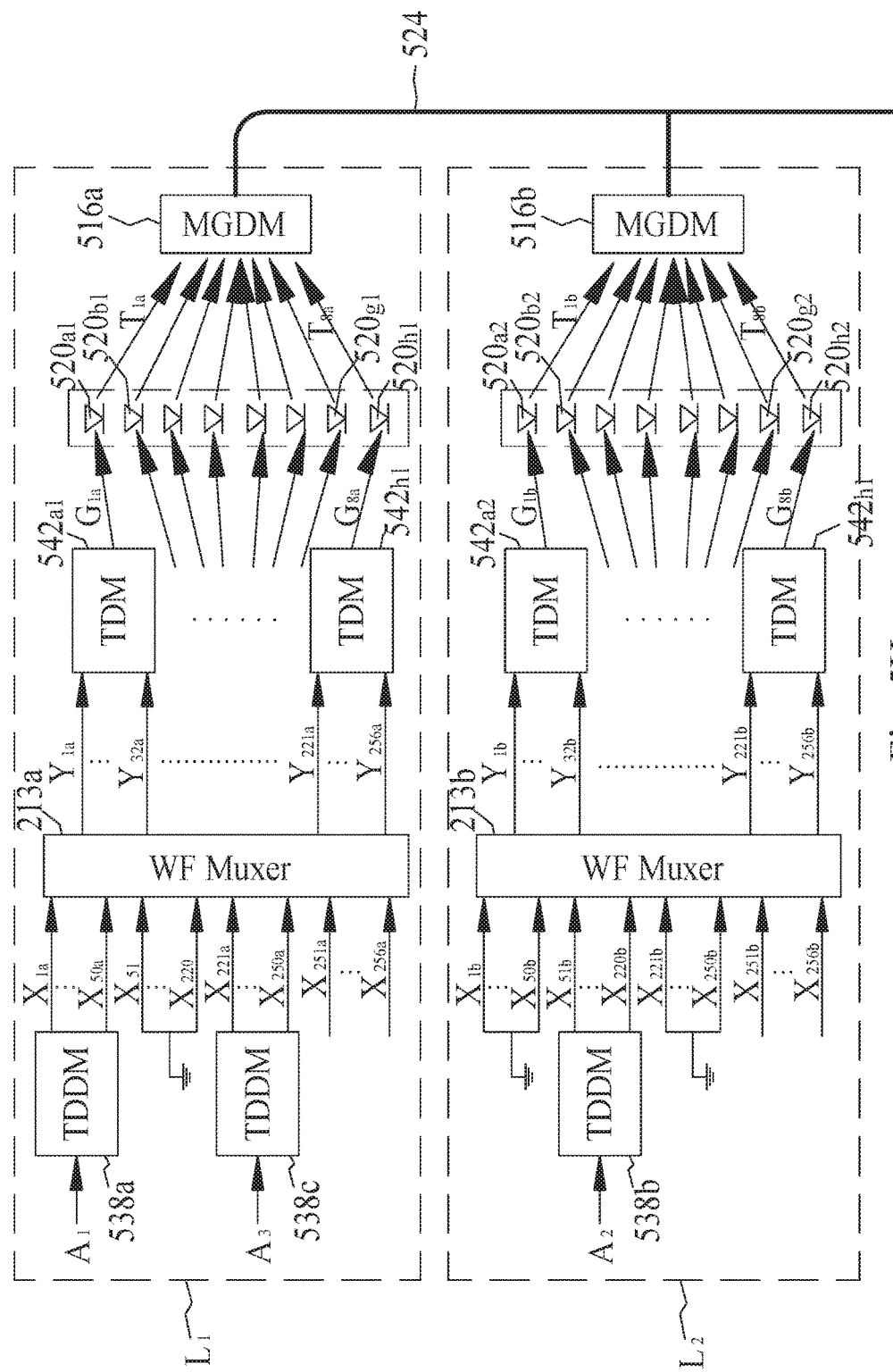

Referring to FIG. 5G and FIG. 5H, the system 500 is for a multipoint-to-point design, but the system 500 shown in FIG. 5G and FIG. 5H are still similar to the system 500 illustrated in FIG. 5F except that the system 500 illustrated in FIG. 5G and FIG. 5H uses the number Nt of signal transmitting sources, such as including a first transmitting source $L_1$ processing two, i.e. $A_1$ and $A_3$ of the digital signals $A_1$, $A_2$ and $A_3$, and a second transmitting source $L_2$ processing one, i.e. $A_2$, of the digital signals $A_1$, $A_2$ and $A_3$, and the number Nr of signal receiving sources, such as such as including only one receiving source outputting the three digital signals $B_1$, $B_2$ and $B_3$ substantially equal to the digital signals $A_1$, $A_2$ and $A_3$ respectively or to the digital signals $A_1$, $A_2$ and $A_3$ multiplied by the same scalar, respectively, wherein the number of Nt could be any number equal to or greater than 2, 3, 4, 5, 6, 7, 8, 9 or 10, and could be greater than the number of Nr that could be one in this embodiment. The number Nt of the transmitting sources have the same wave-front multiplexer as one another or each other and use different input ports in sequence for receiving different extraneous signals. Referring to FIG. 5H, a method for processing signals or data streams by using the system 500 shown in FIG. 5G and FIG. 5H is described below.

In the source $L_1$, an extraneous digital signal $A_1$ is transmitted to a 1-to-50 TDDM 538a through, e.g., a signal path, a wireless channel or a physical channel, and an extraneous digital signal $A_3$ is transmitted to a 1-to-30

TDDM 538c through, e.g., a signal path, a wireless channel or a physical channel. The signal $A_3$ could be independent from the signal $A_1$. There are one-hundred-and-seventy ground signals $X_{51}$-$X_{220}$ couple to the wave-front multiplexer 213a that are represented no signals input to one-hundred-and-seventy input ports of the wave-front multiplexer 213a. Six pilot or diagnostic signals $X_{251a}$-$X_{256a}$ are transmitted to six input ports of the wave-front multiplexer 213a. Each of the pilot or diagnostic signals $X_{251a}$-$X_{256a}$ may have a single frequency and fixed amplitude. Alternatively, the pilot or diagnostic signals $X_{251a}$-$X_{256a}$ could change based on time or could be any signal known by the system 500. The two signals $A_1$ and $A_3$ are unknown by the system 500 and input into the system 500 from one or more extraneous systems.

The TDDM 538a includes an input port and 50 output ports and can divide an extraneous digital signal $A_1$ from the input port to 50 parallel outputs signals $X_{1a}$-$X_{50a}$, respectively output from its 50 output ports, sequentially in time, wherein the 1-to-50 TDDM 538a can divide an input digital signal $A_1$ having a frequency bandwidth of J sampled at a sampling rate of K into 50 output digital signals $X_{1a}$-$X_{50a}$, each having a frequency bandwidth of J/50 sampled at a sampling rate of K/50, passing through 50 parallel signal paths, such as physical or wireless channels, coupled to the wave-front multiplexer 213a.

The TDDM 538c includes an input port and 30 output ports and can divide an extraneous digital signal $A_3$ from the input port to 30 parallel outputs signals $X_{221a}$-$X_{250a}$, respectively output from its 30 output ports, sequentially in time, wherein the 1-to-30 TDDM 538c can divide an input digital signal $A_3$ having a frequency bandwidth of J sampled at a sampling rate of K into 30 output digital signals $X_{221a}$-$X_{250a}$, each having a frequency bandwidth of J/30 sampled at a sampling rate of K/30, passing through 30 parallel signal paths, such as physical or wireless channels, coupled to the wave-front multiplexer 213a.

Next, the wave-front multiplexer 213a performs the above-mentioned wave-front multiplexing transformation to process the signals $X_{1a}$-$X_{50a}$, $X_{51}$-$X_{220}$ and $X_{221a}$-$X_{256a}$ into multiple linear combinations, each combined with the signals $X_{1a}$-$X_{50a}$, $X_{51}$-$X_{220}$ and $X_{221a}$-$X_{256a}$ multiplied by respective weightings, represented by 256 digital signals $Y_{1a}$-$Y_{256a}$. Next, the wave-front multiplexer 213a outputs the signals $Y_{1a}$-$Y_{256a}$ from its output ports of the wave-front multiplexer 213a.

Next, each of eight 32-to-1 TDM 542 can integrate 32 input signals form wave-front multiplexer 213a, each having a frequency bandwidth of J/32 sampled at a sampling rate of K/32, passing through 32 parallel signal paths, such as physical or wireless channels, coupled to the wave-front multiplexer 213a into an output signal G having a frequency bandwidth of J sampled at a sampling rate of K. For example, the $1^{st}$ 32-to-1 TDM 542a1 can integrate input signals $Y_{1a}$-$Y_{32a}$ into an output signal $G_{1a}$, the $2^{nd}$ TDM 542b1 can integrate input signals $Y_{33a}$-$Y_{64a}$ into an output signal $G_{2a}$, the $3^{rd}$ TDM 542c1 can integrate input signals $Y_{65a}$-$Y_{96a}$ into an output signal $G_{3a}$, the $4^{th}$ TDM 542d1 can integrate input signals $Y_{97a}$-$Y_{28a}$ into an output signal $G_{4a}$, the $5^{th}$ TDM 542e1 can integrate input signals $Y_{129a}$-$Y_{160a}$ into an output signal $G_{8a}$, the $6^{th}$ TDM 542f1 can integrate input signals $Y_{161a}$-$Y_{192a}$ into an output signal $G_{6a}$, the $7^{th}$ TDM 542g1 can integrate input signals $Y_{193a}$-$Y_{224a}$ into an output signal $G_{7a}$, the $8^{th}$ TDM 542h1 can integrate input signals $Y_{225a}$-$Y_{256a}$ into an output signal $G_{8a}$. The six TDM 542b1-TDM 542g1 are not shown in FIG. 5H.

Next, the eight 32-to-1 TDM 542a1-TDM 542h1 outputs the digital signals $G_{1a}$-$G_{8a}$ from the output ports of TDM 542a1-TDM 542h1, and the digital signals $G_{1a}$-$G_{8a}$ are respectively transmitted into eight input ports of the optical transmit devices 520a1-520h1 through, e.g., eight parallel channels, such as wireless channels or physical channels. Each of the optical transmit devices or transmitters 520a1-520h1 can be a laser generator, wherein the laser generator can emit a distributed feedback laser (DFB laser), a Fabry-perot laser (F-P laser) or a vertical cavity surface emitting laser (VCSEL) to the mode-group diversity multiplexing (MGDM) device 516a.

Next, the optical transmit devices 520a1-520h1 emit 8 individual optical signals $T_{1a}$-$T_{8a}$ based on the digital signals $G_{1a}$-$G_{8a}$ to the MGDM device 516a, wherein the optical signal $T_{1a}$ carries information associated with the digital signal $G_{1a}$, the optical signal $T_{2a}$ carries information associated with the digital signal $G_{2a}$, the optical signal $T_{3a}$ carries information associated with the digital signal $G_{3a}$, the optical signal $T_{4a}$ carries information associated with the digital signal $G_{4a}$, the optical signal $T_{5a}$ carries information associated with the digital signal $G_{8a}$, the optical signal $T_{6a}$ carries information associated with the digital signal $G_{6a}$, the optical signal $T_{7a}$ carries information associated with the digital signal $G_{7a}$, and the optical signal $T_{8a}$ carries information associated with the digital signal $G_{8a}$.

The MGDM device 516a has been proposed as a way of creating parallel communication channels over the multi-mode fiber (MMF) 524. The MGDM 516a has been proved as an efficient scheme to overcome the limited bandwidth of the multimode fiber (MMF) 524. MGDM device 516a can multiplex the optical signals $T_{1a}$-$T_{8a}$ into different mode groups of light, propagating with different angles in the MMF 524, wherein each mode groups of the light are used to carry different information so that the data throughput is increased without having additional bandwidth. The four optical transmit devices 520c1-520f1, signals $G_{2a}$-$G_{7a}$, and $T_{2a}$-$T_{7a}$ are not shown in FIG. 5H.

In the source $L_2$, an extraneous digital signal $A_2$ is transmitted to an input port of a 1-to-170 TDDM 538b through, e.g., a signal path, a wireless channel or a physical channel. There are eighty ground signals $X_{1b}$-$X_{50b}$ and $X_{221b}$-$X_{250b}$ couple to the wave-front multiplexer 213b that are represented no signals input to eighty input ports of the wave-front multiplexer 213b. Sixth pilot or diagnostic signals $X_{251b}$-$X_{256b}$ are transmitted to six input ports of the wave-front multiplexer 213b. Each of the pilot or diagnostic signals $X_{251b}$-$X_{256b}$ may have a single frequency and fixed amplitude. Alternatively, the six signals $X_{251b}$-$X_{256b}$ could change based on time or could be any signal known by the system 500. The extraneous digital signal $A_2$ is unknown by the system 500 and input into the system 500 from an extraneous system. The six pilot or diagnostic signals $X_{251b}$-$X_{256b}$ of the source $L_2$ are the same as the pilot or diagnostic signal $X_{251a}$-$X_{256a}$ of the source $L_1$, respectively.

The TDDM 538b includes an input port and 170 output ports and can divide an extraneous digital signal $A_2$ from the input port to 170 parallel outputs signals $X_{51b}$-$X_{220b}$, respectively output from its 170 output ports, sequentially in time, wherein the 1-to-170 TDDM 538b can divide an input digital signal $A_2$ having a frequency bandwidth of J sampled at a sampling rate of K into 170 output digital signals $X_{51b}$-$X_{220b}$, each having a frequency bandwidth of J/170 sampled at a sampling rate of K/170, passing through 170 parallel signal paths, such as physical or wireless channels, coupled to the wave-front multiplexer 213b.

Next, the wave-front multiplexer 213b performs the above-mentioned wave-front multiplexing transformation to process the signals $X_{1b}$-$X_{50b}$, $X_{51b}$-$X_{220b}$, $X_{221b}$-$X_{250b}$ and $X_{251b}$-$X_{256b}$ into multiple linear combinations, each combined with the signals $X_{51b}$-$X_{220}$b multiplied by respective weightings, represented by 256 digital signals $Y_{1b}$-$Y_{256b}$.

Next, each of eight 32-to-1 TDM 542 can integrate 32 input signals form wave-front multiplexer 213b, each having a frequency bandwidth of J/32 sampled at a sampling rate of K/32, passing through 32 parallel signal paths, such as physical or wireless channels, coupled to the wave-front multiplexer 213b into an output signal G having a frequency bandwidth of J sampled at a sampling rate of K. For example, the $1^{st}$ 32-to-1 TDM 542a2 can integrate input signals $Y_{1b}$-$Y_{32b}$ into an output signal $G_{1b}$, the $2^{nd}$ TDM 542b2 can integrate input signals $Y_{33b}$-$Y_{64b}$ into an output signal $G_{2b}$, the $3^{rd}$ TDM 542c2 can integrate input signals $Y_{65b}$-$Y_{96b}$ into an output signal $G_{3b}$, the $4^{th}$ TDM 542d2 can integrate input signals $Y_{97b}$-$Y_{128b}$ into an output signal $G_{4b}$, the $5^{th}$ TDM 542e2 can integrate input signals $Y_{129b}$-$Y_{160b}$ into an output signal $G_{5b}$, the $6^{th}$ TDM 542f2 can integrate input signals $Y_{161b}$-$Y_{192b}$ into an output signal $G_{6b}$, the $7^{th}$ TDM 542g2 can integrate input signals $Y_{193b}$-$Y_{224b}$ into an output signal $G_{7b}$, the $8^{th}$ TDM 542h2 can integrate input signals $Y_{225b}$-$Y_{256b}$ into an output signal $G_{8b}$. The six TDM 542b2-TDM 542g2 are not shown in FIG. 5H.

Next, the eight 32-to-1 TDM 542a2-TDM 542h2 outputs the digital signals $G_{1b}$-$G_{8b}$ from the output ports of TDM 542a2-TDM 542h2, and the digital signals $G_{1b}$-$G_{8b}$ are respectively transmitted into eight input ports of the optical transmit devices $520_{a2}$-$520_{h2}$ through, e.g., eight parallel channels, such as wireless channels or physical channels. Each of the optical transmit devices or transmitters $520_{a2}$-$520_{h2}$ can be a laser generator, wherein the laser generator can emit a distributed feedback laser (DFB laser), a Fabry-perot laser (F-P laser) or a vertical cavity surface emitting laser (VCSEL) to the mode-group diversity multiplexing (MGDM) device 516b.

Next, the optical transmit devices $520_{a2}$-$520_{h2}$ emit 8 individual optical signals $T_{1b}$-$T_{8b}$ based on the digital signals $G_{1b}$-$G_{8b}$ to the MGDM device 516b, wherein the optical signal $T_{1b}$ carries information associated with the digital signal $G_{1b}$, the optical signal $T_{2b}$ carries information associated with the digital signal $G_{2b}$, the optical signal $T_{3b}$ carries information associated with the digital signal $G_{3b}$, the optical signal $T_{4b}$ carries information associated with the digital signal $G_{4b}$, the optical signal $T_{5b}$ carries information associated with the digital signal $G_{5b}$, the optical signal $T_{6b}$ carries information associated with the digital signal $G_{6b}$, the optical signal $T_{7b}$ carries information associated with the digital signal $G_{7b}$, and the optical signal $T_{8b}$ carries information associated with the digital signal $G_{8b}$.

The MGDM device 516b has been proposed as a way of creating parallel communication channels over the multimode fiber (MMF) 524. The MGDM 516a has been proved as an efficient scheme to overcome the limited bandwidth of the multimode fiber (MMF) 524. MGDM device 516b can multiplex the optical signals $T_{1b}$-$T_{8b}$ into different mode groups of light, propagating with different angles in the MMF 524, wherein each mode groups of the light are used to carry different information so that the data throughput is increased without having additional bandwidth. The optical transmit devices 520c2-520f2, signals $G_{2b}$-$G_{7b}$ and $T_{2b}$-$T_{7b}$ are not shown in FIG. 5H.

Referring to FIG. 5G, upon receiving the different mode groups of the light output from the MGDM device 516a, MGDM device 516b and propagating over the MMF 524, the mode-group diversity demultiplexing (MGDDM) device 518 demultiplexes the different mode groups of the light based on the time when the different mode groups of the light approach the MGDDM device 518 and on the angles of the different mode groups of the light into multiple optical signals $V_1$-$V_8$ received by the optical detectors 522a-522g and 522h. Upon respectively receiving the 8 optical signals $V_1$-$V_8$ output in parallel from the MGDDM device 518 respectively, the 8 optical detectors 522a-522h can send 8 digital signals $H_1$-$H_8$ to the to eight 1-to-32 TDDM 544a-TDDM 544h, respectively. The digital signal $H_1$ carries information associated with the optical signal $V_1$, the digital signal $H_2$ carries information associated with the optical signal $V_2$, the digital signal $H_3$ carries information associated with the optical signal $V_3$, the digital signal $H_4$ carries information associated with the optical signal $V_4$, the digital signal $H_5$ carries information associated with the optical signal $V_5$, the digital signal $H_6$ carries information associated with the optical signal $V_6$, the digital signal $H_7$ carries information associated with the optical signal $V_7$ and the digital signal $H_8$ carries information associated with the optical signal $V_8$. The six TDDM 544b-TDDM 544g and the signals $V_2$-$V_7$ and signals $H_2$-$H_7$ are not shown in FIG. 5G.

Next, the 1-to-32 TDDM 544a can divide an input digital signal $H_1$ having a frequency bandwidth of J sampled at a sampling rate of K into 32 output digital signals $W_1$-$W_{32}$, each having a frequency bandwidth of J/32 sampled at a sampling rate of K/32, passing through 32 parallel signal paths, such as physical or wireless channels, coupled to the Equalizer 231. The 1-to-32 TDDM 544b can divide an input digital signal $H_2$ having a frequency bandwidth of J sampled at a sampling rate of K into 32 output digital signals $W_{33}$-$W_{64}$, each having a frequency bandwidth of J/32 sampled at a sampling rate of K/32, passing through 32 parallel signal paths, such as physical or wireless channels, coupled to the Equalizer 231. The 1-to-32 TDDM 544c can divide an input digital signal $H_3$ having a frequency bandwidth of J sampled at a sampling rate of K into 32 output digital signals $W_{65}$-$W_{96}$, each having a frequency bandwidth of J/32 sampled at a sampling rate of K/32, passing through 32 parallel signal paths, such as physical or wireless channels, coupled to the Equalizer 231. The 1-to-32 TDDM 544d can divide an input digital signal $H_4$ having a frequency bandwidth of J sampled at a sampling rate of K into 32 output digital signals $W_{97}$-$W_{128}$, each having a frequency bandwidth of J/32 sampled at a sampling rate of K/32, passing through 32 parallel signal paths, such as physical or wireless channels, coupled to the Equalizer 231. The 1-to-32 TDDM 544e can divide an input digital signal $H_5$ having a frequency bandwidth of J sampled at a sampling rate of K into 32 output digital signals $W_{129}$-$W_{160}$, each having a frequency bandwidth of J/32 sampled at a sampling rate of K/32, passing through 32 parallel signal paths, such as physical or wireless channels, coupled to the Equalizer 231. The 1-to-32 TDDM 544f can divide an input digital signal $H_6$ having a frequency bandwidth of J sampled at a sampling rate of K into 32 output digital signals $W_{161}$-$W_{192}$, each having a frequency bandwidth of J/32 sampled at a sampling rate of K/32, passing through 32 parallel signal paths, such as physical or wireless channels, coupled to the Equalizer 231. The 1-to-32 TDDM 544g can divide an input digital signal $H_7$ having a frequency bandwidth of J sampled at a sampling rate of K into 32 output digital signals $W_{193}$-$W_{224}$, each having a frequency bandwidth of J/32 sampled at a sampling rate of K/32, passing through 32 parallel signal paths, such as physical or wireless channels, coupled to the Equalizer 231. The 1-to-32 TDDM 544h can divide an input digital signal $H_8$ having a frequency bandwidth of J sampled at a sampling rate of K into 32 output digital signals $W_{225}$-$W_{256}$, each having a frequency bandwidth of J/32 sampled at a sampling rate of K/32, passing through 32 parallel signal paths, such as physical or wireless channels, coupled to the Equalizer 231.

Next, referring to FIG. 5E, the digital signals $W_1$-$W_{256}$ are transmitted in parallel into 256 input ports of the equalizer 231 through, e.g., 256 parallel channels, such as wireless channels or physical channels. The input ports of the equalizer 231 are arranged in parallel for receiving the digital signals $W_1$-$W_{256}$, respectively. After the digital signals $W_1$-$W_{256}$ are transmitted in parallel into the equalizer 231, the above optimizing and equalizing process, as illustrated in FIG. 1C, is performed such that the digital signals $W_1$-$W_{256}$ can be compensated to be multiplied by four respective weightings by the equalizer 231, wherein the 256 respective weightings of the equalizer 231 can be adjusted based on a control signal CS, output from the optimizer 235 and input into the equalizer 231. The optimizing and equalizing process can be referred to as the optimizing and equalizing process as illustrated in FIG. 1C. After the optimizing and equalizing process, the equalizer 231 outputs four equalized digital signals $S_1$-$S_{256}$, respectively, from its output ports of the equalizer 231. Each of the equalized digital signals $S_1$-$S_{256}$ is created by the equalizer 231 multiplying the corresponding one of the digital signals $W_1$-$W_{256}$ by a weighting of the equalizer 231. For example, the equalized digital signal $S_1$ is created by the equalizer 231 multiplying the digital signal $W_1$ by a weighting of the equalizer 231.

Next, the equalized digital signals $S_1$-$S_{256}$ are transmitted in parallel into input ports of the wave-front demultiplexer 232 through 256 parallel signal paths between the output ports of the equalizer 231 and the input ports of the wave-front demultiplexer 232. Each of the 256 respective weightings of the equalizer 231 can be, but not limited to, a complex value such that the equalized signals $S_1$-$S_{256}$ can be rotated precisely to become in phase. In this case, the equalizer 231 can be performed by the narrow band equalizer, as illustrated in FIG. 1C. The narrow band equalizer 231 can provide phase and amplitude modifications to each of the signals $W_1$-$W_{256}$ featuring a constant phase shift and constant amplitude attenuation across a narrow frequency band. Alternatively, the equalizer 231 can be performed by the broadband equalizer, as illustrated in FIG. 1C. The broadband equalizer 231 can provide phase and amplitude modifications to each of the signals $W_1$-$W_{256}$ featuring a constant phase shift and a constant amplitude attenuation in each sub-band across a broad frequency band, but the phase shift and amplitude attenuation in one sub-band across the broad frequency band is different from those in the other sub-bands across the broad frequency band.

Referring to FIG. 5G, upon receiving, in parallel, the equalized digital signals $S_1$-$S_{256}$ output in parallel from the equalizer 531, the wave-front demultiplexer 232 extracts two-hundred-and-fifty-six coherently combined digital signals $Z_1$-$Z_{256}$, which are substantially equal to the digital signals $X_1$-$X_{256}$ respectively or to the digital signals $X_1$-$X_{256}$ multiplied by the same scalar, respectively, from the digital signals $S_1$-$S_{256}$ by the above-mentioned wave-front demultiplexing transform, and outputs the digital signals $Z_1$-$Z_{256}$ in parallel, which can be referred to as the description illustrated in FIG. 1E. In this case, as illustrated in FIG. 1E, the number of I is equal to 256. The wave-front demultiplexer 232 has 256*256 computing units and 256 summing processors. The computing units form a processor array with four rows and 256 columns. The input signals $S_1$-$S_{256}$ can be received by the computing units in the respective four columns in the processor array. Upon receiving the input signals $S_1$-$S_{256}$, each of the computing units independently weights its received signal, multiplied by a weighting value, to generate a weighted signal. The 256 summing processors can output the four signals $Z_1$-$Z_{256}$ each combined with the weighted signals output from the computing units in a corresponding one of the 256 rows in the processor array. The digital signals $Z_1$-$Z_{256}$ can be, but not limited to, four IF digital signals or four RF digital signals. Each of the digital signals $Z_1$-$Z_{256}$ is a linear combination, i.e. weighted sum, each summed with the digital signals $S_1$-$S_{256}$ multiplied by respective weightings, and distributions of the weightings of any two input components in all digital signals $Z_1$-$Z_{256}$ are orthogonal, which can be referred to as the description illustrated in FIG. 1E.

The wave-front demultiplexer 232 can be, but not limited to, embedded in a processor. The wave-front demultiplexer 232 can be hardware achieving the wave-front demultiplexing transform, such as IFFT chip, a component for 256-by-256 inverse Butler matrix, or a device performing inverse Fourier transformation, inverse discrete Fourier transformation, inverse Hartley transformation, Hadamard transformation, any other inverse Fourier-related transformation, or any transformation of a 256-by-256 orthogonal matrix. Alternatively, the function of the wave-front demultiplexer 232 can be realized by software installed in and performed by the processor, wherein the software can perform the above wave-front demultiplexing transform.

The optimizer 235 can be in a signal path between the output ports of wave-front demultiplexer 232 and the equalizer 231. The flow chart of the optimizing and equalizing process shown in FIG. 1C can be applied to the embodiment illustrated in FIG. 5E. For example, the optimizer 235 can receive the signals $Z_{251}$-$Z_{256}$ output from the wave-front demultiplexer 232 and outputs the control signal CS to the equalizer 231 so as to adjust the four respective weightings of the equalizer 231 when the optimizing and equalizing process is performed.

The equalizer 231, the wave-front demultiplexer 232 and the optimizer 235 can be, but not limited to, embedded in a processor 230, such as single integrated circuit chip or single chip package. The equalizer 231 can be hardware or can be realized by software installed in and performed by the processor 230. The optimizer 235 can be hardware or can be realized by software installed in and performed by the processor 230.

After the equalized digital signals $S_1$-$S_{256}$ are input in parallel to the wave-front demultiplexer 232, the wave-front demultiplexer 232 performs the above-mentioned wave-front demultiplexing transformation to process the equalized digital signals $S_1$-$S_{256}$ into two-hundred-and-fifty-six linear combinations, each combined with the equalized digital signals $S_1$-$S_{256}$ multiplied by respective weightings, represented by the two-hundred-and-fifty-six digital signals $Z_1$-$Z_{256}$ output in parallel from the four parallel output ports of the wave-front demultiplexer 232. The digital signals $Z_1$-$Z_{256}$ are substantially equaled to the digital signals $X_1$-$X_{256}$, respectively.

Next, the 50-to-1 TDM 540a can integrate 50 input signals $Z_1$-$Z_{50}$, each having a frequency bandwidth of J/50 sampled at a sampling rate of K/50, passing through 50 parallel signal paths, such as physical or wireless channels, coupled to the wave-front demultiplexer 232 into an output signal $B_1$ having a frequency bandwidth of J sampled at a sampling rate of K.

The output signal $B_1$ is reconstituted by combining the 50 recovered signals $Z_1$-$Z_{50}$ into one with high data flow rate through a TDM 540a. The output signal $B_1$ is substantially equaled to the input signal $A_1$. As a result, the input signal $A_1$ will be fully recovered.

Next, the 170-to-1 TDM 540b can integrate multiple input signals $Z_{51}$-$Z_{220}$, each having a frequency bandwidth of J/170 sampled at a sampling rate of K/170, passing through 170 parallel signal paths, such as physical or wireless channels, coupled to the wave-front demultiplexer 232 into an output signal $B_2$ having a frequency bandwidth of J sampled at a sampling rate of K.

The output signal $B_2$ is reconstituted by combining the 170 recovered signals $Z_{51}$-$Z_{220}$ into one with high data flow rate through a TDM 540b. The output signal $B_2$ is substantially equaled to the input signal $A_2$. As a result, the input signal $A_2$ will be fully recovered.

Next, the 30-to-1 TDM 540c can integrate multiple input signals $Z_{221}$-$Z_{250}$, each having a frequency bandwidth of J/30 sampled at a sampling rate of K/30, passing through 30 parallel signal paths, such as physical or wireless channels, coupled to the wave-front demultiplexer 232 into an output signal $B_3$ having a frequency bandwidth of J sampled at a sampling rate of K.

The output signal $B_3$ is reconstituted by combining the 30 recovered signals $Z_{221}$-$Z_{250}$ into one with high data flow rate through a TDM 540c. The output signal $B_3$ is substantially equaled to the input signal $A_3$. As a result, the input signal $A_3$ will be fully recovered.

Fifth Embodiment: Application to Secured Satcom or Satellite Communication

Figure 6A:
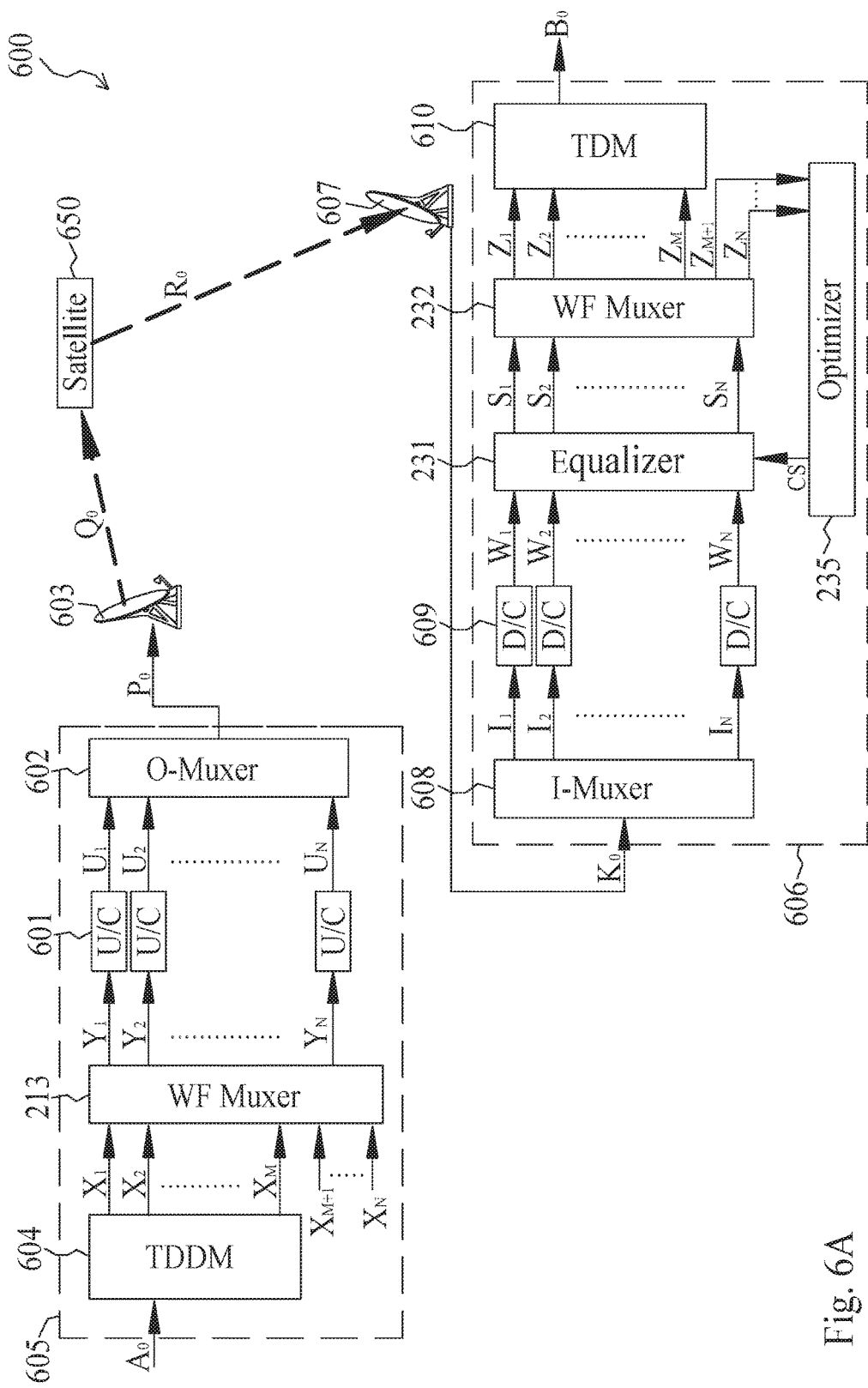
FIG. 6A shows a system including an uplink ground terminal, two antenna arrays, a satellite and a downlink ground terminal according to an embodiment of the present disclosure.

FIG. 6A shows architecture as Satcom waveforms or signals spread through the number N of signal-channel-per-carrier (SCPC) channels with the same polarization in narrowband frequency slots over a satellite. The system 600 features point-to-point communications. A system 600 at a transmitting side, i.e. an uplink ground terminal 605, includes a 1-to-M time domain demultiplexer (TDDM) 604 for dividing an input signal $A_0$ having a high bandwidth sampled at a high sampling rate into multiple output signals $X_1$-$X_M$ each having a low bandwidth sampled at a low sampling rate, the above-mentioned wave-front multiplexer 213, arranged as outputs of the 1-to-M time domain demultiplexer (TDDM) 604, for performing the above-mentioned wave-front multiplexing transform to $X_1$-$X_N$, the number N of frequency up-conversion components 601, arranged in parallel and at outputs of the wave-front multiplexer 213, for converting the number N of signals $Y_1$-$Y_N$ output from the wave-front multiplexer 213 into the number N of signals $U_1$-$U_N$ each having or modulating a distinct carrier within a distinct frequency sub-band for satellite communication from any other one of the number N of signals $U_1$-$U_N$, wherein the frequency sub-bands of the signals $U_1$-$U_N$ are not overlapped to one another or each other, an output multiplexer (O-Mux) 602, arranged at outputs of the frequency up-conversion components 601, that could be a frequency division multiplexer (FDM) for combining the number N of signals $U_1$-$U_N$ into a signal composite signal $P_0$, and an antenna array 603, arranged at an output of the output multiplexer 602, for receiving the signal $P_0$ output from the output multiplexer 602 and outputting or broadcasting a microwave signal $Q_0$ to a satellite 650, wherein the microwave signal $Q_0$ carries information associated with the signal $P_0$.

Referring to FIG. 6A, the system 600 at a receiving side, i.e. a downlink ground terminal 606, includes an antenna array 607 for receiving or intercepting a microwave signal $R_0$ from the satellite 608, wherein the microwave signal $R_0$ carries information associated with the microwave signal $Q_0$, an input multiplexer (I-Mux) 608, arranged at an output of the antenna array 607, for receiving a microwave signal $K_0$ output from the antenna array 607, wherein the microwave signal $R_0$ carries information associated with the signal $K_0$, wherein the input multiplexer 608 can be a frequency division demultiplexer (FDDM) adapted to divide the signal $K_0$ into the number N of signals $I_1$-$I_N$, wherein each of the signals $I_1$-$I_N$ has or modulates a distinct carrier within a distinct frequency sub-band from any other one of the number N of signals $I_1$-$I_N$, wherein the frequency sub-bands of the signals $I_1$-$I_N$ are not overlapped to one another or each other, the number N of frequency down-conversion components 609, arranged in parallel and at outputs of the input multiplexer 608, for converting the number N of signals $I_1$-$I_N$ output from the input multiplexer 608 into the number N of signals $W_1$-$W_N$, the above-mentioned equalizer 231, arranged at outputs of the frequency down-conversion components 609, for compensating the number N of signals $W_1$-$W_N$ each to be multiplied by respective weightings so as to output the number N of equalized signals $S_1$-$S_N$, the above-mentioned optimizer 235, arranged at one or more inputs of the frequency down-conversion components 609, for adjusting the respective weightings of the equalizer 231, the above-mentioned wave-front demultiplexer 232, arranged at outputs of the equalizer 231 and at one or more inputs of the optimizer 235, for performing the above-mentioned wave-front demultiplexing transform to the equalized signals $S_1$-$S_N$, the signal $P_0$ output from the output multiplexer 602, and a M-to-1 time-domain multiplexer 610, arranged at outputs of the wave-front demultiplexer 232, for combining or integrating the number M of signals $Z_1$-$Z_M$, each having a low frequency bandwidth sampled at a low sampling rate, into an output signal $B_0$ having a high frequency bandwidth sampled at a high sampling rate.

In this case as above illustrated in FIG. 6A, the number of N is an integer that could be any number equal to or greater than 2, 4, 8, 16, 32, 64, 128 or 256. The number of M is an integer that could be any number less than the number of N.

Referring to FIG. 6A, a method for processing data streams is described as blow. The 1-to-M TDDM 604 includes an input port receiving a digital or analog signal $A_0$ and the number M of output ports outputting the number M of digital or analog signals $X_1$-$X_M$. A TDDM is defined herein to divide an input signal having a high bandwidth sampled at a high sampling rate into multiple output signals each having a low bandwidth sampled at a low sampling rate. For example, in this embodiment, the 1-to-M TDDM 604 can divide the input signal $A_0$ having a frequency bandwidth of J sampled at a sampling rate of K into the number M of the output signals $X_1$-$X_M$, each having a frequency bandwidth of J/M sampled at a sampling rate of K/M, passing through the number M of parallel signal paths, such as physical or wireless channels, coupled to the wave-front multiplexer 213.

Next, referring to FIG. 6A, the digital or analog signals $X_1$-$X_M$ output from the 1-to-M time-domain demultiplexer 604 and one or more pilot or diagnostic signals $X_{M+1}$-$X_N$ that can analog or digital ones can be transmitted to the wavefront multiplexer 213. Each of the pilot or diagnostic signals $X_{M+1}$-$X_N$ may be a pilot or diagnostic signal that may have a single frequency and fixed amplitude. Alternatively, the pilot or diagnostic signals $X_{M+1}$-$X_N$ could change based on time or could be any signal known by the system 600. The extraneous signal $A_0$ divided into the number M of the digital or analog signals $X_1$-$X_M$ by the 1-to-M time-domain demultiplexer 604 is unknown by the system 600 and input into the system 600 from an extraneous system.

Next, referring to FIG. 6A, upon receiving, in parallel, the number M of the individual and independent digital signals $X_1$-$X_M$ and the number N-M of pilot or diagnostic signals $X_{M+1}$-$X_N$, the wave-front multiplexer 213 can processes the number N of the analog or digital signals $X_1$-$X_N$ into the number N of analog or digital signals $Y_1$-$Y_N$ by the above-mentioned wave-front multiplexing transform, and outputs the digital signals $Y_1$-$Y_N$ in parallel to the number N of the frequency up-conversion components 601, respectively. Each of the analog or digital signals $Y_1$-$Y_N$ is a linear combination, i.e. weighted sum, each combined with the digital signals $X_1$-$X_N$ multiplied by respective weightings, and distributions of the weightings of any two input components in all of the analog or digital signals $Y_1$-$Y_N$ are orthogonal, which can be referred to as the description illustrated in FIGS. 1A and 1D. In this case, as illustrated in FIG. 1D, the number of H is equal to N. The wavefront multiplexer 213 has N*N computing units and four summing processors. The computing units form a processor array with four rows and four columns. The input signals $X_1$-$X_N$ can be received by the computing units in the number N of respective columns in the processor array. Upon receiving the input signals $X_1$-$X_N$, each of the computing units independently weights its received signal, multiplied by a weighting value, to generate a weighted signal. The number N of the summing processors can output the number N of the signals $Y_1$-$Y_N$ each combined with the weighted signals output from the computing units in a corresponding one of the number N of the rows in the processor array. In a case, each of the digital signals $X_1$-$X_N$ can be, but not limited to, an IF digital signal or a RF digital signal.

Next, referring to FIG. 6A, upon receiving the signals $Y_1$-$Y_N$ output in parallel from the wave-front multiplexer 213, the number N of frequency up-conversion components 601 convert the number N of signals $Y_1$-$Y_N$ into the number N of analog or digital microwave signals $U_1$-$U_N$ each having or modulating a distinct carrier within a distinct frequency sub-band in a bandwidth, such as Ku frequency band or Ka frequency band, for satellite communication from any other one of the number N of signals $U_1$-$U_N$, wherein the frequency sub-bands of the signals $U_1$-$U_N$ are not overlapped to one another or each other.

Next, referring to FIG. 6A, upon receiving the signals $U_1$-$U_N$, the output multiplexer (O-Mux) 602, i.e. a frequency division multiplexer (FDM), combines the number N of signals $U_1$-$U_N$ into a signal analog or digital composite microwave signal $P_0$. Next, upon receiving the signal composite signal $P_0$, the antenna array 603 outputs or broadcasts an analog or digital microwave signal $Q_0$ carrying information associated with the signal $P_0$ to the satellite 650.

Next, referring to FIG. 6A, the satellite 650 is provided with a transponder, operating at multiple frequency sub-bands in a Ku or Ka frequency bandwidth, for example, that receives the microwave signal $Q_0$ from the uplink ground terminal 605, amplifies the microwave signal $Q_0$ and outputs an analog or digital microwave signal $R_0$ at a different frequency range from that of the microwave signal $Q_0$, wherein the microwave signal $R_0$ carries information associated with the microwave signal $Q_0$.

Next, referring to FIG. 6A, the antenna array 607 intercepts or receives the microwave signal $R_0$ from the satellite 650 and outputs the microwave signal $K_0$ carrying information associated with the microwave signal $R_0$. Next, upon receiving the microwave signal $K_0$ output from the antenna array 607, the input multiplexer 608, i.e. a frequency division demultiplexer (FDDM), divides the microwave signal $K_0$ into the number N of analog or digital microwave signals $I_1$-$I_N$, wherein each of the microwave signals $I_1$-$I_N$ has or modulates a distinct carrier within a distinct frequency sub-band in the Ku frequency band or Ka frequency band, for example, from any other one of the microwave signals $I_1$-$I_N$, wherein the frequency sub-bands of the microwave signals $I_1$-$I_N$ are not overlapped to one another or each other.

Next, referring to FIG. 6A, upon receiving the microwave signals $I_1$-$I_N$ output in parallel from the input multiplexer 608, the frequency down-conversion components 609 convert the number N of microwave signals $I_1$-$I_N$ into the number N of analog or digital signals $W_1$-$W_N$ at an intermediate-frequency (IF) band or base band, for example, output to the equalizer 231 through multiple parallel channels, such as wireless channels or physical channels.

Next, referring to FIG. 6A, the above optimizing and equalizing process, as illustrated in FIG. 1C, is performed such that the digital signals $W_1$-$W_N$ can be compensated to be multiplied by respective weightings by the equalizer 231, wherein the respective weightings of the equalizer 231 can be adjusted based on one or more control signals CS output from the optimizer 235. After the optimizing and equalizing process, the equalizer 231 outputs the number N of equalized analog or digital signals $S_1$-$S_N$. For example, the equalized analog or digital signal $S_1$ is created by the equalizer 231 multiplying the analog or digital signal $W_1$ by a weighting of the equalizer 231. The equalized digital signal $S_N$ is created by the equalizer 231 multiplying the digital signal $W_N$ by another weighting of the equalizer 231. Each of the respective weightings of the equalizer 231 can be, but not limited to, a complex value such that the equalized signals $S_1$-$S_N$ can be rotated precisely to become in phase. In this case, the equalizer 231 can be performed by the narrow band equalizer, as illustrated in FIG. 1C. The narrow band equalizer 231 can provide phase and amplitude modifications to each of the signals $W_1$-$W_N$ featuring a constant phase shift and a constant amplitude attenuation across a narrow frequency band. Alternatively, the equalizer 231 can be performed by the broadband equalizer as illustrated in FIG. 1C. The broadband equalizer 231 can provide phase and amplitude modifications to each of the signals $W_1$-$W_4$ featuring a constant phase shift and a constant amplitude attenuation in each subband across a broad frequency band, but the phase shift and amplitude attenuation in one subband across the broad frequency band is different from those in the other sub-bands across the broad frequency band.

Next, referring to FIG. 6A, upon receiving, in parallel, the equalized digital signals $S_1$-$S_N$ output in parallel from the equalizer 231, the wave-front demultiplexer 232 extracts multiple analog or digital signals $Z_1$-$Z_N$, which are substantially equal to the analog or digital signals $X_1$-$X_N$, respectively or to the digital signals $X_1$-$X_N$ multiplied by the same scalar, respectively, from the analog or digital signals $S_1$-$S_N$ by the above-mentioned wave-front demultiplexing transform, and outputs the analog or digital signals $Z_1$-$Z_N$ in parallel, which can be referred to as the description illustrated in FIG. 1E. In this case, as illustrated in FIG. 1E, the number of I is equal to N. The wavefront demultiplexer 232 has N*N computing units and four summing processors. The computing units form a processor array with the number N of rows and the number N of columns. The input signals $S_1$-$S_N$ can be received by the computing units in the number N of respective columns in the processor array. Upon receiving the input signals $S_1$-$S_N$, each of the computing units independently weights its received signal, multiplied by a weighting value, to generate a weighted signal. The number N of the summing processors can output the number N of the signals $Z_1$-$Z_N$ each combined with the weighted signals output from the computing units in a corresponding one of the number N of the rows in the processor array. Each of the signals $Z_1$-$Z_N$ is a linear combination, i.e. weighted sum, each combined with the digital signals $S_1$-$S_N$ multiplied by respective weightings, and distributions of the weightings of any two input components in all signals $Z_1$-$Z_N$ are orthogonal, which can be referred to as the description illustrated in FIG. 1A.

Next, referring to FIG. 6A, upon receiving the signals $Z_1$-$Z_M$, the M-to-1 time-domain multiplexer 610 combines or integrates the number M of signals $Z_1$-$Z_M$ each having a bandwidth of J/M sampled as a sampling rate K/M into an analog or digital output signal $B_0$ having a bandwidth of J sampled as a sampling rate of K, wherein the output signal $B_0$ is substantially equal to the signal $A_0$ or to the signal $A_0$ multiplied by the same scalar as the digital signals $X_1$-$X_N$ are multiplied. At the same time, the signals $Z_{M+1}$-$Z_N$ are transmitted to the optimizer 231, the optimizer 235 generates the one or more control signals CS output to the equalizer 231 to adjust the respective weightings of the equalizers 231, as illustrated in FIG. 1C.

Figure 6B:
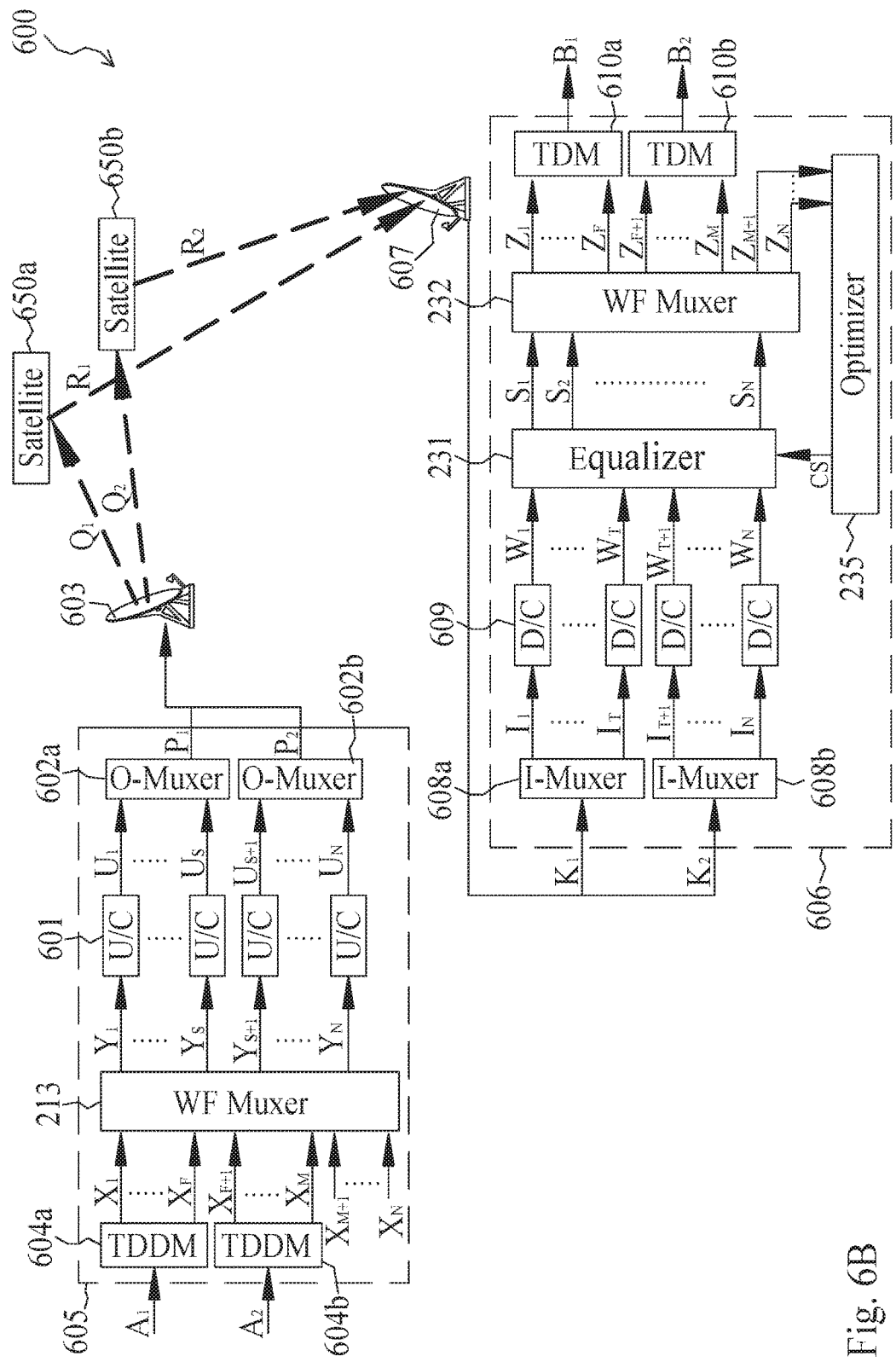
FIG. 6B shows a system including an uplink ground terminal, two antenna arrays, two satellites and a downlink ground terminal according to an embodiment of the present disclosure.

Besides, referring to FIG. 6B showing architecture as Satcom waveforms or signals spread through the number N of signal-channel-per-carrier (SCPC) channels with the same polarization in narrowband frequency slots over multiple satellites. The system 600 features point-to-point communications. The system 600 shown in FIG. 6B is similar to the system 600 illustrated in FIG. 6A except that the 1-to-M time-domain demultiplexer 604 illustrated in FIG. 6A is replaced with a 1-to-F time-domain demultiplexer 604a for receiving an extraneous signal $A_1$ and a 1-to-G time-domain demultiplexer 604b for receiving an extraneous signal $A_2$, as illustrated in FIG. 6B, that the output multiplexer 602 illustrated in FIG. 6A is replaced with two output multiplexers 602a and 602b for outputting two signals $P_1$ and $P_2$ to the antenna array 603, as illustrated in FIG. 6B, that the input multiplexer 602 illustrated in FIG. 6A is replaced with two input multiplexers 608a and 608b for receiving two signals $K_1$ and $K_2$ from the antenna array 607, as illustrated in FIG. 6B, that the M-to-1 time-domain demultiplexer 610 illustrated in FIG. 6A is replaced with a F-to-1 time-domain demultiplexer 610a for outputting a signal $B_1$ and a G-to-1 time-domain demultiplexer 610b for outputting a signal $B_2$, as illustrated in FIG. 6B, and that two satellites 650a and 650b are used to transmits signals from the antenna array 603 to the antenna 607.

Referring to FIG. 6B, a method for processing data streams is described as blow. The 1-to-F TDDM 604a includes an input port receiving a digital or analog signal $A_1$ and the number F of output ports outputting the number F of digital or analog signals $X_1$-$X_F$. The 1-to-F TDDM 604a can divide the input signal $A_1$ having a frequency bandwidth of J1 sampled at a sampling rate of $K_1$ into the number F of the signals $X_1$-$X_F$, each having a frequency bandwidth of J1/F sampled at a sampling rate of K1/F, passing through the number F of parallel signal paths, such as physical or wireless channels, coupled to the wave-front multiplexer 213. The 1-to-G TDDM 604b includes an input port receiving a digital or analog signal $A_2$ and the number G of output ports outputting the number G of digital or analog signals $X_{F+1}$-$X_M$. The 1-to-G TDDM 604b can divide the input signal $A_2$ having a frequency bandwidth of J2 sampled at a sampling rate of K2 into the number G of the output signals $X_{F+1}$-$X_M$, each having a frequency bandwidth of J2/G sampled at a sampling rate of K2/G, passing through the number G of parallel signal paths, such as physical or wireless channels, coupled to the wave-front multiplexer 213.

Next, referring to FIG. 6B, the digital or analog signals $X_1$-$X_F$ output from the 1-to-F time-domain demultiplexer (TDDM) 604a, the digital or analog signals $X_{F+1}$-$X_M$ output from the 1-to-G time-domain demultiplexer 604a and one or more pilot or diagnostic signals $X_{M+1}$-$X_N$ that can analog or digital ones are transmitted to the wavefront multiplexer 213. Each of the pilot or diagnostic signals $X_{M+1}$-$X_N$ may be a pilot or diagnostic signal that may have a single frequency and fixed amplitude. Alternatively, the pilot or diagnostic signals $X_{M+1}$-$X_N$ could change based on time or could be any signal known by the system 600. The extraneous signal $A_1$ divided into the number F of the digital or analog signals $X_1$-$X_F$ by the 1-to-F time-domain demultiplexer 604a and the extraneous signal $A_2$ divided into the number G of the digital or analog signals $X_{F+1}$-$X_M$ by the 1-to-G time-domain demultiplexer 604 are unknown by the system 600 and input into the system 600 from one or more extraneous systems.

Next, referring to FIG. 6B, upon receiving, in parallel, the number M of the individual and independent digital signals $X_1$-$X_M$ and the number N-M of pilot or diagnostic signals $X_{M+1}$-$X_N$, the wave-front multiplexer 213 can processes the number N of the analog or digital signals $X_1$-$X_N$ into the number N of analog or digital signals $Y_1$-$Y_N$ by the above-mentioned wave-front multiplexing transform, and outputs the digital signals $Y_1$-$Y_N$ in parallel to the number N of the frequency up-conversion components 601, respectively. More description and calculation related to the wave-front multiplexer 213 can be referred to as those illustrated in FIG. 6A.

Next, referring to FIG. 6B, upon receiving the signals $Y_1$-$Y_N$ output in parallel from the wave-front multiplexer 213, the number N of frequency up-conversion components 601 convert the number N of signals $Y_1$-$Y_N$ into the number N of analog or digital microwave signals $U_1$-$U_N$ each having or modulating a distinct carrier within a distinct frequency sub-band in a bandwidth, such as Ku frequency band or Ka frequency band, for satellite communication from any other one of the number N of signals $U_1$-$U_N$, wherein the frequency sub-bands of the signals $U_1$-$U_N$ are not overlapped to one another or each other.

Next, referring to FIG. 6B, upon receiving the signals $U_1$-$U_S$, the output multiplexer (O-Mux) 602a, i.e. a frequency division multiplexer (FDM), combines the number S of signals $U_1$-$U_S$ into a signal analog or digital composite microwave signal $P_1$. Upon receiving the signals $U_{S+1}$-$U_N$, the output multiplexer (O-Mux) 602b, i.e. a frequency division multiplexer (FDM), combines the number N-S of signals $U_{S+1}$-$U_N$ into a signal analog or digital composite microwave signal $P_2$. Next, upon receiving the signal composite signals $P_1$ and $P_2$, the antenna array 603 outputs or broadcasts an analog or digital microwave signal $Q_1$ to the satellite 650a and an analog or digital microwave signal $Q_2$ to the satellite 650b, wherein the wave signal $Q_1$ could carry information associated with the signal $P_1$ but independent from the signal $P_2$ and the wave signal $Q_2$ could carry information associated with the signal $P_2$ but independent from the signal $P_1$. Alternatively, the wave signal $Q_1$ could carry information associated with the signals $P_1$ and $P_2$ and the wave signal $Q_2$ could carry information associated with the signal $P_2$ but independent from the signal $P_1$. Alternatively, the wave signal $Q_1$ could carry information associated with the signal $P_1$ but independent from the signal $P_2$ and the wave signal $Q_2$ could carry information associated with the signals $P_1$ and $P_2$. Alternatively, each of the wave signals $Q_1$ and $Q_2$ could carry information associated with the signal $P_1$ and $P_2$.

Next, referring to FIG. 6B, the satellite 650a is provided with a transponder, operating at multiple frequency sub-bands in a Ku or Ka frequency bandwidth, for example, that receives the microwave signal $Q_1$ from the uplink ground terminal 605, amplifies the microwave signal $Q_1$ and outputs an analog or digital microwave signal $R_1$ at a different frequency range from that of the microwave signal $Q_1$ and that of the microwave signal $Q_2$, wherein the microwave signal $R_1$ carries information associated with the microwave signal $Q_1$. The satellite 650b is provided with a transponder, operating at multiple frequency sub-bands in a Ku or Ka frequency bandwidth, for example, that receives the microwave signal $Q_2$ from the uplink ground terminal 605, amplifies the microwave signal $Q_2$ and outputs an analog or digital microwave signal $R_2$ at a different frequency range from that of the microwave signal $Q_1$ and that of the microwave signal $Q_2$, wherein the microwave signal $R_2$ carries information associated with the microwave signal $Q_2$.

Next, referring to FIG. 6B, the antenna array 607 intercepts or receives the microwave signal $R_1$ from the satellite 650a and the microwave signal $R_2$ from the satellite 650b and outputs the microwave signal $K_1$ to the input multiplexer 608a and the microwave signal $K_2$ to the input multiplexer 608b, wherein the wave signal $K_1$ could carry information associated with the signal $R_1$ but independent from the signal $R_2$ and the wave signal $K_2$ could carry information associated with the signal $R_2$ but independent from the signal $R_1$. Alternatively, the wave signal $K_1$ could carry information associated with the signals $R_1$ and $R_2$ and the wave signal $K_2$ could carry information associated with the signal $R_2$ but independent from the signal $R_1$. Alternatively, the wave signal $K_1$ could carry information associated with the signal $R_1$ but independent from the signal $R_2$ and the wave signal $K_2$ could carry information associated with the signals $R_1$ and $R_2$. Alternatively, each of the wave signals $K_1$ and $K_2$ could carry information associated with the signal $R_1$ and $R_2$.

Next, referring to FIG. 6B, upon receiving the microwave signal $K_1$ output from the antenna array 607, the input multiplexer 608a, i.e. a frequency division demultiplexer (FDDM), divides the microwave signal $K_1$ into the number T of analog or digital microwave signals $I_1$-$I_T$. Upon receiving the microwave signal $K_2$ output from the antenna array 607, the input multiplexer 608b, i.e. a frequency division demultiplexer (FDDM), divides the microwave signal $K_2$ into the number N-T of analog or digital microwave signals $I_{T+1}$-$I_N$. Each of the microwave signals $I_1$-$I_N$ has or modulates a distinct carrier within a distinct frequency sub-band in the Ku frequency band or Ka frequency band, for example, from any other one of the microwave signals $I_1$-$I_N$, wherein the frequency sub-bands of the microwave signals $I_1$-$I_N$ are not overlapped to one another or each other.

Next, referring to FIG. 6B, upon receiving the microwave signals $I_1$-$I_N$ output in parallel from the input multiplexers 608a and 608b, the frequency down-conversion components 609 convert the number N of microwave signals $I_1$-$I_N$ into the number N of analog or digital signals $W_1$-$W_N$ at an intermediate-frequency (IF) band or base band, for example, output to the equalizer 231 through multiple parallel channels, such as wireless channels or physical channels.

Next, referring to FIG. 6B, the above optimizing and equalizing process, as illustrated in FIG. 1C, is performed such that the digital signals $W_1$-$W_N$ can be compensated to be multiplied by respective weightings by the equalizer 231, wherein the respective weightings of the equalizer 231 can be adjusted based on one or more control signals CS output from the optimizer 235. After the optimizing and equalizing process, the equalizer 231 outputs the number N of equalized analog or digital signals $S_1$-$S_N$. More description and calculation related to the equalizer 231 can be referred to as those illustrated in FIG. 6A.

Next, referring to FIG. 6B, upon receiving, in parallel, the equalized digital signals $S_1$-$S_N$ output in parallel from the equalizer 231, the wave-front demultiplexer 232 extracts multiple analog or digital signals $Z_1$-$Z_N$, which are substantially equal to the analog or digital signals $X_1$-$X_N$, respectively or to the digital signals $X_1$-$X_N$ multiplied by the same scalar, respectively, from the analog or digital signals $S_1$-$S_N$ by the above-mentioned wave-front demultiplexing transform. More description and calculation related to the wave-front demultiplexer 232 can be referred to as those illustrated in FIG. 6A.

Next, referring to FIG. 6B, upon receiving the signals $Z_1$-$Z_F$, the F-to-1 time-domain multiplexer 610a combines or integrates the number F of signals $Z_1$-$Z_F$ each having a bandwidth of J1/F sampled as a sampling rate K1/F into an analog or digital output signal $B_1$ having a bandwidth of J1 sampled as a sampling rate of $K_1$, wherein the output signal $B_1$ is substantially equal to the signal $A_1$ or to the signal $A_1$ multiplied by the same scalar as the digital signals $X_1$-$X_N$ are multiplied. Upon receiving the signals $Z_{F+1}$-$Z_M$, the G-to-1 time-domain multiplexer 610b combines or integrates the number G of signals $Z_{F+1}$-$Z_M$ each having a bandwidth of J2/G sampled as a sampling rate K2/G into an analog or digital output signal $B_2$ having a bandwidth of J2 sampled as a sampling rate of K2, wherein the output signal $B_2$ is substantially equal to the signal $A_2$ or to the signal $A_2$ multiplied by the same scalar as the digital signals $X_1$-$X_N$ are multiplied. The signals $B_1$ and $B_2$ are substantially equal to the signals $A_1$ and $A_2$ respectively or to the signals $B_1$ and $B_2$ multiplied by the same scalar, respectively. At the same time, the signals $Z_{M+1}$-$Z_N$ are transmitted to the optimizer 231, the optimizer 235 generates the one or more control signals CS output to the equalizer 231 to adjust the respective weightings of the equalizers 231, as illustrated in FIG. 1C.

In this case as above illustrated in FIG. 6B, the number of N is an integer that could be any number equal to or greater than 2, 4, 8, 16, 32, 64, 128 or 256. The number of M is an integer that could be any number less than the number of N. The number of F is an integer that could be any number less than the number of M. The number of G is an integer that could be any number less than the number of M and could be equal to or greater or less than the number of F. The number of S is an integer that could be any number less than the number of N and equal to or greater or less than an half of the number of N. The number of T is an integer that could be any number less than the number of N, equal to or greater or less than an half of the number of N and equal to or greater or less than the number of S. The number F plus the number G equals the number M.

Figure 6C:
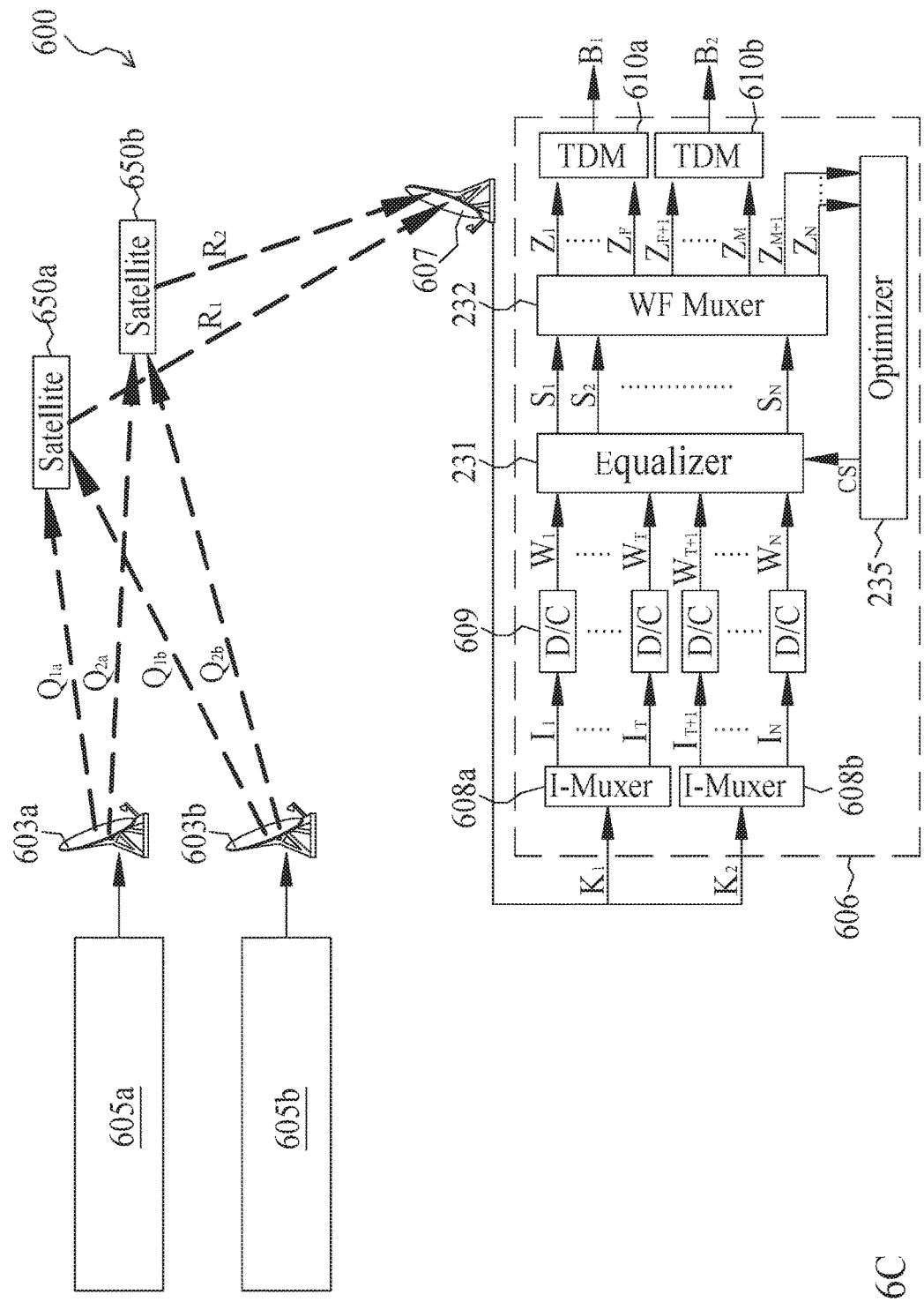
FIGS. 6C and 6D show a system including two uplink ground terminals, three antenna arrays, two satellites and a downlink ground terminal according to an embodiment of the present disclosure.
Figure 6D:
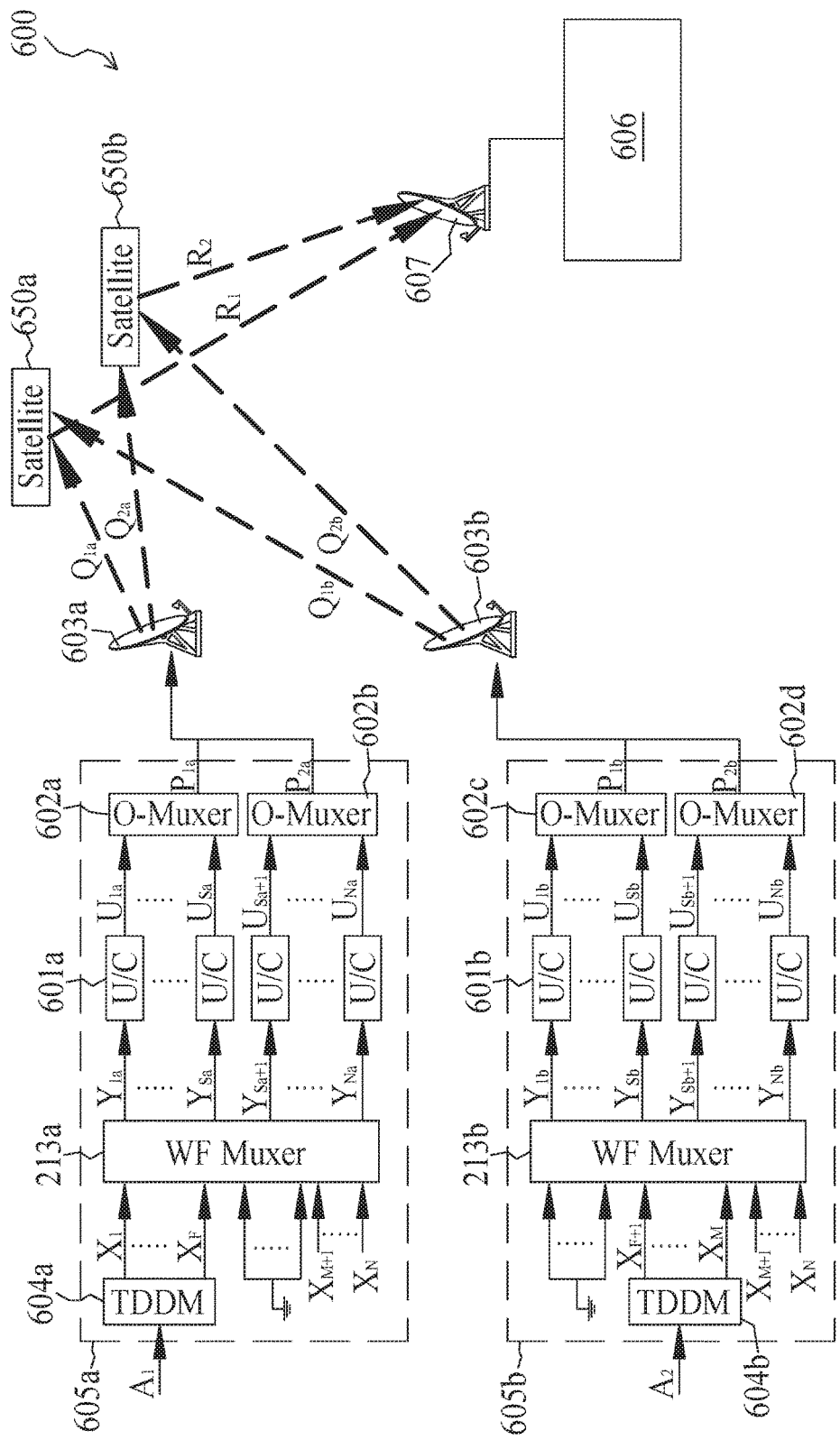

Besides, FIG. 6C shows multipoint-to-point communications over multiple satellites. FIG. 6D shows architecture of uplink ground terminals 605a and 605b shown in FIG. 6C. Referring to FIGS. 6C and 6D, satcom waveforms or signals are shown to be spread through the number N of signal-channel-per-carrier (SCPC) channels with the same polarization in narrowband frequency slots over multiple satellites. The system 600 shown in FIGS. 6C and 6D is similar to that illustrated in FIG. 6B except that the system 600 illustrated in FIGS. 6C and 6D uses the number Nt of signal transmitting sources, such as including a first transmitting source 605a, i.e. an uplink ground terminal, processing one, i.e. $A_1$, of the extraneous signals $A_1$ and $A_2$, and a second transmitting source 605b, i.e. an uplink ground terminal, processing one, i.e. $A_2$, of the extraneous signals $A_1$ and $A_2$. The number Nr of signal receiving sources, such as including only one receiving source outputting the two signals $B_1$ and $B_2$ substantially equal to the signals $A_1$ and $A_2$ respectively or to the signals $B_1$ and $B_2$ multiplied by the same scalar, respectively. The number of Nt could be any number equal to or greater than 2, 3, 4, 5, 6, 7, 8, 9 or 10, and could be greater than the number of Nr that could be one in this embodiment. The number Nt of the transmitting sources have the same wavefront multiplexer as one another or each other and use different input ports in sequence for receiving different extraneous signals. For example, referring to FIG. 6C, the two transmitting sources 605a and 605b contains two wavefront multiplexers 213a and 213b each having the same architecture as each other, and the wavefront multiplexers 213a and 213b use different input ports in sequence for receiving the different signals $X_1$-$X_M$, wherein the wavefront multiplexer 213a has the number F of upper ports for receiving the signals $X_1$-$X_F$ output from the 1-to-F time domain demultiplexer (TDDM) 604a but the wavefront multiplexer 213b has the number G of middle ports, for receiving the signals $X_{F+1}$-$X_M$ output from the 1-to-G time domain demultiplexer 604b, different in sequence from the upper ports of the wavefront multiplexer 213a for receiving the signals $X_1$-$X_F$. In this case, referring to FIG. 6C, the one or more pilot or diagnostic signals $X_{M+1}$-$X_N$, input into the wavefront multiplexer 213a, carry the same information in sequence as the pilot or diagnostic signals $X_{M+1}$-$X_N$ input into the wavefront multiplexer 213b. The other ports of the wavefront multiplexers 213a and 213b can be connected to a ground reference for receiving ground signals. The number Nt of the signal transmitting sources contains the number Nt of antenna arrays. In this case, the two signal transmitting sources 605a and 605b contains two antenna arrays 603a and 603b, respectively. Upon intercepting or receiving analog or digital microwave signals $Q_{1a}$ and $Q_{1b}$ output from the antenna arrays 603a and 603b, the satellite 650a combines carriers at the same frequency sub-bands across the microwave signals $Q_{1a}$ and $Q_{1b}$ and outputs the microwave signal $R_1$ carrying information associated with the microwave signals $Q_{1a}$ and $Q_{1b}$ to the antenna array 607. Upon intercepting or receiving analog or digital microwave signals $Q_{1a}$ and $Q_{1b}$ output from the antenna arrays 603a and 603b, the satellite 650a combines carriers at the same frequency sub-bands across the microwave signals $Q_{2a}$ and $Q_{2b}$ and outputs the microwave signal $R_2$ carrying information associated with the microwave signals $Q_{2a}$ and $Q_{2b}$ to the antenna array 607. There could be no synchronizations between the two transmitting sources 605a and 605b.

A method for processing signals or data streams by using the system 600 shown in FIGS. 6C and 6D is described below. The uplink ground terminal 605a receives an extraneous analog or digital signal $A_1$ input to an input port of the 1-to-F TDDM 604a. The 1-to-F TDDM 604a includes the number F of output ports outputting the number F of digital or analog signals $X_1$-$X_F$. The 1-to-F TDDM 604a can divide the input signal $A_1$ having a frequency bandwidth of J1 sampled at a sampling rate of $K_1$ into the number F of the signals $X_1$-$X_F$, each having a frequency bandwidth of J1/F sampled at a sampling rate of K1/F, passing through the number F of parallel signal paths, such as physical or wireless channels, coupled to a wave-front multiplexer 213a. The analog or digital signal $X_1$-$X_F$ could be individual and independent from each other or one another. At the same time, the number G of ground signals and the number N-M of pilot or diagnostic signals are input in parallel to the wave-front multiplexer 213a through multiple parallel signal paths, such as wireless channels or physical channels, wherein the number G of input ports of the wave-front multiplexer 213a can be connected to a ground reference for receiving the ground signals. The ground signals represent no extraneous signals input to the input ports of the wave-front multiplexer 213a. The digital pilot or diagnostic signals $X_{M+1}$-$X_N$ may have a single frequency and fixed amplitude. Alternatively, the digital pilot or diagnostic signals $X_{M+1}$-$X_N$ could change based on time or could be any signal known by the system 600. The extraneous analog or digital signal $A_1$ divided into the number F of the analog or digital signals $X_1$-$X_F$ by the 1-to-F TDDM 604a is unknown by the system 600 and input into the system 600 from an extraneous system.

Next, referring to FIGS. 6C and 6D, the wave-front multiplexer 213a performs the above wave-front multiplexing transform to process the analog and digital signals $X_1$-$X_F$, the number G of the ground signals and the pilot or diagnostic signals $X_{M+1}$-$X_N$ into multiple linear combinations, each combined with the signals $X_1$-$X_F$ and $X_{M+1}$-$X_N$ and the ground signals multiplied by respective weightings, represented by the number N of digital signals $Y_{1a}$-$Y_{Na}$, which can referred to as FIGS. 1A and 1D. In this case, as illustrated in FIG. 1D, the number of H is equal to N. The wavefront multiplexer 213a has N*N computing units and the number N of summing processors. The computing units form a processor array with the number N of rows and the number N of columns. The signals $X_1$-$X_F$ and $X_{M+1}$-$X_N$ and the ground signals can be received by the computing units in the number N of the respective columns in the processor array. Upon receiving the input signals $X_1$-$X_F$ and $X_{M+1}$-$X_N$ and the ground signals, each of the computing units independently weights its received signal, multiplied by a weighting value, to generate a weighted signal. The number N of the summing processors can output the signals $Y_{1a}$-$Y_{Na}$ each combined with the weighted signals output from the computing units in a corresponding one of the number N of the rows in the processor array. The signals $X_1$-$X_F$ and $X_{M+1}$-$X_N$ can be, but not limited to, IF digital signals or RF digital signals.

Next, referring to FIGS. 6C and 6D, upon receiving the digital signals $Y_{1a}$-$Y_N$a output in parallel from the wave-front multiplexer 213a, the number N of frequency up-conversion components 601 convert the number N of signals $Y_{1a}$-$Y_{Na}$ into the number N of analog or digital microwave signals $U_{1a}$-$U_{Na}$ each having or modulating a distinct carrier within a distinct frequency sub-band in a bandwidth, such as Ku frequency band or Ka frequency band, for satellite communication from any other one of the number N of signals $U_{1a}$-$U_{Na}$, wherein the frequency sub-bands of the signals $U_{1a}$-$U_{Na}$ are not overlapped to one another or each other.

Next, referring to FIGS. 6C and 6D, upon receiving the signals $U_{1a}$-$U_{Sa}$, the output multiplexer (O-Mux) 602a, i.e. a frequency division multiplexer (FDM), combines the number S of signals $U_{1a}$-$U_{Sa}$ into a signal analog or digital composite microwave signal $P_{1a}$. Upon receiving the signals $U_{Sa+1}$-$U_{Na}$, the output multiplexer (O-Mux) 602b, i.e. a frequency division multiplexer (FDM), combines the number N-S of signals $U_{Sa+1}$-$U_{Na}$ into a signal analog or digital composite microwave signal $P_{2a}$. Next, upon receiving the signal composite signals $P_{1a}$ and $P_{2a}$, the antenna array 603a outputs or broadcasts an analog or digital microwave signal $Q_{1a}$ to the satellite 650a and an analog or digital microwave signal $Q_{2a}$ to the satellite 650b, wherein the wave signal $Q_{1a}$ could carry information associated with the signal $P_{1a}$ but independent from the signal $P_{2a}$ and the wave signal $Q_{2a}$ could carry information associated with the signal $P_{2a}$ but independent from the signal $P_{1a}$. Alternatively, the wave signal $Q_{1a}$ could carry information associated with the signals $P_{1a}$ and $P_{2a}$ and the wave signal $Q_{2a}$ could carry information associated with the signal $P_{2a}$ but independent from the signal $P_{1a}$. Alternatively, the wave signal $Q_{1a}$ could carry information associated with the signal $P_{1a}$ but independent from the signal $P_{2a}$ and the wave signal $Q_{2a}$ could carry information associated with the signals $P_{1a}$ and $P_{2a}$. Alternatively, each of the wave signals $Q_{1a}$ and $Q_{2a}$ could carry information associated with the signal $P_{1a}$ and $P_{2a}$.

Referring to FIGS. 6C and 6D, with regards to the uplink ground terminal 605b receiving an extraneous analog or digital signal $A_2$, the extraneous analog or digital signal $A_2$ is input to an input port of the 1-to-G TDDM 604b. The 1-to-G TDDM 604b includes the number G of output ports outputting the number G of digital or analog signals $X_{F+1}$-$X_M$. The 1-to-G TDDM 604b can divide the input signal $A_2$ having a frequency bandwidth of J2 sampled at a sampling rate of K2 into the number G of the signals $X_{F+1}$-$X_M$, each having a frequency bandwidth of J2/G sampled at a sampling rate of K2/G, passing through the number G of parallel signal paths, such as physical or wireless channels, coupled to a wave-front multiplexer 213b. The analog or digital signal $X_{F+1}$-$X_M$ could be individual and independent from each other or one another. At the same time, the number F of ground signals and the number N-M of pilot or diagnostic signals are input in parallel to the wave-front multiplexer 213b through multiple parallel signal paths, such as wireless channels or physical channels, wherein the number F of input ports of the wave-front multiplexer 213a can be connected to a ground reference for receiving the ground signals. The ground signals represent no extraneous signals input to the input ports of the wave-front multiplexer 213b. The digital pilot or diagnostic signals $X_{M+1}$-$X_N$ may have a single frequency and fixed amplitude. Alternatively, the digital pilot or diagnostic signals $X_{M+1}$-$X_N$ could change based on time or could be any signal known by the system 600. The extraneous analog or digital signal $A_2$ divided into the number G of the analog or digital signals $X_{F+1}$-$X_M$ by the 1-to-G TDDM 604b is unknown by the system 600 and input into the system 600 from an extraneous system.

Next, referring to FIGS. 6C and 6D, the wave-front multiplexer 213b performs the above wave-front multiplexing transform to process the analog and digital signals $X_{F+1}$-$X_M$, the number F of the ground signals and the pilot or diagnostic signals $X_{M+1}$-$X_N$ into multiple linear combinations, each combined with the signals $X_{F+1}$-$X_M$ and $X_{M+1}$-$X_N$ and the ground signals multiplied by respective weightings, represented by the number N of digital signals $Y_{1b}$-$Y_{Nb}$, which can referred to as FIGS. 1A and 1D. In this case, as illustrated in FIG. 1D, the number of H is equal to N. The wavefront multiplexer 213a has N*N computing units and the number N of summing processors. The computing units form a processor array with the number N of rows and the number N of columns. The signals $X_{F+1}$-$X_M$ and $X_{M+1}$-$X_N$ and the ground signals can be received by the computing units in the number N of the respective columns in the processor array. Upon receiving the input signals $X_{F+1}$-$X_M$ and $X_{M+1}$-$X_N$ and the ground signals, each of the computing units independently weights its received signal, multiplied by a weighting value, to generate a weighted signal. The number N of the summing processors can output the signals $Y_{1b}$-$Y_{Nb}$ each combined with the weighted signals output from the computing units in a corresponding one of the number N of the rows in the processor array. The signals $X_{F+1}$-$X_M$ and $X_{M+1}$-$X_N$ can be, but not limited to, IF digital signals or RF digital signals.

Next, referring to FIGS. 6C and 6D, upon receiving the digital signals $Y_{1b}$-$Y_{Nb}$ output in parallel from the wave-front multiplexer 213b, the number N of frequency up-conversion components 601 convert the number N of signals $Y_{1b}$-$Y_{Nb}$ into the number N of analog or digital microwave signals $U_{1b}$-$U_{Nb}$ each having or modulating a distinct carrier within a distinct frequency sub-band in a bandwidth, such as Ku frequency band or Ka frequency band, for satellite communication from any other one of the number N of signals $U_{1b}$-$U_{Nb}$, wherein the frequency sub-bands of the signals $U_{1b}$-$U_{Nb}$ are not overlapped to one another or each other.

Next, referring to FIGS. 6C and 6D, upon receiving the signals $U_{1b}$-$U_{Lb}$, the output multiplexer (O-Mux) 602c, i.e. a frequency division multiplexer (FDM), combines the number L of signals $U_{1b}$-$U_{Lb}$ into a signal analog or digital composite microwave signal $P_{1b}$. Upon receiving the signals $U_{Lb+1}$-$U_{Nb}$, the output multiplexer (O-Mux) 602b, i.e. a frequency division multiplexer (FDM), combines the number N-L of signals $U_{Lb+1}$-$U_{Nb}$ into a signal analog or digital composite microwave signal $P_{2b}$. Next, upon receiving the signal composite signals $P_{1b}$ and $P_{2b}$, the antenna array 603b outputs or broadcasts an analog or digital microwave signal $Q_{1b}$ to the satellite 650a and an analog or digital microwave signal $Q_{2b}$ to the satellite 650b, wherein the wave signal $Q_{1b}$ could carry information associated with the signal $P_{1b}$ but independent from the signal $P_{2b}$ and the wave signal $Q_{2b}$ could carry information associated with the signal $P_{2b}$ but independent from the signal $P_{1b}$. Alternatively, the wave signal $Q_{1b}$ could carry information associated with the signals $P_{1b}$ and $P_{2b}$ and the wave signal $Q_{2b}$ could carry information associated with the signal $P_{2b}$ but independent from the signal $P_{1b}$. Alternatively, the wave signal $Q_{1b}$ could carry information associated with the signal $P_{1b}$ but independent from the signal $P_{2b}$ and the wave signal $Q_{2b}$ could carry information associated with the signals $P_{1b}$ and $P_{2b}$. Alternatively, each of the wave signals $Q_{1b}$ and $Q_{2b}$ could carry information associated with the signal $P_{1b}$ and $P_{2b}$.

Next, referring to FIGS. 6C and 6D, the satellite 650a is provided with a transponder, operating at multiple frequency sub-bands in a Ku or Ka frequency bandwidth, for example, that receives the microwave signal $Q_{1a}$ from the uplink ground terminal 605a and the microwave signal $Q_{1b}$ from the uplink ground terminal 605b, amplifies the microwave signals $Q_{1a}$ and $Q_{1b}$ and outputs an analog or digital microwave signal $R_1$ at different frequency ranges from those of the microwave signal $Q_{1a}$, $Q_{1b}$, $Q_{2a}$ and $Q_{2b}$ respectively, wherein the microwave signal $R_1$ carries information associated with the microwave signals $Q_{1a}$ and $Q_{1b}$ and the microwave signal $R_2$ carries information associated with the microwave signal $Q_{2a}$ and $Q_{2b}$. The satellite 650b is provided with a transponder, operating at multiple frequency sub-bands in a Ku or Ka frequency bandwidth, for example, that receives the microwave signal $Q_{2a}$ and $Q_{2b}$ from the uplink ground terminal 605b, amplifies the microwave signals $Q_{2a}$ and $Q_{2b}$ and outputs an analog or digital microwave signal $R_2$ at a different frequency range from those of the microwave signal $Q_{1a}$, $Q_{1b}$, $Q_{2a}$ and $Q_2$b respectively, wherein the microwave signal $R_2$ carries information associated with the microwave signal $Q_{2a}$ and $Q_2b$.

Next, referring to FIGS. 6C and 6D, the antenna array 607 intercepts or receives the microwave signal $R_1$ from the satellite 650a and the microwave signal $R_2$ from the satellite 650b and outputs the microwave signal $K_1$ to the input multiplexer 608a and the microwave signal $K_2$ to the input multiplexer 608b, wherein the wave signal $K_1$ could carry information associated with the signal $R_1$ but independent from the signal $R_2$ and the wave signal $K_2$ could carry information associated with the signal $R_2$ but independent from the signal $R_1$. Alternatively, the wave signal $K_1$ could carry information associated with the signals $R_1$ and $R_2$ and the wave signal $K_2$ could carry information associated with the signal $R_2$ but independent from the signal $R_1$. Alternatively, the wave signal $K_1$ could carry information associated with the signal $R_1$ but independent from the signal $R_2$ and the wave signal $K_2$ could carry information associated with the signals $R_1$ and $R_2$. Alternatively, each of the wave signals $K_1$ and $K_2$ could carry information associated with the signal $R_1$ and $R_2$.

Next, referring to FIGS. 6C and 6D, upon receiving the microwave signal $K_1$ output from the antenna array 607, the input multiplexer 608a, i.e. a frequency division demultiplexer (FDDM), divides the microwave signal $K_1$ into the number T of analog or digital microwave signals $I_1$-$I_T$. Upon receiving the microwave signal $K_2$ output from the antenna array 607, the input multiplexer 608b, i.e. a frequency division demultiplexer (FDDM), divides the microwave signal $K_2$ into the number N-T of analog or digital microwave signals $I_{T+1}$-$I_N$. Each of the microwave signals $I_1$-$I_N$ has or modulates a distinct carrier within a distinct frequency sub-band in the Ku frequency band or Ka frequency band, for example, from any other one of the microwave signals $I_1$-$I_N$, wherein the frequency sub-bands of the microwave signals $I_1$-$I_N$ are not overlapped to one another or each other.

Next, referring to FIGS. 6C and 6D, upon receiving the microwave signals $I_1$-$I_N$ output in parallel from the input multiplexers 608a and 608b, the frequency down-conversion components 609 convert the number N of microwave signals $I_1$-$I_N$ into the number N of analog or digital signals $W_1$-$W_N$ at an intermediate-frequency (IF) band or base band, for example, output to the equalizer 231 through multiple parallel channels, such as wireless channels or physical channels.

Next, referring to FIGS. 6C and 6D, the above optimizing and equalizing process, as illustrated in FIG. 1C, is performed such that the digital signals $W_1$-$W_N$ can be compensated to be multiplied by respective weightings by the equalizer 231, wherein the respective weightings of the equalizer 231 can be adjusted based on one or more control signals CS output from the optimizer 235. After the optimizing and equalizing process, the equalizer 231 outputs the number N of equalized analog or digital signals $S_1$-$S_N$. More description and calculation related to the equalizer 231 can be referred to as those illustrated in FIG. 6A.

Next, referring to FIGS. 6C and 6D, upon receiving, in parallel, the equalized digital signals $S_1$-$S_N$ output in parallel from the equalizer 231, the wave-front demultiplexer 232 extracts multiple analog or digital signals $Z_1$-$Z_N$, which are substantially equal to the analog or digital signals $X_1$-$X_N$, respectively or to the digital signals $X_1$-$X_N$ multiplied by the same scalar, respectively, from the analog or digital signals $S_1$-$S_N$ by the above-mentioned wave-front demultiplexing transform. More description and calculation related to the wave-front demultiplexer 232 can be referred to as those illustrated in FIG. 6A.

Next, referring to FIGS. 6C and 6D, upon receiving the signals $Z_1$-$Z_F$, the F-to-1 time-domain multiplexer 610a combines or integrates the number F of signals $Z_1$-$Z_F$ each having a bandwidth of J1/F sampled as a sampling rate K1/F into an analog or digital output signal $B_1$ having a bandwidth of J1 sampled as a sampling rate of $K_1$, wherein the output signal $B_1$ is substantially equal to the signal $A_1$ or to the signal $A_1$ multiplied by the same scalar as the digital signals $X_1$-$X_N$ are multiplied. Upon receiving the signals $Z_{F+1}$-$Z_M$, the G-to-1 time-domain multiplexer 610b combines or integrates the number G of signals $Z_{F+1}$-$Z_M$ each having a bandwidth of J2/G sampled as a sampling rate K2/G into an analog or digital output signal $B_2$ having a bandwidth of J2 sampled as a sampling rate of K2, wherein the output signal $B_2$ is substantially equal to the signal $A_2$ or to the signal $A_2$ multiplied by the same scalar as the digital signals $X_1$-$X_N$ are multiplied. The signals $B_1$ and $B_2$ are substantially equal to the signals $A_1$ and $A_2$ respectively or to the signals $B_1$ and $B_2$ multiplied by the same scalar, respectively. At the same time, the signals $Z_{M+1}$-$Z_N$ are transmitted to the optimizer 231, the optimizer 235 generates the one or more control signals CS output to the equalizer 231 to adjust the respective weightings of the equalizer 231, as illustrated in FIG. 1C.

In this case as above illustrated in FIGS. 6C and 6D, the number of N is an integer that could be any number equal to or greater than 2, 4, 8, 16, 32, 64, 128 or 256. The number of M is an integer that could be any number less than the number of N. The number of F is an integer that could be any number less than the number of M. The number of G is an integer that could be any number less than the number of M and could be equal to or greater or less than the number of F. The number of S is an integer that could be any number less than the number of N and equal to or greater or less than an half of the number of N. The number of T is an integer that could be any number less than the number of N, equal to or greater or less than an half of the number of N and equal to or greater or less than the number of S. The number of L is an integer that could be any number less than the number of N, equal to or greater or less than an half of the number of N, equal to or greater or less than the number of S and equal to or greater or less than the number of T. The number F plus the number G equals the number M.

Sixth Embodiment: Application to Power Amplifier

Figure 7A:
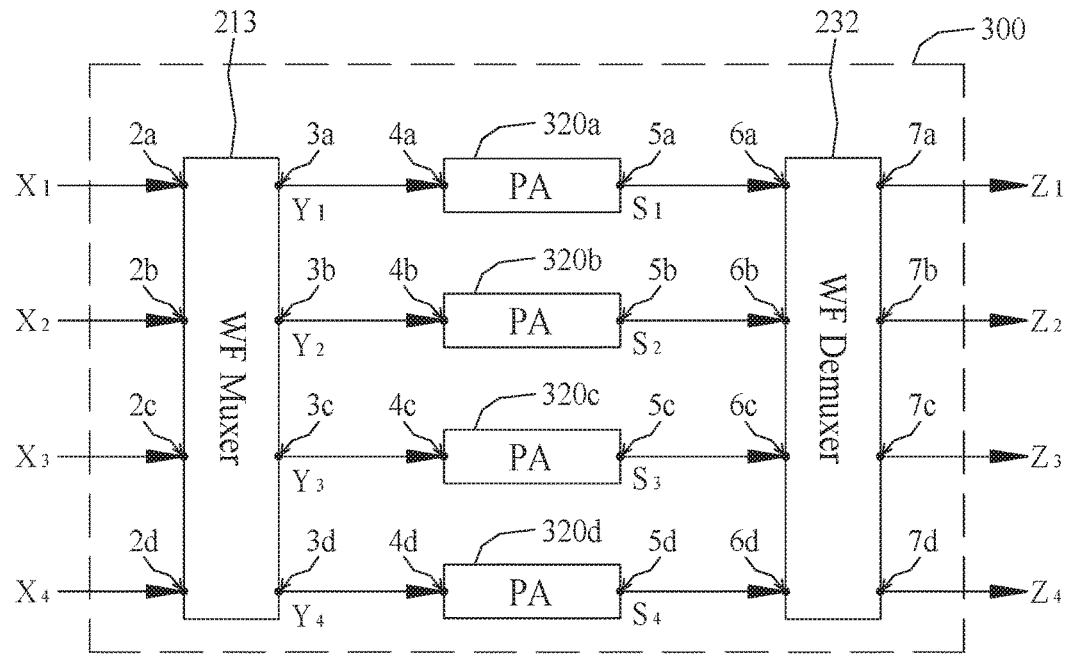
FIG. 7A shows a power amplifying system including a wave-front multiplexer, four power amplifiers and a wave-front demultiplexer according to an embodiment of the present disclosure.

FIG. 7A depicts a system of sharing output power to multiple input signals using a wave-front multiplexer, multiple power amplifiers and a wave-front demultiplexer according to an exemplary embodiment of the present disclosure.

Referring to FIG. 7A, a power amplifying system 300 may include a wave-front multiplexer 213, four power amplifiers (PAs) 320a-320d, and a wave-front demultiplexer 232. In this embodiment, the four processing units or devices 999a-999d as illustrated in FIG. 1A can be replaced with the four power amplifiers 320a-320d illustrated in FIG. 2A.

Referring to FIG. 7A, the wave-front multiplexer 213 after receiving, in parallel, four individual and independent analog or digital signals $X_1$-$X_4$, processes all the analog or digital signals $X_1$-$X_4$ into four analog or digital signals $Y_1$-$Y_4$ by the above-mentioned wave-front multiplexing transform, and outputs the analog or digital signals $Y_1$-$Y_4$ in parallel, which can be referred to as the description illustrated in FIG. 1A. Each of the analog or digital signals $Y_1$-$Y_4$ is a linear combination, i.e. weighted sum, of all the analog or digital signals $X_1$-$X_4$ multiplied by respective weightings, and distributions of the weightings of any two input components in all analog or digital signals $Y_1$-$Y_4$ are orthogonal, which can be referred to as the description illustrated in FIGS. 1A and 1D. In this case, as illustrated in FIG. 1D, the number of H is equal to 4. The wave-front multiplexer 213 may include 4*4 computing units and four summing processors. The computing units form a processor array with four rows and four columns. The input signals $X_1$-$X_4$ can be received by the computing units in the respective four columns in the processor array. Upon receiving the input signals $X_1$-$X_4$, each of the computing units independently weights its received signal, multiplied by a weighting value, to generate a weighted signal. The four summing processors can output the four signals $Y_1$-$Y_4$ each combined with the weighted signals output from the computing units in a corresponding one of the four rows in the processor array. Each of the analog or digital signals $X_1$-$X_4$ can be, but not limited to, an IF digital signal or a RF digital signal.

Referring to FIG. 7A, the wave-front demultiplexer 232 can receive, in parallel, multiple coherently-combined digital signals $S_1$, $S_2$, $S_3$ and $S_4$ output in parallel from the power amplifiers 320a-320d, extracts multiple coherently combined analog or digital signals $Z_1$-$Z_4$, which are the analog or digital signals $X_1$-$X_4$ powered by substantially the same gain respectively or the analog or digital signals $X_1$-$X_4$ powered by different gains respectively, from the analog or digital signals $S_1$-$S_4$ by the above-mentioned wave-front demultiplexing transform, and outputs the analog or digital signals $Z_1$-$Z_4$ in parallel, which can be referred to as the description illustrated in FIG. 1A. Each of the analog or digital signals $Z_1$-$Z_4$ is a linear combination, i.e. weighted sum, of all the analog or digital signals $S_1$-$S_4$ multiplied by respective weightings, and distributions of the weightings of any two input components in all analog or digital signals $Z_1$-$Z_4$ are orthogonal, which can be referred to as the description illustrated in FIGS. 1A and 1E. In this case, the number of I is equal to 4. The wave-front demultiplexer 232 may include 4*4 computing units and four summing processors. The computing units form a processor array with four rows and four columns. The input signals $S_1$-$S_4$ can be received by the computing units in the respective four columns in the processor array. Upon receiving the input signals $S_1$-$S_4$, each of the computing units independently weights its received signal, multiplied by a weighting value, to generate a weighted signal. The four summing processors can output the four signals $Z_1$-$Z_4$ each combined with the weighted signals output from the computing units in a corresponding one of the four rows in the processor array. Each of the analog or digital signals $Z_1$-$Z_4$ can be, but not limited to, an IF digital signal or a RF digital signal.

Referring to FIG. 7A, the four power amplifiers 320a-320d operating in near linear modes, that is the output power level of a power amplifier is proportional to the input power level of the power amplifier, are arranged in four parallel signal paths between the wave-front multiplexer 213 and the wave-front demultiplexer 232 of the system 300. In other words, the power amplifier 320a is arranged in a first signal path between an output port 3a of the wave-front multiplexer 213 and an input port 6a of the wave-front demultiplexer 232 of the system 300. The power amplifier 320b is arranged in a second signal path between an output port 3b of the wave-front multiplexer 213 and an input port 6b of the wave-front demultiplexer 232 of the system 300. The power amplifier 320c is arranged in a third signal path between an output port 3c of the wave-front multiplexer 213 and an input port 6c of the wave-front demultiplexer 232 of the system 300. The analog-to-digital converter 220d is arranged in a fourth signal path between an output port 3d of the wave-front multiplexer 213 and an input port 6d of the wave-front demultiplexer 232 of the system 300.

Referring to FIG. 7A, each of the power amplifiers 320a-220d can power a corresponding one of the four signals $Y_1$-$Y_4$ by a specific gain. For instance, each of the power amplifiers 320a-220d has a corresponding input port 4a, 4b, 4c or 4d for receiving a corresponding one of the analog or digital signals $Y_1$-$Y_4$ and a corresponding output port 5a, 5b, 5c or 5d for outputting a corresponding one of the analog or digital signal $S_1$-$S_4$. The analog or digital signals $S_1$-$S_4$ passing in parallel can be transmitted to parallel input ports 6a-6d of the wave-front demultiplexer 232 through parallel channels, such as wireless channels or physical channels, respectively.

A method for processing signals or data streams by using the system 300 is described below. Referring to FIG. 7A, the individual and independent analog or digital signals $X_1$-$X_4$ from, e.g., one or more wireless base stations or array elements such as antenna array elements are input in parallel to the input ports 2a-2d of the wave-front multiplexer 213 through, e.g., four parallel signal paths, four parallel wireless channels or four parallel physical channels. Each of the wireless base stations can be, but not limited to, a mobile base station or a $W_1$-Fi base station. Alternatively, the analog signals $X_1$-$X_4$ can come from, but not limited to, one or more microphone devices, one or more image sensors, one or more micro-electro-mechanical-system (MEMS) microphone chips, or one or more antennas of a mobile phone. After the analog or digital signals $X_1$-$X_4$ are input in parallel to the wave-front multiplexer 213, the wave-front multiplexer 213 performs the above-mentioned wave-front multiplexing transformation to process the individual analog or digital signals $X_1$-$X_4$ into multiple linear combinations, each combined with the analog or digital signals $X_1$-$X_4$ multiplied by respective weightings, represented by the analog or digital signals $Y_1$-$Y_4$. Next, the wave-front multiplexer 213 outputs the four analog or digital signals $Y_1$-$Y_4$ from its four output ports 3a-3d, and the four analog or digital signals $Y_1$-$Y_4$ are transmitted to the four input ports 4a-4d of the four power amplifiers 320a-320d, respectively, through four parallel channels, such as wireless channels or physical channels.

Referring to FIG. 7A, After the analog or digital signals $Y_1$-$Y_4$ are transmitted in parallel into the power amplifiers 320a-320d arranged in parallel, the power amplifiers 320a-320d power the analog or digital signals $Y_1$-$Y_4$ by the same gain or different gains respectively and output the four analog or digital signals $S_1$-$S_4$ in parallel from the four output ports 5a-5d of the power amplifiers 320a-320d. For example, the analog or digital signal $S_1$ features the analog or digital signal $Y_1$ powered by a first gain of the power amplifier 320a. The analog or digital signal $S_2$ features the analog or digital signal $Y_2$ powered by a second gain of the power amplifier 320b. The analog or digital signal $S_3$ features the analog or digital signal $Y_3$ powered by a third gain of the power amplifier 320c. The analog or digital signal $S_4$ features the analog or digital signal $Y_4$ powered by a fourth gain of the power amplifier 320d. In a case, the first, second, third and fourth gains can be substantially equal to one another. Alternatively, some of the first, second, third and fourth gains, such as first, second and third gains, can be substantially equal to each other or one another, and two of the first, second, third and fourth gains, such as first and fourth gains, can be different from each other. Alternatively, the first, second, third and fourth gains can be different from one another. The power amplifiers $320a$-$320d$, for example, could be realized by four integrated circuit chips embedded in a single chip package, by four integrated circuit chips embedded in four individual chip packages, or by a single integrated circuit chip. Alternatively, the function of the power amplifiers $320a$-$320d$ can be realized by software installed in the system 300.

Next, referring to FIG. 7A, the analog or digital signals $S_1$-$S_4$ are transmitted in parallel into the four input ports $6a$-$6d$ of the wave-front demultiplexer 232 through four parallel channels, such as wireless channels or physical channels. The input ports $6a$-$6d$ are arranged in parallel. Next, the wave-front demultiplexer 232 performs the above-mentioned wave-front demultiplexing transformation to process the analog or digital signals $S_1$-$S_4$ into multiple linear combinations, each combined with the analog or digital signals $S_1$-$S_4$ multiplied by respective weightings, represented by the analog or digital signals $Z_1$-$Z_4$ output in parallel from the four parallel output ports $7a$-$7d$ of the wave-front demultiplexer 232. The four output ports $7a$-$7d$ are arranged in parallel. The analog or digital signals $Z_1$-$Z_4$ are the analog or digital signals $X_1$-$X_4$ powered by substantially the same gain respectively or the analog or digital signals $X_1$-$X_4$ powered by different gains respectively. For example, the analog or digital signal $Z_1$ features the analog or digital signal $X_1$ powered by a fifth gain of the system 300. The analog or digital signal $Z_2$ features the analog or digital signal $X_2$ powered by a sixth gain of the system 300. The analog or digital signal $Z_3$ features the analog or digital signal $X_3$ powered by a seventh gain of the system 300. The analog or digital signal $Z_4$ features the analog or digital signal $X_4$ powered by an eighth gain of the system 300. In a case, the fifth, sixth, seventh and eighth gains can be substantially equal to one another. Alternatively, some of the fifth, sixth, seventh and eighth gains, such as fifth, sixth and seventh gains, can be substantially equal to each other or one another, and two of the fifth, sixth, seventh and eighth gains, such as fifth and eighth gains, can be different from each other. Alternatively, the fifth, sixth, seventh and eighth gains can be different from one another. The power amplifiers $320a$-$320d$, for example, could be realized by four integrated circuit chips embedded in a single chip package, by four integrated circuit chips embedded in four individual chip packages, or by a single integrated circuit chip.

Figure 7B:
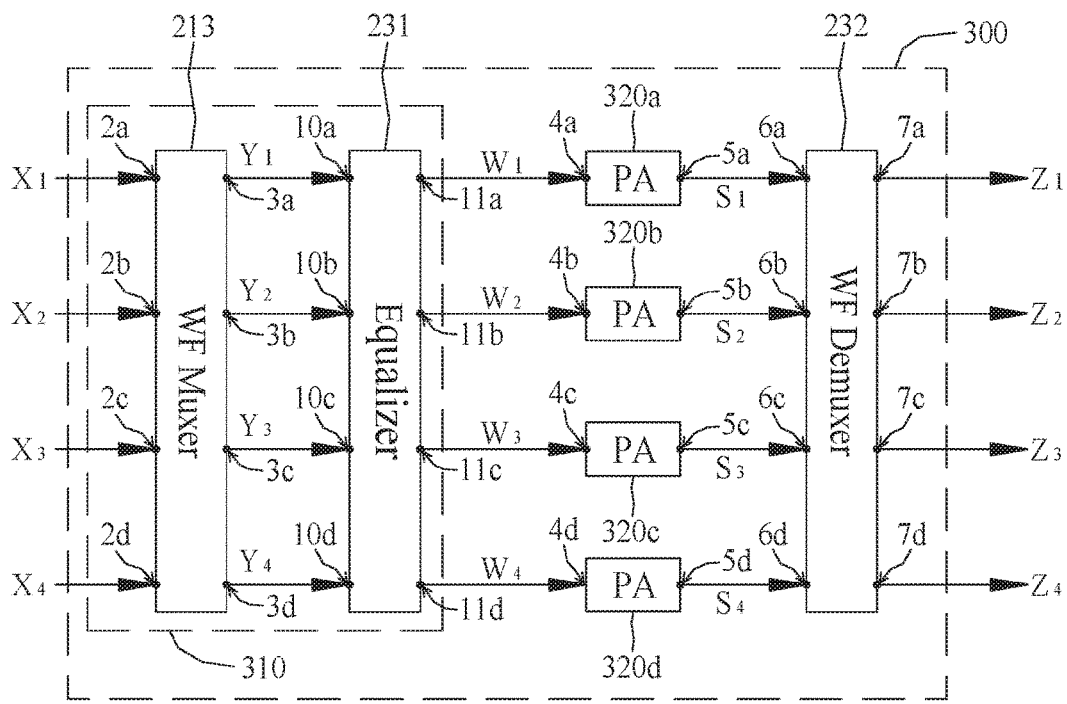
FIG. 7B shows a power amplifying system including a wave-front multiplexer, an equalizer, four power amplifiers and a wave-front demultiplexer according to an embodiment of the present disclosure.

According to another exemplary embodiment of the present disclosure, as seen in FIG. 7B, the system 300 may further include an equalizer to adjust the analog or digital signals $Y_1$-$Y_4$ output from the wave-front multiplexer 231 before the digital signals $Y_1$-$Y_4$ are transmitted into the power amplifiers $320a$-$320d$. The system 300 illustrated in FIG. 7B is similar to that illustrated in FIG. 7A except that the system 300 illustrated in FIG. 7B further includes the equalizer 231. In FIG. 7B, the wave-front multiplexer 213 and the equalizer 231 can be, but not limited to, embedded in a module, processor, integrated-circuit chip, system-on chip or chip package 310.

A method for processing signals or data streams by using the system 300 shown in FIG. 7B is described below. The four extraneous analog or digital signals $X_1$-$X_4$ can be input from one or more wireless base stations or antenna array elements to the input ports $2a$-$2d$ of the wave-front multiplexer 213 through four parallel signal paths, four parallel wireless channels or four parallel physical channels. Each of the wireless base stations can be, but not limited to, a mobile base station or a $W_1$-Fi base station. Alternatively, the analog or digital signals $X_1$-$X_4$ can come from, but not limited to, one or more microphone devices, one or more image sensors, one or more MEMS microphone chips, or one or more antennas of a mobile phone. The extraneous analog or digital signals $X_1$-$X_4$ could be independent from one another.

Next, referring to FIG. 7B, the wave-front multiplexer 213 performs the above wave-front multiplexing transformation to process the signals $X_1$-$X_4$ into multiple linear combinations, each combined with the signals $X_1$-$X_4$ multiplied by respective weightings, represented by four analog or digital signals $Y_1$-$Y_4$. Next, the wave-front multiplexer 213 outputs the analog or digital signals $Y_1$-$Y_4$ from its output ports $3a$-$3d$, and the analog or digital signals $Y_1$-$Y_4$ are respectively transmitted to four input ports $10a$-$10d$ of the equalizer 231 through four parallel channels, such as wireless channels or physical channels.

Referring to FIG. 7B, upon receiving the analog or digital signals $Y_1$-$Y_4$, the equalizer 231 performs an equalizing process to the analog or digital signals $Y_1$-$Y_4$ such that the digital signals $Y_1$-$Y_4$ can be compensated to be multiplied by four respective weightings, and then outputs four equalized digital signals $W_1$-$W_4$, respectively, from its output ports $11a$-$11d$. The equalized digital signal $W_1$ is created by the equalizer 231 multiplying the analog or digital signal $Y_1$ by a weighting of the equalizer 231. The equalized digital signal $W_2$ is created by the equalizer 231 multiplying the analog or digital signal $Y_2$ by another weighting of the equalizer 231. The equalized digital signal $W_3$ is created by the equalizer 231 multiplying the analog or digital signal $Y_3$ by another weighting of the equalizer 231. The equalized digital signal $W_4$ is created by the equalizer 231 multiplying the analog or digital signal $Y_4$ by the other weighting of the equalizer 231. Each of the four respective weightings of the equalizer 231 can be, but not limited to, a complex value such that the equalized signals $W_1$-$W_4$ can be rotated precisely to become in phase. In this case, the equalizer 231 can be performed by the narrow band equalizer, as illustrated in FIG. 1C. The narrow band equalizer 231 can provide phase and amplitude modifications to each of the signals $Y_1$-$Y_4$ featuring a constant phase shift and a constant amplitude attenuation across the narrow frequency band. Alternatively, the equalizer 231 can be performed by the broadband equalizer, as illustrated in FIG. 1C. The broadband equalizer 231 can provide phase and amplitude modifications to each of the signals $Y_1$-$Y_4$ featuring a constant phase shift and a constant amplitude attenuation in each sub-band across the broad frequency band, but the phase shift and amplitude attenuation in one sub-band across the broad frequency band is different from those in the other sub-band across the broad frequency band.

Next, referring to FIG. 7B, the equalized digital signals $W_1$-$W_4$ are transmitted in parallel to the input ports $4a$-$4d$ of the power amplifiers $320a$-$320d$ operating in near linear modes. Upon receiving the equalized digital signals $W_1$-$W_4$, the power amplifiers $320a$-$320d$ power the analog or digital signals $W_1$-$W_4$ by the same gain or different gains respectively and output four analog or digital signals $S_1$-$S_4$ in parallel from the four output ports $5a$-$5d$ of the power amplifiers $320a$-$320d$. For example, the analog or digital signal $S_1$ features the analog or digital signal $W_1$ powered by the first gain of the power amplifier $320a$. The analog or digital signal $S_2$ features the analog or digital signal $W_2$ powered by the second gain of the power amplifier $320b$. The analog or digital signal $S_3$ features the analog or digital signal $W_3$ powered by the third gain of the power amplifier $320c$. The analog or digital signal $S_4$ features the analog or digital signal $W_4$ powered by the fourth gain of the power amplifier 320d. In a case, the first, second, third and fourth gains can be substantially equal to one another. Alternatively, some of the first, second, third and fourth gains, such as first, second and third gains, can be substantially equal to each other or one another, and two of the first, second, third and fourth gains, such as first and fourth gains, can be different from each other. Alternatively, the first, second, third and fourth gains can be different from one another. The power amplifiers 320a-320d, for example, could be realized by four integrated circuit chips embedded in a single chip package, by four integrated circuit chips embedded in four individual chip packages, or by a single integrated circuit chip. Alternatively, the function of the power amplifiers 320a-320d can be realized by software installed in the system 300.

Next, referring to FIG. 7B, the analog or digital signals $S_1$-$S_4$ are transmitted in parallel into the four input ports 6a-6d of the wave-front demultiplexer 232 through four parallel channels, such as wireless channels or physical channels. The input ports 6a-6d are arranged in parallel. Upon on receiving the analog or digital signals $S_1$-$S_4$, the wave-front demultiplexer 232 performs the above-mentioned wave-front demultiplexing transformation to process the analog or digital signals $S_1$-$S_4$ into multiple linear combinations, each combined with the analog or digital signals $S_1$-$S_4$ multiplied by respective weightings, represented by the analog or digital signals $Z_1$-$Z_4$ output in parallel from the four parallel output ports 7a-7d of the wave-front demultiplexer 232. The four output ports 7a-7d are arranged in parallel. The analog or digital signals $Z_1$-$Z_4$ are the analog or digital signals $X_1$-$X_4$ powered by substantially the same gain respectively or the analog or digital signals $X_1$-$X_4$ powered by different gains respectively. For example, the analog or digital signal $Z_1$ features the analog or digital signal $X_1$ powered by a fifth gain of the system 300. The analog or digital signal $Z_2$ features the analog or digital signal $X_2$ powered by a sixth gain of the system 300. The analog or digital signal $Z_3$ features the analog or digital signal $X_3$ powered by a seventh gain of the system 300. The analog or digital signal $Z_4$ features the analog or digital signal $X_4$ powered by an eighth gain of the system 300. In a case, the fifth, sixth, seventh and eighth gains can be substantially equal to one another. Alternatively, some of the fifth, sixth, seventh and eighth gains, such as fifth, sixth and seventh gains, can be substantially equal to each other or one another, and two of the fifth, sixth, seventh and eighth gains, such as fifth and eighth gains, can be different from each other. Alternatively, the fifth, sixth, seventh and eighth gains can be different from one another. The power amplifiers 320a-320d, for example, could be realized by four integrated circuit chips embedded in a single chip package, by four integrated circuit chips embedded in four individual chip packages, or by a single integrated circuit chip.

Figure 7C:
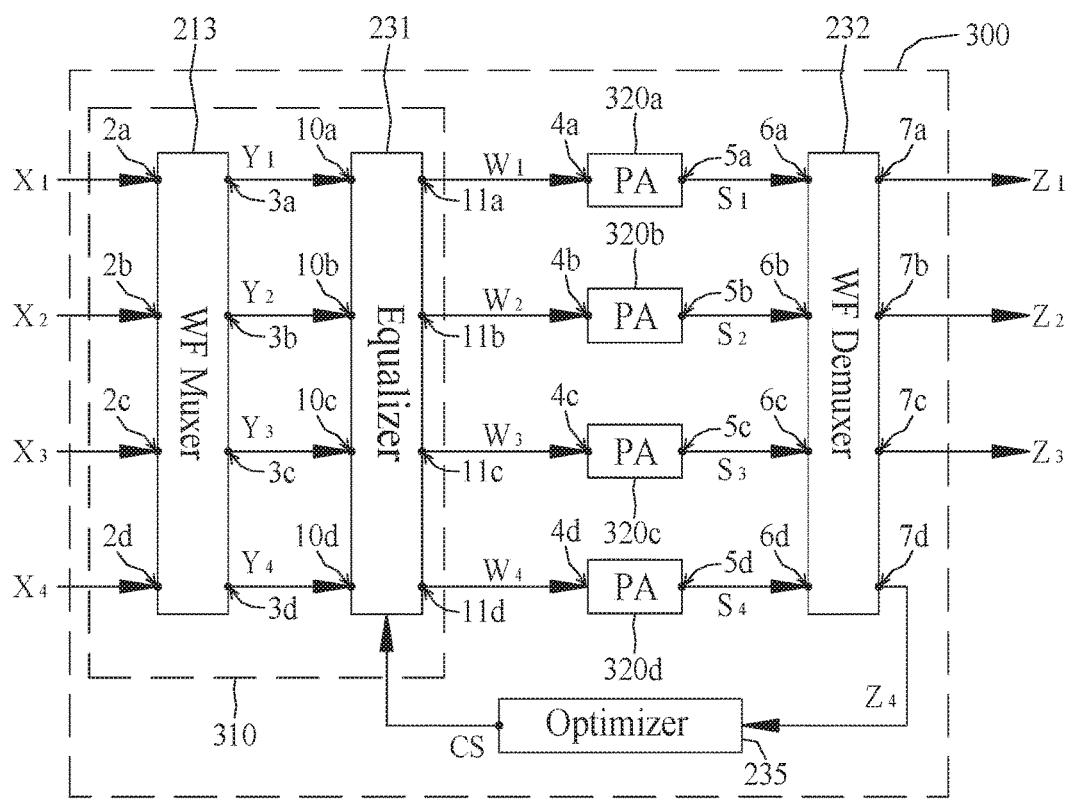
FIG. 7C shows a power amplifying system including a wave-front multiplexer, an equalizer, four power amplifiers, a wave-front demultiplexer and an optimizer according to an embodiment of the present disclosure.

According to another exemplary embodiment of the present disclosure, as seen in FIG. 7C, the system 300 may further include an optimizer 235 to adjust the weightings of the equalizer 231. The system 300 illustrated in FIG. 7C is similar to that illustrated in FIG. 7B except that the system 300 illustrated in FIG. 7C further includes the optimizer 235 and the analog or digital signal $X_4$ is input as a pilot or diagnostic signal. The pilot or diagnostic signal $X_4$ may have a single frequency and fixed amplitude. Alternatively, the analog pilot or diagnostic signal $X_4$ could change based on time or could be any signal known by the system 300. The extraneous analog or digital signals $X_1$-$X_3$ are unknown by the system 300 and input into the system 300 from an extraneous system, wherein the analog or digital signals $X_1$-$X_3$ are at least 20 dB above that of the pilot or diagnostic signal $X_4$. It will only consume 1% or less output power. The optimizer 235 can be in a signal path between the output ports 7a-7d of the wave-front demultiplexer 232 and the equalizer 231 (only one signal path between the output port 7d and the equalizer 231 is shown in FIG. 7C). In FIG. 7C, the wave-front multiplexer 213 and the equalizer 231 can be, but not limited to, integrated or embedded in a module, processor, integrated-circuit chip, system-on chip or chip package 310, and the optimizer 235 can be, but not limited to, embedded in another module, processor, integrated-circuit chip, system-on chip or chip package. Alternatively, the wave-front multiplexer 213, the equalizer 231 and the optimizer 235 can be, but not limited to, integrated or embedded in the module, processor, integrated-circuit chip, system-on chip or chip package 310.

Following the above steps illustrated in FIG. 7B, after the signals $Z_1$-$Z_4$ are output from the wave-front demultiplexer 232, upon receiving the signal $Z_4$, the optimizer 235 shown in FIG. 7C is configured to calculate a difference between a value represented by the diagnostic signal $Z_4$ and a predetermined value known by the system 300, wherein the diagnostic signal $X_4$, input into the wave-front multiplexer 213, corresponding to the diagnostic signal $Z_4$ represents the predetermined value. Alternatively, upon receiving the signals $Z_1$-$Z_4$, the optimizer 235 may be configured further to calculate correlations between the signals $Z_1$ and $Z_2$, between the signals $Z_1$ and $Z_3$, between the signals $Z_1$ and $Z_4$, between the signals $Z_2$ and $Z_3$, between the signals $Z_2$ and $Z_4$, and the signals $Z_3$ and $Z_4$. Next, the optimizer 235 is configured to calculate a sum value, i.e. cost, by performing weighted summation of multiple factors including the difference. Alternatively, the factors may further include the correlations in case that the correlations are obtained. Next, the optimizer 235 is configured to compare the calculated sum value or cost with a threshold sum value, i.e. threshold cost. Next, the optimizer 235 is configured to calculate a variation in the calculated sum value or cost in response to finding the calculated sum value or cost is greater than the threshold sum value or threshold cost. The optimizer 235 creates a control signal CS based on the variation and transmits the control signal CS to the equalizer 231 so as to adjust the four weightings of the equalizer 231. The optimizer 235 is configured to stop the above loop in response to finding the calculated sum value or cost is less than the threshold sum value or threshold cost. Therefore, the equalizer 231 coupled to the optimizer 235 can dynamically provide a compensation function to compensate the signals $Y_1$-$Y_4$ for propagation effects and/or difference of unbalanced amplitudes, unbalanced phases, and/or unbalanced time-delays so as to improve the signals $Z_1$-$Z_4$. Since the dynamic optimization will assure the orthogonality among the four amplified outputs $Z_1$-$Z_4$, the low power diagnostic signal $Z_4$ is reconstituted and focused as the designated output port 7d with leakage from other ports 7a-7c at least −35 dB below.

Figure 7D:
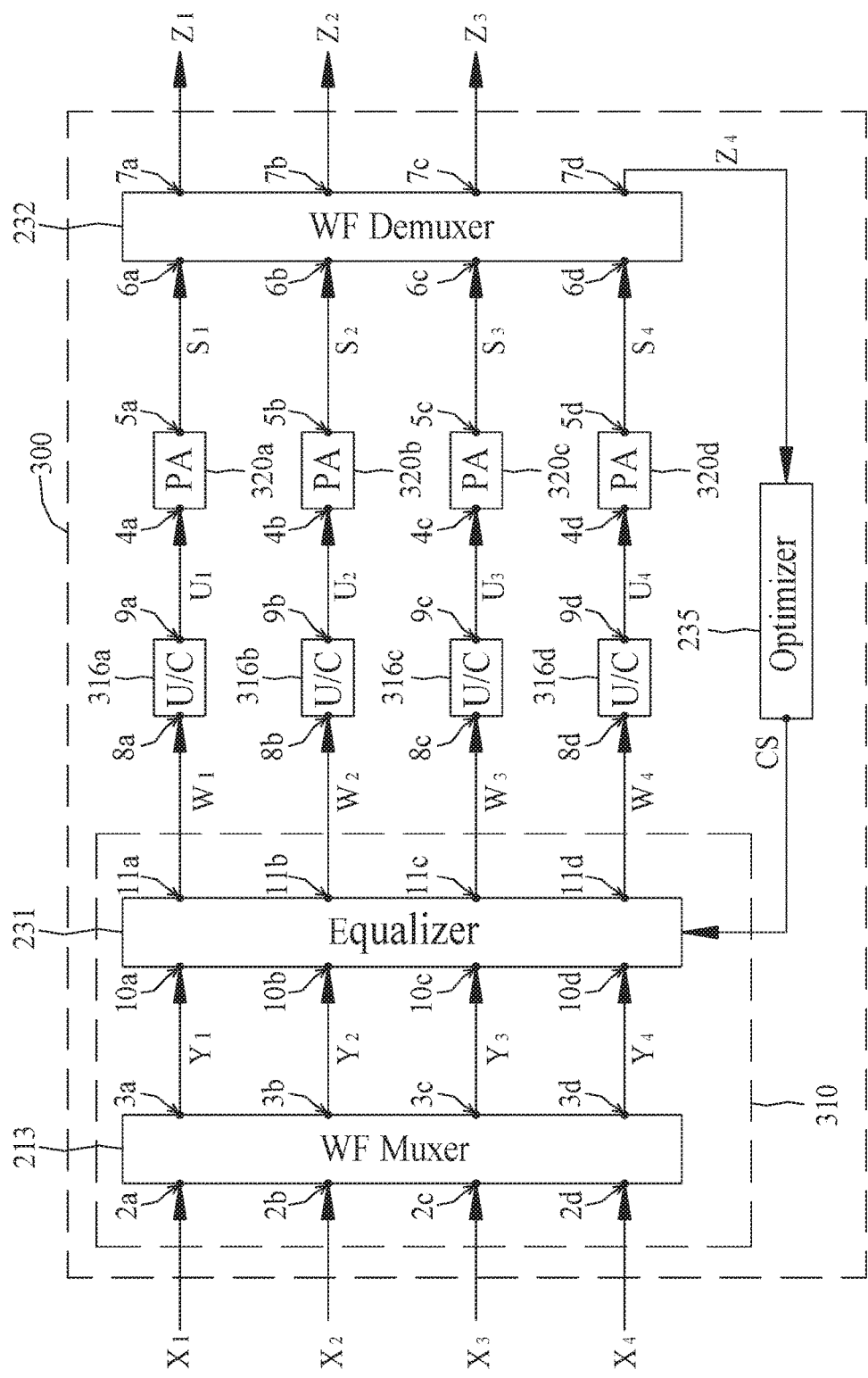
FIG. 7D shows a power amplifying system including a wave-front multiplexer, an equalizer, four frequency up-conversion components, four power amplifiers, a wave-front demultiplexer and an optimizer according to an embodiment of the present disclosure.

Alternatively, the system 300 can further include four frequency up-conversion components 316a-316d illustrated in FIG. 7D in four parallel signal paths or channels between four output ports 11a-11d of the equalizer 231 and four input ports 8a-8d of the power amplifiers 320a-320d. The system 300 illustrated in FIG. 7D is similar to that illustrated in FIG. 7C except that the system 300 illustrated in FIG. 7D further includes the frequency up-conversion components 316a-316d. In this case, the wave-front multiplexer 213 and equalizer 231 can process signals in baseband, for example. In FIG. 7D, the wave-front multiplexer 213 and the equalizer 231 can be, but not limited to, integrated or embedded in a module, processor, integrated-circuit chip, system-on chip or chip package 310, and the optimizer 235 can be, but not limited to, embedded in another module, processor, integrated-circuit chip, system-on chip or chip package. Alternatively, the wave-front multiplexer 213, the equalizer 231 and the optimizer 235 can be, but not limited to, integrated or embedded in the module, processor, integrated-circuit chip, system-on chip or chip package 310.

Referring to FIG. 7D, the process illustrated in FIG. 7D is similar to that illustrated in FIG. 7C except the following process. Referring to FIG. 7D, before the equalized signals $W_1$-$W_4$ are transmitted to the power amplifiers 320a-320d operating in near linear modes, the equalized signals $W_1$-$W_4$ can be alternatively sent in parallel to input ports 8a-8d of the frequency up-conversion components 316a-316d. Upon receiving the equalized signals $W_1$-$W_4$, the frequency up-conversion components 316a-316d can convert the signals $W_1$-$W_4$ into four analog or digital signals $U_1$-$U_4$ each having or modulating a distinct carrier within a distinct frequency sub-band in a bandwidth, such as Ku frequency band or Ka frequency band, for satellite communication, for example. The analog or digital signals $U_1$-$U_4$ can be output from output ports 9a-9d of the frequency up-conversion components 316a-316d respectively.

Referring to FIG. 7D, upon receiving the analog or digital signals $U_1$-$U_4$, the power amplifiers 320a-320d power the analog or digital signals $U_1$-$U_4$ by the same gain or different gains respectively and output four analog or digital signals $S_1$-$S_4$ in parallel from the four output ports 5a-5d of the power amplifiers 320a-320d. The operation and characteristics of the power amplifiers 320a-320d illustrated in FIG. 7D can be referred to as those illustrated in FIGS. 7A and 7B.

Alternatively, the system 300 can process the number $N_A$ of input signals, wherein the input signals includes extraneous analog or digital signals from one or more extraneous systems, ground signals from a ground reference, and one or more pilot or diagnostic signals. The number of $N_A$ could be any number equal to or greater than 2, 4, 8, 16, 32, 64, 128, 256 and so on. In this case illustrated in FIG. 7E, the system 300 processes eight input signals including four extraneous analog or digital signals $X_1$-$X_4$ input from one or more extraneous systems to ports 2a, 2e, 2f and 2g of the wave-front multiplexer 213, three ground signals from a ground reference to ports 2b, 2c and 2d of the wave-front multiplexer 213, and a pilot or diagnostic signal $X_5$ input to a port 2h of the wave-front multiplexer 213.

Figure 7E:
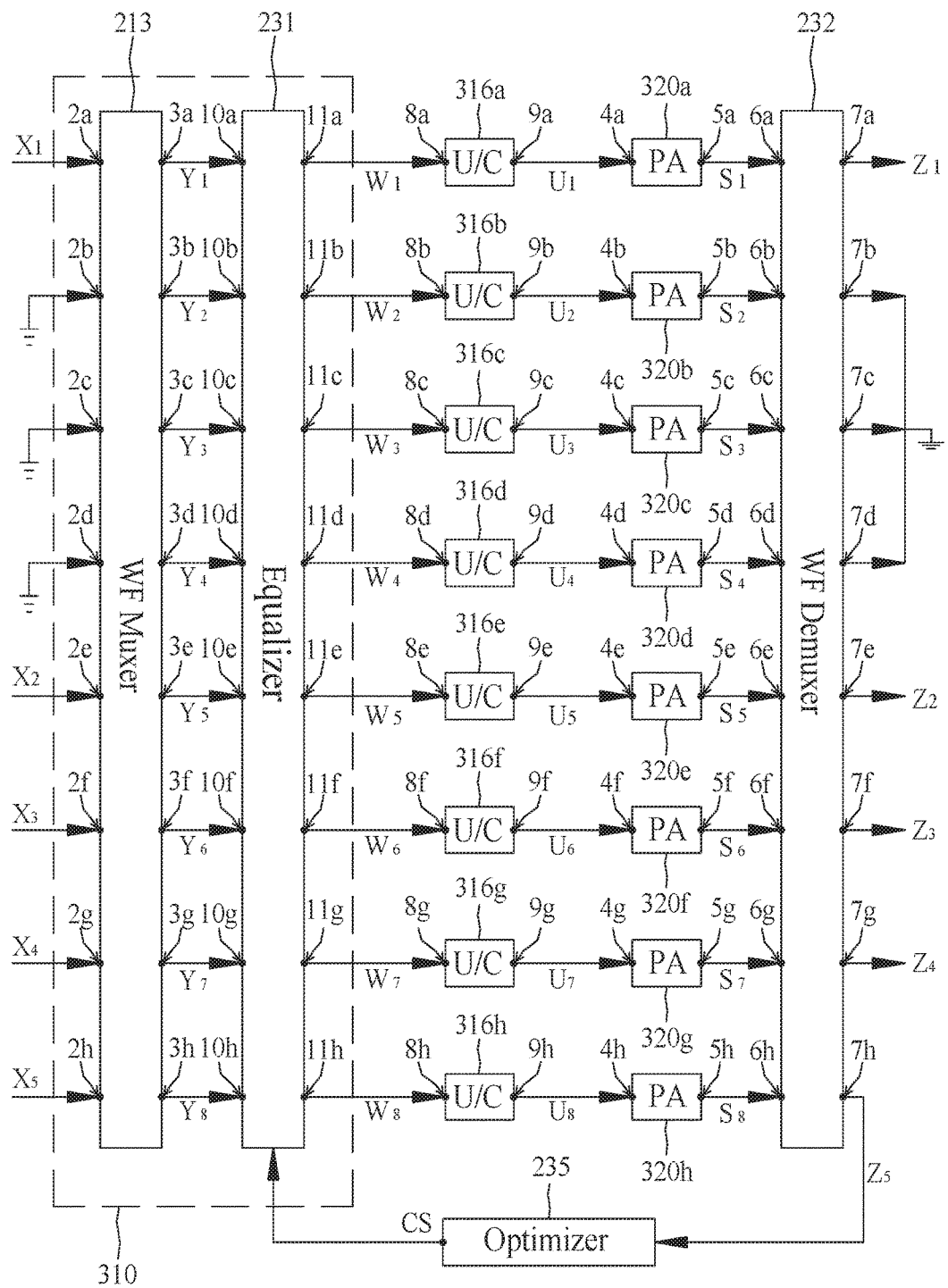
FIG. 7E shows a power amplifying system including a wave-front multiplexer, an equalizer, eight frequency up-conversion components, eight power amplifiers, a wave-front demultiplexer and an optimizer according to an embodiment of the present disclosure.

Referring to FIG. 7E, upon receiving the number $N_A$ of input signals, such as eight input signals including the analog or digital signals $X_1$-$X_4$, the three ground signals and the pilot or diagnostic signal $X_5$, the wave-front multiplexer 213 processes the number $N_A$ of the input signals into the number $N_A$ of output signals, such as eight analog or digital signals $Y_1$-$Y_8$, by the above-mentioned wave-front multiplexing transform, which can be referred to as the description illustrated in FIGS. 1A and 1D. Each of the number $N_A$ of the output signals is a linear combination, i.e. weighted sum, of the number $N_A$ of the input signals multiplied by respective weightings, and distributions of the weightings of any two input components in all the number $N_A$ of the output signals are orthogonal, which can be referred to as the description illustrated in FIGS. 1A and 1D. In this case, as illustrated in FIG. 1D, the number of H is equal to 8. The wave-front multiplexer 213 may include 8*8 computing units and eight summing processors. The computing units form a processor array with eight rows and eight columns.

The extraneous signals $X_1$-$X_4$, the three ground signals and the pilot or diagnostic signal $X_5$ can be received by the computing units in the respective eight columns in the processor array. Upon receiving the input signals $X_1$-$X_4$, the three ground signals and the pilot or diagnostic signal $X_5$, each of the computing units independently weights its received signal, multiplied by a weighting value, to generate a weighted signal. The eight summing processors can output the four signals $Y_1$-$Y_8$ each combined with the weighted signals output from the computing units in a corresponding one of the eight rows in the processor array. Each of the signals $X_1$-$X_4$ and pilot or diagnostic signal $X_8$ can be, but not limited to, an IF digital signal or a RF digital signal.

Next, referring to FIG. 7E, upon receiving the number $N_A$ of the signals output from the wave-front multiplexer 213, such as the eight analog or digital signals $Y_1$-$Y_8$, the equalizer 231 performs an equalizing process to the number $N_A$ of the signals, such as $Y_1$-$Y_8$, output from the wave-front multiplexer 213 such that the number $N_A$ of the signals, such as $Y_1$-$Y_8$, output from the wave-front multiplexer 213 can be compensated to be multiplied by the number $N_A$ of respective weightings, and then outputs the number $N_A$ of equalized digital signals, such as the equalized digital signals $W_1$-$W_8$, respectively, from its the number $N_A$ of output ports, such as the eight output ports 11a-11h. For example, the equalized digital signal $W_1$ is created by the equalizer 231 multiplying the analog or digital signal $Y_1$ by a weighting of the equalizer 231. The equalized digital signal $W_2$ is created by the equalizer 231 multiplying the analog or digital signal $Y_2$ by another weighting of the equalizer 231. The equalized digital signal $W_3$ is created by the equalizer 231 multiplying the analog or digital signal $Y_3$ by another weighting of the equalizer 231. The equalized digital signal $W_4$ is created by the equalizer 231 multiplying the analog or digital signal $Y_4$ by another weighting of the equalizer 231. The equalized digital signal $W_5$ is created by the equalizer 231 multiplying the analog or digital signal $Y_5$ by another weighting of the equalizer 231. The equalized digital signal $W_6$ is created by the equalizer 231 multiplying the analog or digital signal $Y_6$ by another weighting of the equalizer 231. The equalized digital signal $W_7$ is created by the equalizer 231 multiplying the analog or digital signal $Y_7$ by another weighting of the equalizer 231. The equalized digital signal $W_8$ is created by the equalizer 231 multiplying the analog or digital signal $Y_8$ by the other weighting of the equalizer 231. Each of the respective weightings of the equalizer 231 can be, but not limited to, a complex value such that the number $N_A$ of equalized signals, such as the equalized signals $W_1$-$W_8$, can be rotated precisely to become in phase. In this case, the equalizer 231 can be performed by the narrow band equalizer, as illustrated in FIG. 1C. The narrow band equalizer 231 can provide phase and amplitude modifications to each of the number $N_A$ of the signals output from the wave-front multiplexer 213, such as the signals $Y_1$-$Y_8$, featuring a constant phase shift and a constant amplitude attenuation across the narrow frequency band. Alternatively, the equalizer 231 can be performed by the broadband equalizer, as illustrated in FIG. 1C. The broadband equalizer 231 can provide phase and amplitude modifications to each of the number $N_A$ of the signals output from the wave-front multiplexer 213, such as the signals $Y_1$-$Y_8$, featuring a constant phase shift and a constant amplitude attenuation in each sub-band across the broad frequency band, but the phase shift and amplitude attenuation in one sub-band across the broad frequency band is different from those in the other sub-band across the broad frequency band. In this case, the wave-front multiplexer 213 and equalizer 231 can process signals in baseband, for example.

Next, referring to FIG. 7E, the number $N_A$ of the equalized signals, such as the eight equalized digital signals $W_1$-$W_8$, are transmitted in parallel to the number $N_A$ of the input ports, such as eight input port 8a-8h, of the number $N_A$ of the frequency up-conversion components, such as eight frequency up-conversion components 316a-316h. Upon receiving the number $N_A$ of the equalized signals, such as $W_1$-$W_8$, the number $N_A$ of the frequency up-conversion components, such as 316a-316h, can convert the number $N_A$ of the signals, such as $W_1$-$W_8$, into the number $N_A$ of up-converted signals, such as eight analog or digital signals $U_1$-$U_8$, each having or modulating a distinct carrier within a distinct frequency sub-band in a bandwidth, such as Ku frequency band or Ka frequency band, for satellite communication, for example. The number $N_A$ of up-converted signals, such as $U_1$-$U_8$, can be output from the number $N_A$ of output ports, such as eight output ports 9a-9h, of the number $N_A$ of the frequency up-conversion components, such as 316a-316h, respectively.

Next, referring to FIG. 7E, the number $N_A$ of the up-converted signals, such as the eight up-converted digital signals $W_1$-$W_8$, are transmitted in parallel to the number $N_A$ of the input ports, such as the eight input port 4a-4h, of the number $N_A$ of the power amplifiers, such as the eight power amplifiers 320a-320h, operating in near linear modes. Upon receiving the number $N_A$ of the up-converted signals, such as $U_1$-$U_8$, the number $N_A$ of the power amplifiers, such as 320a-320h, power the number $N_A$ of the up-converted signals, such as $U_1$-$U_8$, by the same gain or different gains respectively and output the number $N_A$ of powered signals, such as eight analog or digital signals $S_1$-$S_8$, in parallel from the number $N_A$ of output ports, such as its eight output ports 5a-5h, of the number $N_A$ of the power amplifiers, such as 320a-320h. For example, the analog or digital signal $S_1$ features the analog or digital signal $W_1$ powered by a first gain of the power amplifier 320a. The analog or digital signal $S_2$ features the analog or digital signal $W_2$ powered by a second gain of the power amplifier 320b. The analog or digital signal $S_3$ features the analog or digital signal $W_3$ powered by a third gain of the power amplifier 320c. The analog or digital signal $S_4$ features the analog or digital signal $W_4$ powered by a fourth gain of the power amplifier 320d. The analog or digital signal $S_5$ features the analog or digital signal $W_5$ powered by a fifth gain of the power amplifier 320e. The analog or digital signal $S_6$ features the analog or digital signal $W_6$ powered by a sixth gain of the power amplifier 320f. The analog or digital signal $S_7$ features the analog or digital signal $W_7$ powered by a seventh gain of the power amplifier 320g. The analog or digital signal $S_8$ features the analog or digital signal $W_8$ powered by an eighth gain of the power amplifier 320h. In a case, the first through eighth gains can be substantially equal to one another. Alternatively, some of the first through eighth gains can be substantially equal to each other or one another, such as the first through fourth gains are substantially equal to one another, and the fifth through eighth gains are substantially equal to one another, and two of the first through eighth gains, such as first and fifth gains, can be different from each other. Alternatively, the first through eighth gains can be different from one another. The number $N_A$ of the power amplifiers, such as 320a-320h, could be realized by the number $N_A$ of integrated circuit chips embedded in a single chip package, by the number $N_A$ of integrated circuit chips embedded in the number $N_A$ of individual chip packages, or by a single integrated circuit chip. Alternatively, the function of the number $N_A$ of the power amplifiers, such as 320a-320d, can be realized by software installed in the system 300.

Next, referring to FIG. 7E, upon receiving, in parallel, the number $N_A$ of the powered signals, such as the eight powered signals $S_1$-$S_8$, the wave-front demultiplexer 232 extracts the number $N_A$ of coherently combined signals, such as including five analog or digital signals $Z_1$-$Z_5$ and three ground signals, from the number $N_A$ of the powered signals, such as $S_1$-S, by the above-mentioned wave-front demultiplexing transform. The number $N_A$ of the extracted signals output from the wave-front demultiplexer 232 can be, in sequence, the number $N_A$ of the input signals, input into the wave-front multiplexer 213, powered by substantially the same gain respectively or by different gains respectively. For example, the analog or digital signals $Z_1$-$Z_5$ can be the analog or digital signals $X_1$-$X_5$ powered by substantially the same gain respectively or by different gains respectively. The wave-front demultiplexing transform can be referred to as the description illustrated in FIGS. 1A and 1E. Each of the number $N_A$ of the extracted signals, such as including five analog or digital signals $Z_1$-$Z_5$ and three ground signals, is a linear combination, i.e. weighted sum, of the number $N_A$ of the powered signals, such as $S_1$-S, multiplied by respective weightings, and distributions of the weightings of any two input components in all the number $N_A$ of the extracted signals, such as signals $Z_1$-$Z_5$ and three ground signals, are orthogonal, which can be referred to as the description illustrated in FIGS. 1A and 1E. In this case, the number of I is equal to 8. The wave-front demultiplexer 232 may include 8*8 computing units and eight summing processors. The computing units form a processor array with eight rows and eight columns. The input signals $S_1$-$S_8$ can be received by the computing units in the respective eight columns in the processor array. Upon receiving the input signals $S_1$-$S_8$, each of the computing units independently weights its received signal, multiplied by a weighting value, to generate a weighted signal. The eight summing processors can output the eight signals, including the analog or digital $Z_1$-$Z_5$ and thee ground signals, each combined with the weighted signals output from the computing units in a corresponding one of the eight rows in the processor array. Each of the analog or digital signals $Z_1$-$Z_5$ can be, but not limited to, an IF digital signal or a RF digital signal.

Next, referring to FIG. 7E, an optimization process as illustrated in FIG. 7C can be performed. One of more of the number $N_A$ of the input signals, input to the wave-front multiplexer 213, such as the signal $X_5$, can be input as a pilot or diagnostic signal. For example, the pilot or diagnostic signal $X_5$ may have a single frequency and fixed amplitude. Alternatively, the analog pilot or diagnostic signal $X_5$ could change based on time or could be any signal known by the system 300. The extraneous analog signals $X_1$-$X_4$ are unknown by the system 300 and input into the system 300 from an extraneous system. The optimizer 235 can be in a signal path between the wave-front demultiplexer 232 and the equalizer 231.

After the number $N_A$ of the extracted signals are output from the wave-front demultiplexer 232, upon receiving the pilot or diagnostic signals, such as $Z_5$, the optimizer 235 shown in FIG. 7E is configured to calculate differences between values represented by the pilot or diagnostic signals, such as $Z_5$, and corresponding predetermined values known by the system 300, wherein the corresponding pilot or diagnostic signals, such as $X_5$, input into the wave-front multiplexer 213 at the same sequences as the corresponding pilot or diagnostic signals, such as $Z_5$, output from the wave-front demultiplexer 232, represent the predetermined values. Alternatively, upon receiving all of the number $N_A$ of the extracted signals, such as the signals $Z_1$-$Z_5$ and the three ground signals, output from the wave-front demultiplexer 232, the optimizer 235 may be configured further to calculate a correlation between each two of the number $N_A$ of the extracted signals. Next, the optimizer 235 is configured to calculate a sum value, i.e. cost, by performing weighted summation of multiple factors including the differences. Alternatively, the factors may further include the all correlations in case that the correlations are obtained. Next, the optimizer 235 is configured to compare the calculated sum value or cost with a threshold sum value, i.e. threshold cost. Next, the optimizer 235 is configured to calculate a variation in the calculated sum value or cost in response to finding the calculated sum value or cost is greater than the threshold sum value or threshold cost. The optimizer 235 creates one or more control signals CS (only one is shown) based on the variation and transmits the control signals CS to the equalizer 231 so as to adjust the number $N_A$ of the weightings of the equalizer 231. The optimizer 235 is configured to stop the above loop in response to finding the calculated sum value or cost is less than the threshold sum value or threshold cost. Therefore, the equalizer 231 coupled to the optimizer 235 can dynamically provide a compensation function to compensate the number $N_A$ of the signals, such as $Y_1$-$Y_8$, output from the wave-front multiplexer 213, for propagation effects and/or difference of unbalanced amplitudes, unbalanced phases, and/or unbalanced time-delays so as to improve the number $N_A$ of the extracted signals, such as $Z_1$-$Z_5$.

Referring to FIG. 7E, the input ports 2b-2d of the wave-front multiplexer 213 and the output ports 7b-7d of the wave-front demultiplexer 232 are connected to a ground reference for a linearization processing. In FIG. 7E, the wave-front multiplexer 213 and the equalizer 231 can be, but not limited to, integrated or embedded in a module, processor, integrated-circuit chip, system-on chip or chip package 310, and the optimizer 235 can be, but not limited to, embedded in another module, processor, integrated-circuit chip, system-on chip or chip package. Alternatively, the wave-front multiplexer 213, the equalizer 231 and the optimizer 235 can be, but not limited to, integrated or embedded in the module, processor, integrated-circuit chip, system-on chip or chip package 310.

The above-mentioned embodiments of the present invention can be, but not limited to, applied to wireless communication system, fiber optical communication system, wire communication system, radio frequency communication system, satellite communication system, sonar communication system, radar communication system, laser communication system, interne communication system, communication system between a vehicle and a satellite, communication system between a least two vehicles, internal vehicle communication system between the various operating subsystems within a vehicle, or a communication system resulting from a combination of at least two of these communication systems therein.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Suitable software can include computer-readable or machine-readable instructions for performing methods and techniques (and portions thereof) of designing and/or controlling the implementation of the wave-front multiplexing and demultiplexing processes. Moreover, embodiments of the present disclosure can be, but not limited to, used in a wireless or physical communication between two systems, such as between two computers, between a computer and a mobile or smart phone, between two mobile or smart phones, between a computer and a storage device, between a mobile or smart phone and a storage device, between two storage devices, between a television and a ground station, between a television and a smart or mobile phone, between a television and a computer, between a television and a storage device, or between two ground stations.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A broadband linear processing system comprising:
   a pre-processing module comprising:
      a wavefront multiplexer having M input ports and M output ports, M being an integer greater than 1, receiving M input signals at the M input ports, performing a wavefront multiplexing transform on the M input signals, the wavefront multiplexing transform having an inverse, and outputting M narrowband signal streams at the M output ports; and
   a set of M linear processors coupled to the pre-processing module, each of the M linear processors receiving and processing a corresponding one of the M narrowband signal streams and outputting a corresponding one of M processed narrowband signal streams.

2. The broadband linear processing system of claim 1 further comprising:
   a post-processing module comprising:
      an equalizer coupled to the M linear processors for receiving the M processed narrowband signal streams, applying weightings on the M processed narrowband signal streams, and generating M equalized signals; and
      a wavefront demultiplexer coupled to the equalizer, for receiving the M equalized signals, performing the inverse of the wavefront multiplexing transform on the M equalized signals, and generating M wavefront demultiplexed signals.

3. The broadband linear processing system of claim 2, wherein the post-processing module further comprises:
an optimizer coupled to the wavefront demultiplexer and the equalizer, the optimizer receiving at least one of the M wavefront demultiplexed signals, generating a control signal based on the at least one of the M wavefront demultiplexed signals, and outputting the control signal to the equalizer to adjust the weightings.

4. The broadband linear processing system of claim 1, wherein the pre-processing module further comprises:
a time-division demultiplexer coupled to the wavefront multiplexer, for receiving and transforming an input data signal stream into L demultiplexed signals, L being an integer smaller than or equal to M,
wherein the wavefront multiplexer receives the L demultiplexed signals and M minus L diagnostic signals at the M input ports.

5. The broadband linear processing system of claim 4 further comprising:
a post-processing module comprising:
an equalizer coupled to the M linear processors for receiving the M processed narrowband signal streams, applying weightings on the M processed narrowband signal streams, and generating M equalized signals; and
a wavefront demultiplexer coupled to the equalizer, for receiving the M equalized signals, performing the inverse of the wavefront multiplexing transform on the M equalized signals, and generating M wavefront demultiplexed signals; and
a time-division multiplexer module coupled to the wavefront demultiplexer, for receiving and performing time-division multiplexing on L wavefront demultiplexed signals of the M wavefront demultiplexed signals, and generating a broadband output signal.

6. The broadband linear processing system of claim 5, wherein the post-processing module further comprises:
an optimizer coupled to the wavefront demultiplexer and the equalizer, the optimizer receiving remaining M minus L wavefront demultiplexed signals of the M wavefront demultiplexed signals, generating a control signal based on the remaining M-L wavefront demultiplexed signals, and outputting the control signal to the equalizer to adjust the weightings.

7. The broadband linear processing system of claim 1, wherein each of the M linear processors comprises at least one of the following: a multiplier, an adder, a subtractor, and a divider.

8. The broadband linear processing system of claim 1, wherein the wavefront multiplexing transform is one of a Fourier transform, a Hadamard transform, and a Hartley transform.

9. A broadband linear processing system comprising:
a pre-processing module comprising:
a first time-division demultiplexer module for receiving and transforming at least one input data signal stream into L demultiplexed signals, L being an integer greater than 1;
a wavefront multiplexer coupled to the time-division demultiplexer, the wavefront multiplexer receiving the L demultiplexed signals and J diagnostic signals, J being an integer greater than 0, performing a wavefront multiplexing transform on the L demultiplexed signals and the J diagnostic signals, the wavefront multiplexing transform having an inverse, and outputting L plus J wavefront multiplexed signals; and
a first time-division multiplexer module coupled to the wavefront multiplexer for transforming the L plus J wavefront multiplexed signals into the M narrowband signal streams, M being an integer smaller than L; and
a set of M linear processors coupled to the pre-processing module, each of the M linear processors receiving and processing a corresponding one of the M narrowband signal streams and outputting a corresponding one of M processed narrowband signal streams.

10. The broadband linear processing system of claim 9 further comprises:
a post-processing module comprising:
a second time-division demultiplexer module for receiving and transforming the M processed narrowband signal streams into L plus J demultiplexed signals;
an equalizer coupled to the time-division demultiplexer, for receiving the L plus J demultiplexed signals, applying weightings on the L plus J demultiplexed signals, and generating L plus J equalized signals;
a wavefront demultiplexer coupled to the equalizer, for receiving the L plus J equalized signals, performing the inverse of the wavefront multiplexing transform on the L plus J equalized signals, and generating L plus J wavefront demultiplexed signals; and
a second time-division multiplexer module coupled to the wavefront demultiplexer, for receiving and performing time-division multiplexing on L wavefront demultiplexed signals of the L plus J wavefront demultiplexed signals, and generating at least one broadband output signal.

11. The broadband linear processing system of claim 10, wherein the post-processing module further comprises:
an optimizer coupled to the wavefront demultiplexer and the equalizer, the optimizer receiving remaining J wavefront demultiplexed signals of the L plus J wavefront demultiplexed signals, generating a control signal based on the remaining J wavefront demultiplexed signals, and outputting the control signal to the equalizer to adjust the weightings.

12. The broadband linear processing system of claim 9, wherein each of the M linear processors comprises at least one of the following: a multiplier, an adder, a subtractor, and a divider.

13. The broadband linear processing system of claim 9, wherein the wavefront multiplexing transform is one of a Fourier transform, a Hadamard transform, and a Hartley transform.

14. The broadband linear processing system of claim 9, wherein the first time-division demultiplexer module comprises a plurality of first time-division demultiplexer submodules, each of the first time-division demultiplexer submodules receiving and transforming a respective input data signal stream of the at least one input data signal stream into a subset of the L demultiplexed signals.

15. The broadband linear processing system of claim 10, wherein the second time-division multiplexer module comprises a plurality of second time-division multiplexer submodules, each of the second time-division multiplexer submodules receiving and performing time-division multiplexing on a subset of the L wavefront demultiplexed signals and generating a corresponding one of the at least one broadband output signal.

16. The broadband linear processing system of claim 9, wherein the first time-division multiplexer module comprises a plurality of first time-division multiplexer submodules, each of the first time-division multiplexer submodules receiving and transforming a respective subset of the L plus J wavefront multiplexed signals into one of the M narrowband signal streams.

17. The broadband linear processing system of claim 10, wherein the second time-division demultiplexer module comprises a plurality of second time-division demultiplexer submodules, each of the second time-division demultiplexer submodules receiving and transforming a respective one of the M processed narrowband signal streams into a subset of the L plus J demultiplexed signals.

18. A method for broadband linear processing, comprising the operations of:
(a) providing a pre-processing module, wherein operation (a) comprises:
providing a wavefront multiplexer having M input ports and M output ports, M being an integer greater than 1;
(b) receiving M input signals at the M input ports;
(c) performing, via the wavefront multiplexer, a wavefront multiplexing transform on the M input signals, the wavefront multiplexing transform having an inverse; and
(d) outputting M narrowband signal streams at the M output ports;
(e) providing a set of M linear processors coupled to the pre-processing module;
(f) receiving and processing, at each of the M linear processors, a corresponding one of the M narrowband signal streams; and
(g) outputting from each of the M linear processors a corresponding one of M processed narrowband signal streams.

19. The method of claim 18 further comprising the operations of:
(h) providing a post-processing module, wherein operation (h) comprises:
providing an equalizer coupled to the M linear processors;
(i) receiving, via the equalizer, the M processed narrowband signal streams;
(j) applying, via the equalizer, weightings on the M processed narrowband signal streams;
(k) generating, via the equalizer, M equalized signals;
(l) providing a wavefront demultiplexer coupled to the equalizer;
(m) receiving, via the wavefront demultiplexer, the M equalized signals;
(n) performing, via the wavefront demultiplexer, the inverse of the wavefront multiplexing transform on the M equalized signals; and
(o) generating, via the wavefront demultiplexer, M wavefront demultiplexed signals.

20. The method of claim 19, wherein operation (h) further comprises:
providing an optimizer coupled to the wavefront demultiplexer and the equalizer, and wherein the method of claim 19 further comprises:
receiving, via the optimizer, at least one of the M wavefront demultiplexed signals;
generating, via the optimizer, a control signal based on the at least one of the M wavefront demultiplexed signals; and
outputting, via the optimizer, the control signal to the equalizer to adjust the weightings.

* * * * *